(12) United States Patent
Tanaka et al.

(10) Patent No.: US 9,760,102 B2
(45) Date of Patent: Sep. 12, 2017

(54) ACTIVE-MATRIX SUBSTRATE, DISPLAY PANEL AND DISPLAY DEVICE INCLUDING THE SAME

(71) Applicant: Sharp Kabushiki Kaisha, Sakai, Osaka (JP)

(72) Inventors: Kohei Tanaka, Sakai (JP); Hidefumi Yoshida, Sakai (JP); Takeshi Noma, Sakai (JP); Ryo Yonebayashi, Sakai (JP); Takayuki Nishiyama, Sakai (JP); Mitsuhiro Murata, Sakai (JP); Yosuke Iwata, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/253,152

(22) Filed: Aug. 31, 2016

(65) Prior Publication Data
US 2016/0370635 A1    Dec. 22, 2016

Related U.S. Application Data

(63) Continuation of application No. 14/438,941, filed as application No. PCT/JP2013/079424 on Oct. 30, 2013.

(30) Foreign Application Priority Data

Oct. 30, 2012   (JP) ................................. 2012-238805
Jun. 3, 2013    (JP) ................................. 2013-116924

(51) Int. Cl.
*G09G 5/00*     (2006.01)
*G05F 1/46*     (2006.01)
(Continued)

(52) U.S. Cl.
CPC ............ *G05F 1/467* (2013.01); *G02F 1/1368* (2013.01); *G02F 1/13454* (2013.01);
(Continued)

(58) Field of Classification Search
CPC ............... G02F 1/13454; G02F 1/1368; G02F 1/133514; G02F 1/133308;
(Continued)

(56) References Cited

U.S. PATENT DOCUMENTS 6,621,537 B1    9/2003   Nakamura et al.
2005/0280747 A1*  12/2005  Nakayoshi ........ G02F 1/136213
                                                    349/38

(Continued)

FOREIGN PATENT DOCUMENTS

EP   2 253 994 A2    11/2010
JP   10-171369 A     6/1998
(Continued)

OTHER PUBLICATIONS

Tanaka et al., "Active-Matrix Substrate, Display Panel and Display Device Including the Same", U.S. Appl. No. 14/438,941, filed Apr. 28, 2015.

*Primary Examiner* — Amr Awad
*Assistant Examiner* — Aaron Midkiff
(74) *Attorney, Agent, or Firm* — Keating & Bennett, LLP

(57) ABSTRACT

A technique is provided that reduces dullness of a potential provided to a line such as gate line on an active-matrix substrate to enable driving the line at high speed and, at the same time, reduces the size of the picture frame region. On an active-matrix substrate (20a) are provided gate lines (13G) and source lines. On the active-matrix substrate (20a) are further provided: gate drivers (11) each including a plurality of switching elements, at least one of which is located in a pixel region, for supplying a scan signal to a gate line (13G); and lines (15L1) each for supplying a control signal to the associated gate driver (11). A control signal is supplied by a display control circuit (4) located outside the display region to the gate drivers (11) via the lines (15L1).

(Continued)

In response to a control signal supplied, each gate driver (11) drives the gate line (13G) to which it is connected.

25 Claims, 107 Drawing Sheets

(51) Int. Cl.
G02F 1/1368 (2006.01)
G02F 1/1362 (2006.01)
H03K 17/042 (2006.01)
H03K 17/16 (2006.01)
H03K 17/687 (2006.01)
G09G 3/36 (2006.01)
G02F 1/1333 (2006.01)
G02F 1/1335 (2006.01)
G02F 1/1345 (2006.01)
H01L 27/12 (2006.01)
H01L 27/32 (2006.01)

(52) U.S. Cl.
CPC .. G02F 1/133308 (2013.01); G02F 1/133514 (2013.01); G02F 1/136213 (2013.01); G02F 1/136227 (2013.01); G02F 1/136286 (2013.01); G09G 3/3677 (2013.01); H01L 27/124 (2013.01); H01L 27/1255 (2013.01); H03K 17/04206 (2013.01); H03K 17/165 (2013.01); H03K 17/687 (2013.01); G02F 2201/123 (2013.01); G09G 2300/0408 (2013.01); G09G 2300/0426 (2013.01); G09G 2310/0251 (2013.01); G09G 2310/0281 (2013.01); G09G 2310/0286 (2013.01); G09G 2320/0223 (2013.01); H01L 27/3272 (2013.01)

(58) Field of Classification Search
CPC ......... G02F 1/136286; G02F 1/136213; G02F 2201/123; H01L 27/124; H01L 27/1255; H01L 27/3272; G05F 1/467; H03K 17/04206; H03K 17/165; G09G 3/3677; G09G 2300/0408; G09G 2300/0426; G09G 2310/0281; G09G 2310/0251; G09G 2310/0286; G09G 2320/0223
USPC .......................................... 345/204–206, 208
See application file for complete search history.

(56) References Cited

U.S. PATENT DOCUMENTS

| | | |
|---|---|---|
| 2007/0069214 A1 | 3/2007 | Lee |
| 2008/0012819 A1 | 1/2008 | Lee et al. |
| 2009/0046085 A1* | 2/2009 | Ino ...................... G09G 3/3648 345/208 |
| 2013/0188110 A1 | 7/2013 | Miyamoto |

FOREIGN PATENT DOCUMENTS

| | | |
|---|---|---|
| JP | 10-197851 A | 7/1998 |
| JP | 11-184406 A | 7/1999 |
| JP | 2000-111937 A | 4/2000 |
| JP | 2003-302654 A | 10/2003 |
| JP | 2007-004204 A | 1/2007 |
| JP | 2011-146620 A | 7/2011 |
| WO | 2010/140537 A1 | 12/2010 |
| WO | 2012/032749 A1 | 3/2012 |
| WO | 2012/042824 A1 | 4/2012 |

* cited by examiner

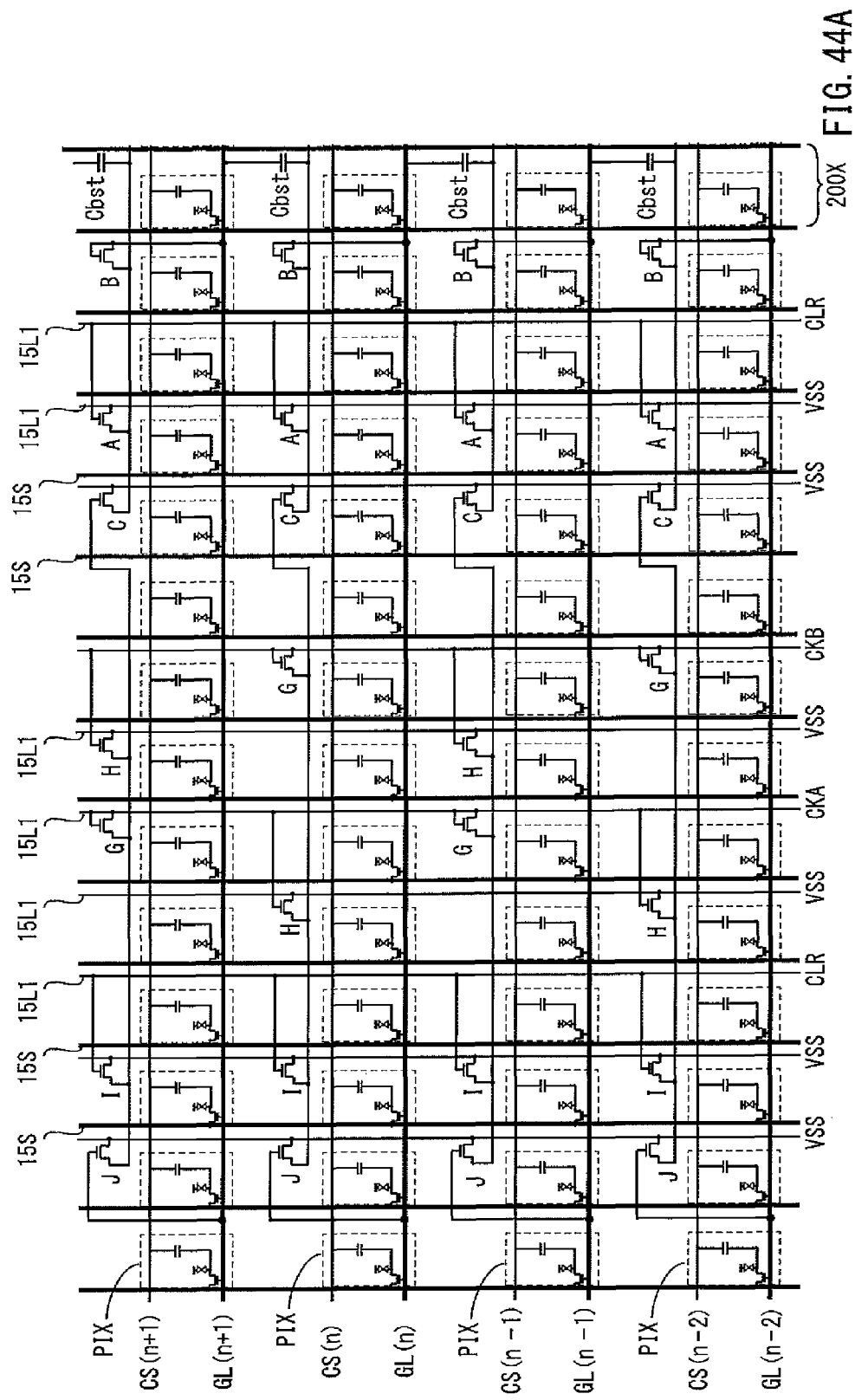

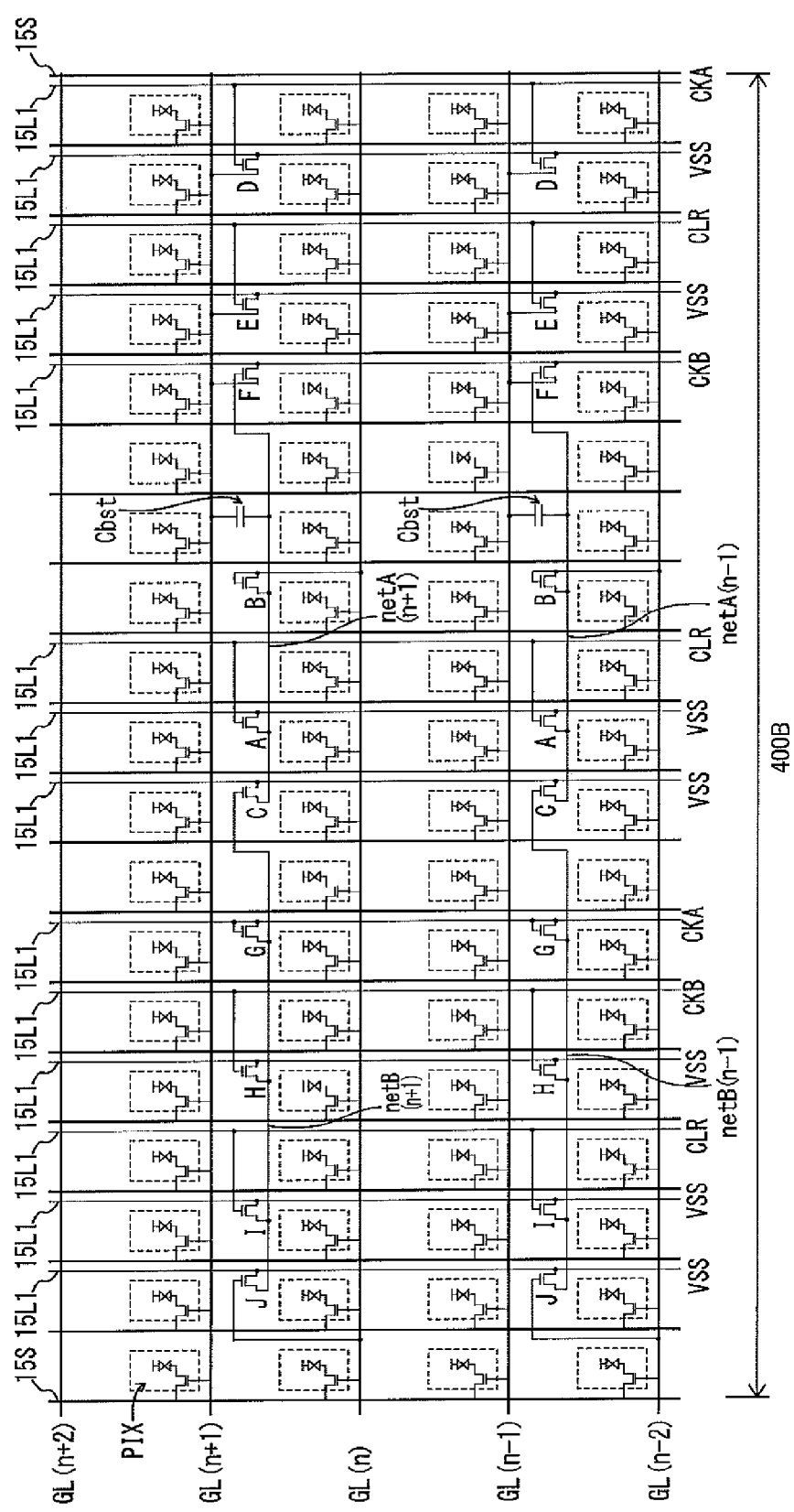

ACTIVE-MATRIX SUBSTRATE, DISPLAY PANEL AND DISPLAY DEVICE INCLUDING THE SAME

TECHNICAL FIELD

The present invention relates to an active-matrix substrate, a display panel and a display device including the same, and, more particularly, to the arrangement of gate drivers.

BACKGROUND ART

Display panels are known where gate drivers are provided along a side of an active-matrix substrate and source drivers are provided along an adjacent side thereof. JP 2004-538511 A discloses a technique to provide, along one side of the pixel element array, a row driving circuit for driving column address conductors for supplying data signals and a column driving circuit for driving row address conductors for supplying row selection signals. Thus, JP 2004-538511 A prevents these driving circuits from limiting the region around the pixel element array on the support body that holds the pixel element array and other components.

DISCLOSURE OF THE INVENTION

When a potential corresponding to a selection or non-selection state of a gate line is supplied to a gate line through one side of the active-matrix substrate that is parallel to the source lines, the potential becomes dull as it goes toward the distal end of the gate line. This requires a design that takes into consideration the position where a potential on a gate line becomes dull. JP 2004-538511 A, mentioned above, provides the gate driver and source driver along one side of the active-matrix substrate to make it possible to reduce the width of the portions of the picture frame region along the other three sides. However, according to JP 2004-538511 A, the distance of routing of the gate lines is greater than in conventional devices, increasing the load on the gate lines. As a result, a potential provided to a gate line becomes dull, making it difficult to drive the gate lines at high speed.

An object of the present invention is to provide a technique to reduce dullness of a potential provided to a line such as a gate line on the active-matrix substrate to enable driving the line at high speed and, at the same time, reduce the width of the picture frame region.

An active-matrix substrate according to a first invention includes: a plurality of data lines; a plurality of lines crossing the plurality of data lines and including at least gate lines; and a driving circuit connected with at least one of the plurality of lines for controlling a potential of this line in response to a control signal supplied from outside a display region that includes pixel regions defined by the data lines and the gate lines, the driving circuit including a plurality of switching elements, at least one of the plurality of switching elements being located in one of the pixel regions.

In a second invention, starting from the first invention, the driving circuit is connected with one of the gate lines and controls the potential of this gate line by applying one of a selection voltage and a non-selection voltage to the gate line in response to the control signal.

A third invention, starting from the first or second invention, further includes: a first terminal located outside the display region for supplying a data signal to one of the plurality of data lines; and a second terminal located outside the display region for supplying the control signal to the driving circuit, the first and second terminals being located outside a side of the display region that is parallel to the gate lines.

A fourth invention further includes: a pixel electrode located in one of the pixel regions of the second or third invention and connected with one of the gate lines and one of the data lines, wherein a shield layer made of transparent conductive film is provided between one of the switching elements of the driving circuit that is located in the pixel region, and the pixel electrode.

A fifth invention further includes a pixel electrode located in one of the pixel regions of the second or third invention and connected with one of the gate lines and one of the data lines, wherein one of the switching elements of the driving circuit that is located in the pixel region is disposed so as not to overlie the pixel electrode.

In a sixth invention, starting from one of the second to fifth inventions, an adjustment line is further provided in a pixel region in which the switching element of the driving circuit is not provided such that this pixel region has an aperture ratio substantially equal to that of a pixel region in which a switching element of the driving circuit is provided.

A seventh invention, starting from one of the third to sixth inventions, further includes: a first insulating layer located between a gate line layer forming the gate lines and a data line layer forming the data lines; a control signal line located in one of the pixel regions and disposed in the data line layer so as to be generally parallel to the data lines for supplying the control signal from the second terminal to the driving circuit; a second insulating layer having a greater thickness than the first insulating layer and provided on top of the data line layer and including a contact hole extending therethrough to the data line layer; and a conductive layer portion provided in the contact hole, wherein the control signal line is interrupted at a location overlying one of the gate lines and portions of the control line on this interruption are connected via the conductive layer portion in the contact hole of the second insulating layer.

An eighth invention, starting from one of the third to sixth inventions, further includes: a control signal line located in one of the pixel regions for supplying the control signal from the second terminal to the driving circuit, wherein at least a portion of the control signal line is disposed to be generally parallel to the data lines and located at generally the same distance from two data lines in the pixel region.

A ninth invention, starting from one of the second to eighth inventions, further includes: a pixel switching element located in one of the pixel regions and connected with one of the data lines and one of the gate lines, wherein the gate line has portions with a width smaller than the maximum width of the gate line, one of these portions being located between the point on the gate line to which a gate terminal of the pixel switching element is connected and the intersection of the data line and the gate line, and the other one of the portions being located near the intersection of a portion of the gate line to which the gate terminal is not connected and the data line.

In a tenth invention, starting from one of the second to ninth inventions, each of the pixel regions corresponds to one of a plurality of colors, and the driving circuit is provided in a pixel region corresponding to one of the plurality of colors.

In an eleventh invention, starting from one of the second to tenth inventions, a pixel region in which a the switching element of the driving circuit is provided has a larger dimension measured in a direction in which the gate lines extend than other pixel regions.

In a twelfth invention, starting from one of the eighth to eleventh inventions, the pixel region includes a pixel electrode connected with one of the gate lines and one of the data lines; and an auxiliary capacitance electrode connected with the pixel electrode, and the invention includes: an auxiliary capacitance line located outside the display region and connected with the auxiliary capacitance electrode for supplying a predetermined potential to the auxiliary capacitance electrode; and a low-impedance line located in the pixel region and connected with the auxiliary capacitance electrode and connected with the auxiliary capacitance line.

In a thirteenth invention, starting from one of the second to twelfth invention, a plurality of driving circuits are provided, each for one of the gate lines.

In a fourteenth invention, starting from one of the second to thirteenth inventions, the display region is divided into a plurality of sub-regions arranged in a direction in which the gate lines are arranged, and a driving circuit provided for a gate line disposed in each of the plurality of sub-regions applies one of a selection voltage and a non-selection voltage to the gate line at a frequency that is specified for the sub-region.

In a fifteenth invention, starting from one of the third to thirteenth inventions, N gate lines (N is a natural number) are provided, M driving circuits (M is a natural number, M≥2), i.e. a first to Mth driving circuits, are provided for each of the gate lines, the M driving circuits provided for the nth gate line (1≤n≤N) apply a selection voltage to the nth gate line in the order beginning with the first driving circuit and ending with the Mth driving circuit, the second one of the M driving circuits to the Mth drive circuit apply the selection voltage to the nth gate line at a time point at which the preceding driving circuit applies the selection voltage to the n+1th gate line, and the first terminal supplies the data line with a data signal for an image to be written to the pixel region defined by the nth gate line and the data line at a time point at which the Mth driving circuit applies the selection voltage to the nth gate line.

In a sixteenth invention, starting from one of the second to thirteenth inventions, the pixel region includes a plurality of sub-pixel regions, the lines include the gate lines and sub-gate lines, one of the sub-pixel regions includes a pixel electrode connected with one of the gate lines and one of the data lines, the other one of the sub-pixel regions includes a pixel electrode connected with one of the sub-gate lines and the data line and a capacitor connected between this pixel electrode and the pixel electrode in the one of the sub-pixel regions, the driving circuit includes a sub-gate line driver located in a pixel region in which the switching element is not provided, and provided for one of the sub-gate lines for applying one of the selection voltage and the non-selection voltage to the sub-gate line in response to the control signal, and the sub-gate line driver applies the selection voltage to the sub-gate line in one horizontal interval after the selection voltage is applied to the gate line.

In a seventeenth invention, starting from one of the second to thirteenth inventions, the pixel region includes a plurality of sub-pixel regions, the lines include the gate lines, sub-gate lines and auxiliary capacitance lines, the plurality of sub-pixel regions each include a pixel electrode connected with one of the gate lines and one of the data lines, one of the sub-pixel regions includes an auxiliary capacitance connected with one of the auxiliary capacitance lines, and a switching element including a gate terminal connected with one of the sub-gate lines, a source terminal connected with the pixel electrode in the one of the sub-pixel regions, and a drain terminal connected with the auxiliary capacitance, the driving circuit includes a sub-gate line driver located in a pixel region in which the switching element is not provided, and provided for one of the sub-gate lines for applying one of the selection voltage and the non-selection voltages to the sub-gate line, and the sub-gate line driver applies the selection voltage to the sub-gate line in response to the control signal after the selection voltage is applied to the gate line.

In an eighteenth invention, starting from one of the second to thirteenth inventions, the pixel region includes a plurality of sub-pixel regions, the lines include the gate lines, first auxiliary capacitance lines and second auxiliary capacitance lines, the plurality of sub-pixel regions each include a pixel electrode connected with one of the gate lines and one of the data lines, one of the sub-pixel regions includes a first auxiliary capacitance connected with the pixel electrode in the one of the sub-pixel region and one of the first auxiliary capacitance lines, the other one of the sub-pixel regions includes a second auxiliary capacitance connected with the pixel electrode in the other one of the sub-pixel regions and one of the second auxiliary capacitance line, the driving circuit includes an auxiliary capacitance line control element provided inside the display region for controlling a potential of the first auxiliary capacitance line and a potential of the second auxiliary capacitance line, and the auxiliary capacitance line control element applies voltages to the first auxiliary capacitance line and the second auxiliary capacitance line such that the potential of the first auxiliary capacitance line and the potential of the second auxiliary capacitance line have opposite phases after the selection voltage is applied to the gate line.

In a nineteenth invention, starting from one of the second to thirteenth inventions, the lines include the gate lines and auxiliary capacitance lines, the pixel region includes a pixel electrode connected with one of the gate lines and one of the data lines and an auxiliary capacitance connected with the pixel electrode and one of the auxiliary capacitance lines, the driving circuit includes auxiliary capacitance line drivers each provided for one of the auxiliary capacitance lines, and the auxiliary capacitance line driver applies a voltage with the same polarity as the voltage on the data line to the auxiliary capacitance line in response to the control signal.

In a twentieth invention, starting from one of the second to ninth inventions, the driving circuit is provided in each of K regions (K is a natural number, K≥2) arranged in a direction in which the gate lines of the display region extend, each driving circuit being provided for every K gate lines, driving circuits being provided on different gate lines in different regions.

In a twenty-first invention, starting from the twentieth invention, the pixel region corresponds to one of a plurality of colors, and the driving circuit is provided in a pixel region corresponding to one of the plurality of colors.

In a twenty-second invention, starting from the twenty-first invention, a pixel region in which a switching element of the driving circuit is provided has a larger dimension measured in a direction in which at least one of the gate line and the data line extends than other pixel regions.

In a twenty-third invention, starting from one of the second to thirteenth inventions, the lines include the gate lines and common electrode lines, the pixel region includes a pixel electrode connected with one of the gate lines and one of the data lines and an auxiliary capacitance connected with the pixel electrode and one of the common electrode lines, the driving circuit includes common electrode drivers each located in a pixel region in which the switching element is not provided, and provided for one of the common electrode lines, and the common electrode driver applies to the common electrode line a voltage with a polarity opposite that of the potential of the data line in response to the control signal.

In a twenty-fourth invention, starting from one of the first to fourth inventions, the lines include the gate lines and light-emission control lines, the pixel region includes a light-emitting element, an electric circuit connected with one of the data lines and one of the gate lines, and a light-emission control switching element having a gate terminal connected with one of the light-emission control lines, a source terminal connected with the electric circuit, and a drain terminal connected with the light-emitting element, the driving circuit includes light-emission control line drivers each provided for one of the light-emission control lines for controlling a potential of the light-emission control line in response to the control signal.

A display panel according to a twenty-fifth invention includes: the active-matrix substrate of one of the first to twenty-second inventions; a counter-substrate having a color filters and a counter-substrate; and a liquid crystal layer sandwiched between the active-matrix substrate and the counter-substrate.

A twenty-sixth invention includes: the active-matrix substrate of the twenty-third invention; a counter-substrate having a color filter; and a liquid crystal layer sandwiched between the active-matrix substrate and the counter-substrate.

In a twenty-seventh invention, at least one element of the driving circuit is provided on the active-matrix substrate of the twenty-fifth or twenty sixth invention in a dark-line region that is produced depending on orientation in the liquid crystal layer within the pixel region.

A display device according to a twenty-eighth invention includes: the display panel of one of the twenty-fifth to twenty-seventh inventions; and a housing containing the display panel, the housing including a first cover portion located to overlie a portion of a picture frame region of the display panel and a portion of the display region and having a lens with a viewer's side that is curved in shape, and a second cover portion covering at least a side of the display panel.

The arrangements of the present invention reduce dullness of a potential provided to a line on the active-matrix substrate to enable driving the lines at high speed.

BRIEF DESCRIPTION OF THE DRAWINGS

FIG. 44A is a schematic diagram of pixel regions in which gate drivers and CS drivers are provided of the thirteenth embodiment.

FIG. 64A illustrates an example of a pattern of polarities where noise is produced by a parasitic capacitance between a netA and a source line.

FIG. 64B illustrates an example of a pattern of polarities where noise is produced by a parasitic capacitance between a netA and a source line.

FIG. 64C illustrates an example of a pattern of polarities where noise is produced by a parasitic capacitance between a netA and a source line.

FIG. 73B shows an equivalent circuit of gate drivers 11y shown in FIG. 72.

Figure 78A:
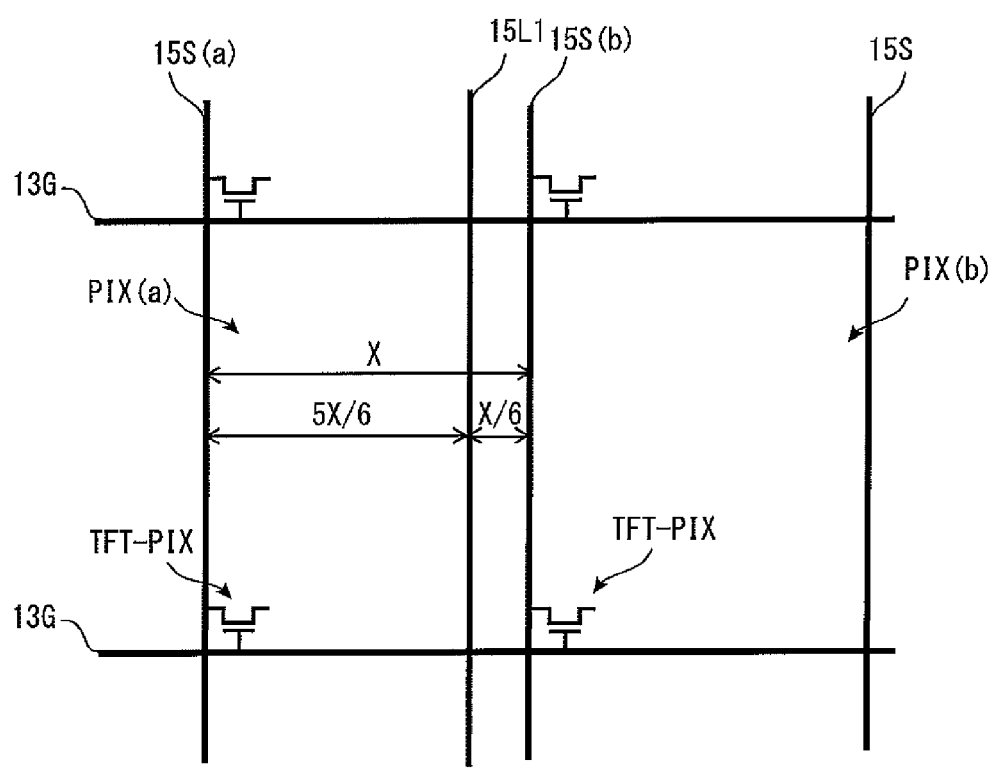
FIG. 78A illustrates an example of a pixel of Variation 14.
Figure 78B:
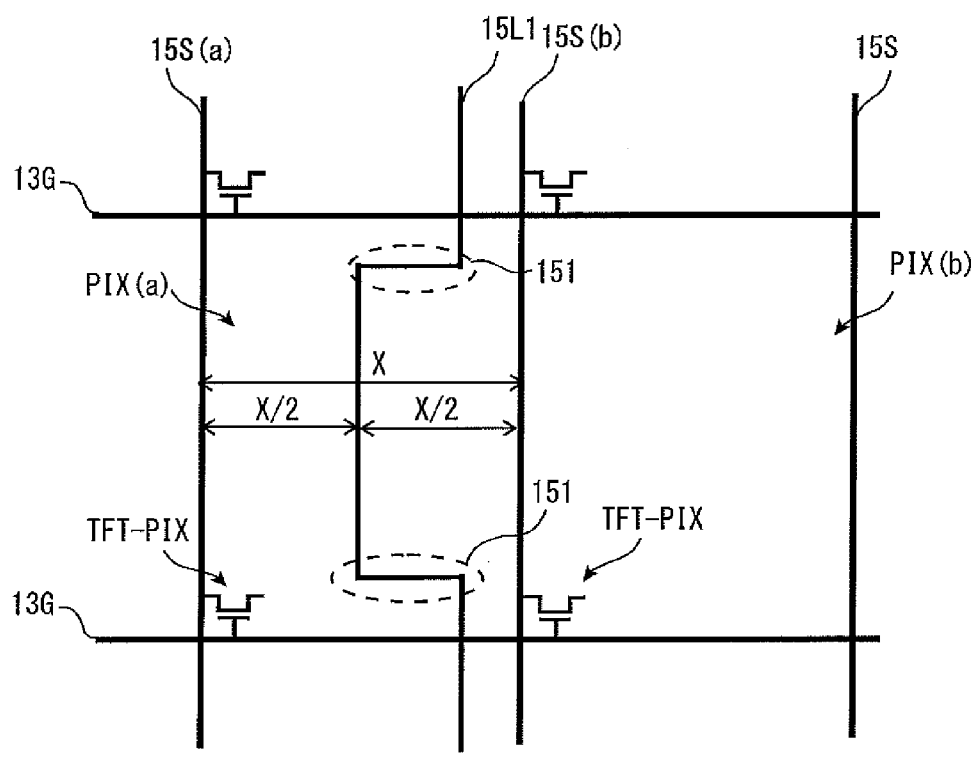
FIG. 78B schematically illustrates an implementation in which a line 15L1 of Variation 14 is disposed.
Figure 78C:
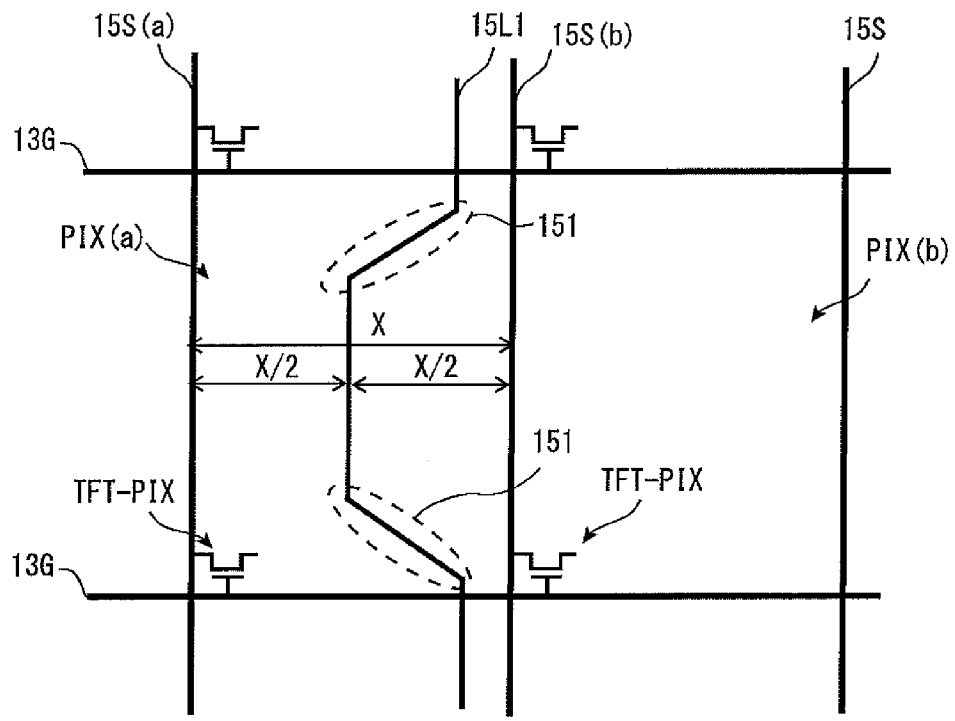

FIG. 78C schematically illustrates an implementation in which a line 15L1 of Variation 14 is disposed.

Figure 79A:
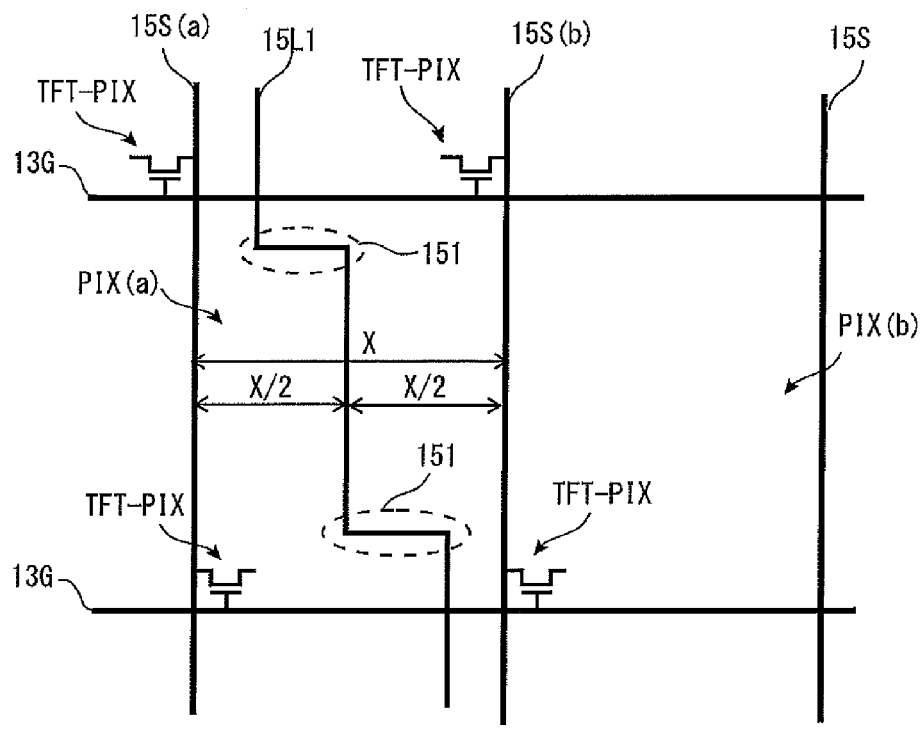

FIG. 79A schematically illustrates an implementation in which a line 15L1 of Variation 14 is disposed.

Figure 79B:
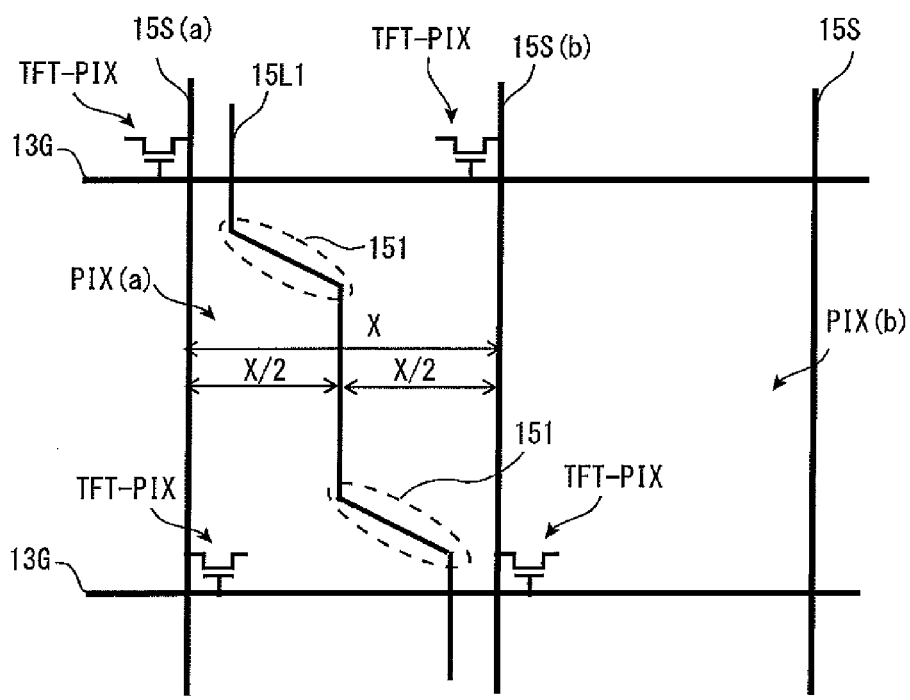

FIG. 79B schematically illustrates an implementation in which a line 15L1 of Variation 14 is disposed.

Figure 80:
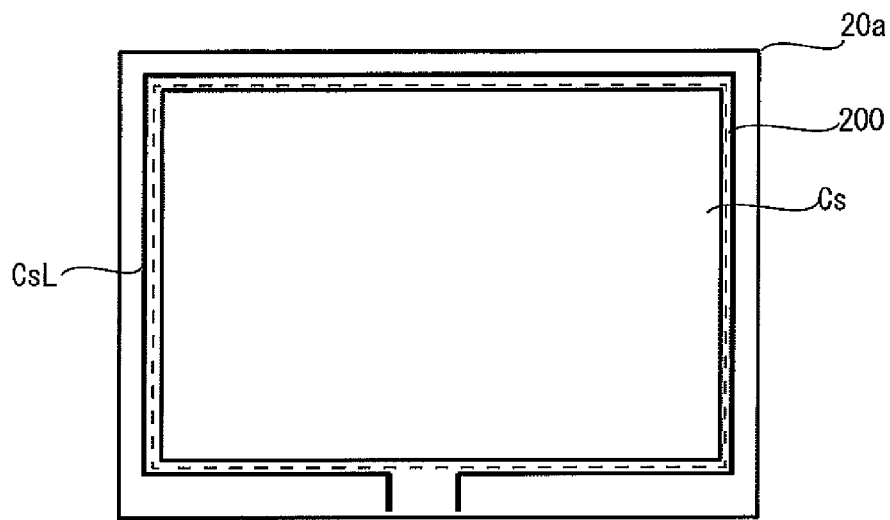

FIG. 80 is a schematic view of auxiliary capacitance electrodes and an auxiliary capacitance line according to Variation 15.

Figure 81A:
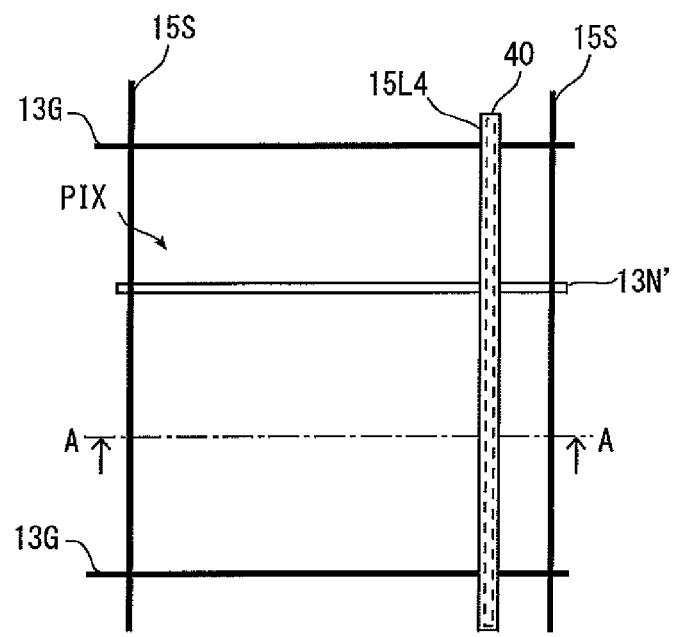

FIG. 81A is a schematic diagram of a pixel according to Example Arrangement 1 of Variation 15.

Figure 81B:
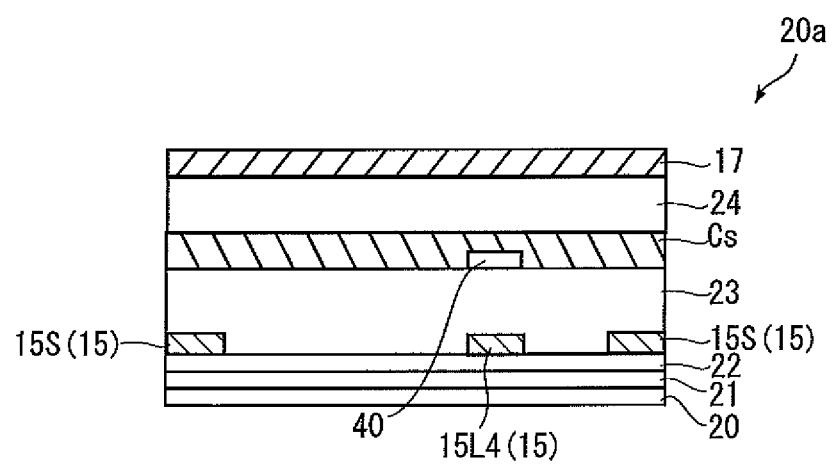

FIG. 81B is a cross-sectional view of the pixel PIX of FIG. 81A taken along line A-A.

Figure 82A:
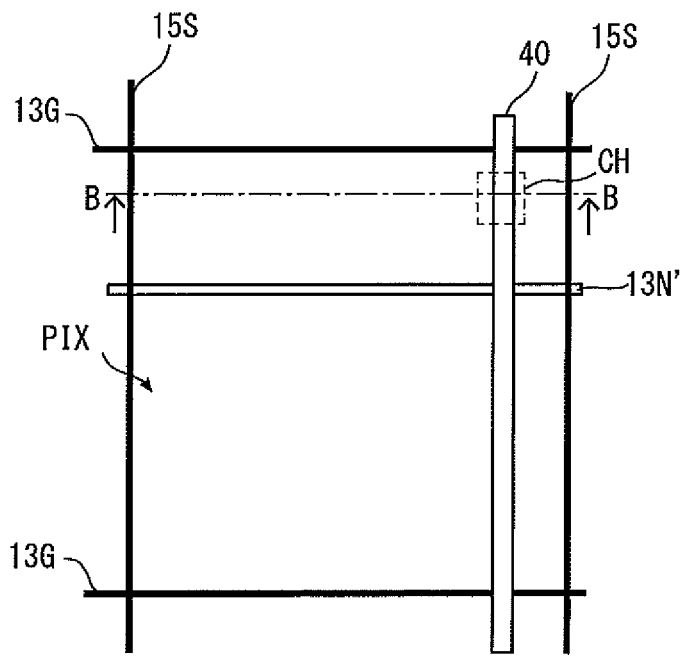

FIG. 82A is a schematic diagram of a pixel according to Example Arrangement 2 of Variation 15.

Figure 82B:
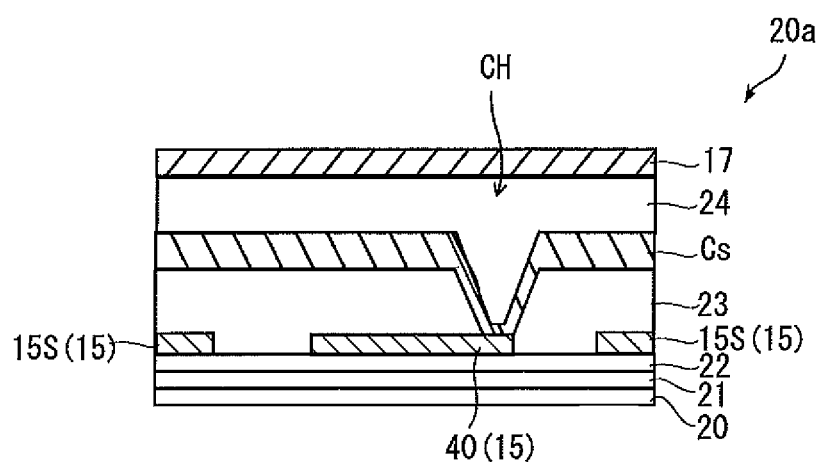

FIG. 82B is a cross-sectional view of the pixel PIX of FIG. 82A taken along line B-B.

Figure 83A:
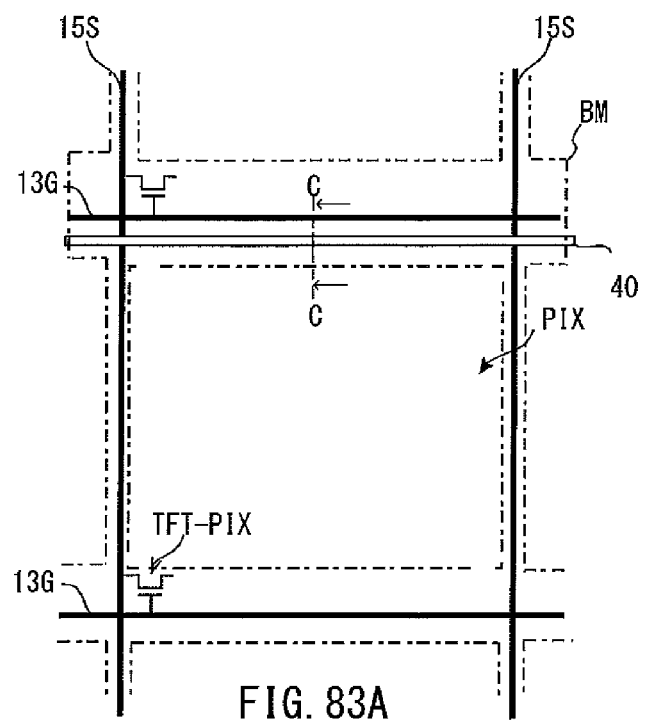

FIG. 83A is a schematic diagram of a pixel according to Example Arrangement 3 of Variation 15.

Figure 83B:
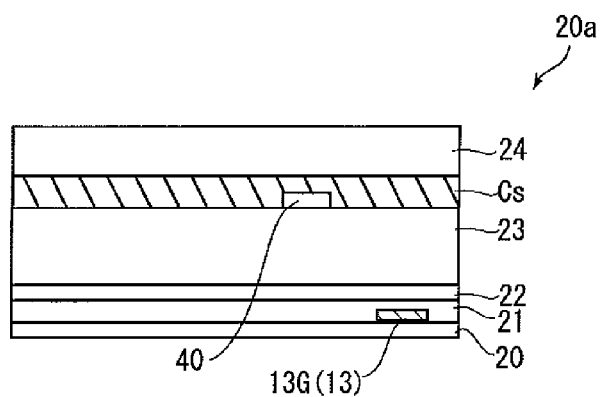

FIG. 83B is a cross-sectional view of the pixel PIX of FIG. 83A taken along line C-C.

Figure 83C:
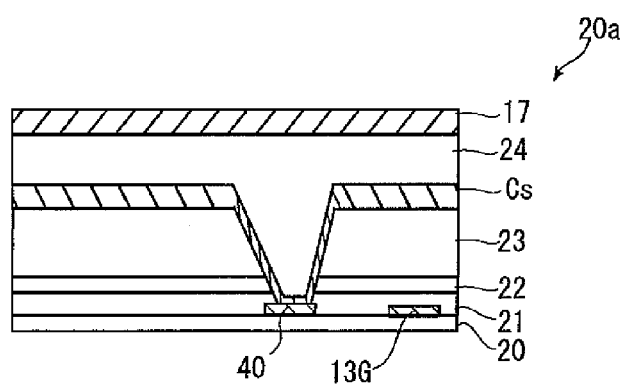

FIG. 83C is a cross-sectional view of the pixel PIX of FIG. 83A taken along line C-C.

EMBODIMENTS FOR CARRYING OUT THE INVENTION

An active-matrix substrate according to an embodiment of the present invention includes: a plurality of data lines; a plurality of lines crossing the plurality of data lines and including at least gate lines; and a driving circuit connected with at least one of the plurality of lines for controlling a potential of this line in response to a control signal supplied from outside a display region that includes pixel regions defined by the data lines and the gate lines, the driving circuit including a plurality of switching elements, at least one of the plurality of switching elements being located in one of the pixel regions (first arrangement).

In the first arrangement, the line to which the driving circuit is connected may be a gate line or a line of another kind. The potential of at least one of the lines crossing the data lines is controlled by the driving circuit in response to a control signal supplied from outside the display region. At least one of the switching elements constituting a part of the driving circuit is located inside a pixel region. Thus, compared with implementations where the potential of a line is controlled by an element at one end of the line, the present arrangement reduces dullness of a potential at the distal end of a line, thereby driving the line at high speed. Further, since at least one switching element of the driving circuit is located inside a pixel region, the picture frame width may be made smaller than in implementations where all the switching elements of the driving circuit are located outside the region of pixels.

In a second arrangement, starting from the first arrangement, the driving circuit is connected with one of the gate lines and controls the potential of this gate line by applying one of a selection voltage and a non-selection voltage to the gate line in response to the control signal.

In the second arrangement, one of a selection voltage and a non-selection voltage is applied to a gate line by a driving circuit having at least one switching element located inside a pixel region. This reduces dullness of a potential of a gate line near its end, enabling switching the gate line between a selection state and a non-selection state at high speed. Further, at least one of the switching elements of the driving circuit that controls the potential of a gate line is located inside a pixel region, the picture frame width may be made smaller than in implementations where the driving circuit is located outside the region of pixels.

A third arrangement, starting from the first or second arrangement, further includes: a first terminal located outside the display region for supplying a data signal to one of the plurality of data lines; and a second terminal located outside the display region for supplying the control signal to the driving circuit, the first and second terminals being located outside a side of the display region that is parallel to the gate lines.

In the third arrangement, a first terminal and a second terminal are provided outside a side of the display region that is parallel to the gate lines. Thus, a data signal and a control signal can be supplied to a data line and the driving circuit, respectively, in the display region from outside a side of the display region that is parallel to the gate lines, making it possible to reduce the width of the portions of the picture frame along the other sides of the display region.

A fourth arrangement further includes: a pixel electrode located in one of the pixel regions of the second or third arrangement and connected with one of the gate lines and one of the data lines, wherein a shield layer made of transparent conductive film is provided between one of the switching elements of the driving circuit that is located in the pixel region, and the pixel electrode. The fourth arrangement reduces interference between the pixel electrode provided in a pixel region and a switching element of the driving circuit.

A fifth arrangement further includes a pixel electrode located in one of the pixel regions of the second or third arrangement and connected with one of the gate lines and one of the data lines, wherein one of the switching elements of the driving circuit that is located in the pixel region is disposed so as not to overlie the pixel electrode. The fifth arrangement reduces interference between the pixel electrode provided in a pixel region and the switching element of the driving circuit.

In a sixth arrangement, starting from one of the second to fifth arrangements, an adjustment line is further provided in a pixel region in which the switching element of the driving circuit is not provided such that this pixel region has an aperture ratio substantially equal to that of a pixel region in which a switching element of the driving circuit is provided. The sixth arrangement reduces the difference between the aperture ratio of the pixel regions with switching elements of driving circuits and the aperture ratio of the pixel regions without such switching elements. This reduces luminance unevenness caused by the different between the aperture ratio of the pixel regions with switching elements of driving circuits and the aperture ratio of the pixel regions without such switching elements.

A seventh arrangement, starting from one of the third to sixth arrangements, further includes: a first insulating layer located between a gate line layer forming the gate lines and a data line layer forming the data lines; a control signal line located in one of the pixel regions and disposed in the data line layer so as to be generally parallel to the data lines for supplying the control signal from the second terminal to the driving circuit; a second insulating layer having a greater thickness than the first insulating layer and provided on top of the data line layer and including a contact hole extending therethrough to the data line layer; and a conductive layer portion provided in the contact hole, wherein the control signal line is interrupted at a location overlying one of the gate lines and portions of the control line on this interruption are connected via the conductive layer portion in the contact hole of the second insulating layer.

In the seventh arrangement, a second insulating layer having a greater thickness than the first insulating layer is provided on top of the data line layer forming the control signal lines. The control signal line is interrupted at a position where it overlies a gate line, with the first insulating layer being present in between, and the line portions across the interruption are connected via a conductive layer portion in a contact hole provided in the second insulating layer. If a control signal line is provided above the gate lines, with the first insulating layer being present in between, then, a parasitic capacitance between a gate line and a control signal line may cause a delay or disturbance in a control signal. In the present arrangement, the control signal line is not present at locations that overlie the gate lines, and the portions of the control signal line on the interruption are connected via a contact hole provided in the second insulating layer. Thus, a control signal line is more distant from the gate line than in implementations where a control signal line is located to overlie the gate line, thereby reducing the likelihood that a delay or disturbance occurs in a control signal caused by a parasitic capacitance between the gate line and control signal line.

An eighth arrangement, starting from one of the third to sixth arrangements, further includes: a control signal line located in one of the pixel regions for supplying the control signal from the second terminal to the driving circuit, wherein at least a portion of the control signal line is disposed to be generally parallel to the data lines and located at generally the same distance from two data lines in the pixel region. In the eighth arrangement, at least a portion of the control signal line located in the pixel region is disposed to be generally parallel to the data lines at a position where it is located at generally the same distance from the two data lines in the pixel region. This reduces noise produced in a data line by the control signal line compared with implementations where a control signal line is disposed close to a data line.

A ninth arrangement, starting from one of the second to eighth arrangements, further includes: a pixel switching element located in one of the pixel regions and connected with one of the data lines and one of the gate lines, wherein the gate line has portions with a width smaller than the maximum width of the gate line, one of these portions being located between the point on the gate line to which a gate terminal of the pixel switching element is connected and the intersection of the data line and the gate line, and the other one of the portions being located near the intersection of a portion of the gate line to which the gate terminal is not connected and the gate line.

In the ninth arrangement, the gate line has portions with a width smaller than the maximum width of the gate line, one of these portions being located between its connection with the gate terminal of the pixel switching element and its intersection with the data line, and the other one of the portions being located near the intersection of a portion of the gate line to which the gate terminal is not connected and the data line. Thus, the portion of the gate line that has a smaller width than the maximum width can be broken more easily than other portions. When there is a short circuit near the intersection of a gate line and a data line, the portion of the gate line with a smaller width than the maximum width may be broken to cut off the short-circuited portion, thereby allowing the data line and the pixel switching element to continue to function.

In a tenth arrangement, starting from one of the second to ninth arrangements, each of the pixel regions corresponds to one of a plurality of colors, and the driving circuit is provided in a pixel region corresponding to one of the plurality of colors. In the tenth arrangement, a pixel region corresponds to one of a plurality of colors. The switching element of a driving circuit is provided in a pixel region corresponding to one of the colors. When a color filter is placed on the counter-substrate, pixel regions are positioned in the locations that correspond to the color filters of one color. For example, positioning the switching element of a drive circuit in a pixel region that corresponds to a color that is less susceptible to luminance will reduce color irregularity or the like caused by the difference between the aperture ratio of a pixel region with a switching element and that of other pixel regions.

In an eleventh arrangement, a pixel region in which a switching element of the driving circuit of one of the second to tenth arrangements is provided has a larger dimension measured in a direction in which the gate lines extend than other pixel regions. In the eleventh arrangement, the aperture ratio of a pixel region with a switching element of a driving circuit and that for other pixel regions are substantially the same such that the luminance for the entire display screen is uniform.

In a twelfth arrangement, the pixel region of one of the eighth to eleventh arrangements includes a pixel electrode connected with one of the gate lines and one of the data lines; and an auxiliary capacitance electrode connected with the pixel electrode, and the arrangement includes: an auxiliary capacitance line located outside the display region and connected with the auxiliary capacitance electrode for supplying a predetermined potential to the auxiliary capacitance electrode; and a low-impedance line located in the pixel region and connected with the auxiliary capacitance electrode and connected with the auxiliary capacitance line. The twelfth arrangement includes a low-impedance line connected with an auxiliary capacitance line connected, outside the display region, with an auxiliary capacitance electrode connected with a pixel electrode, and connected with the auxiliary capacitance electrode in the pixel region. Thus, even when the auxiliary capacitance electrode in the pixel region is affected by noise from a control signal line disposed in a pixel region and the potential of the auxiliary capacitance line becomes different from a predetermined level of potential supplied by the auxiliary capacitance line, the low-impedance line may be used to return the potential to the predetermined level.

In a thirteenth arrangement, starting from the second or third arrangement, a plurality of driving circuits are provided, each for one of the gate lines. In the thirteenth arrangement, a plurality of driving circuits are provided, each for one of the gate lines. Thus, the gate line may be switched to a selection state at a higher speed than in implementations where a single driving circuit is provided for one gate line.

In a fourteenth arrangement, starting from one of the second to thirteenth arrangements, the display region is divided into a plurality of sub-regions arranged in a direction in which the gate lines are arranged, and a driving circuit provided for a gate line disposed in each of the plurality of sub-regions applies a selection voltage to the gate line at a frequency that is specified for the sub-region.

In the fourteenth arrangement, the driving circuits apply selection voltages to the gate lines at different frequencies for different sub-regions. Thus, a selection voltage may be applied to a gate line in a sub-region depending on an image displayed in this sub-region.

In a fifteenth arrangement, starting from one of the third to thirteenth arrangements, N gate lines (N is a natural number) are provided, M driving circuits (M is a natural number, M≥2), i.e. a first to Mth driving circuits, are provided for each of the gate lines, the M driving circuits provided for the nth gate line (1≤n≤N) apply a selection voltage to the nth gate line in the order beginning with the first driving circuit and ending with the Mth driving circuit, the second one of the M driving circuits to the Mth drive circuit apply the selection voltage to the nth gate line at a time point at which the preceding driving circuit applies the selection voltage to the n+1th gate line, and the first terminal supplies the data line with a data signal for an image to be written to the pixel region defined by the nth gate line and the data line at a time point at which the Mth driving circuit applies the selection voltage to the nth gate line.

In the fifteenth arrangement, M driving circuits are provided for each gate line, and they apply a selection voltage to a gate line in the order beginning with the first driving circuit and ending with the Mth driving circuit. The second to Mth driving circuits apply a selection voltage to the nth gate line at a time point at which the preceding drive circuit applies a selection voltage to the n+1 gate line. The data lines crossing the nth gate line are supplied with a data signal at a time point at which a selection voltage is applied to the nth gate line. That is, the nth gate line is switched to a selection state M times by the M driving circuits. Thus, the nth gate line may be pre-charged before the data lines crossing the nth gate line receive a data signal such that data is written at a higher speed.

In a sixteenth arrangement, starting from one of the second to thirteenth arrangements, the pixel region includes a plurality of sub-pixel regions, the lines include the gate lines and sub-gate lines, one of the sub-pixel regions includes a pixel electrode connected with one of the gate lines and one of the data lines, the other one of the sub-pixel regions includes a pixel electrode connected with one of the sub-gate lines and the data line and a capacitor connected between this pixel electrode and the pixel electrode in the one of the sub-pixel regions, the driving circuit includes a sub-gate line driver located in a pixel region in which the switching element is not provided, and provided for one of the sub-gate lines for applying one of the selection voltage and the non-selection voltage to the sub-gate line in response to the control signal, and the sub-gate line driver applies the selection voltage to the sub-gate line in one horizontal interval after the selection voltage is applied to the gate line.

In the sixteenth arrangement, when the selection voltage is applied to the gate line in one horizontal interval, a voltage depending on a data signal supplied to the source line is applied to the pixel electrode in the one sub-pixel region. When the non-selection voltage is applied to the gate line, the potential of the one sub-pixel region is in a floating state. Then, a selection voltage is applied by the sub-gate line driver to the sub-gate line, and a voltage depending on the data signal is applied to the pixel electrode in the other sub-pixel region. This amplifies the potential of one of the sub-pixel regions through a capacitor. As a result, one sub-pixel region has a higher luminance in display than the other sub-pixel region. Further, the sub-gate line driver is provided in the pixel region, reducing the picture frame width than implementations where a sub-gate line driver is provided outside the display region.

In a seventeenth arrangement, starting from one of the second to thirteenth arrangements, the pixel region includes a plurality of sub-pixel regions, the lines include the gate lines, sub-gate lines and auxiliary capacitance lines, the plurality of sub-pixel regions each include a pixel electrode connected with one of the gate lines and one of the data lines, one of the sub-pixel regions includes an auxiliary capacitance connected with one of the auxiliary capacitance lines, and a switching element including a gate terminal connected with one of the sub-gate lines, a source terminal connected with the pixel electrode in the one of the sub-pixel regions, and a drain terminal connected with the auxiliary capacitance, the driving circuit includes a sub-gate line driver located in a pixel region in which the switching element is not provided, and provided for one of the sub-gate lines for applying one of the selection voltage and the non-selection voltages to the sub-gate line, and the sub-gate line driver applies the selection voltage to the sub-gate line in response to the control signal after the selection voltage is applied to the gate line.

In the seventeenth arrangement, when the selection voltage is applied to the gate line, the voltage depending on the data signal supplied to the data line is applied to the pixel electrode in each of the sub-pixel regions. When the selection voltage is applied by the sub-gate line driver to the sub-gate line after the selection voltage is applied to the gate line, the charge in the auxiliary capacitance in one of the sub-pixel region is re-distributed among the pixel electrodes via the switching element. Thus, the other one of the sub-pixel regions has a pixel potential depending on the voltage of the data signal, and the one of the sub-pixel regions goes to the pixel potential that depends on the voltage of the data signal and then the potential increases or decreases depending on the potential of the auxiliary capacitance line. This allows an image to be displayed with different pixel potentials in the one and the other one of the sub-pixel regions, and thus with different levels of luminance within one pixel region. Further, since the sub-gate line driver is provided inside a pixel region, the picture frame width may be reduced compared with that in implementations where a sub-gate line driver is provided outside the display region.

In an eighteenth arrangement, starting from one of the second to thirteenth arrangements, the pixel region includes a plurality of sub-pixel regions, the lines include the gate lines, first auxiliary capacitance lines and second auxiliary capacitance lines, the plurality of sub-pixel regions each include a pixel electrode connected with one of the gate lines and one of the data lines, one of the sub-pixel regions includes a first auxiliary capacitance connected with the pixel electrode in the one of the sub-pixel region and one of the first auxiliary capacitance lines, the other one of the sub-pixel regions includes a second auxiliary capacitance connected with the pixel electrode in the other one of the sub-pixel regions and one of the second auxiliary capacitance line, the driving circuit includes an auxiliary capacitance line control element provided inside the display region for controlling a potential of the first auxiliary capacitance line and a potential of the second auxiliary capacitance line, and the auxiliary capacitance line control element applies voltages to the first auxiliary capacitance line and the second auxiliary capacitance line such that the potential of the first auxiliary capacitance line and the potential of the second auxiliary capacitance line have opposite phases after the selection voltage is applied to the gate line.

In the eighteenth arrangement, voltages are applied to the first and second auxiliary capacitance lines such that the potentials of the first and second auxiliary capacitance lines are made to have opposite phases by the auxiliary capacitance control element after one horizontal interval of the gate lines ends. In one horizontal interval of the gate lines, the potential of the data lines is applied to the pixel electrode of one sub-pixel region and the pixel electrode of the other sub-pixel region. After the selection voltage is applied to the gate line, the charges held in the first and second auxiliary capacitances increase or decrease depending on the potentials of the first and second auxiliary capacitance lines. Thus, one sub-pixel region may have a higher pixel potential than the other sub-pixel region and thus can display an image at a higher luminance than the other sub-pixel region. Further, since the auxiliary capacitance control element is provided inside the region of pixels, the picture frame width may be reduced compared with that in implementations where an auxiliary capacitance control element is provided outside the display region.

In a nineteenth arrangement, starting from one of the second to thirteenth arrangements, the lines include the gate lines and auxiliary capacitance lines, the pixel region includes a pixel electrode connected with one of the gate lines and one of the data lines and an auxiliary capacitance connected with the pixel electrode and one of the auxiliary capacitance lines, the driving circuit includes auxiliary capacitance line drivers each provided for one of the auxiliary capacitance lines, and the auxiliary capacitance line driver applies a voltage with the same polarity as the voltage on the data line to the auxiliary capacitance line in response to the control signal.

In the nineteenth arrangement, the auxiliary capacitance line driver applies to the auxiliary capacitance line a voltage with the same polarity as that for the data line. The potential of the pixel electrode changes through the auxiliary capacitance depending on the potential of the auxiliary capacitance line. Accordingly, when the data line has a positive potential, a positive voltage is applied to the auxiliary capacitance line. Then, the pixel electrode has a potential that depends on the data line, and the potential increases through the auxiliary potential. This reduces the amplitude of the data signal applied to the pixel electrode compared with implementations without the present arrangement, thereby reducing power consumption. Further, since the auxiliary capacitance line driver is provided inside the region of pixels, the picture frame width may be made smaller than in implementation where an auxiliary capacitance line driver is provided outside the display region.

In a twentieth arrangement, starting from one of the second to ninth arrangements, the driving circuit is provided in each of K regions (K is a natural number, K≥2) arranged in a direction in which the gate lines of the display region extend, each driving circuit being provided for every K gate lines, driving circuits being provided on different gate lines in different regions. In the twentieth arrangement, a driving circuit is provided in each of K regions arranged in a direction in which the gate lines extend in the display region, each driving circuit being provided for every K gate lines. Driving circuits are provided on different gate lines in different regions. Thus, within one region, the number of pixel regions without a driving circuit is larger than in implementations where a driving circuit is provided for every gate line, thereby improving the aperture ratio.

In a twenty-first arrangement, starting from the twentieth arrangement, the pixel region corresponds to one of a plurality of colors, and the driving circuit is provided in the pixel region corresponding to one of the plurality of colors. In the twenty-first arrangement, the switching element of a driving circuit is provided in the pixel region for one particular color. Thus, for example, positioning the switching element of a drive circuit in a pixel region that corresponds to a color that is less susceptible to luminance will reduce color irregularity or the like caused by the difference between the aperture ratio of a pixel region with a switching element and that of other pixel regions.

In a twenty-second arrangement, starting from the twenty-first arrangement, a pixel region in which a switching element of the driving circuit is provided has a larger dimension measured in a direction in which at least one of the gate line and the data line extend than other pixel regions. In the twenty-second arrangement, a pixel region in which a switching element of the driving circuit is provided has a larger dimension measured in a direction in which at least one of the gate line and the data line extends than other pixel regions. This reduces the decrease in the aperture ratio of a pixel region with a switching element of a driving circuit such that the aperture ratio in the display region is uniform.

In a twenty-third arrangement, starting from one of the second to thirteenth arrangements, the lines include the gate lines and common electrode lines, the pixel region includes a pixel electrode connected with one of the gate lines and one of the data lines and an auxiliary capacitance connected with the pixel electrode and one of the common electrode lines, the driving circuit includes common electrode drivers each located in a pixel region in which the switching element is not provided, and provided for one of the common electrode lines, and the common electrode driver applies to the common electrode line a voltage with a polarity opposite that of the potential of the data line in response to the control signal.

In the twenty-third arrangement, a voltage with a polarity opposite that of the potential of the data lines is applied by the common electrode driver to a common electrode line. The potential of a pixel electrode changes through an auxiliary capacitance depending on the potential of the common electrode line. Since the potentials of the data lines and the common electrode lines have opposite polarities, the amplitude of a data signal supplied to the data line may be reduced, thereby reducing power consumption. Further, since the common electrode driver is provided inside the region of pixels, the picture frame width may be made smaller than in implementation where a common electrode driver is provided outside the display region.

In a twenty-fourth arrangement, starting from one of the first to fourth arrangements, the lines include the gate lines and light-emission control lines, the pixel region includes a light-emitting element, an electric circuit connected with one of the data lines and one of the gate lines, and a light-emission control switching element having a gate terminal connected with one of the light-emission control lines, a source terminal connected with the electric circuit, and a drain terminal connected with the light-emitting element, the driving circuit includes light-emission control line drivers each provided for one of the light-emission control lines for controlling a potential of the light-emission control line in response to the control signal.

In the twenty-fourth arrangement, the light-emission control line driver controls the potential of the light-emission control line. The light-emission control switching element has a gate terminal connected with a light-emission control line and is connected between the light-emitting element and the electric circuit. This enables switching the connection of the light-emitting element and electric circuit depending on the potential of the light-emission control line, thereby controlling light emission.

A display panel according to an embodiment of the present invention includes: the active-matrix substrate of one of the first to twenty-second arrangements; a counter-substrate having a color filter and a counter-electrode; and a liquid crystal layer sandwiched between the active-matrix substrate and the counter-substrate (twenty-fifth arrangement).

A display panel according to an embodiment of the present invention includes: the active-matrix substrate of the twenty-third arrangement; a counter-substrate having a color filter; and a liquid crystal layer sandwiched between the active-matrix substrate and the counter-substrate (twenty-sixth arrangement).

In the twenty-fifth or twenty sixth arrangement, at least one of the driving circuits is provided inside the region of pixels, reducing dullness of a signal in a signal line compared with implementations where a signal is input at one end of the signal line, allowing an image to be displayed appropriately.

In a twenty-seventh arrangement, at least one element of the driving circuit is provided on the active-matrix substrate of the display panel of the twenty-fifth or twenty sixth arrangement in a dark-line region that is produced depending on orientation in the liquid crystal layer within the pixel region. Light transmission is smaller in a dark-line region produced depending on the orientation in the liquid crystal layer of the pixel region. The twenty-seventh arrangement provides a driving circuit in a dark-line region, thereby reducing the decrease in the light transmission caused by driving circuits provided in the pixel region.

A display device according to an embodiment of the present invention includes: the display panel of one of the twenty-fifth to twenty-seventh arrangements; and a housing containing the display panel, the housing including a first cover portion located to overlie a portion of a picture frame region of the display panel and a portion of the display region and having a lens with a viewer's side that is curved in shape, and a second cover portion covering at least a side of the display panel (twenty-eighth arrangement). In the twenty-eighth arrangement, the lens located to overlie the picture frame region of the display panel causes light emitted from the display surface to be refracted before advancing toward the viewer such that the picture frame region is unlikely to be visible to the viewer.

Embodiments of the present invention will be described below in detail with reference to the drawings. The same or corresponding components in the drawings are labeled with the same reference numerals and their description will not be repeated.

First Embodiment (Construction of Liquid Crystal Display Device)

Figure 1:
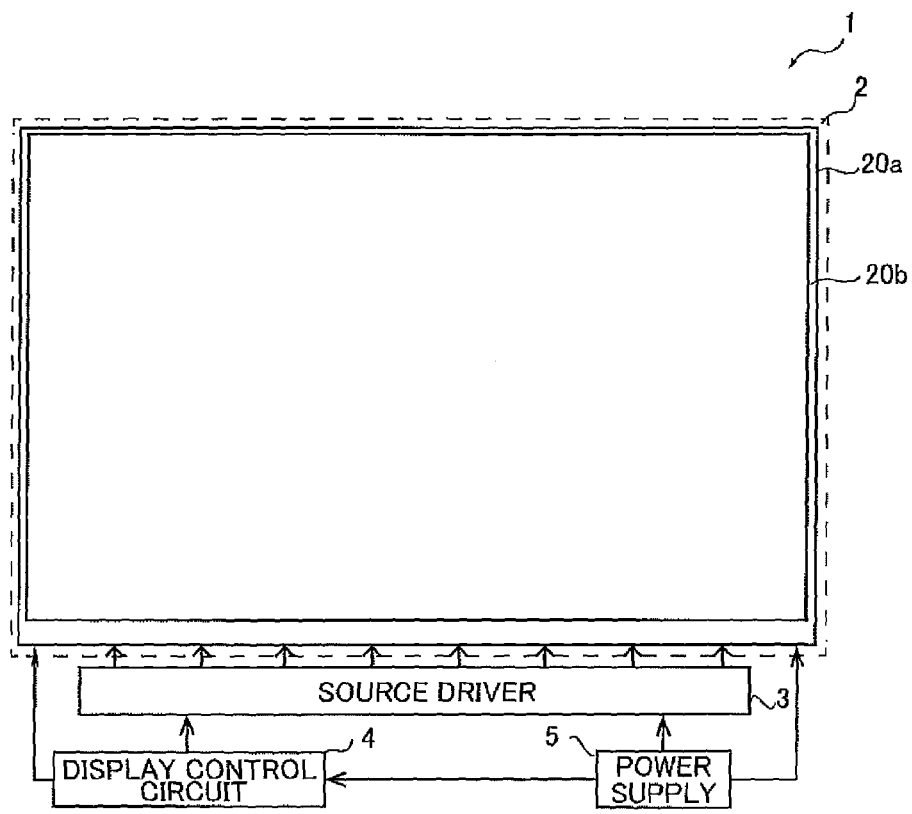
FIG. 1 is a schematic view of a liquid crystal display device according to a first embodiment.

FIG. 1 is a schematic plan view of a liquid crystal display device according to the present embodiment. The liquid crystal display device 1 includes a display panel 2, a source device 3, a display control circuit 4, and a power supply 5. The display panel 2 includes an active-matrix substrate 20a, a counter-substrate 20b, and a liquid crystal layer (not shown) sandwiched between these substrates. Although not shown in FIG. 1, a polarizer is provided on the lower side of the active-matrix substrate 20a and another polarizer is provided on the upper side of the counter-substrate 20b. On the counter-substrate 20b are provided: a black matrix, red (R), green (G) and blue (B) color filters, and a common electrode (all not shown).

As shown in FIG. 1, the active-matrix substrate 20a is electrically connected with the source driver 3, which is provided on a flexible substrate. The display control circuit 4 is electrically connected with the display panel 2, source driver 3 and power supply 5. The display control circuit 4 provides control signals to the source driver 3 and driving circuits, described below, provided on the active-matrix substrate 20a (hereinafter referred to as gate drivers). Examples of control signals include reset signals (CLR) for displaying an image on the display panel 2, clock signals (CKA, CKB) and data signals. The power supply 5 is electrically connected with the display panel 2, source driver 3 and display control circuit 4 for supplying power supply voltage signals thereto.

(Construction of Active-Matrix Substrate)

Figure 2:
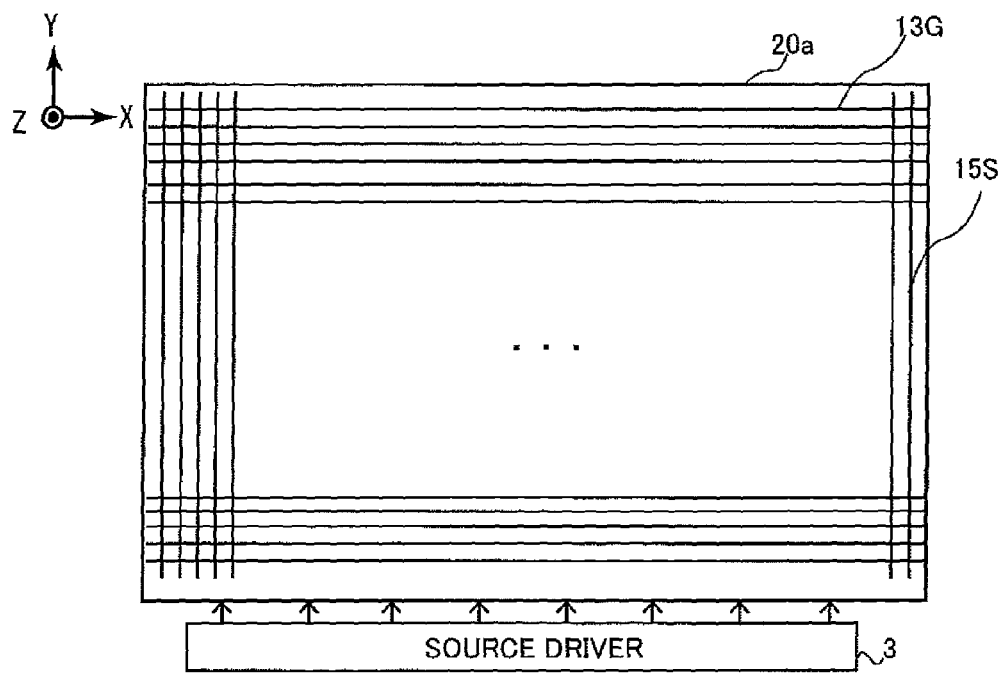
FIG. 2 is a schematic view of the active-matrix substrate according to the first embodiment.

FIG. 2 is a schematic plan view of the active-matrix substrate 20a. On the active-matrix substrate 20a are provided a plurality of gate lines 13G extending from one end to the other end of the substrate disposed in the X-direction, separated at a constant distance and substantially parallel to each other. Further, a plurality of source lines 15S (data lines) are provided on the active-matrix substrate 20a to cross the gate lines 13G. The region defined by a gate line 13G and source line 15S forms one pixel. Each pixel corresponds to one of the colors of the color filters.

Figure 3:
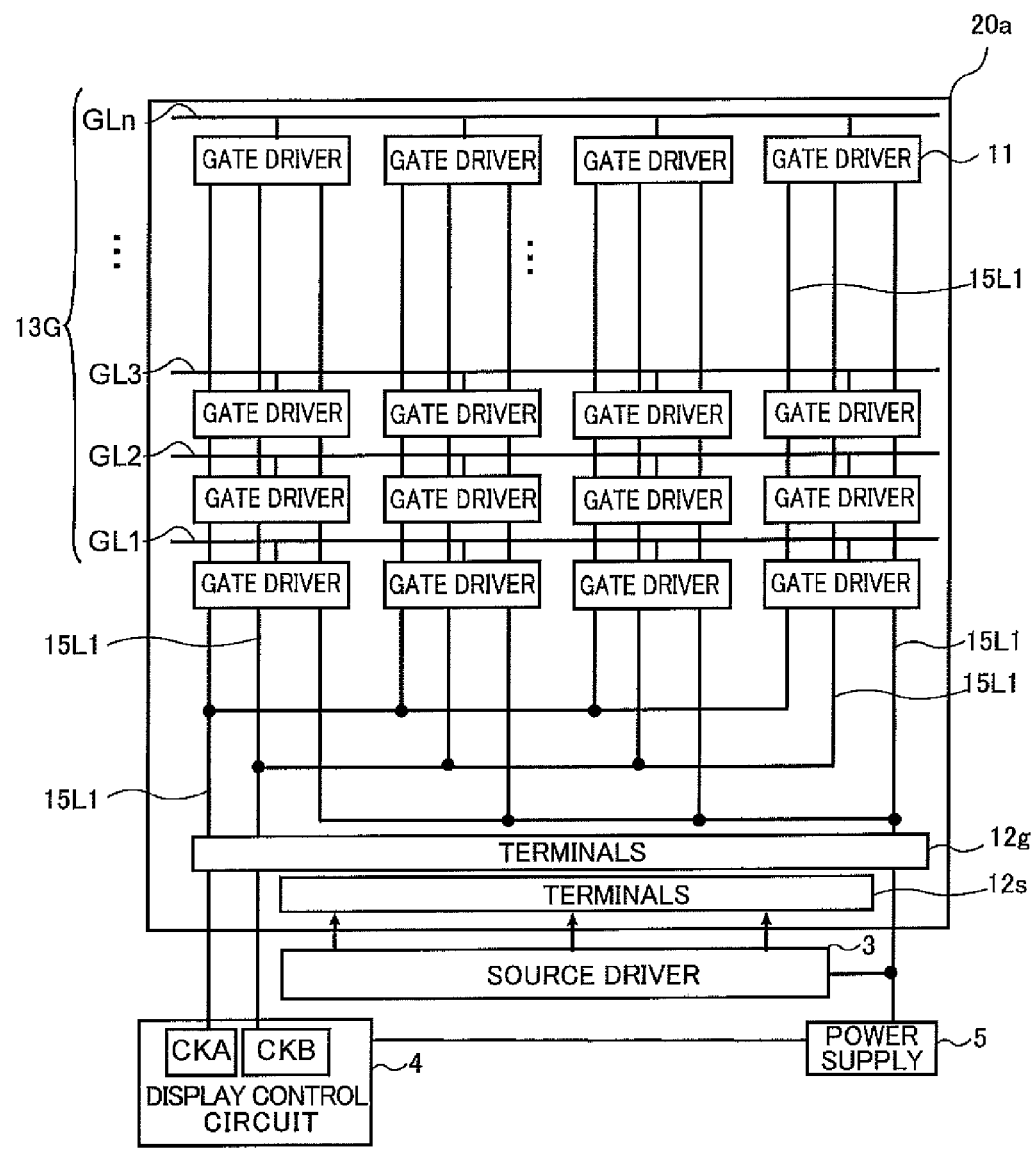
FIG. 3 is a schematic view of the active-matrix substrate according to the first embodiment.

FIG. 3 is a schematic plan view of the active-matrix substrate 20a without the source lines 15S and components connected with the active-matrix substrate 20a. As shown in the implementation of FIG. 3, each gate driver 11 (i.e. driving circuit) is provided between a gate line 13G and another gate line 13G in the display region. In the present implementation, four gate drivers 11 are connected with each gate line 13G. Terminals 12g (i.e. second terminals) are provided in the portion of the picture frame region along that side of the display region of the active-matrix substrate 20a that the source device 3 adjoins. The terminals 12g are connected with the control circuit 4 and power supply 5. The terminals 12g receive signals such as control signals (CKA, CKB) and power supply voltage signals provided by the control circuit 4 and power supply 5. The signals such as control signals (CKA, CKB) and power supply voltage signals supplied to the terminals 12g are supplied to the gate drivers 11 via the lines 15L1. Each gate driver 11, in response to a supplied signal, provides a voltage signal indicating one of the selection state and non-selection state to the gate line 13G to which it is connected, and provides the same voltage signal to the gate driver of the subsequent row. In the following description, a voltage signal corresponding to the selection state or non-selection state will be sometimes referred to as scan signal. And the state of a gate line 13G being selected will be referred to as driving of the gate line 13G.

Further, terminals 12s (i.e. first terminals) connecting the source driver 3 with the source lines 15S are provided on the portions of the picture frame region of the active-matrix substrate 20a that are located along the side thereof that the source device 3 adjoins. In response to control signals supplied by the display control circuit 4, the source drivers 3 provide data signals to the source lines 15S.

As shown in FIG. 3, in the present embodiment, in the display region, a plurality of gate drivers 11 are connected with each of the gate lines 13G: GL(1) to GL(n). The gate drivers 11 connected with one and the same gate line 13G are synchronized, and scan signals provided by these gate drivers 11 simultaneously drive one gate line 13G. In the present embodiment, a plurality of gate drivers 11 connected with one gate line 13G are separated substantially by the same distance such that the load on each of the gate drivers 11 driving a gate line 13G is substantially the same.

(Construction of Gate Driver)

Figure 4:
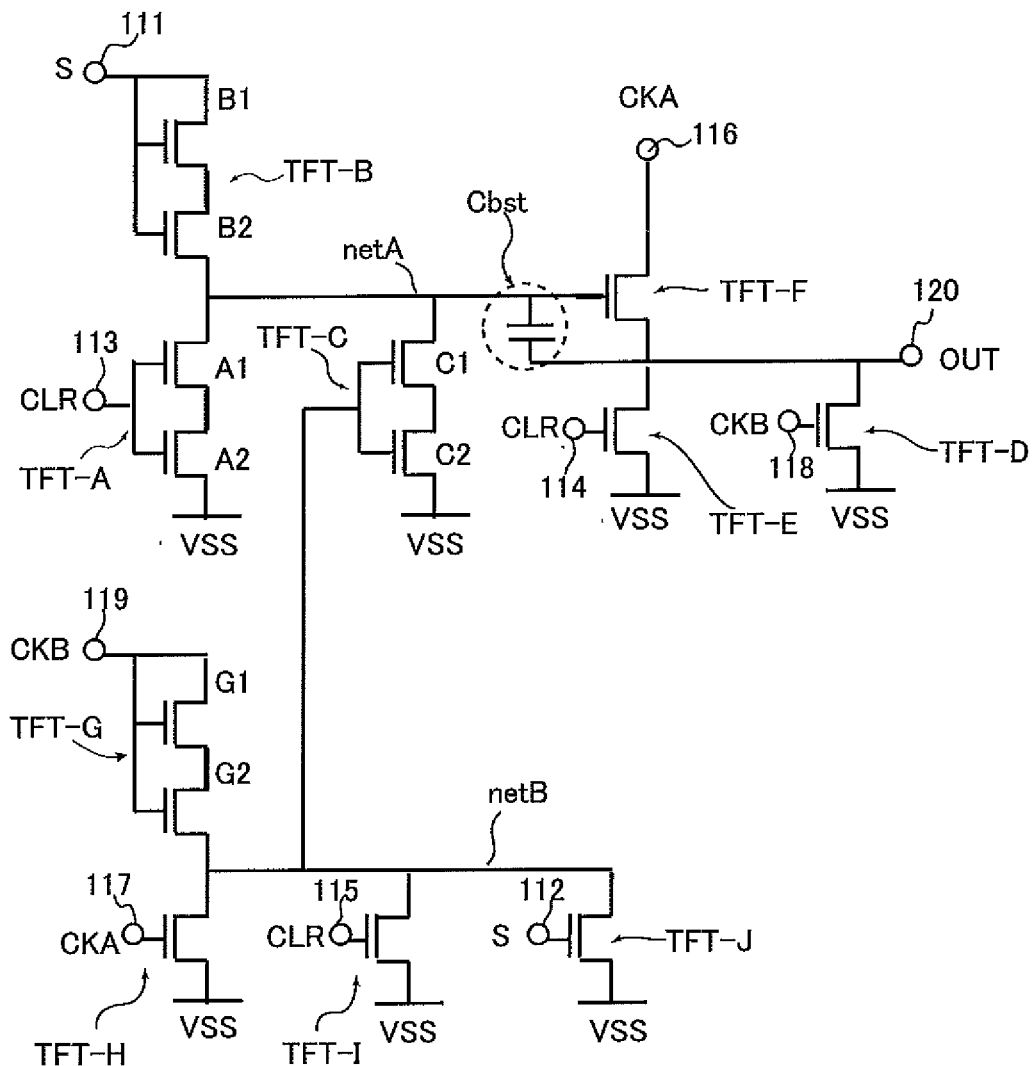
FIG. 4 is an example equivalent circuit of a gate driver according to the first embodiment.

The construction of the gate drivers 11 of the present embodiment will be described below. FIG. 4 shows an example of an equivalent circuit of a gate driver 11 located between gate lines 13G: GL(n−1) and GL(n−2) for driving the gate line 13G: GL(n−1). As shown in FIG. 4, the gate driver 11 includes a TFT-A to TFT-J constituted by thin-film transistors (TFT) that serve as switching elements, a capacitor Cbst, terminals 111 to 120, and terminals for receiving low-level power supply voltage signals.

The terminals 111 and 112 each receive a set signal (S) via the gate line 13G of the preceding row GL(n−2). The terminals 111 and 112 of a gate driver 11 connected with the gate line 13G: GL(1) each receive a gate start pulse signal (S) provided by the display control circuit 4. The terminals 113 to 115 each receive a reset signal (CLR) provided by the display control circuit 4. The terminals 116 and 117 each receive a clock signal (CKA) supplied. The terminals 118 and 119 each receive a clock signal (CKB) supplied. The terminal 120 provides a set signal (OUT) to the gate line 13G of the subsequent row.

Figure 9:
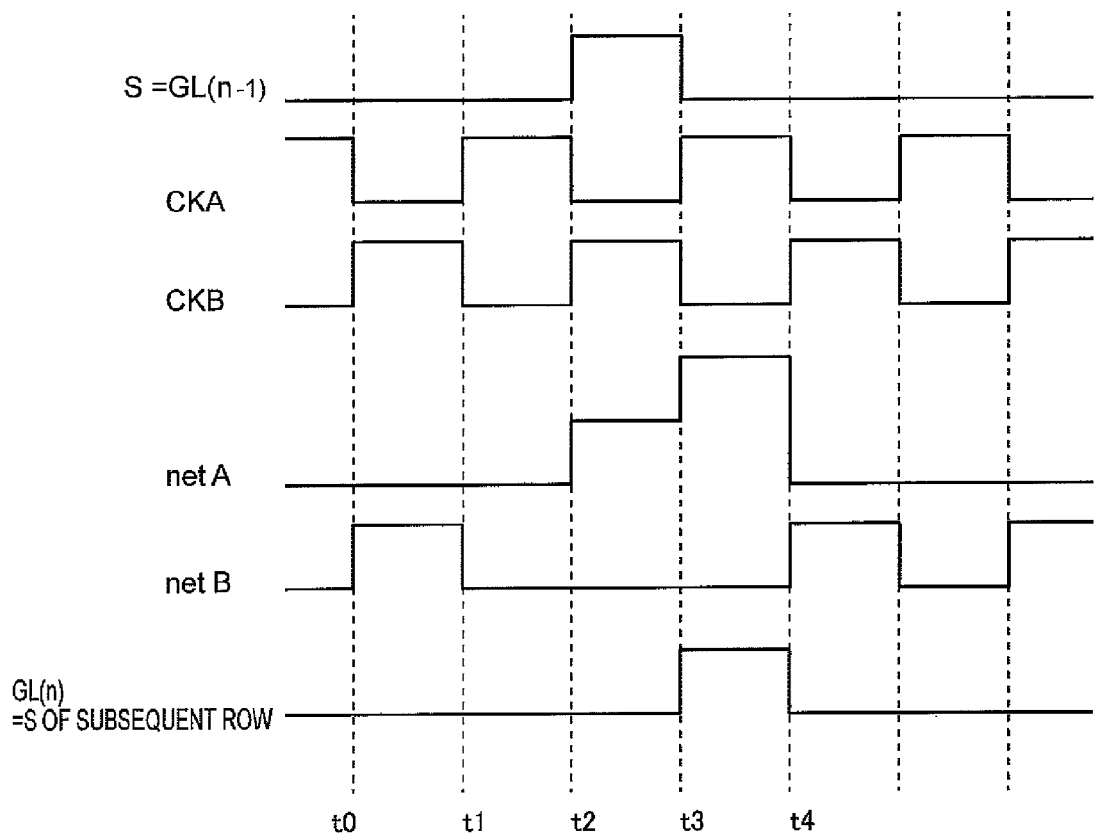
FIG. 9 is a timing chart showing signals encountered when a gate driver scans a gate line.

The clock signal (CKA) and clock signal (CKB) are two-phase clock signals whose phase is reversed at each horizontal scan interval (see FIG. 9). FIG. 4 shows a gate driver 11 for driving the gate line 13G: GL(n−1); in a gate driver 11 of the subsequent row for driving the line GL(n), the terminals 116 and 117 each receive a clock signal (CKB), and the terminals 118 and 119 of this gate driver 11 each receive a clock signal (CKA). That is, the terminals 116 and 117 and terminals 118 and 119 of a given gate driver 11 receive clock signals of the phase opposite that of clock signals received by the gate drivers 11 of the adjacent lines.

In FIG. 4, the line to which the source terminal of the TFT-B, the drain terminal of the TFT-A, the source terminal of the TFT-C, one of the electrodes of the capacitor Cbst and the gate terminal of the TFT-F are connected will be referred to as "netA". The line to which the gate terminal of the TFT-C, the source terminal of the TFT-G, the drain terminal of the TFT-H, the source terminal of the TFT-I and the source terminal of the TFT-J are connected will be referred to as "netB".

The TFT-A is composed of two TFTs (A1, A2) connected in series. The gate terminals of the TFT-A are connected with the terminal 113, the drain terminal of A1 is connected with the netA, the source terminal of the element A2 is connected with the power supply voltage terminal VSS.

The TFT-B is composed of two TFTs (B1, B2) connected in series. The gate terminals of the TFT-B and the drain terminal of the element B1 are connected with the terminal 111 (which constitutes a diode connection), and the source terminal of the element B2 is connected with the netA.

The TFT-C is composed of two TFTs (C1, C2) connected in series. The gate terminals of the TFT-C are connected with the netB, the drain terminal of the element C1 is connected with the netA, and the source terminal of the element C2 is connected with the power supply voltage terminal VSS.

The capacitor Cbst has one electrode connected with the netA and the other electrode connected with the terminal 120.

The TFT-D has a gate terminal connected with the terminal 118, a drain terminal connected with the terminal 120 and a source terminal connected with the power supply voltage terminal VSS.

The TFT-E has a gate terminal connected with the terminal 114, a drain terminal connected with the terminal 120 and a source terminal connected with the power supply voltage terminal VSS.

The TFT-F has a gate terminal connected with the netA, a drain terminal connected with the terminal 116 and a source terminal connected with the output terminal 120.

The TFT-G is composed of two TFTs (G1, G2) connected in series. The gate terminals of the TFT-G and the drain terminal of G1 are connected with the terminal 119 (which constitutes a diode connection), and the source terminal of G2 is connected with the netB.

The TFT-H has a gate terminal connected with the terminal 117, a drain terminal connected with the netB and source terminal connected with the power supply voltage terminal VSS.

The TFT-I has a gate terminal connected with the terminal 115, a drain terminal connected with the netB and a source terminal connected with the power supply voltage terminal VSS.

The TFT-J has a gate terminal connected with the terminal 112, a drain terminal connected with the netB and a source terminal connected with the power supply voltage terminal VSS.

FIG. 4 shows an example where the TFT-A, B, C and G each is composed of two TFTs connected in series; alternatively, each of them may be composed of one TFT.

(Overall Layout of Gate Drivers)

Figure 5A:
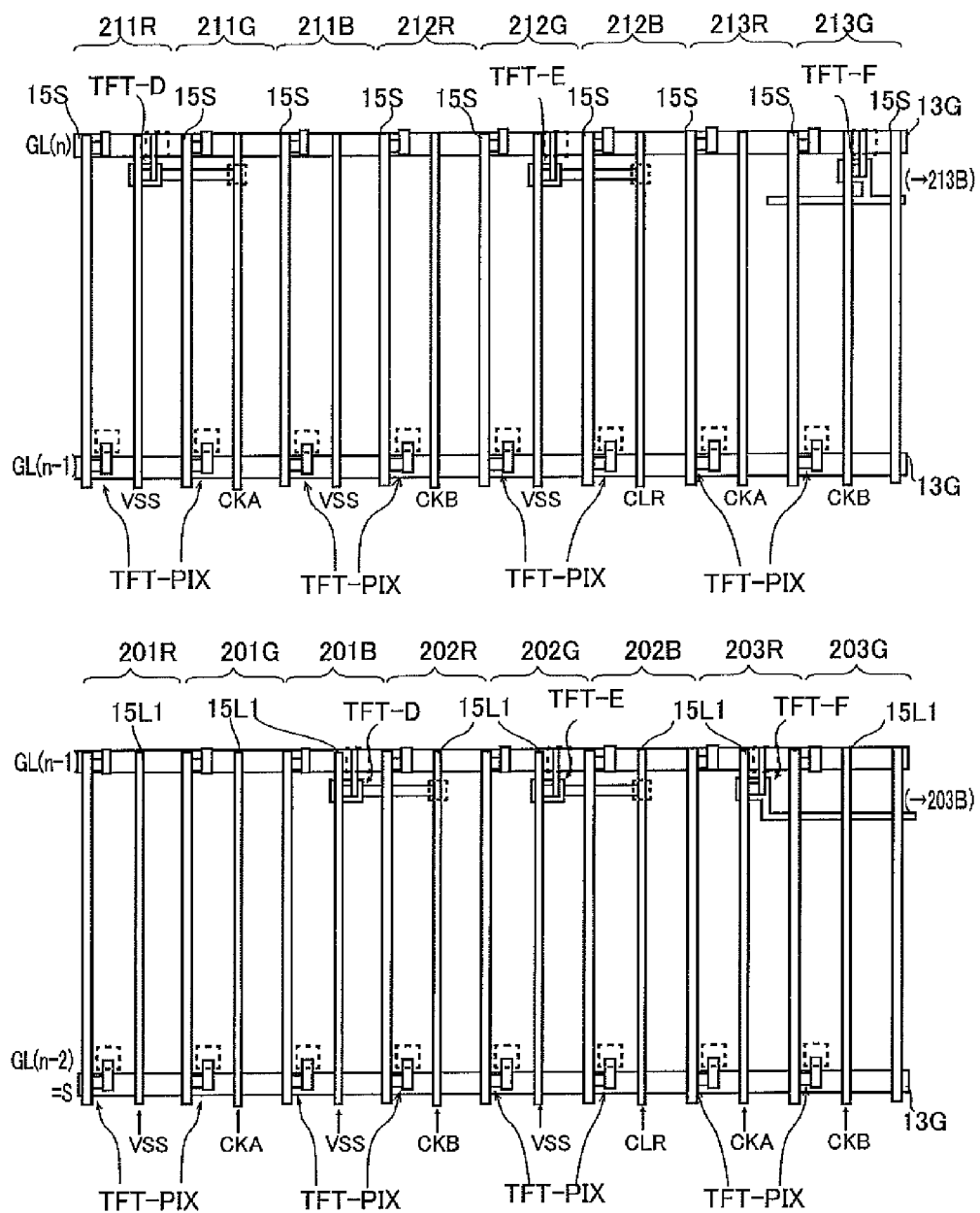
FIG. 5A is a schematic view of an example arrangement of gate drivers according to the first embodiment.
Figure 5B:
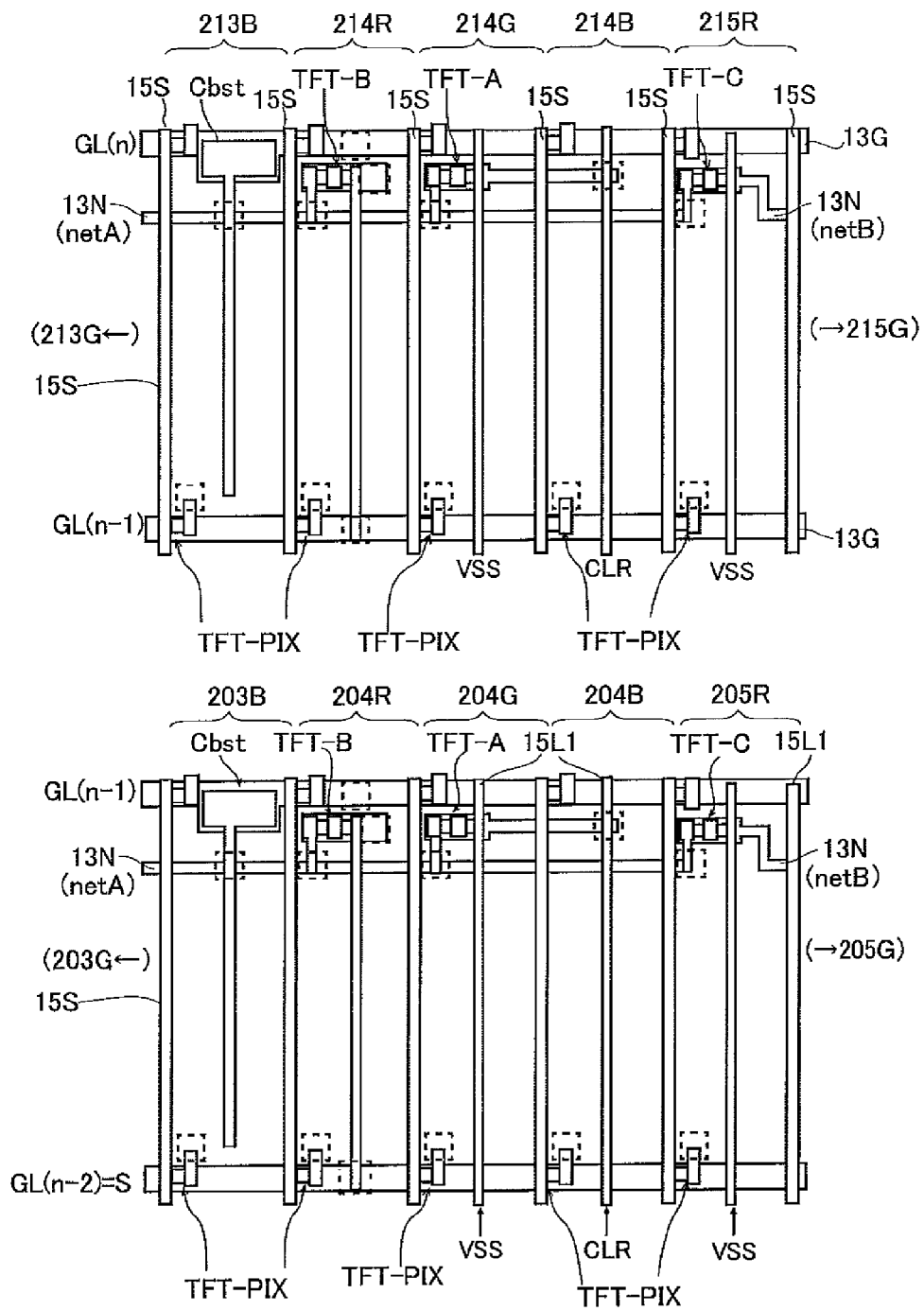
FIG. 5B is a schematic view of an example arrangement of gate drivers according to the first embodiment.
Figure 5C:
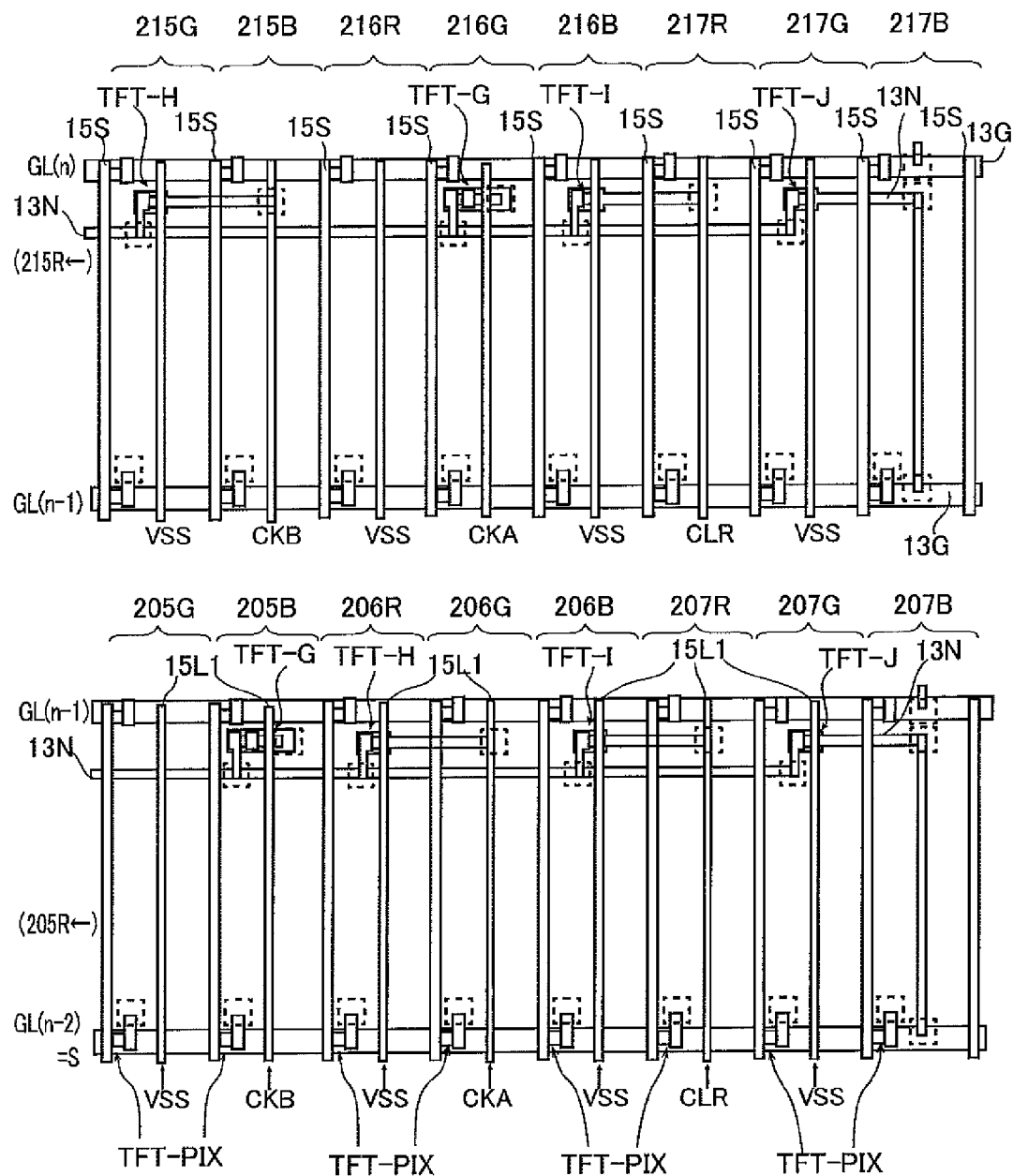
FIG. 5C is a schematic view of an example arrangement of gate drivers according to the first embodiment.

Now, how various elements of gate drivers 11 are disposed in the display region will be described. FIGS. 5A to 5C show how one gate driver 11 located between the rows GL(n) and GL(n−1) and another one located between the rows GL(n−1) and GL(n−2) may be disposed. For convenience, FIGS. 5A to 5C show the pixel regions 211R to 217B between the rows GL(n) and GL(n-1) separated from the pixel regions 201R to 207B between the rows GL(n-1) and GL(n-2); in reality, the rows of pixel regions overlap each other at the gate line 13G: GL(n-1) and the upper row of pixel regions and the lower row of pixel regions are continuous. R, G and B contained in reference characters indicating pixel regions each indicate the color of a color filter (not shown) provided on the counter-substrate 20b.

As shown in FIG. 5A to 5C, in the row of pixel regions 211R to 217B (hereinafter referred to as upper pixel region row) and the row of pixel regions 201R to 207B (hereinafter referred to as lower pixel region row), TFTs for displaying an image (hereinafter referred to as TFT-PIX) (i.e. pixel switching elements) are each located near the intersection of a source line 15S and gate line 13G.

In the upper and lower pixel region rows, a gate driver 11 is composed of distributed elements (i.e. one of the TFT-A to TFT-J and capacitor Cbst). A pixel region that includes a switching element (i.e. TFT-A, C to F, H to J) that receives one of clock signals (CKA, CKB), a reset signal (CLR) and a power supply voltage signal has a line 15L1 provided therein for supplying such a signal. Lines 15L1 extend substantially parallel to the source lines 15S through the upper and lower pixel region rows. Further, lines 13N for the netA and netB are provided in the upper and lower pixel region rows. Each of the lines 13N extends through the upper and lower pixel region rows and substantially parallel to the gate lines 13G and through pixel regions in which elements connected with the netA and netB (i.e. TFT-A to C, F, G to J, and Cbst) are disposed.

In the present embodiment, the TFTs are arranged such that the clock signals supplied to the TFT-D, TFT-F, TFT-H and TFT-G of a gate driver 11 have a phase opposite that of the clock signals supplied to such TFTs of a gate driver 11 in an adjacent row. That is, the TFT-D, TFT-F, TFT-H and TFT-G are positioned in pixel regions that are horizontally displaced from the pixel regions in which such TFTs of an adjacent row are provided.

More specifically, as shown in FIG. 5A, the TFT-D of the upper pixel region row is located in the pixel regions 211R and 211G while the TFT-D of the lower pixel region row is located in the pixel regions 201B and 202R. The TFT-F of the upper pixel region row is located in the pixel region 213G while the TFT-F of the lower pixel region row is located in the pixel region 203R. Further, as shown in FIG. 5C, the TFT-H of the upper pixel region row is located in the pixel regions 215G and 215B while the TFT-H of the lower pixel region row is located in the pixel regions 206R and 206G. The TFT-G of the upper pixel region row is located in the pixel region 216G while the TFT-G of the lower pixel region row is located in the pixel region 205B. Thus, a clock signal (CKA) is supplied to the TFT-D of the upper pixel region row while a clock signal (CKB) with a phase opposite that of the clock signal (CKA) is supplied to the TFT-D of the lower pixel region row. The same applies to the TFT-G and TFT-H: as shown in FIGS. 5A and 5C, a clock signal (CKA or CKB) of one phase is supplied to the upper pixel region row, while a clock signal of the opposite phase is supplied to the lower pixel region row.

Further, the TFT-B and TFT-J of the upper pixel region row are connected with the gate line 13G: GL(N-1) while the TFT-B and TFT-J of the lower pixel region row are connected with the gate line 13G: GL(n-2). The TFT-D and TFT-F of the upper pixel region row are connected with the gate line 13G: GL(n) while the TFT-D and TFT-F of the lower pixel region row are connected with the gate line 13G: GL(n-1). The gate driver 11 located in the lower pixel region row receives a set signal (S) via the gate line 13G: GL(n-2) and, then, provides the set signal (S) to the gate line 13G: GL(n) and drives the gate line 13G: GL (n-1). The gate driver 11 located in the upper pixel region row receives a set signal (S) via the gate line 13G: GL(n-1) and, then, provides the set signal (S) to the gate line 13G: GL(n+1) and drives the gate line 13G: GL(n).

Figure 6:
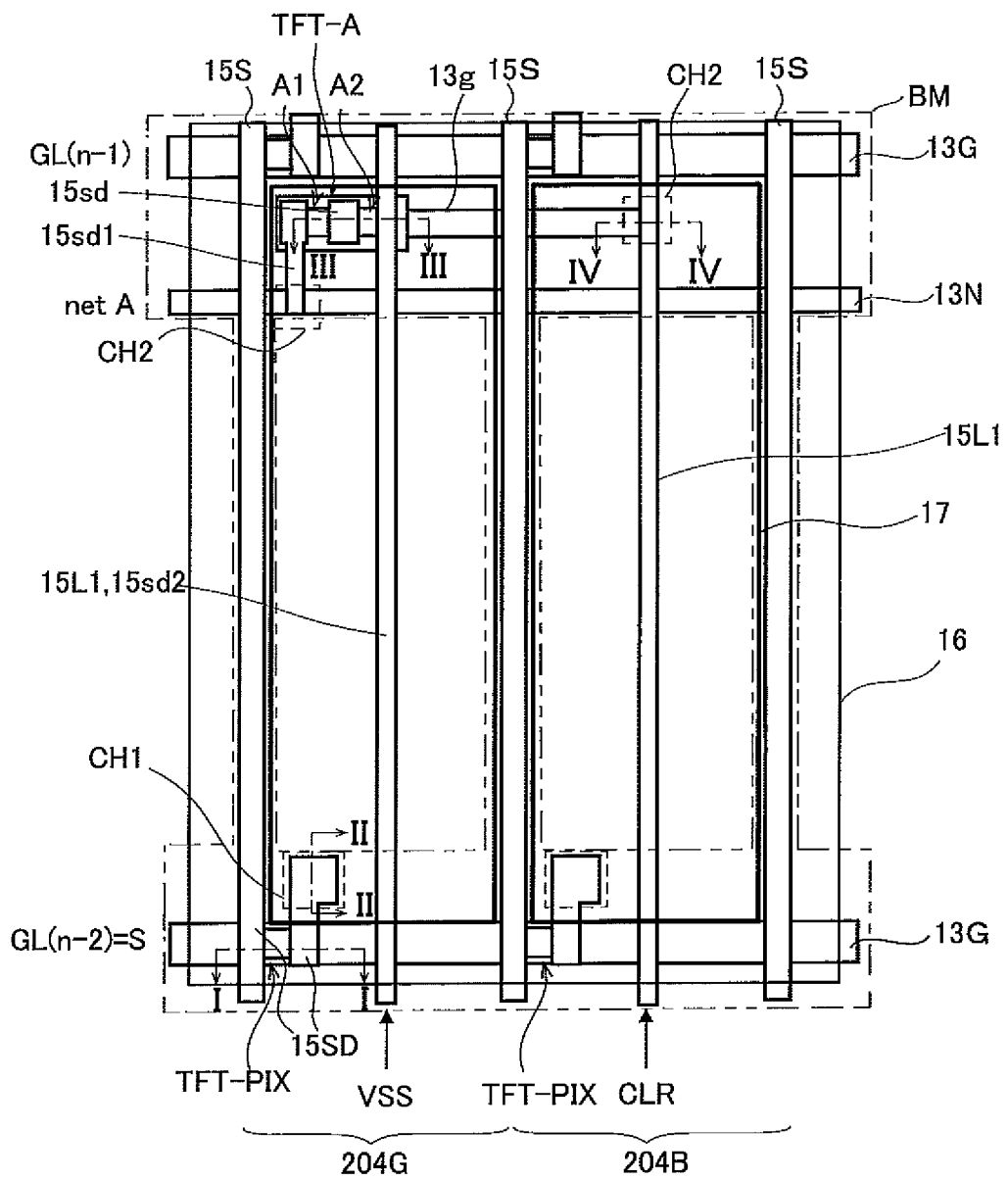
FIG. 6 is an enlarged plan view of the pixel region in which the TFT-A of FIG. 5B is provided.

How the elements constituting a gate driver 11 are connected will be described below. FIG. 6 is an enlarged plan view of the pixel regions 204G and 204B in which the TFT-A of FIG. 5B is provided. The TFT-A and TFT-H, I, and J are each constructed using two pixel regions and their elements are connected in the same manner; accordingly, the TFT-A will be described as an example. In FIG. 6, the region BM defined by two-dot chain lines is the region where light is blocked by a black matrix (not shown) provided on the counter-substrate 20b (hereinafter referred to as light-shielding region BM). The light-shielding region BM includes regions where the gate lines 13G, the elements constituting the gate driver 11 and the source lines 15S are located.

As shown in FIG. 6, a TFT-PIX for displaying an image is provided near the intersection of a gate line 13G and source line 15S. The TFT-PIX is connected with a pixel electrode 17 via a contact CH1. Further, in each pixel region, a line 15L1 is provided to extend substantially parallel to the source lines 15S and cross the gate lines 13G. A power supply voltage signal (VSS) is supplied to the line 15L1 in the pixel region 204G, and a reset signal (CLR) is supplied to the line 15L1 of the pixel region 204B.

As shown in FIG. 6, the gate terminal 13g of the TFT-A is located in the pixel regions 204B to 204G. The line 13N is provided in the pixel regions 204G and 204B to cross the source lines 15S and lines 15L1 and substantially parallel to the gate lines 13G. The line 13N constitutes the netA and netB, described above. The TFT-A is connected with the line 15L1 via the contact CH2 of the pixel region 204B and is connected with the line 13N via the contact CH2 of the pixel region 204G. Further, in the present embodiment, a shield layer 16 is provided between the pixel electrodes 17 and TFT-A, lines 13N and 15L1.

Figure 7A:
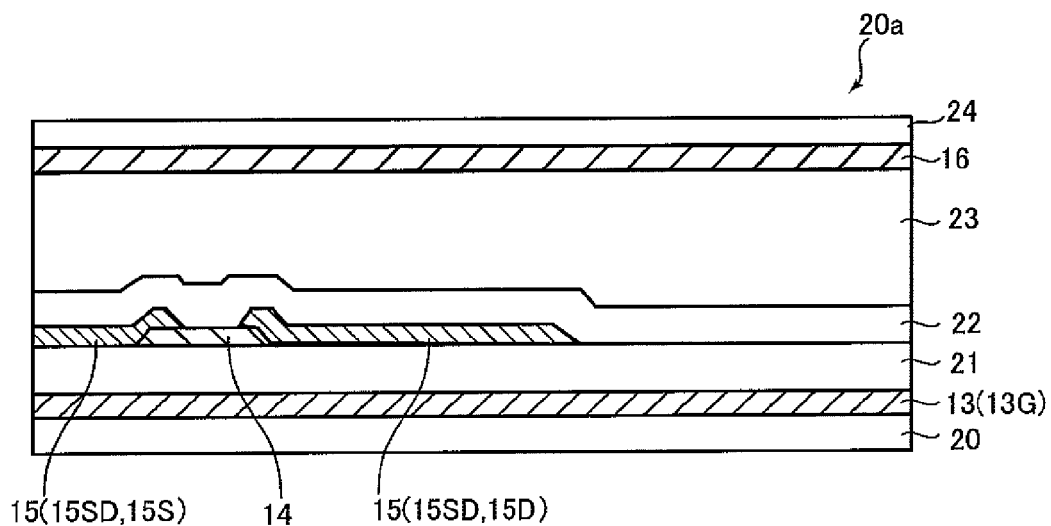
FIG. 7A is a schematic cross-sectional view of a TFT-PIX of FIG. 6 taken along line I-I.
Figure 7B:
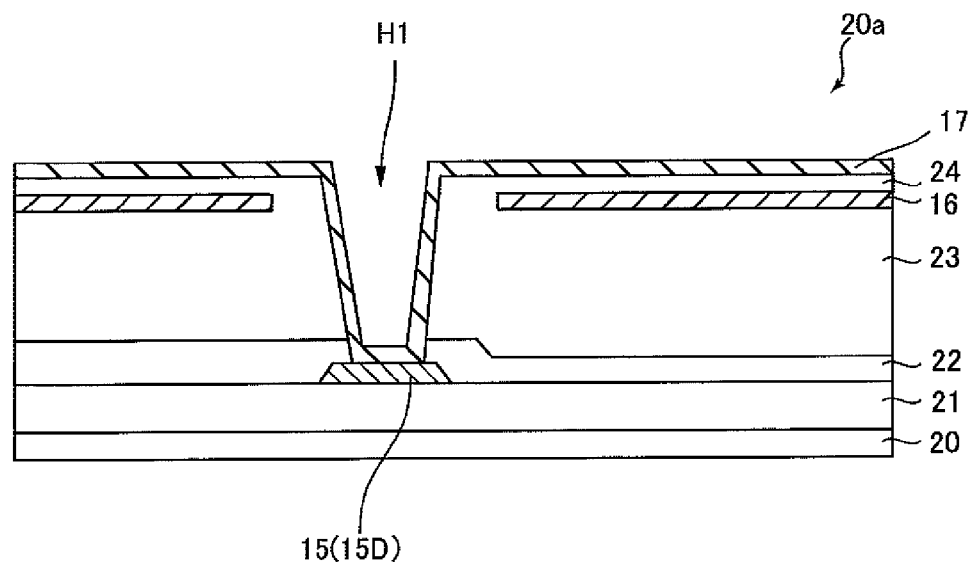
FIG. 7B is a schematic cross-sectional view of the contact CH1 of FIG. 6 taken along line II-II.

FIG. 7A shows a cross-sectional view of a TFT-PIX of FIG. 6 taken along line I-I, while FIG. 7B shows a cross-sectional view of the contact CH1 taken along line II-II. Further, FIG. 7C shows a cross-sectional view of the TFT-A of FIG. 6 taken along line III-III, while FIG. 7D shows a cross-sectional view of the contact CH2 taken along line IV-IV.

Figure 7C:
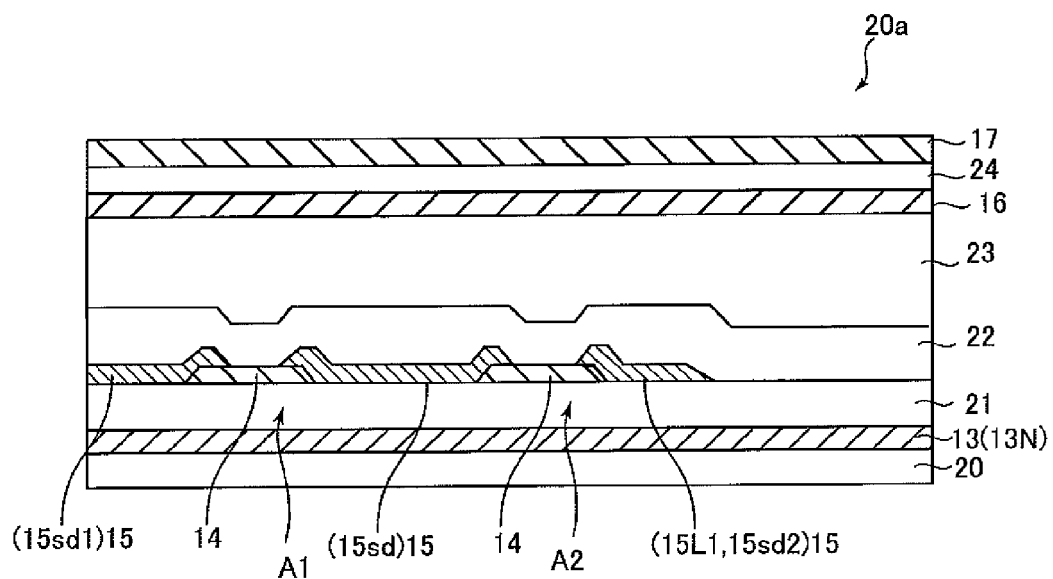
FIG. 7C is a schematic cross-sectional view of the TFT-A of FIG. 6 taken along line III-III.
Figure 7D:
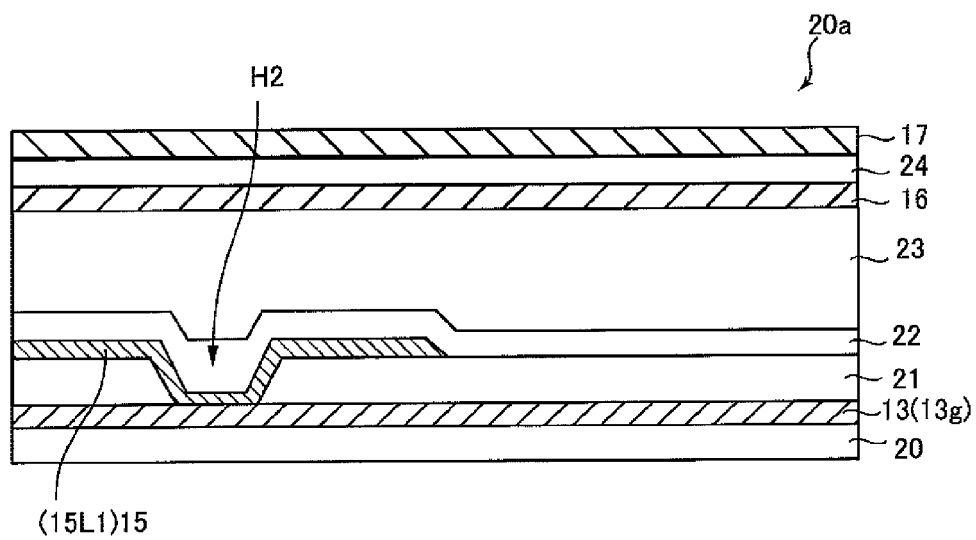
FIG. 7D is a schematic cross-sectional view of the contact CH2 of FIG. 6 taken along line IV-IV.

As shown in FIGS. 7A, 7C and 7D, the gate line 13G, the gate terminal 13g of the TFT-A and the line 13N are formed as a gate line layer 13 is formed on the substrate 20. As shown in FIGS. 7A and 7C, a semiconductor layer portion 14 formed of an oxide semiconductor is provided on top of the gate line layer 13, with a gate insulating film 21 being present in between, in the areas where a TFT-PIX is to be formed and a TFT-A is to be formed. Further, above the substrate 20 which has the semiconductor layer portion 14 provided thereon is provided a source line layer 15 portions separated across the top of the semiconductor layer portion 14. Thus, as shown in FIGS. 7A to 7C, the source line 15S, the source-drain terminal 15SD of the TFT-PIX, the source-drain terminal 15sd (including 15sd1 and 15sd2) of the TFT-A and line 15L1 are formed.

As shown in FIG. 7D, at the contact CH2 of the pixel region 204B, a contact hole H2 is formed in the gate insulating film 21 to extend throughout to the surface of the gate layer 13. The source line layer 15 (15L1) is provided on the gate insulating film 21 to contact the gate line layer 13

(13g) at the contact hole H2. Thus, the gate terminal 13g of the TFT-A is connected with the line 15L1 at the contact CH2 of the pixel region 204B. Similarly, at the contact CH2 of the pixel region 204G, the drain terminal 15sd1 of the element A1 of the TFT-A formed by the source line layer 15 is connected with the line 13N formed by the gate line layer 13. Thus, the TFT-A is connected with the netA, and a reset signal (CLR) is supplied through the line 15L1.

Further, as shown in FIGS. 7A to 7D, on top of the source line layer 15 are stacked a protection film 22 and protection film 23 to cover the source line layer 15. The protection film 22 is formed of an inorganic insulating film such as SiO2, for example. The protection film 23 is formed of an organic insulating film such as a positive photosensitive resin film, for example. Further, as shown in FIGS. 7A and 7D, a shield layer 16 is provided on top of the protection film 23. The shield layer 16 is formed of a transparent conductive film such as ITO, for example. Then, on top of the shield layer 16 is provided an interlayer insulating layer 24 formed of an inorganic insulating film such as SiO2, for example. On top of the interlayer insulating layer 24 are provided pixel electrodes 17 formed of a transparent conductive film such as ITO, as shown in FIGS. 7C and 7D.

As shown in FIG. 7B, at the contact CH1, a contact hole H1 is provided above the drain terminal 15D of the TFT-PIX to extend through the interlayer insulating layer 24, shield layer 16 and protection films 22 and 23. The pixel electrode 17 is provided on top of the interlayer insulating layer 24 to contact the drain terminal 15D in the contact hole H1. Forming the shield layer 16 forms a capacitance Cs between the pixel electrode 17 and shield layer 16, and the capacitance Cs stabilizes the potential of the pixel electrode 17.

Thus, the TFT-A and the line 13N and lines 15L1 connected with the TFT-A are located in two pixel regions, thereby reducing the decrease in the aperture ratio compared with implementations where they are located in one pixel region. Further, a shield layer 16 is provided between the pixel electrode 17 and the TFT-A, line 13N and lines 15L1, thereby reducing interference between the TFT-A or the like and the pixel electrode 17.

(TFT-B)

Figure 8A:
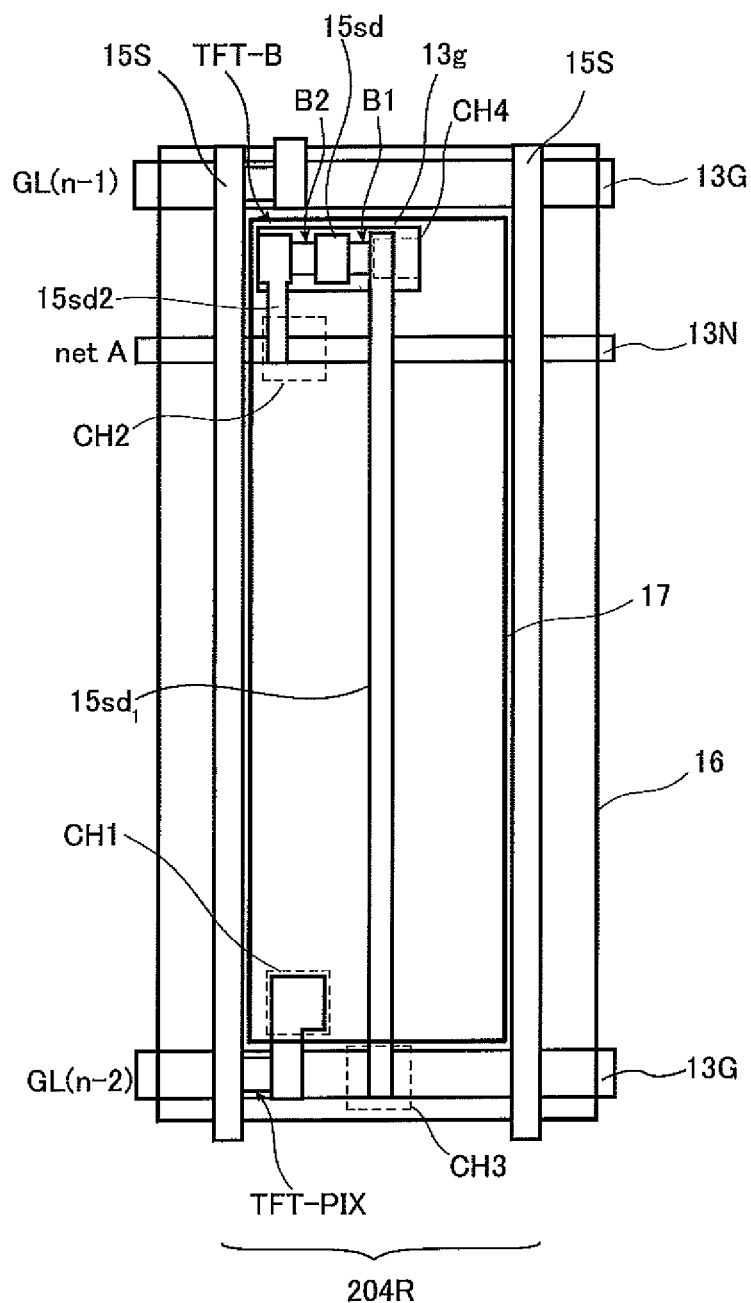
FIG. 8A is an enlarged plan view of the pixel region 204R of FIG. 5B.

How the TFT-B is connected will be described below. FIG. 8A is an enlarged plan view of the pixel region 204R of FIG. 5B. In FIG. 8A, the light-shielding region BM is not shown. As shown in FIG. 8A, in the pixel region 204R, as is the case in the pixel region 204G described above, a TFT-PIX is connected with a pixel electrode 17 at the contact CH1. Further, the source-drain terminal 15sd (including 15sd1 and 15sd2) of the TFT-B are formed by the source line layer 15. The gate terminal 13g of the TFT-B, the gate line 13G: GL(n−2) and line 13N are formed by the gate line layer 13.

The drain terminal 15sd1 of the element B1 crosses the gate line 13G: GL(n−2) and line 13N. At the contacts CH3 and CH4, as at the contact CH2 described above, a contact hole H2 is formed in the gate insulating film 21 for connecting the gate line layer 13 with the source line layer 15.

The drain terminal 15sd1 is connected with the gate line 13G: GL(n−2) via the contact CH3, and is connected with the gate terminal 13g via the contact CH4. The source terminal 15sd2 of the element B2 is connected with the line 13N via the contact CH2. Thus, the TFT-B is connected with the netA and receives a set signal (S) via the gate line 13G: GL (n−2).

(TFT-C)

Figure 8B:
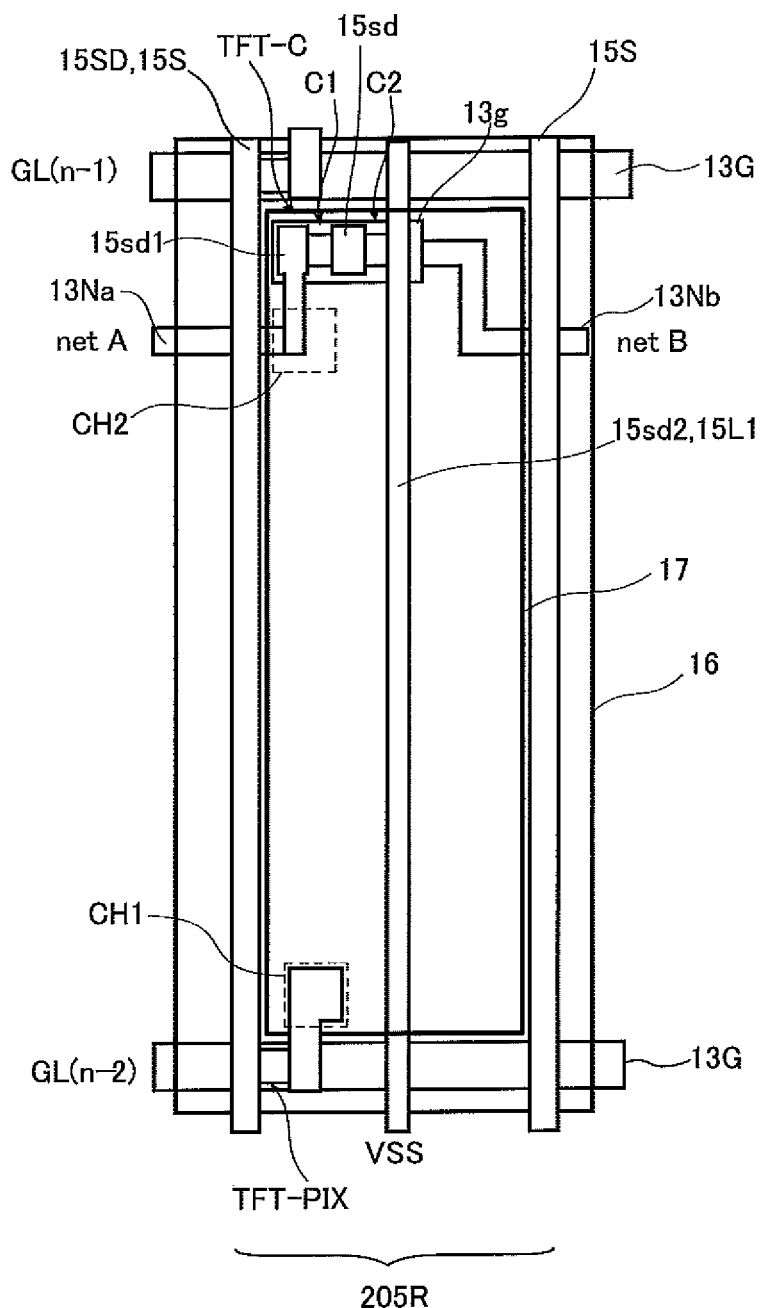
FIG. 8B is an enlarged plan view of the pixel region 205R of FIG. 5B.

How the TFT-C is connected will be described below. FIG. 8B is an enlarged plan view of the pixel region 205R of FIG. 5B. In FIG. 8B, the light-shielding region BM is not shown. As shown in FIG. 8B, in the pixel region 205R, as is the case in the pixel regions 204G and 204B described above, the TFT-PIX is connected with the pixel electrode 17 via the contact CH1. Further, the gate terminal 13g of the TFT-C, the gate line 13G and line 13N (13Na, 13Nb) are formed by the gate line layer 13. The source-drain terminal 15sd (including 15sd1 and 15sd2) of the TFT-C and line 15L1 are formed by the source line layer 15. The drain terminal 15sd1 of the element C1 is connected with the line 13Na via the contact CH2. The TFT-C is connected with the netA via the line 13Na, and is connected with the netB via the line 13Nb. Further, a power supply voltage signal (VSS) is supplied to the TFT-C via the line 15L1.

(TFT-F)

Figure 8C:
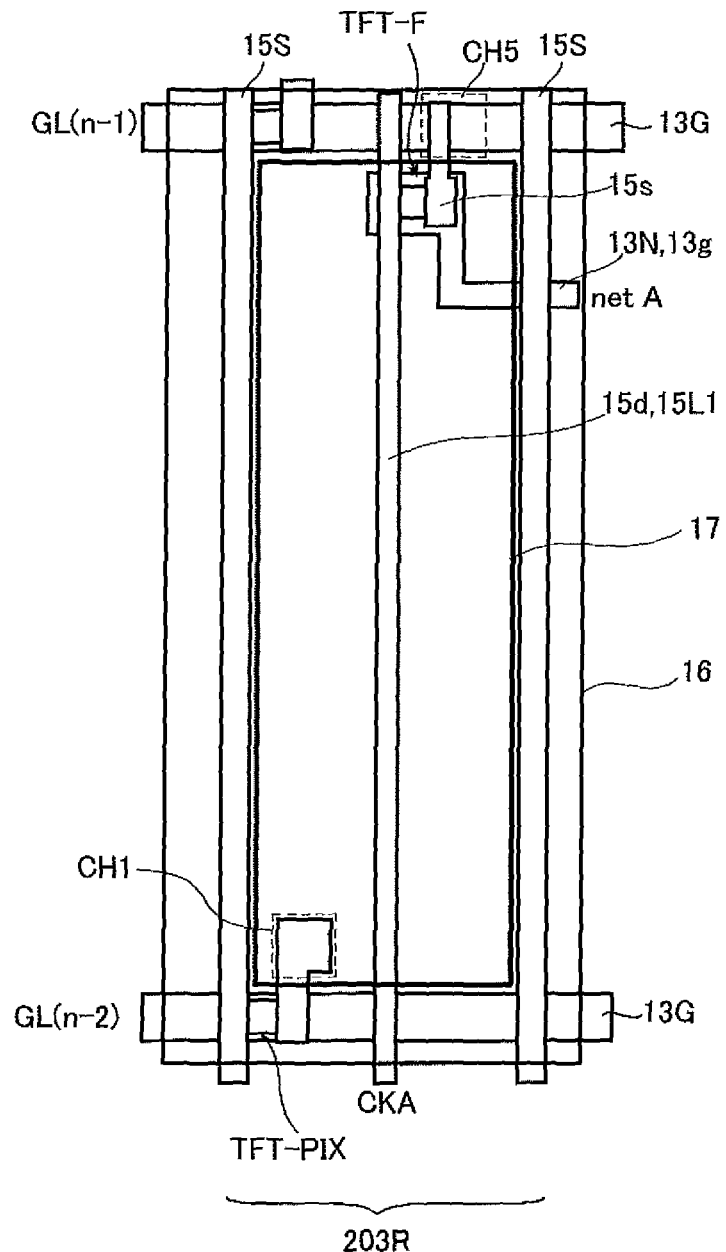
FIG. 8C is an enlarged plan view of the pixel region 203R of FIG. 5B.

How the TFT-F is connected will be described below. FIG. 8C is an enlarged plan view of the pixel region 203R of FIG. 5A. In FIG. 8C, the light-shielding region BM is not shown. As shown in FIG. 8C, in the pixel region 203R, as is the case in the pixel regions 204G and 204B, the TFT-PIX is connected with the pixel electrode 17 via the contact CH1. Further, the gate terminal 13g of the TFT-F, the gate line 13G and line 13N are formed by the gate line layer 13. The source terminal 15s and the drain terminal 15d of the TFT-F, and line 15L1 are formed by the source line layer 15.

At the contact CH5, as at the contact CH2 described above, a contact hole H2 is provided for connecting the gate line layer 13 with the source line layer 15. The source terminal 15s of the TFT-F is connected with the gate line 13G: GL(n−1) via the contact CH5, and the gate terminal of the TFT-F is connected with the netA. A clock signal (CKA) is supplied to the drain terminal 15d of the TFT-F via the line 15L1. Further, the TFT-F provides a scan signal to the gate line 13G: GL(n−1) via the contact CH5.

(TFT-G)

Figure 8D:
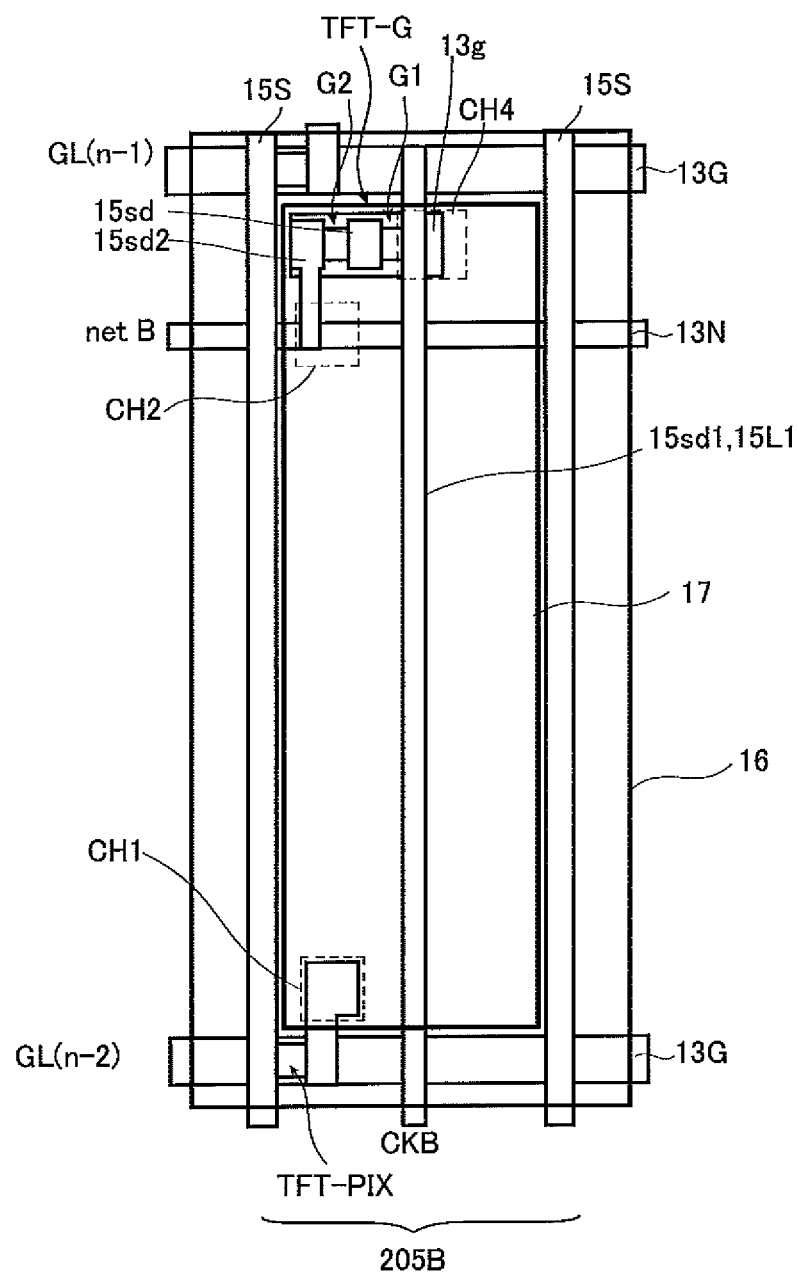
FIG. 8D is an enlarged plan view of the pixel region 205B of FIG. 5C.

How the TFT-G is connected will be described below. FIG. 8D is an enlarged plan view of the pixel region 205B of FIG. 5C. In FIG. 8D, the light-shielding region BM is not shown. As shown in FIG. 8D, in the pixel region 205B, as is the case in the pixel regions 204G and 204B, the TFT-PIX is connected with the pixel electrode 17 via the contact CH1. Further, the gate terminal 13g of the TFT-G, the gate line 13G and line 13N are formed by the gate line layer 13. The source-drain terminal 15sd(including 15sd1 and 15sd2) of the TFT-G and line 15L1 are formed by the source line layer 15. The source terminal 15sd2 of the element G2 of the TFT-G is connected with the line 13N via the contact CH2. The gate terminal 13g of the TFT-G is connected with the drain terminal 15sd1 of the element G1 and line 15L1 via the contact CH4. Thus, the TFT-G is connected with the netB, and a clock signal (CKB) is supplied thereto via the line 15L1.

(Cbst)

Figure 8E:
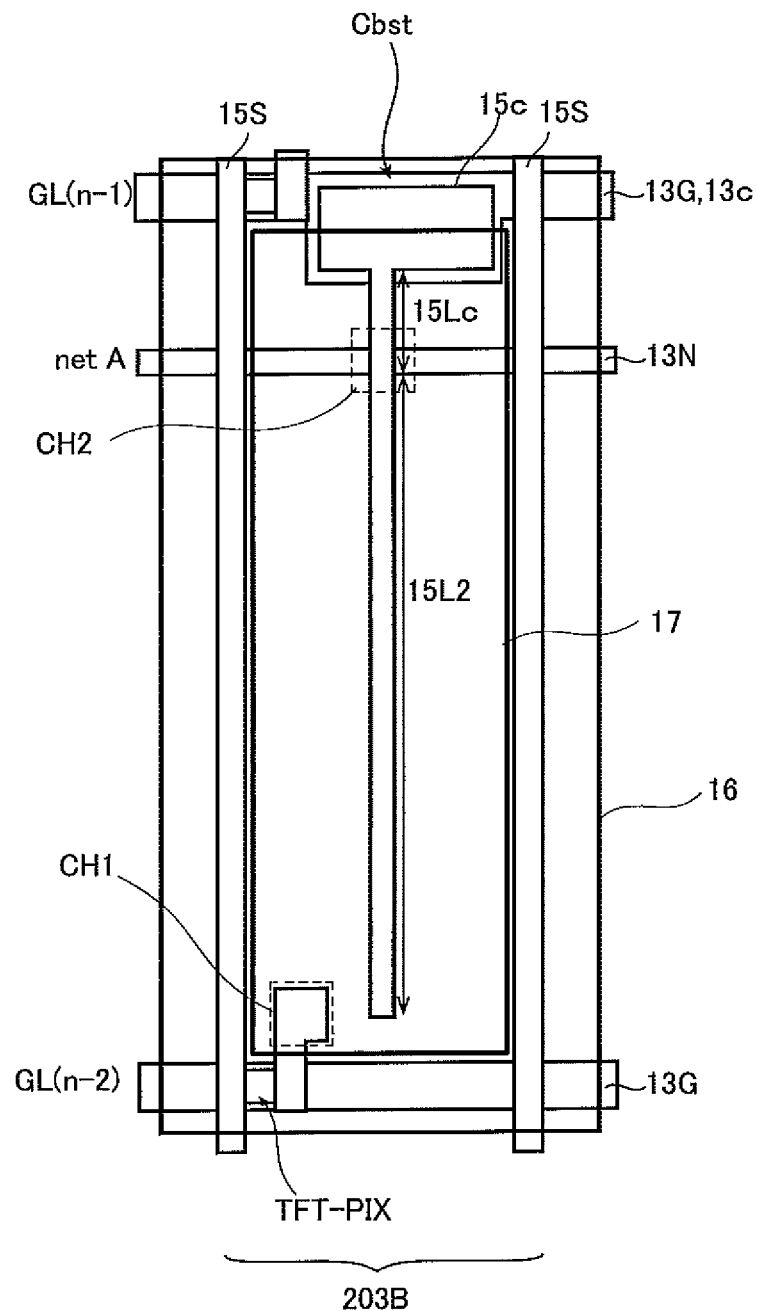
FIG. 8E is an enlarged plan view of the pixel region 203B of FIG. 5B.

How the capacitor Cbst is connected will be described below. FIG. 8E is an enlarged plan view of the pixel region 203B of FIG. 5B. In FIG. 8E, the light-shielding region BM is not shown. In the pixel region 203B, as is the case in the pixel regions 204G and 204B described above, the TFT-PIX is connected with the pixel electrode 17 via the contact CH1. Further, one of the electrodes constituting the capacitor Cbst, 13c, the gate line 13G and line 13N are formed by the gate line layer 13. The other one of the electrodes of the capacitor Cbst, 15c, the connection 15Lc and line 15L2 are formed by the source line layer 15. As shown in FIG. 8E, the connection 15Lc has substantially the same width as the line 13N, extends from the electrode 15c to the contact CH2 and is connected with the line 13N via the contact CH2. The line 15L2 extends from the end of the connection 15Lc adjacent the contact CH2 to the vicinity of the contact CH1. In the present embodiment, the line 15L2 is formed such that the aperture ratio of a pixel region with a capacitor Cbst is equal to that of other pixel regions. At the contact CH2, the electrode 15c is connected with the line 13N via the contact 15Lc. Thus, the capacitor Cbst is connected with the netA.

(TFT-D, E)

How the TFT-D and TFT-E are connected will be described below. In the TFT-D and TFT-E, as is the case in the TFT-A described above, the gate terminal 13g is located in two adjacent pixel regions, and the line 15L1 in one of the pixel regions is connected with the gate terminal 13g. The TFT-D and TFT-E are only different in that the reset signal (CLR) or clock signal (CKA) is supplied to the respective gate terminal; thus, only how the TFT-D is connected will be described.

Figure 8F:
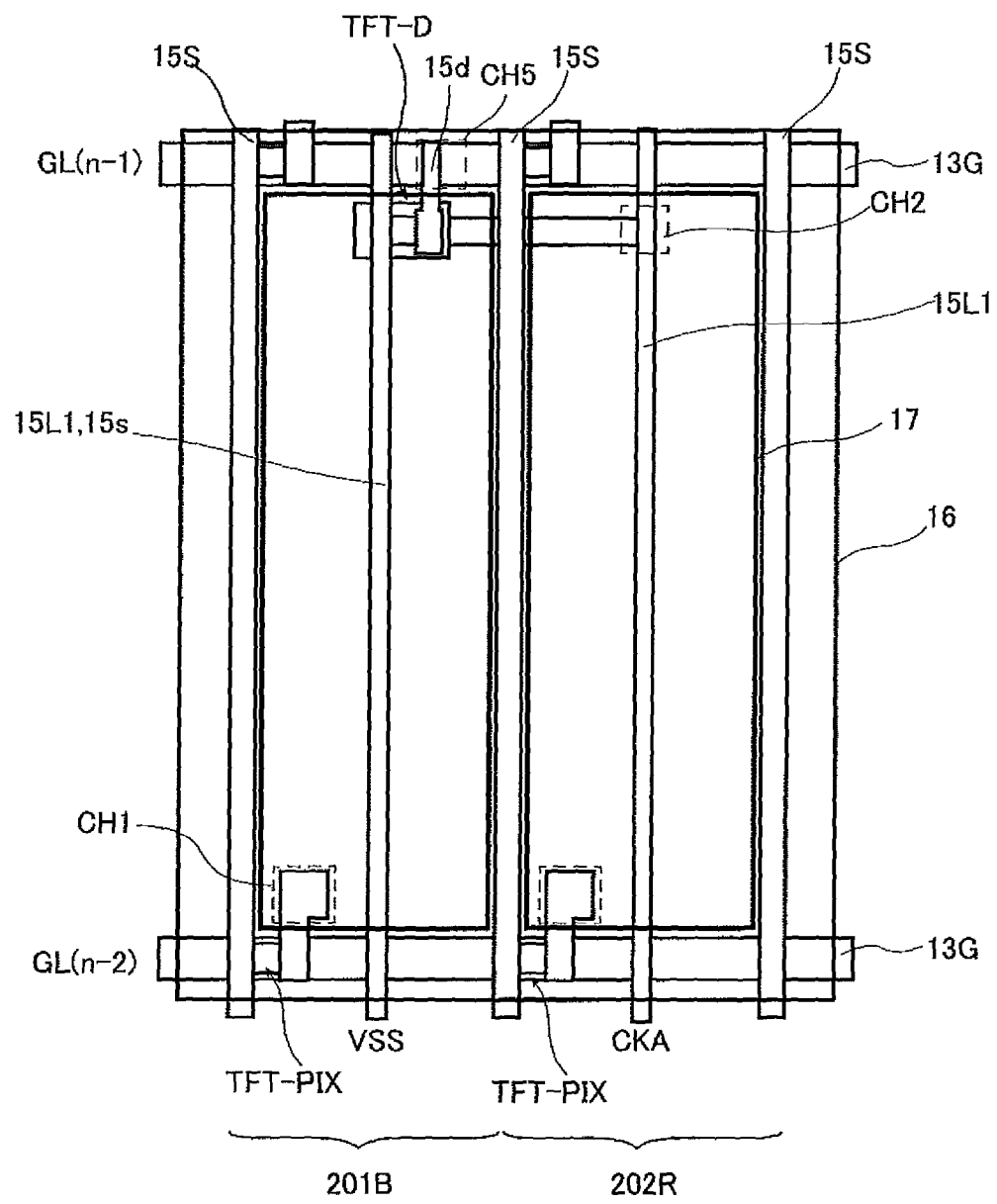
FIG. 8F is an enlarged plan view of the pixel regions 201B and 202R of FIG. 5A.

FIG. 8F is an enlarged plan view of the pixel regions 201B and 202R of FIG. 5A. In FIG. 8F, the light-shielding region BM is not shown. In the pixel regions 201B and 202R, as is the case in the pixel regions 204G and 204B described above, forming a source line layer 15 forms the source terminal 15s and drain terminal 15d of the TFT-D and the line 15L1. The drain terminal 15d is connected with the gate line 13G: GL(n−1) at the contact CH5 of the pixel region 201R. The power supply voltage signal (VSS) and clock signal (CKA) are supplied to the TFT-D via the lines 15L1 of the pixel regions 201B and 202R, and the TFT-D drives the gate line 13G: GL(n−1) via the contact CH5 and provides the set signal to the gate line 13G: GL(n).

The foregoing is an example of how the gate driver 11 is constructed and how their elements are connected. The pixel regions in which the TFT-B to TFT-E, TFT-F, TFT-G, capacitor Cbst and TFT-D are provided are not described; in these pixel regions, as is the case in the pixel region in which the TFT-A is provided, a source line layer 15 is provided, and on top of this are stacked protection films 22 and 23, a shield layer 16, an interlayer insulating film 24 and a pixel electrode 17.

(Operation of Gate Driver 11)

Now, the operation of a gate driver 11 will be described with reference to FIGS. 4 and 9. FIG. 9 is a timing chart showing signals encountered when the gate driver 11 scans a gate line 13G. In FIG. 9, the period from t3 to t4 is the period in which the gate line 13G: GL(n) is selected. Clock signals (CKA) and (CKB), whose phase is reversed at each horizontal scan interval, are supplied from the display control circuit 4 to the gate driver 11 via the terminals 116 to 119. Although not shown in FIG. 9, a reset signal (CLR) that goes to H (high) level at each vertical scan interval and remains that way for a predetermined period of time is supplied to the gate driver 11 by the display control circuit 4 via the terminals 113 to 115. When a reset signal (CLR) is supplied, the netA, netB and gate line 13G transition to L (low) level.

From time t0 to t1 of FIG. 9, an L level clock signal (CKA) is supplied to the terminals 116 and 117, and an H level clock signal (CKB) is supplied to the terminals 118 and 119. Thus, the TFT-G turns on and the TFT-H turns off such that the netB is charged to H level. Further, the TFT-C and TFT-D turn on and the TFT-F turns off such that the netA is charged to L level, i.e. the level of the power supply voltage (VSS), and the L-level potential is output at the terminal 120.

Next, at time t1, the clock signal (CKA) goes to H level and the clock signal (CKB) goes to L level, turning off the TFT-G and turning on the TFT-H such that the netB is charged to L level. Then, the TFT-C and the TFT-D turn off, which maintains the potential of the netA at L level, and the L level potential is output at the terminal 120.

At time t2, the clock signal (CKA) goes to L level and the clock signal (CKB) goes to H level, and a set signal (S) is supplied to the terminals 111 and 112 via the gate line 13G: GL(n−1). This turns on the TFT-B and charges the netA to H level. Further, the TFT-J turns on, the TFT-G turns on and the TFT-H turns off such that the netB is maintained at L level. The TFT-C and the TFT-F turn off such that the potential of the netA does not decrease, i.e. is maintained. Meanwhile, since the TFT-D is on, the L-level potential is output at the terminal 120.

At time t3, the clock signal (CKA) goes to H level and the clock signal (CKB) goes to L level, turning on the TFT-F and turning off the TFT-D. Since the capacitor Cbst is provided between the netA and terminal 120, the netA is charged to a potential higher than the H level of the clock signal (CKA) as the potential of the terminal 116 of the TFT-F increases. Meanwhile, the TFT-G and the TFT-J are off and the TFT-H is on such that the potential of the netB is maintained at L level. Since the TFT-C is off, the potential of the netA does not decrease, and the H-level potential (i.e. selection voltage) of the clock signal (CKA) is output at the terminal 120. Thus, the gate line 13G: GL(n) connected with the terminal 120 is charged to H level, and is in the selected state.

At time t4, the clock signal (CKA) goes to L level and the clock signal (CKB) goes to H level, turning on the TFT-G and turning off the TFT-H such that the netB is charged to H level. Thus, the TFT-C turns on and the netA is charged to L level. Meanwhile, the TFT-D is on and the TFT-F is off such that the L-level potential (i.e. non-selection voltage) is output at the terminal 120, and the gate line 13G: GL(n) is charged to L level.

Thus, as a set signal (S) is provided to a gate line 13G from the terminal 120 of the gate driver 11, this gate line 13 enters the selected state. The liquid crystal display device 1 uses a plurality of gate drivers 11 connected with the gate lines 13G to sequentially scan the gate lines 13G and uses the source driver 3 to supply data signals to the source lines 15S to display an image on the display panel 2.

In the above first embodiment, a plurality of gate drivers 11 are provided for each gate line 13G within the display region. Each gate line 13G is sequentially driven by a scan signal provided by the gate drivers 11 connected with this gate line 13G. This reduces dullness of a scan signal in a gate line compared with conventional implementations where a gate driver is provided outside the display region and a scan signal is input at one end of each gate line, thereby driving the gate lines at high speed. Also, since a plurality of gate drivers 11 are connected with one gate line 13G, even when the gate line 13G is broken at one position, a scan signal is supplied from other portions, maintaining appropriate image display.

Further, in the above first embodiment, control signals such as clock signals and power supply voltage signals supplied to the gate drivers 11 provided in the display region are input through the portions of the picture frame region that are provided along the side of the display panel 2 where the source driver 3 is provided, as shown in FIGS. 1 and 3, for example. Thus, the picture frame width of the portions of the peripheral region along the other sides, where the source driver 3 is not present, may be reduced.

Further, in the above first embodiment, a shield layer 16 is provided between the switching elements and lines of the gate drivers 11 provided in the display region and the pixel electrodes 17, thereby preventing interference between the gate drivers 11 and pixel electrodes 17 such that an image can be displayed appropriately.

Further, in the above first embodiment, a line 15L2 is provided in a pixel region in which a capacitor Cbst constituting a part of a gate driver 11 is provided to extend from the contact CH2 to the vicinity of the contact CH1 such that the aperture ratio of this pixel region is equal to that of other pixel regions, as shown in FIGS. 5B and 8E. This results in a generally uniform aperture ratio among the pixel regions, reducing color irregularity or the like.

Second Embodiment

Figure 10A:
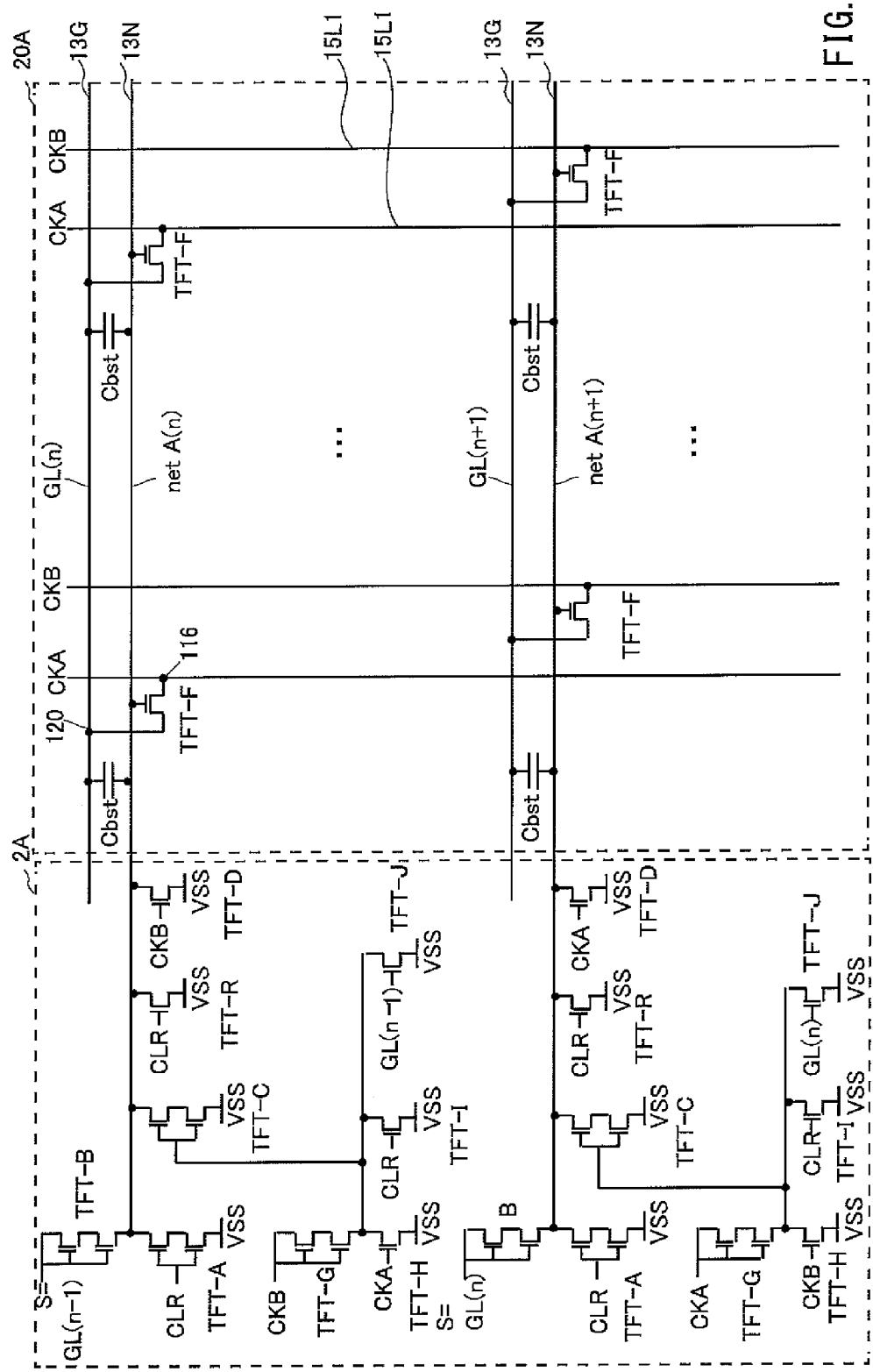
FIG. 10A is a schematic diagram of an example arrangement of a gate driver according to a second embodiment.

The above first embodiment describes an implementation where all the elements constituting each gate driver 11 are provided inside the display region. The present embodiment describes an implementation where some of the elements constituting each gate driver 11 are provided inside the display region. FIG. 10A is a schematic diagram showing a portion of each gate driver 11 provided inside the display region and the other portions of the gate drivers 11 provided outside the display region. As shown in FIG. 10A, in the present embodiment, in the display region 20A of the active-matrix substrate 20a are provided, in addition to the gate lines 13G and source lines 15S, TFTs-F and capacitors Cbst, lines 15L1 for supplying the TFTs-F with clock signals (CKA, CKB), and lines 13N connecting the TFTs-F and capacitors Cbst with the netA.

The portions of the gate drivers 11 except the TFTs-F and capacitors Cbst are provided in the external region 2A (i.e. outside the display region) of the display region 20A of the active-matrix substrate 20a, on one end of each gate line 13G. These portions of the gate drivers 11 are electrically connected with the TFTs-F and capacitors Cbst via lines 13N.

Figure 10B:
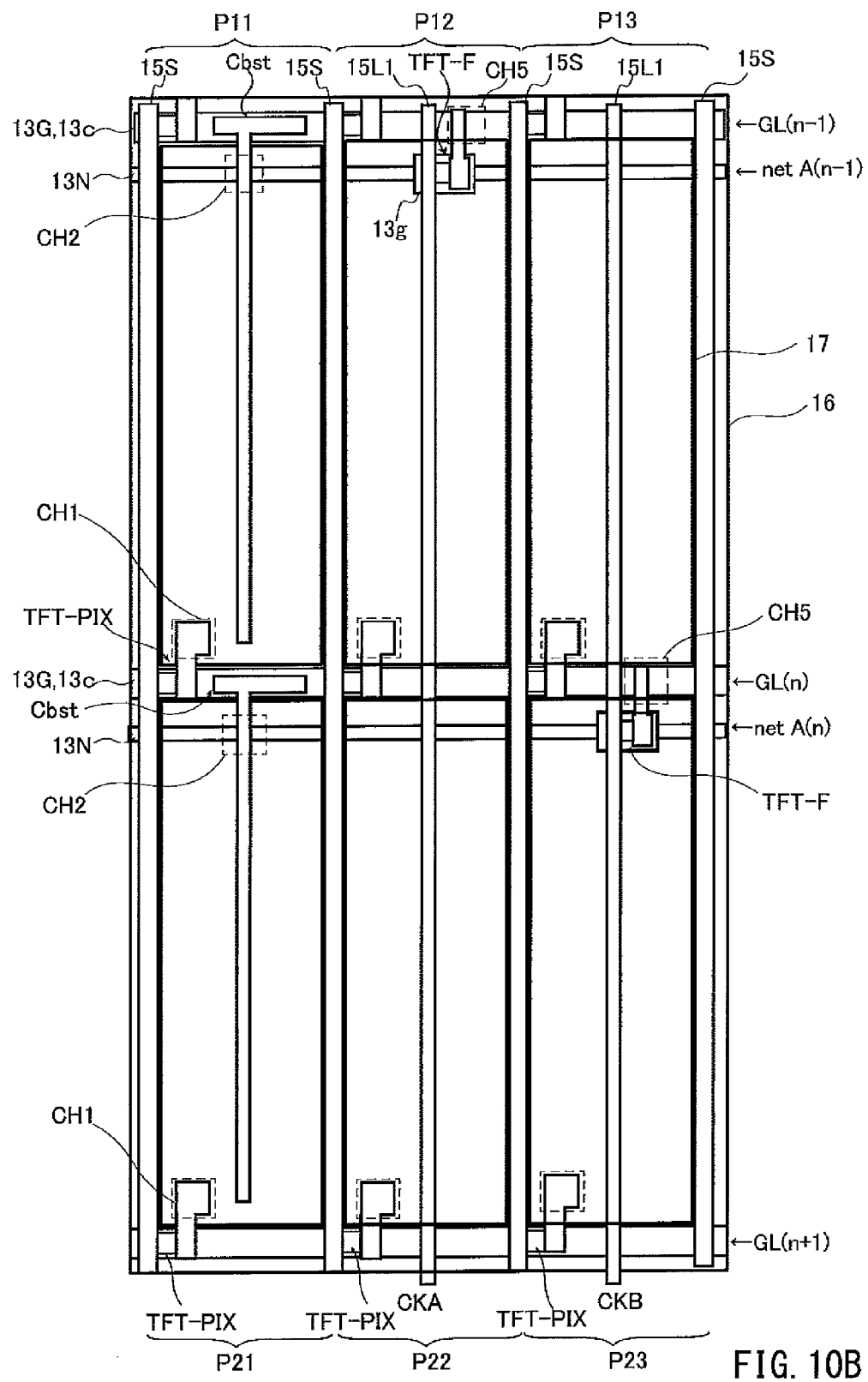
FIG. 10B is an enlarged plan view of pixel regions of a gate driver located in the display region.

How the TFTs-F and capacitors Cbst provided in the display region 20a are connected will be described below. FIG. 10B is an enlarged plan view of pixel regions in which the TFT-F and the capacitor Cbst of a gate driver 11 for driving the lines GL(n−1) and GL(n) are provided. As shown in FIG. 10B, lines 13N are provided that are substantially parallel to the gate lines 13G in the pixel regions P11 to P13 and P21 to P23, each connecting to the netA of a gate driver 11 provided outside the display region.

As is the case in the first embodiment, a capacitor Cbst and a line 15L2 are provided in the pixel regions P11 and P21, and the electrode 15c of the capacitor Cbst is connected with the line 13N via the contact CH2. Further, a line 15L1 to which a clock signal (CKA) is supplied is provided in the pixel regions P12 and P22. A line 15L1 to which a clock signal (CKB) is supplied is provided in the pixel regions P13 and P23. As is the case in the first embodiment, the gate line 13G is connected with the drain terminal via the contact CH5.

In the above second embodiment, the TFTs-F and capacitors Cbst are provided in the display region 20A; alternatively, for example, TFTs-D may be provided in the display region 20A. A TFT-F has the function of switching the driving of a gate line 13G between on and off, while a TFT-D has the function of maintaining the driving of a gate line 13G at the off state in response to a supplied clock signal. These TFTs, which have a larger output than other TFTs, may be provided in the display region 20A to disperse heat emitted by the TFTs, thereby increasing the margin against a malfunction.

Third Embodiment

Figure 11:
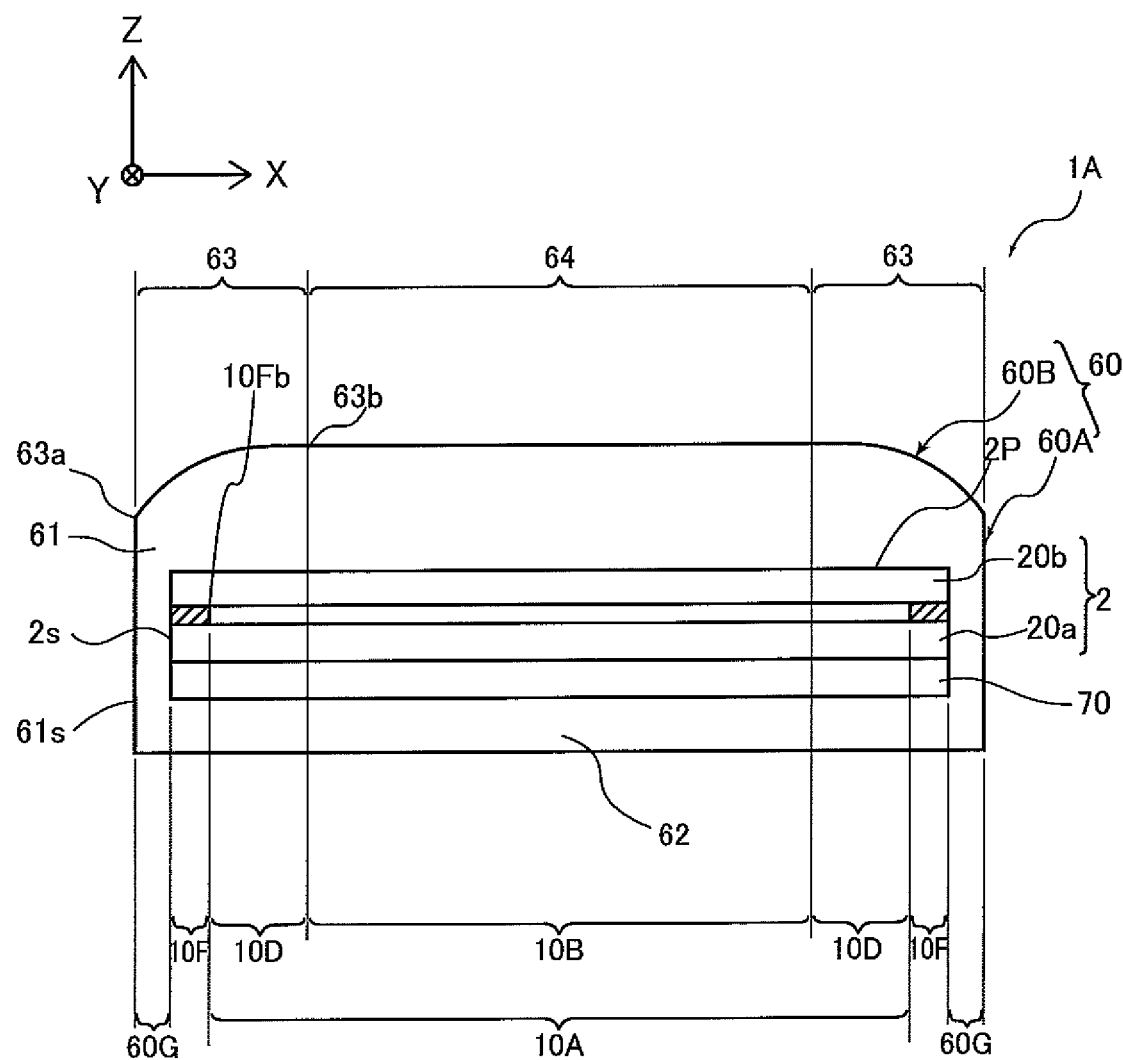
FIG. 11 is a schematic cross-sectional view of a liquid crystal display device according to a third embodiment.

The present embodiment describes a liquid crystal display device including a display panel 2 according to the first embodiment contained in a lens-integrated housing. FIG. 11 is a schematic cross-sectional view of the liquid crystal display device according to the present embodiment. As shown in FIG. 11, the liquid crystal display device 1A includes a lens-integrated housing 60 (i.e. an example of a housing), a display panel 2 and a backlight 70.

The lens-integrated housing 60 includes a housing body 60A (i.e. an example of a second cover portion) and a cover 60B (i.e. an example of a first cover portion). The housing body 60A includes a housing side 61 and a housing bottom 62. The housing side 61 is translucent and is provided on the side 2s of the display panel 2, which is parallel to the Y axis of the display panel 2 shown in FIG. 2, so as to cover the side 2s. The housing bottom 62 is provided below the backlight 70 so as to cover the bottom of the backlight 70.

The cover 60B includes a lens 63 and a flat plate 64. The lens 63 has a viewer's side (in the Z-direction) that is curved in shape. The lens 63 is located to overlie a region that includes the picture frame region 10F, display region 10D and panel-housing region 600 of the display panel 2. The display region 10D is the portions of the lens 63 that are defined between the inner edge 63b of the display region 10A and the inner edge 10Fb of the picture frame region 10F. The panel-housing region 600 is defined between the side 2s of the display panel 2 and the side 60s of the housing side 61. The outer edge 63a of the lens 63 is connected with the housing side 61 at the upper edge of its side 61s. The flat plate 64 is translucent and is located to overlie the display region 10B. The light-emitting surface of the flat plate 64 is constructed so as to be substantially parallel to the display surface 2p of the display panel 2.

Figure 12:
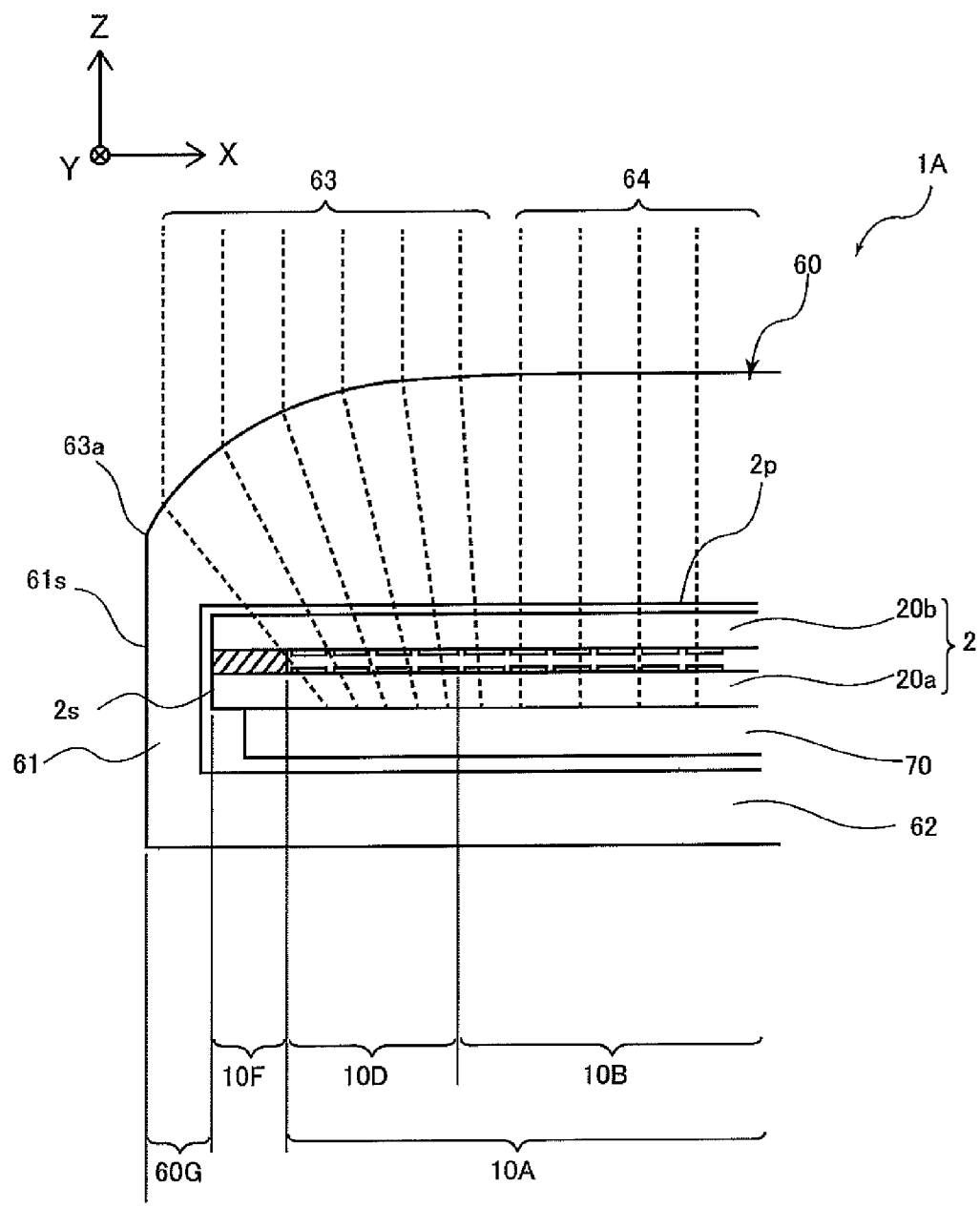
FIG. 12 illustrates how light beams emitted from the display surface of the third embodiment advance.

As discussed in connection with the first embodiment, the display panel 2 has gate drivers 11 located in the display region 10A. As shown in FIGS. 2 and 3, control signals such as clock signals are supplied through the portions of the picture frame region through which control signals and power supply voltage signals are supplied, i.e. the portions of the picture frame region that are provided along one side parallel to the X axis. Thus, in the display panel 2, the width of the portions of the picture frame that are provided along another side parallel to the X axis and the two sides parallel to the Y axis may be reduced. In the present embodiment, the display panel 2 is contained in the lens-integrated housing 60 such that the portions of the picture frame region 10F that are provided along the two sides parallel to the Y axis overlie the lens 63. As shown in FIG. 12, a light beam (indicated by a broken line) emitted from the display surface 2p of the display panel 2 is refracted by the curved surface of the lens 63 and advances straightforward in a direction perpendicular to the display surface 2p (i.e. positive Y-direction). As a result, an image from the display region 10A is displayed on the viewer's side, and the picture frame region 10F is less visible.

Thus, a display panel 2 with two opposite sides that have narrower picture frame portions may be employed to reduce the size of the lens 63 compared with conventional implementations, thereby reducing the weight of the lens-integrated housing 60 and reducing manufacturing costs. That is, in a conventional display panel 2 with gate drivers 11 provided outside the display region 10A, the terminals and other components for supplying data signals and scan signals are located in the picture frame portions along two adjacent sides. In a conventional display panel, these picture frame region portions overlie the lens 63. As the width of the picture frame region 10F increases, the thickness of the lens 63 increases. Thus, if a conventional display panel is employed, a lens 63 with a larger size must be used than in the display panel 2 of the present embodiment, making it difficult to reduce the weight of the lens-integrated housing 60 or reduce manufacturing costs.

Fourth Embodiment

Figure 13:
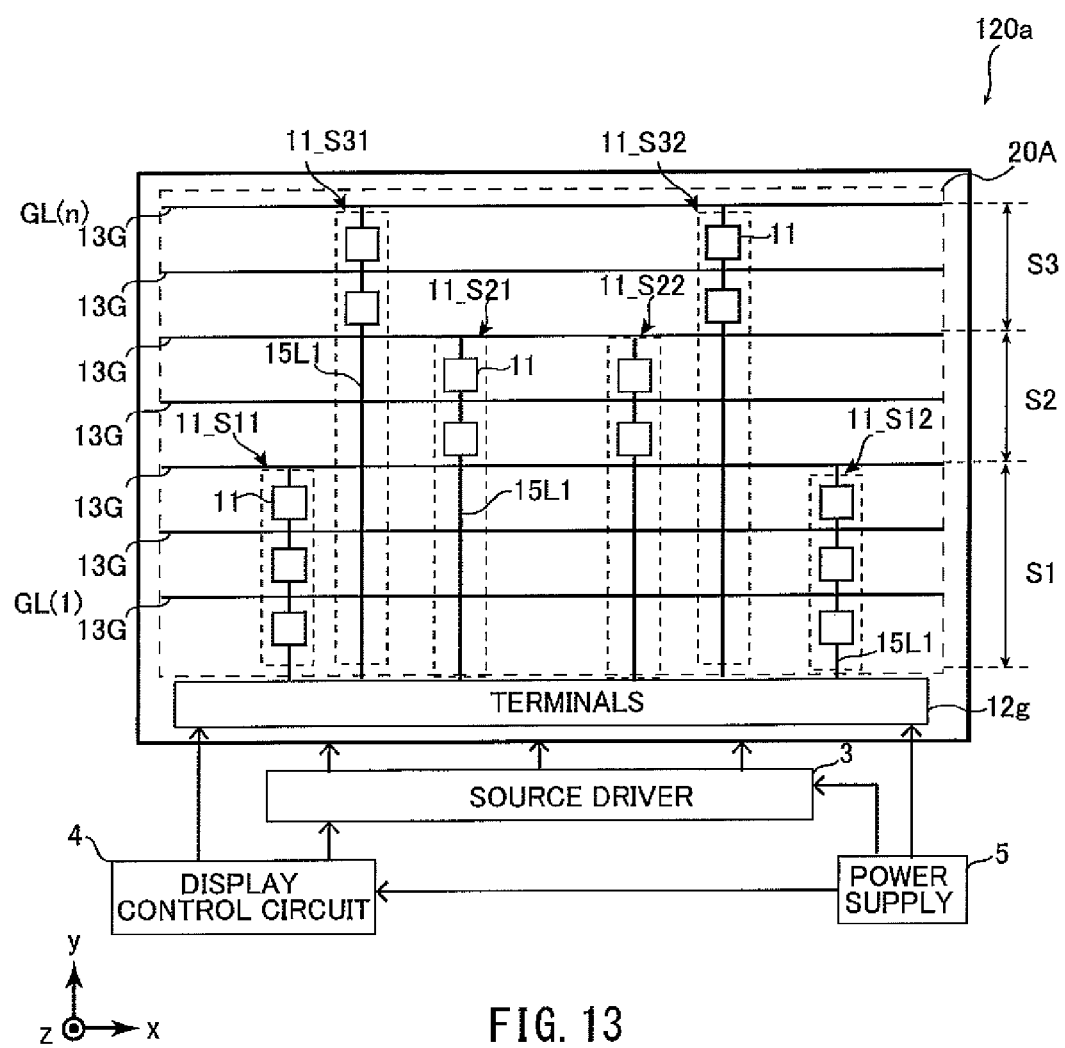
FIG. 13 is a schematic view of an active-matrix substrate according to a fourth embodiment.

Starting from the above first embodiment, the display region may be divided into sub-regions arranged in the direction in which the gate lines 13G are arranged and data may be written for each sub-region. FIG. 13 is a schematic diagram of an active-matrix substrate 120a according to the present embodiment without the source lines 15S and terminals 12s. In FIG. 13, the components that are the same as the corresponding ones of the above first embodiment are labeled with the same reference numerals. The differences from the first embodiment will be described below.

The display region 20A of FIG. 13 includes three separate sub-regions S1, S2 and S3 arranged in the direction in which the gate lines 13G are arranged, i.e. in the Y-direction. In this implementation, the gate lines 13G in the sub-region S3 are driven by the gate driver groups 11_S31 and 11_S32. Each gate driver 11 in the gate driver groups 11_S31 and 11_S32 is provided between two gate lines 13G in the sub-region S3, and no gate driver 11 is provided in the portions of the columns having the gate driver groups 11_S31 and 11_S32 that belong to the other sub-regions (S1 and S2). Each gate driver 11 is connected with a terminal 12g via a line 15L1 and, in response to control signals supplied via the terminal 12g (clock signals, for example), drives the corresponding one of the gate lines 13G.

The gate lines 13G in the sub-region S2 are driven by the gate driver groups 11_S21 and 11_S22. Further, the gate lines 13G in the sub-region S1 are driven by the gate driver groups 11_S11 and 11_S12. Each gate driver 11 of these gate driver groups is located between two gate lines 13G in the sub-region (S2 or S1) in which it is located. No gate driver 11 is provided in the portions of the columns having these gate driver groups that belong to the other sub-regions.

FIG. 13 shows an implementation where two gate drivers 11 drive one gate line 13G; alternatively, only one gate driver 11 may drive a gate line 13G, or three or more gate drivers may drive a gate line.

How data from the source driver 4 is written into the display region 20A of the implementation of FIG. 13 will be described. Signals of data to be displayed in the sub-regions S1, S2 and S3 are provided from the source driver 4 to the source lines 15S (not shown) in the display region 20A on a frame basis. Start pulse signals are supplied from the display control circuit 4 to the gate driver groups so as to start driving the gate lines 13G in the sub-regions at a time point at which the data signals are written into the sub-regions S1, S2 and S3.

Figure 14:
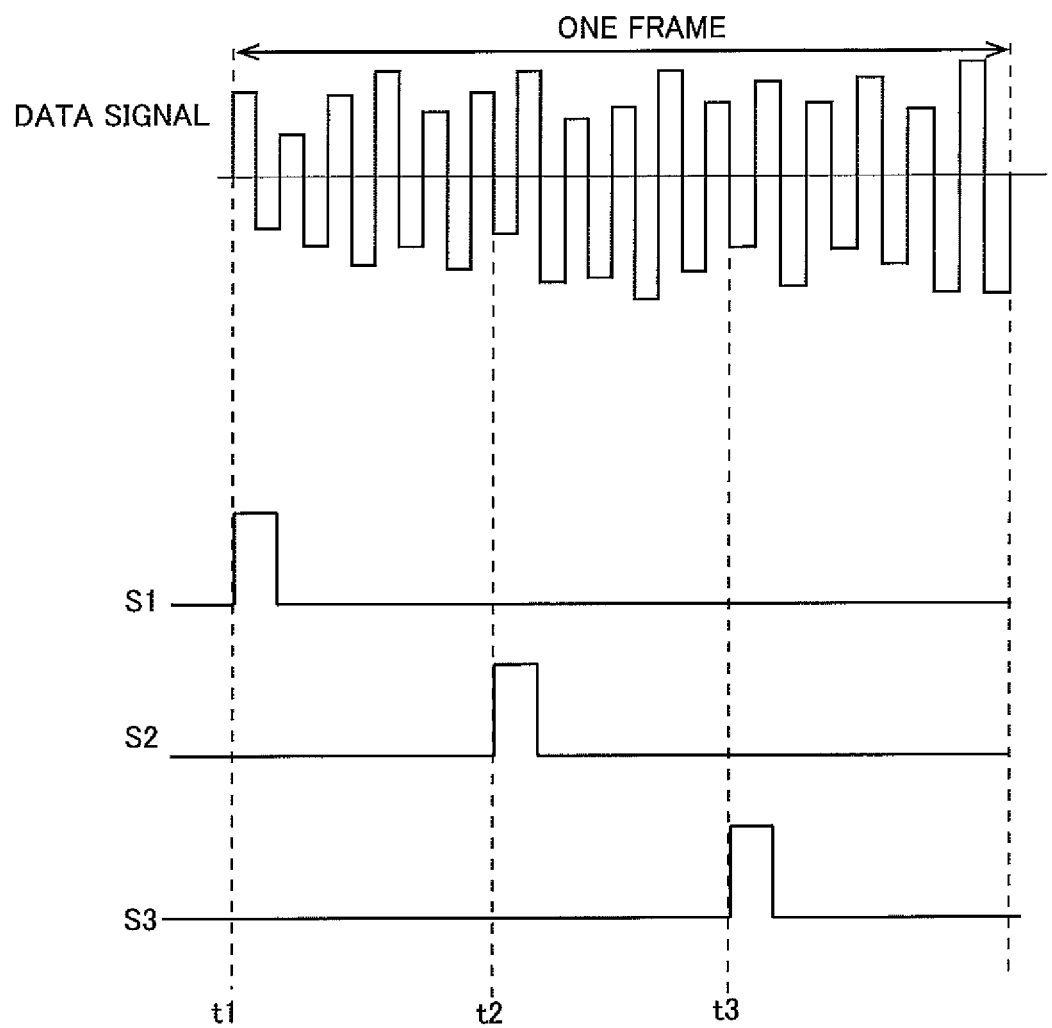
FIG. 14 illustrates the timing for driving gate lines in the sub-regions of the fourth embodiment.

As shown in FIG. 14, in each frame, the data signals for all the sub-regions are output. Beginning at time t1 at which the start pulse signals are supplied, the gate driver groups 11_S11 and 11_S12 sequentially drive the gate lines 13G in the sub-region S1. Thus, data signals are written into the sub-region S1 at the time point at which the gate lines 13G in the sub-region S1 are driven.

At time t2 at which set signals are provided by the gate driver groups 11_S11 and 11_S12 to the gate lines 13G of the sub-region S2, start pulse signals are supplied to the gate driver groups 11_S21 and 11_S22. After the start pulse signals are supplied, the gate driver groups 11_S21 and 11_S22 sequentially drive the gate lines 13G of the sub-region S2. Thus, data signals are written into the sub-region S2 at the time point at which the gate lines 13G in the sub-region S2 are driven.

At time t3 at which set signals are provided by the gate driver groups 11_S21 and 11_S22 to the gate lines 13G of the sub-region S3, start pulse signals are supplied to the gate driver groups 11_S31 and 11_S32. After the start pulse signals are supplied, the gate driver groups 11_S31 and 11_S32 sequentially drive the gate lines 13G of the sub-region S3. Thus, data signals are written into the sub-region S3 at the time point at which the gate lines 13G in the sub-region S3 are driven.

Thus, when data is written to the entire display region 20A, data signals for all the sub-regions are supplied to the source lines 15S (not shown), and start pulse signals are supplied such that, in the time period during which data for each sub-region is written, the gate lines 13G in this sub-region start to be driven. Thus, data is sequentially written in the order of the sub-regions S1, S2 and S3.

Figure 15:
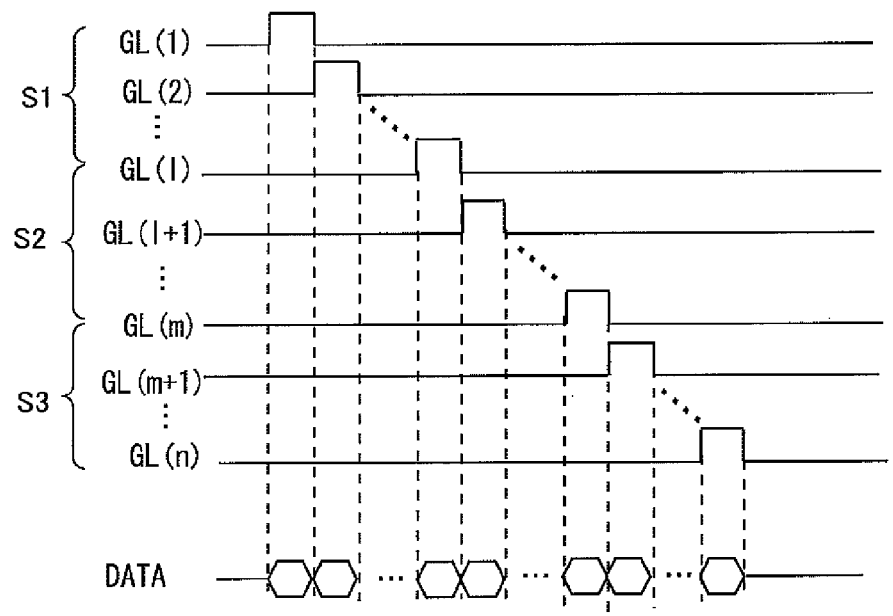
FIG. 15 is a timing chart illustrating how data is written into the sub-regions of the fourth embodiment.

How data signals are written at different frequencies for different sub-regions will be described below. For example, if data signals are written to the sub-regions S1 and S3 at a frequency of 60 Hz and data signals are written to the sub-region S2 at a frequency of 1 Hz, for the first frame, data signals are written to the sub-regions as shown in FIG. 15 by sequentially driving the gate lines 13G in the order of the sub-regions S1 to S3, as described above.

For the second to sixtieth frames, in the time period during which data is written for the sub-regions S1 and S3 (i.e. the selection periods for the gate lines 13 of the sub-regions S1 and S3), data signals for images to be displayed in the sub-regions S1 and S3 are provided from the source driver 4 to the source lines 15S (not shown). Further, in the period during which data is written for the sub-region S2, data signals with the smallest amplitude is provided by the source driver 4. Data signals with the smallest amplitude may be, for example, data signals indicating black if the active-matrix substrate 120a is in normally black display mode. In the period during which data is written to the sub-region S2 (i.e. the selection period for the gate lines 13 of the sub-region S2), the display control circuit 4 does not supply control signals (such as clock signals) and does not drive the gate driver groups 11_S21 and 11_S22.

Figure 16:
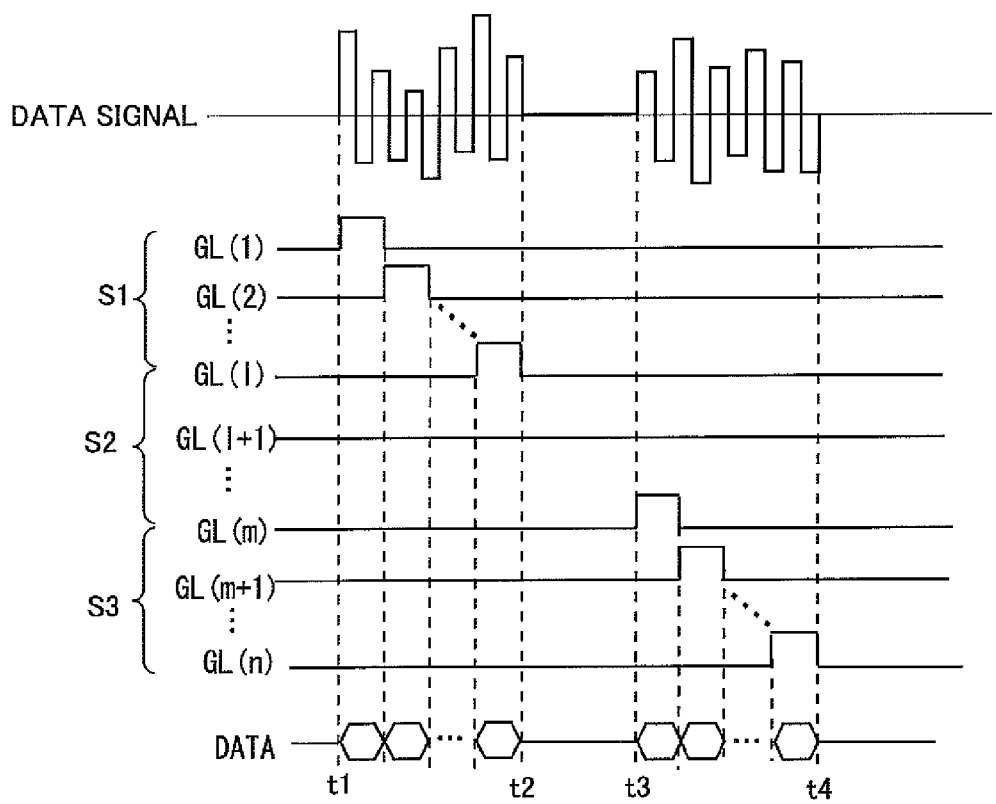
FIG. 16 is a timing chart illustrating how data is written into the sub-regions of the fourth embodiment.

Thus, as shown in FIG. 16, in the period during which data is written for the sub-region S1 (t1 to t2), the gate lines 13G of the sub-region S1 are sequentially driven such that data is written to the sub-region S1. Then, in the period during which data is written to the sub-region S2 (t2 to t3), the gate lines 13G of the sub-region S2 are not driven and data signals indicating black are output such that no data is written to the sub-region S2. After the period during which data is written for the sub-region S2, the gate lines 13G of the sub-region S3 are sequentially driven and data is written to the sub-region S3. Thus, as the gate lines 13G of the sub-region S2 are only driven for the first frame, data is written to the sub-region S2 at 1 Hz and data is written to the other sub-regions S1 and S3 at 60 Hz.

The present embodiment describes an implementation where data is written to the sub-regions at 60 Hz and 1 Hz; alternatively, data may be written to the sub-regions at frequencies of 10 Hz and 0.1 Hz, for example. The present embodiment only requires that data be written to the sub-regions at at least two different frequencies. Providing a sub-region to which data is written at a lower frequency than to other sub-regions reduces power consumption.

Fifth Embodiment

Starting from the above first embodiment, the gate lines 13G may be driven on a single-row basis or a multiple-row basis depending on the image to be displayed. The following describes such an arrangement.

To improve the quality of moving images displayed, data may be written at a frequency of 120 Hz or 240 Hz. The higher the frequency, the more quickly the liquid crystal layer must be charged, and, to address this, a plurality of gate lines may be driven simultaneously. In such a case, for example, the gate lines in the N+1th and Nth rows are driven simultaneously such that data signals written to the pixels of the Nth row are also written to the pixels of the N+1th row. In the case of moving images, the pixels of the same column in the Nth and N+1th rows receive data signals indicating substantially the same color, and, as such, a pixel having a data signal that is intended for a pixel in an adjacent row rarely poses a problem when displaying an image. On the other hand, in the case of a still image or video with sharp contours, writing to a pixel a data signal intended for a pixel in an adjacent row may cause a problem: for example, an image may be blurred. In the present embodiment, the gate lines 13G are driven on a single-row basis when an image such as a still image is to be displayed, and the gate lines 13G are driven on a multiple-row basis when moving images are to be displayed.

Figure 17:
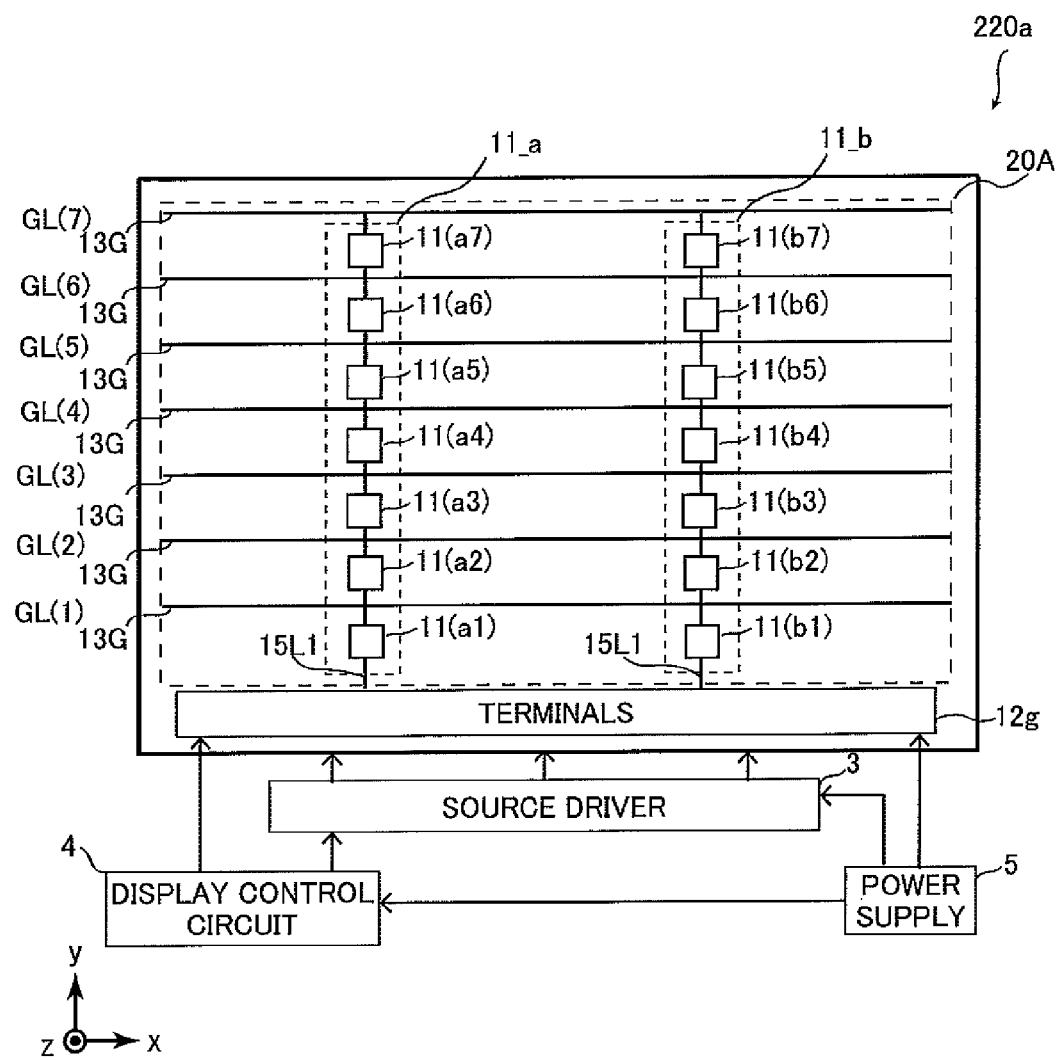
FIG. 17 is a schematic view of an active-matrix substrate according to a fifth embodiment.

FIG. 17 is a schematic view of an active-matrix substrate according to the present embodiment. In FIG. 17, for convenience, the source lines 15S and terminals 12s are not shown and the gate drivers 11 and lines 15L 1 are simplified. Further, in the present implementation, for convenience, gate lines 13G: GL(1) to GL(7) are provided on the active-matrix substrate 220a.

A gate driver group 11_a and gate driver group 11_b are provided on the active-matrix substrate 220a. Each of the gate driver group 11_a and gate driver group 11_b includes a plurality of gate drivers 11 each connected with one of the gate lines 13G: GL(1) to GL(7). The gate driver group 11_a includes gate drivers 11(a1) to (a7). The gate driver group 11_b includes gate drivers 11(b1) to (b7). For example, the gate line 13G: GL(1) is driven by the gate drivers 11(a1) and 11(b1). The gate line 13G: GL(2) is driven by the gate drivers 11(a2) and 11(b2). Similarly, each of the gate lines 13G: GL(3) to GL(7) is driven by two gate drivers 11, belonging to the gate driver groups 11_a and 11_b, connected with the corresponding gate line 13G.

When an image such as a still image is to be displayed, as is the case in the first embodiment, the gate driver 11 of the gate driver group 11_a and the gate driver 11 of the gate driver group 11_b for each gate line 13G are synchronized to drive this gate line 13G.

Figure 18:
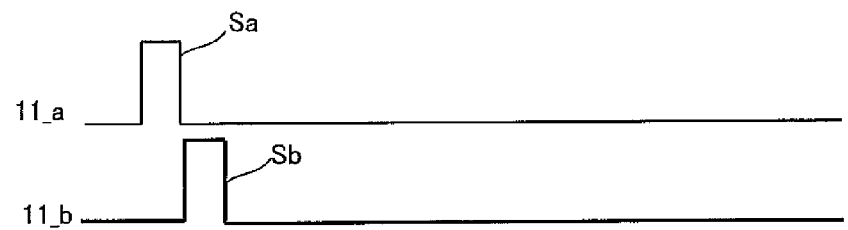
FIG. 18 illustrates the timing for supplying start pulses in the fifth embodiment.

When moving images are to be displayed, start pulse signals are supplied to the gate driver group 11_a and the gate driver group 11_b at different time points. FIG. 18 illustrates the timing for supplying start pulse signals to the gate driver groups 11_a and 11_b from the display control circuit 4. In the example of FIG. 18, a start pulse signal Sa is supplied to the gate driver group 11_a, and then a start pulse signal Sb is supplied to the gate driver group 11_b. That is, a start pulse signal for the gate driver group 11_b is supplied at a time point at which the driving time for the gate line 13G of the first row (GL(1)) by the gate driver 11 of the gate driver group 11_a ends.

Figure 19:
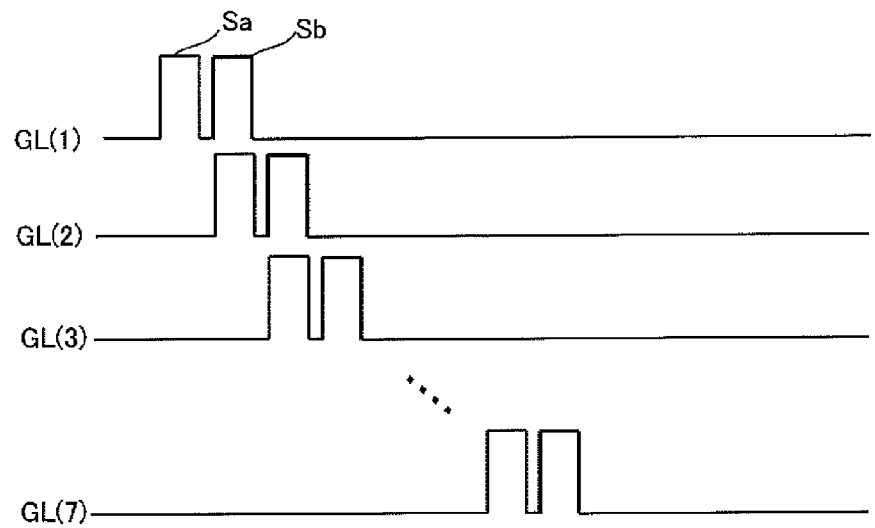
FIG. 19 illustrates the timing for driving gate lines in the fifth embodiment.

FIG. 19 illustrates the timing in which the gate lines 13G: GL(1) to GL(7) are driven when start pulse signals are supplied to the gate driver groups 11_a and 11_b. Each of the gate lines 13G: GL(1) to GL(7) is driven by the corresponding gate driver 11 of the gate driver group 11_a and then is driven by the corresponding gate driver 11 of the gate driver group 11_b. Thus, as illustrated in FIG. 19, each gate line 13G is driven twice successively. Then, at the time point at which the gate line 13G of the Nth row is driven by the gate driver group 11_b, the gate line 13G of the N+1th row is driven by the gate driver group 11_a such that the gate lines 13G of the Nth and N+1th rows are driven simultaneously.

The source driver 3 provides data signals for the pixels of each row to the source lines 15S (not shown) at a time point at which the gate line 13G of this row is driven for the second time, i.e. the corresponding gate driver 11 of the gate driver group 11_b drives this gate line 13G.

Figure 20:
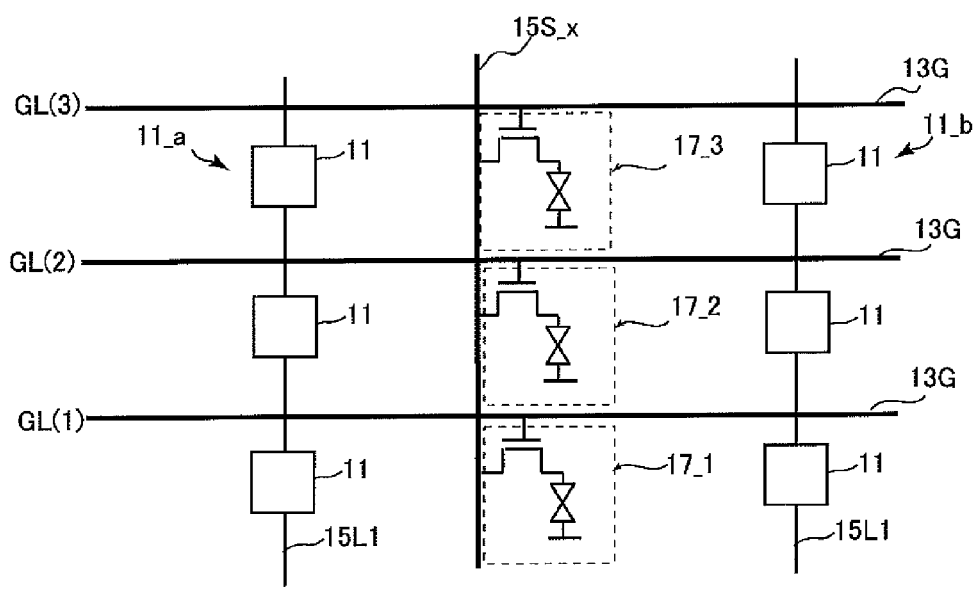
FIG. 20 is a enlarged schematic diagram of a pixel shown in FIG. 17.

FIG. 20 is an enlarged schematic diagram of an area containing the pixels 17_1, 17_2 and 17_3 formed by the gate lines 13G: GL(1) to GL(3), respectively, and the source line 15S_x of the Xth column, shown in FIG. 17. From the pixel 17_1 of the row GL(1) onward, a data signal for the pixel is provided to the source line 15S_x at a time point at which the gate line 13G of the associated row is driven for the second time.

Figure 21:
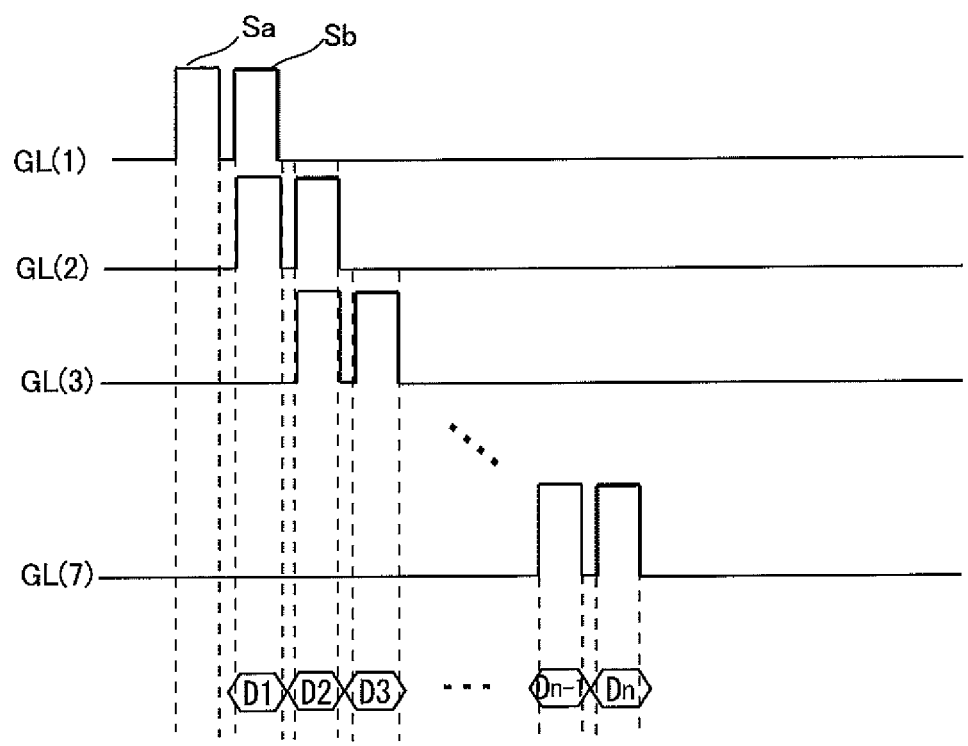
FIG. 21 is a timing chart illustrating how data is written in the fifth embodiment.

As shown in FIG. 21, the data D1 for the pixel 17_1 is written to the pixel 17_1 of the row GL(1) at a time point at which the gate line 13G: GL(1) is driven for the second time. Then, the data D1 for the pixel 17_1 of the preceding row is written to the pixel 17_2 of the row GL(2) at the first driving time point, and the data D2 for the pixel 17_2 is written thereto at the second driving time point. The data D2 for the pixel 17_2 of the preceding row is written to the pixel 17_3 of the row GL(3) at the first driving time point, and the data D3 for the pixel 17_3 is written thereto at the second driving time point. Similarly, the data Dn−1 for the pixel of the preceding row is written to the pixel 17_7 (not shown) of the row GL(7) at the first driving time point, and the data Dn for the pixel 17_n is written thereto at the second driving time point. Thus, for the pixel of a given row, the data that is supposed to be written to that pixel is written thereto at the time point at which the gate line 13G of this row is driven for the last time.

The present embodiment shows an implementation where one gate line 13G is driven by two gate drivers 11 at different time points to drive two gate lines 13G simultaneously; alternatively, three or more gate drivers 11 may drive one gate line 13G. The present embodiment only requires that one gate line 13G is driven by at least the number of gate drivers 11 that is equal to the number of gate lines 13G that are driven simultaneously. That is, if N gate lines 13G (N>2) are to be driven simultaneously, N different data signal voltages are applied to one pixel. Of course, in such a case, for a given pixel, a data signal that is supposed to be written to this pixel is supplied as the final written signal for this pixel.

Sixth Embodiment

In the above first embodiment, the line 15L1 formed by the source line layer 15 is provided on top of the gate line layer 13, with the gate insulating film 21 being present in between, and the gate lines 13G cross the lines 15L1, with the gate insulating film 21 being present in between (see FIG. 7C). The parasitic capacitance at the intersection of a line of the gate line layer 13 and a line of the source line layer 15 is relatively large, potentially causing a disturbance, delay or the like in clock signals or the like supplied by a line 15L1. The present embodiment describes an implementation where the line 15L1 is formed such that the gate line 13G does not cross the line 15L1, with the gate insulating film 21 being present in between.

Figure 22:
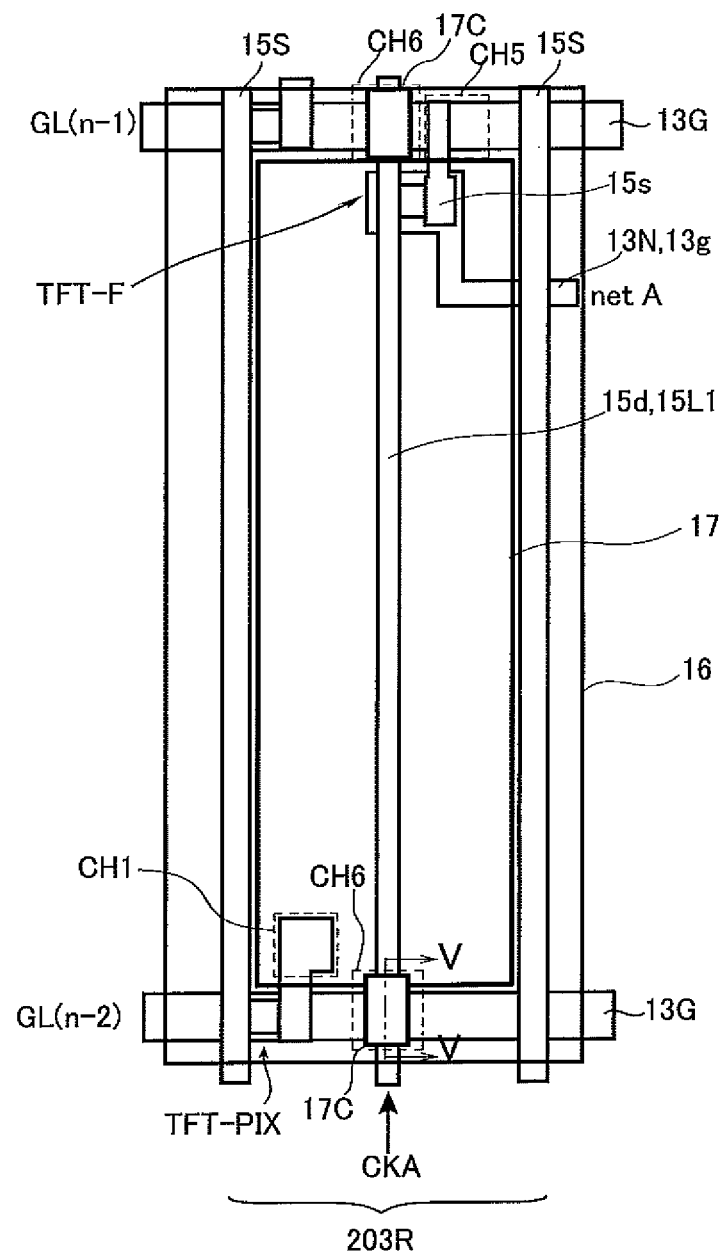
FIG. 22 is a schematic plan view of the pixel region in which a switching element (TFT-F) is provided according to a sixth embodiment.

FIG. 22 is a schematic plan view of the pixel region 203R in which a switching element (TFT-F) constituting a part of the gate driver 11 described above is provided. In FIG. 22, the line 15L1 formed by the source line layer 15 and the drain electrode 15d of the TFT-F are connected with a connection line 17C via a contact CH6 that crosses the gate line 13G. The connection line 17C is provided in the same layer as the pixel electrode 17.

Figure 23:
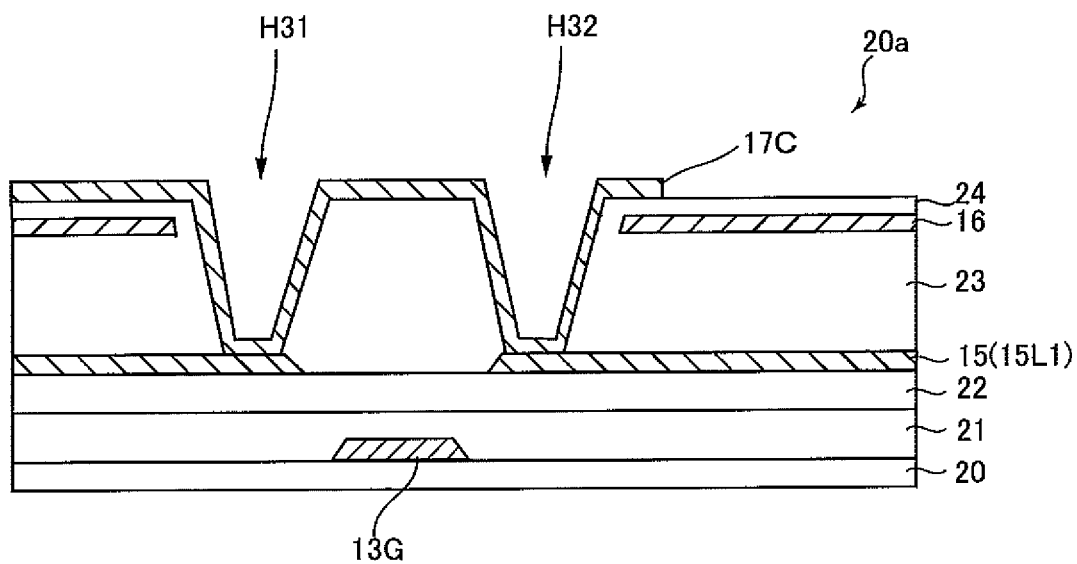
FIG. 23 is a schematic cross-sectional view of the contact CH6 of FIG. 22 taken along line V-V.

FIG. 23 is a schematic cross-sectional view of the contact CH6 of FIG. 22 taken along line V-V. As shown in FIG. 23, on top of the gate line 13G are provided a gate insulating film 21 and a protection film 22. The line 15L1, formed by the source line layer 15, is provided on top of the protection film 22 so as to be broken into separate portions above the gate line 13G, with the gate insulating film 21 being present in between. On top of the line 15L1 is provided a protection film 23 made of an insulating film and having a larger thickness than the gate insulating film 21. On top of the protection film 23 is provided a shield layer 16 made of a transparent conductive film, and, on top of the shield layer 16 is provided an interlayer insulating film 24. Contact holes H31 and H32 are provided near the opposite ends of the separated line 15L1 portions to extend through the protection film 23, shield layer 16 and interlayer insulating film 24. A connection line 17C made of ITO, similar to the pixel electrode 17, is provided on the contact holes H31 and H32, and the separate portions of the line 15L1 are connected with the connection line 17C at the contact holes H31 and H32.

Thus, the separate portions of the line 15L1 above the gate line 13G are connected via the connection line 17C, thereby allowing control signals such as clock signals from the terminals 12G to be supplied to the gate drivers 11. Further, the line 15L1 is not present at the location where it would otherwise cross the gate line 13G, with the gate insulating film 21 being present in between, reducing the signal disturbance or delay caused by the electric capacitance of the gate line 13G.

Seventh Embodiment

The present embodiment describes an implementation where a portion of the gate line 13G near the intersection of itself and the source line 15S is smaller than the maximum width of the gate line 13G such that the gate line 13G can be easily broken.

Figure 24A:
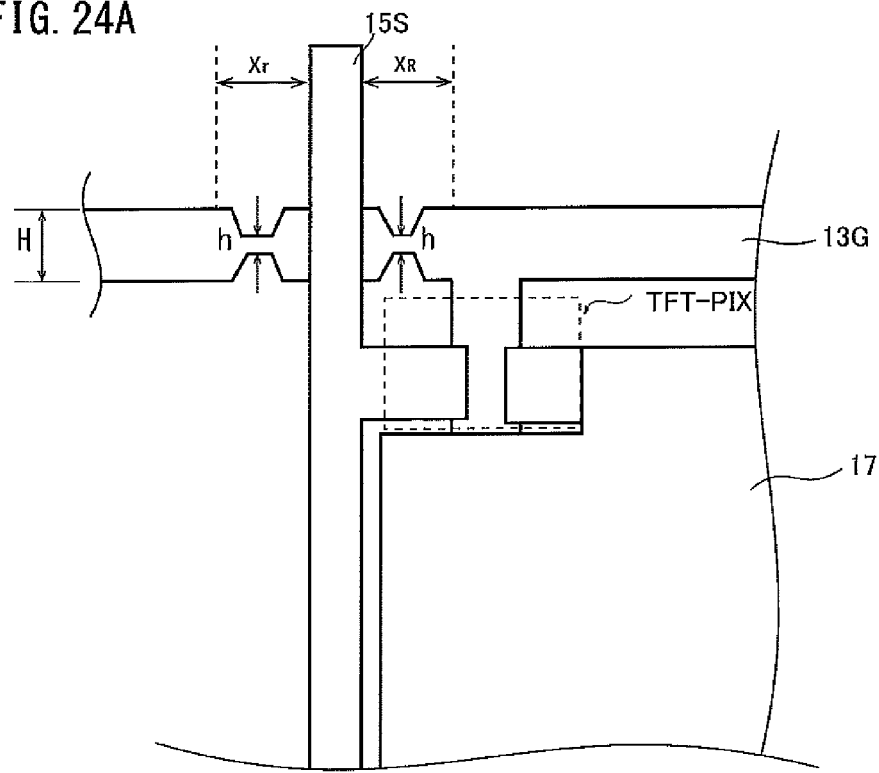
FIG. 24A is an enlarged schematic view of the intersection of a gate line and source line of a seventh embodiment.

FIG. 24A is an enlarged schematic view of an area containing the intersection of a gate line 13G and a source line 15S. As shown in FIG. 24A, an image display TFT (TFT-PIX) is connected with the gate line 13G and source line 15S, and a pixel electrode 17 is connected with the TFT-PIX. The gate line 13G is constructed such that each of a portion near the intersection of the gate line and source line 15S that is adjacent its connection with the gate terminal of the TFT-PIX, ($x_R$), and a portion near the intersection of the gate line and source line 15S that is not adjacent its connection with the TFT-PIX, ($x_L$), has a portion with a width h that is smaller than the maximum width H of the gate line 13G. Each of the portions of the gate line 13G that have the width h are narrower and therefore can be easily broken than other portions of the line. In the present embodiment, the maximum width H of the gate line 13G may be about 10 µm, for example, and the width h may be about 5 µm, for example.

As is the case in the first embodiment, a plurality of gate drivers 11 are provided, each corresponding to one of the gate lines 13G. Thus, when there is a short circuit at the intersection of a gate line 13G and source line 15S and between two adjacent gate drivers 11 (not shown) provided for the same row, the gate line 13G may be broken at the portions of the gate line 13G that have the width h to cut off the portion of the gate line 13G where there is a short circuit. Even when the gate line 13G is broken, that one of the gate line 13G portions separated at the source line 15S to which the TFT-PIX is connected (hereinafter referred to as TFT-PIX connection portion) is driven by a gate driver 11 (not shown) that is located on the TFT-PIX connection portion. That one of the gate line 13G portions separated at the source line 15S to which the TFT-PIX is not connected (hereinafter referred to as TFT-PIX non-connection portion) is driven by a gate driver 11 (not shown) that is located on the TFT-PIX non-connection portion. That is, even when the gate line 13G is broken, the TFTs-PIX connected with the broken gate line 13G can function such that supplying data signals to the source lines 15S causes the pixel at the broken location to display an image.

Figure 24B:
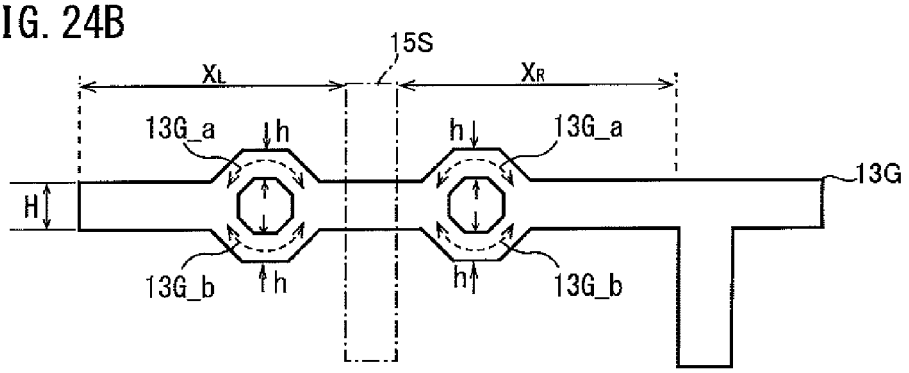
FIG. 24B illustrates a variation of a gate line of the seventh embodiment.
Figure 24C:
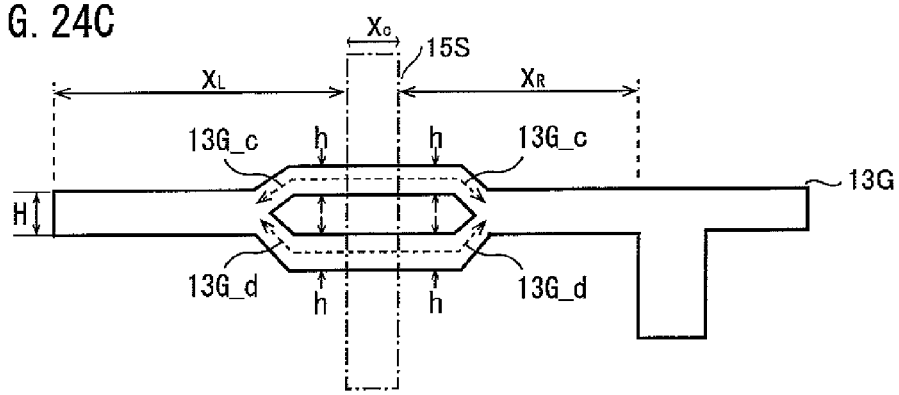
FIG. 24C illustrates a variation of a gate line of the seventh embodiment.

The gate line 13G of FIG. 24A is an implementation where a portion thereof near the intersection thereof and the source line 15S has a smaller width than the maximum width of the gate line 13G; alternatively, the gate line may be constructed as shown in FIGS. 24B and 24C, for example. Each of FIGS. 24B and 24C is an enlarged schematic view of a portion of a gate line 13G near the intersection thereof and a source line 15S.

As shown in FIG. 24B, each of the portions of the gate line 13G near the intersection ($x_R$, $x_L$) has a portion branched into two gate line sub-portions 13G_a and 13G_b. In the implementation of FIG. 24C, the gate line 13G is branched into two gate line sub-portions 13G_c and 13G_d at the portions near the intersection ($x_R$, $x_L$), and each of the gate line sub-portions 13G_c and 13G_d is continuous at the intersection portion ($x_C$). Each of the gate line sub-portions 13G_a and 13G_b and gate line sub-portions 13G_c and 13G_d has a width h that is smaller than the maximum width H.

If a gate line 13G has a portion with a small width h as in FIG. 24A, the resistance is larger in such a portion, potentially causing a signal delay. In the implementations of FIGS. 24B and 24C, each of the gate line sub-portions (13G_a, 13G_b, 13G_c and 13G_d) has a width h that is substantially equal to that of FIG. 24A; however, in the implementations of FIGS. 24B and 24C, portions of a small width h are provided in parallel, reducing the resistance compared with the implementation of FIG. 24A. The sum of the widths h may be equal to or larger than the width H. That is, the gate line may be constructed such that h×2≥H if it is branched into two. Thus, the resistance of the entire portion with a branch is equal to or smaller than the resistance of the other portions (without a branch).

Eighth Embodiment

In the above first embodiment, luminance unevenness or the like may be produced by the difference between the aperture ratio of a pixel region with an element that constitutes a part of a gate driver 11 (hereinafter referred to as gate driver region) and that of a pixel region without an element constituting a part of a gate driver 11 (hereinafter referred to as no-gate driver region). In view of this, in the present embodiment, a no-gate driver region is constructed so as to reduce the difference between the aperture ratio of the gate driver regions and that of the no-gate driver regions.

Figure 25A:
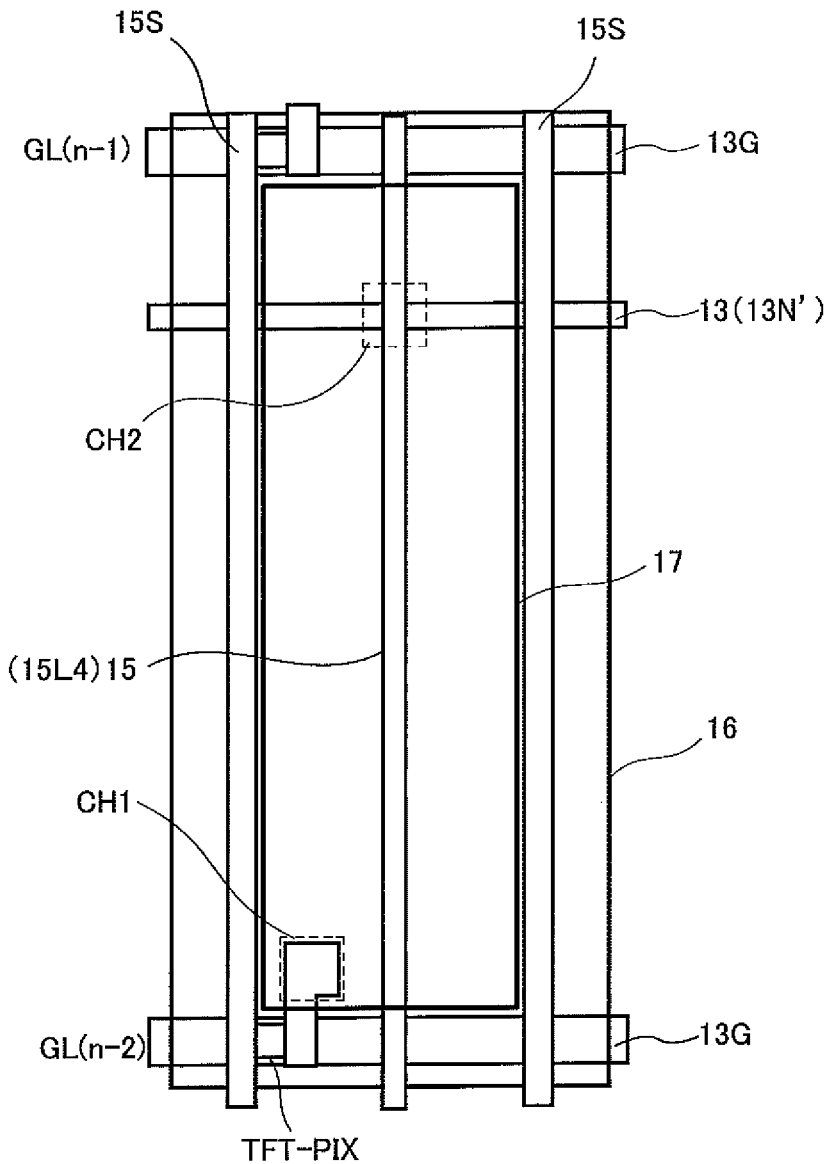
FIG. 25A is a schematic plan view of a no-gate-driver region of an eighth embodiment.

FIG. 25A is a schematic plan view of a no-gate driver region according to the present embodiment. In FIG. 25A, the components that are the same as the corresponding ones of the first embodiment are labeled with the same reference numerals as in the first embodiment. As shown in FIGS. 8A to 8D for the above first embodiment, in a gate driver region, a line 15L1 formed by the source line layer 15 is provided to be generally parallel to the source lines 15S. In view of this, in a no-gate driver region, a dummy line 15L4 (i.e. adjustment line) formed by the source line layer 15 is provided to be generally parallel to the source lines 15S, as shown in FIG. 25A. The dummy line 15L4 has a length and width that are substantially equal to those of the line 15L1. Although the region where light is blocked by the black matrix is not indicated in FIG. 25A, the area in which the gate line 13G, dummy line 15L4 and source line 15S are provided is shielded by the black matrix, as is the case in FIG. 6 of the above first embodiment such that the aperture ratio is substantially equal to that of the gate driver region. This construction reduces the difference between the aperture ratio of the no-gate driver regions and that of the gate driver regions, reducing luminance unevenness or the like.

Further, as shown in FIGS. 8A, 8D and 8E for the above first embodiment, in a gate driver region, a line 13N formed by the gate line layer 13 is provided to be generally parallel to the gate line 13G. In view of this, as shown in FIG. 25A, in a no-gate driver region, a dummy line 13N' (i.e. adjustment line) formed by the gate line layer 13 is provided to be generally parallel to the gate line 13G. In this implementation, the dummy lines 13N' and 15L4 are connected via the contact CH2. If an auxiliary capacitance is to be provided in a pixel, the dummy line 13N' may be used as an auxiliary capacitance line and the dummy line 15L4 may be used as a line for supplying a voltage signal to the auxiliary capacitance line. Alternatively, the dummy line 13N' may be used as a common electrode line and the dummy line 15L4 may be used as a line for supplying a voltage signal to the common electrode line. Providing a dummy line 13N' reduces the difference between the parasitic capacitance between the source line layer 15 and gate line layer 13 in the no-gate driver regions and that for the gate driver regions, reducing display unevenness. FIG. 25A shows an implementation where the dummy lines 13N' and 15L4 are connected with each other within the pixel; alternatively, if voltage signals for the common electrode and auxiliary capacitance are supplied to these dummy lines separately, these dummy lines do not need be connected with each other within the pixel.

(Example Application of Eighth Embodiment)

In the above eighth embodiment, a parasitic capacitance is produced between the source line 15S and the dummy line 15L4 provided in the no-gate driver region. As discussed above, a constant voltage signal is supplied to the dummy line 15L4 for controlling the potential of the common electrode and auxiliary capacitance. On the other hand, in the gate driver region, a parasitic capacitance is produced between the source line 15S and a node in the gate driver 11 such as the netA or netB formed by the gate line layer 13. During the period where the TFT-C of the gate driver 11 is on, the netA or netB is fixed to the power supply voltage VSS; during the period where the TFT-C is off, it is in a floating state.

The no-gate driver region has a parasitic capacitance between the source line 15S and the dummy line 15L4 with a fixed, generally constant potential, and the gate driver region has a parasitic capacitance between the source line 15S and a node that may be in a floating state; as such, there is a difference between the capacitance of the source line 15S in the no-gate driver regions and that for the gate driver regions. As a result, there is a difference between the charging rate of the source line 15S encountered when data is written to a gate driver region and that for a no-gate driver region, causing luminance unevenness among the gate driver regions and no-gate driver regions. Particularly, luminance unevenness can be easily perceived when a half-tone image is displayed. In view of this, when data for a half-tone image is to be written to a gate driver region, this image data may be adjusted. A specific arrangement for this will be described below.

Figure 25B:
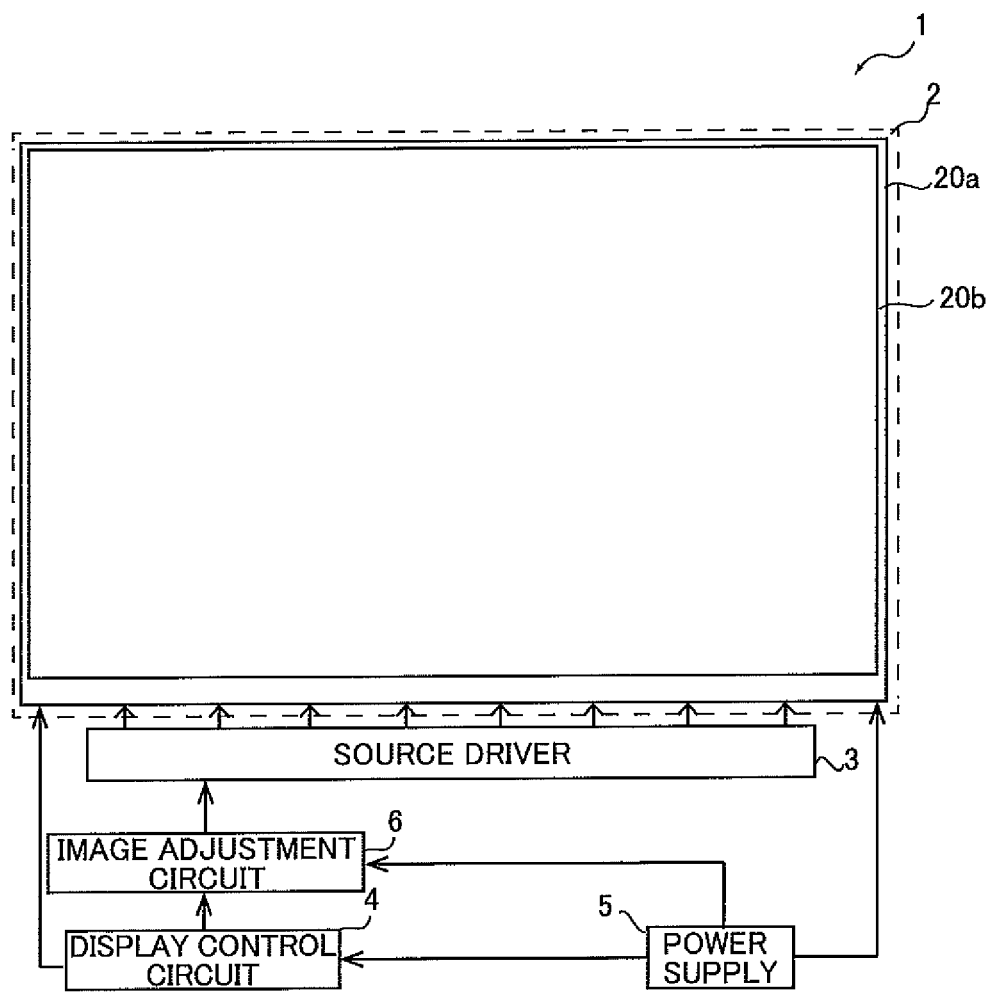
FIG. 25B is a schematic view of the liquid crystal display device of an example application of the eighth embodiment.

FIG. 25B is a schematic view of an arrangement of the liquid crystal display device 1 according to the present example application. As shown in FIG. 25B, in addition to the components of the first embodiment, an image adjustment circuit 6 is provided. The image adjustment circuit 6 is electrically connected with the display control circuit 4, source driver 3 and power supply 5. The image adjustment circuit 6 supplies the source drive 3 with a data signal with a voltage in the level equal to the voltage of a data signal to be written to a no-gate driver region plus a predetermined amount.

Figure 25C:
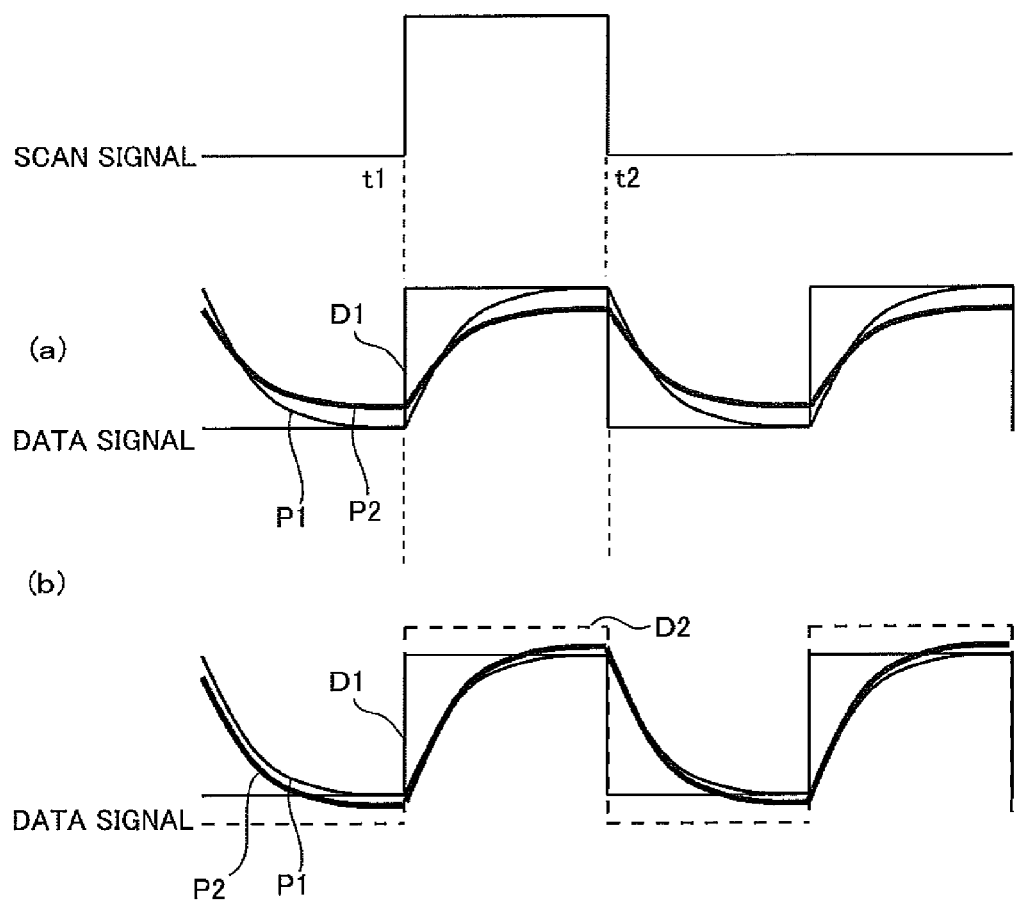
FIG. 25C illustrates how pixel potentials change in the example application of the eighth embodiment.

FIG. 25C shows drive waveforms for a pixel encountered when an unadjusted data signal and a data signal adjusted by the image adjustment circuit 6 are supplied to the source line 15S of the no-gate driver region. As shown in FIG. 25C(a), if an unadjusted data signal D1 is supplied to the source line 15S at time t1, at which the gate line 13G of the no-gate driver region is driven, the potential of the source line 15S of the gate driver region fluctuates as indicated by the wave P1. The potential of the source line 15S of the no-gate driver region fluctuates as indicated by the wave P2. That is, the potential of the pixel of the no-gate driver region is smaller than the potential of the pixel of the gate driver region, causing luminance unevenness among the no-gate driver regions and gate driver regions.

To address this, the image adjustment circuit 6 supplies the pixel of a no-gate driver region with a data signal D2 (indicated by a broken line) with a voltage in the level equal to the voltage of the data signal D1 plus a predetermined amount. Referring to (b) of FIG. 25C, when a data signal D2 is supplied to the pixel of the no-gate driver region, the potential of the source line 15S of the no-gate driver region is generally equal to the potential of the source line 15S of the gate driver region. This reduces luminance unevenness among the gate driver regions and no-gate driver regions. The above example application describes an implementation where the voltage of the data signal written to a no-gate driver region is increased; alternatively, the potential of the data signal written to a gate driver region may be reduced by a predetermined amount.

Ninth Embodiment

The present embodiment describes an implementation where each pixel is composed of two sub-pixels with different luminance levels to improve viewing angle characteristics when the display mode of the liquid crystal display device 1 is the vertical alignment (VA) mode.

Figure 26:
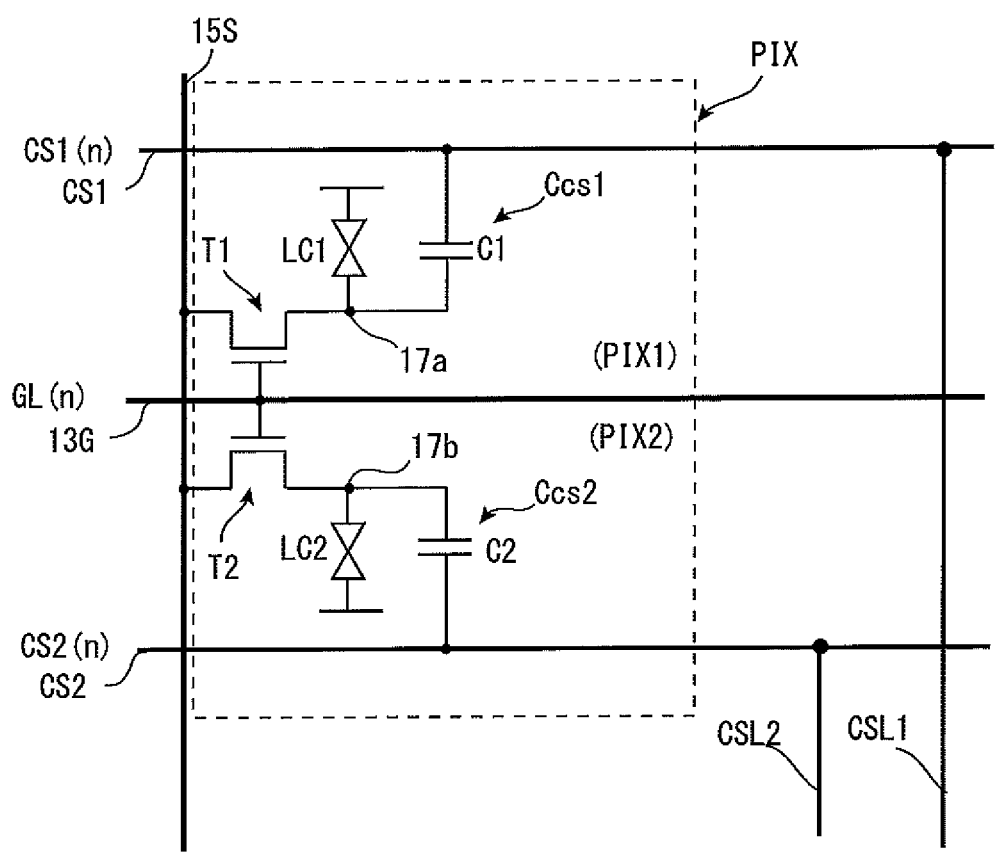
FIG. 26 shows an equivalent circuit of a pixel of a ninth embodiment.

FIG. 26 shows an equivalent circuit of a pixel according to the present embodiment. As shown in FIG. 26, the pixel PIX is composed of a sub-pixel PIX1 and a sub-pixel PIX2. Further, auxiliary capacitance lines CS1 and CS2 extending generally parallel to the gate line 13G are provided to sandwich the gate line 13G: GL(n). Two switching elements T1 and T2, each composed of a thin-film transistor, are connected to the gate line 13G: GL(n) and the source line 15S.

The pixel electrode 17a and one of the electrodes of a capacitor (i.e. auxiliary capacitance electrode) Ccs1 are connected with the drain terminal of the switching element T1, while the other electrode of the capacitor Ccs1 is connected with the auxiliary capacitance line CS1(n). The sub-pixel PIX1 includes a liquid crystal capacitance LC1 formed by the pixel electrode 17a (i.e. first pixel electrode), liquid crystal layer and common electrode (not shown), and an auxiliary capacitance C1 of the capacitor Ccs1.

The pixel electrode 17b (i.e. second pixel electrode) and one of the electrodes of a capacitor (i.e. auxiliary capacitance electrode) Ccs2 are connected with the drain terminal of the switching element T2, while the other electrode of the capacitor Ccs2 is connected with the auxiliary capacitance line CS2(n). Thus, the sub-pixel PIX2 includes a liquid crystal capacitance LC2 formed by the pixel electrode 17b, liquid crystal layer and common electrode (not shown), and an auxiliary capacitance C2 of the capacitor Ccs2.

The auxiliary capacitance lines CS1(n) and CS2(n) are connected with auxiliary capacitance signal lines CSL1 and CSL2, respectively, provided in the display region. The auxiliary capacitance signal lines CSL1 and CSL2 supply the auxiliary capacitance lines CS1(n) and CS2(n), respectively, with voltage signals VCS1 and VCS2, respectively, from a control circuit (not shown) in the source driver 3 (not shown). The voltage signals VCS1 and VSC2 are supplied to the auxiliary capacitance lines CS1(n) and CS2(n), respectively, such that the phase of the potential of the auxiliary capacitance line CS1(n) is opposite the phase of the potential of the auxiliary capacitance line CS2(n). The voltage signals VCS1 and VCS2 are positive and negative voltage signals, respectively, each with an increase or decrease in amplitude with respect to the potential of the common electrode (not shown), and the polarity is reversed by the control circuit (not shown) on a frame-to-frame basis.

As is the case in the first embodiment, the gate line 13G: GL(n) is driven by a gate driver 11 provided in the display region. A positive or negative data signal with respect to the potential of the common electrode (not shown) is supplied to the source line 15S. The data signal is supplied to the source line 15S while its polarity is reversed on a frame-to-frame basis.

Figure 27A:
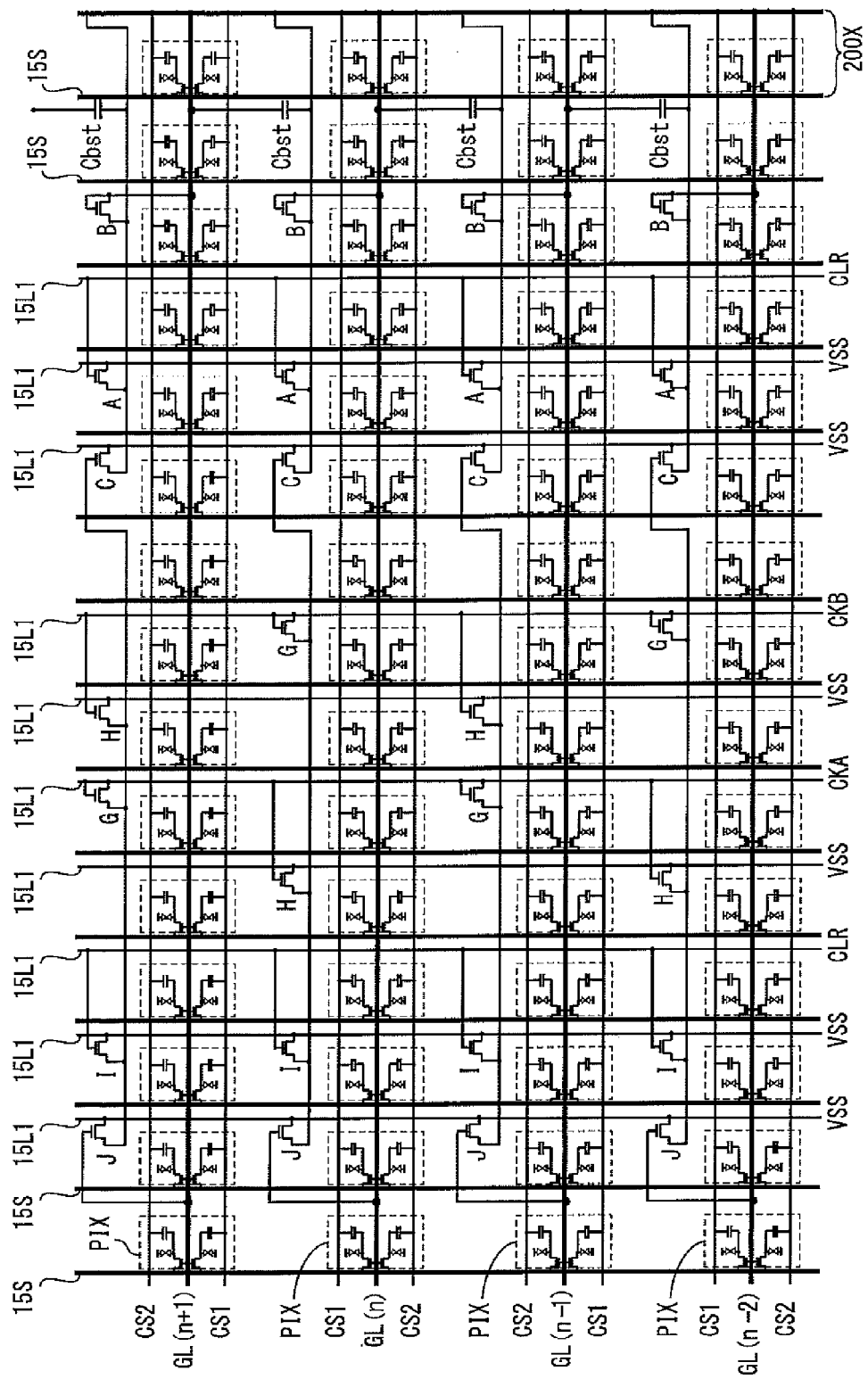
FIG. 27A schematically illustrates pixel regions in which gate drivers and auxiliary capacitance signal lines are provided in the ninth embodiment.
Figure 27B:
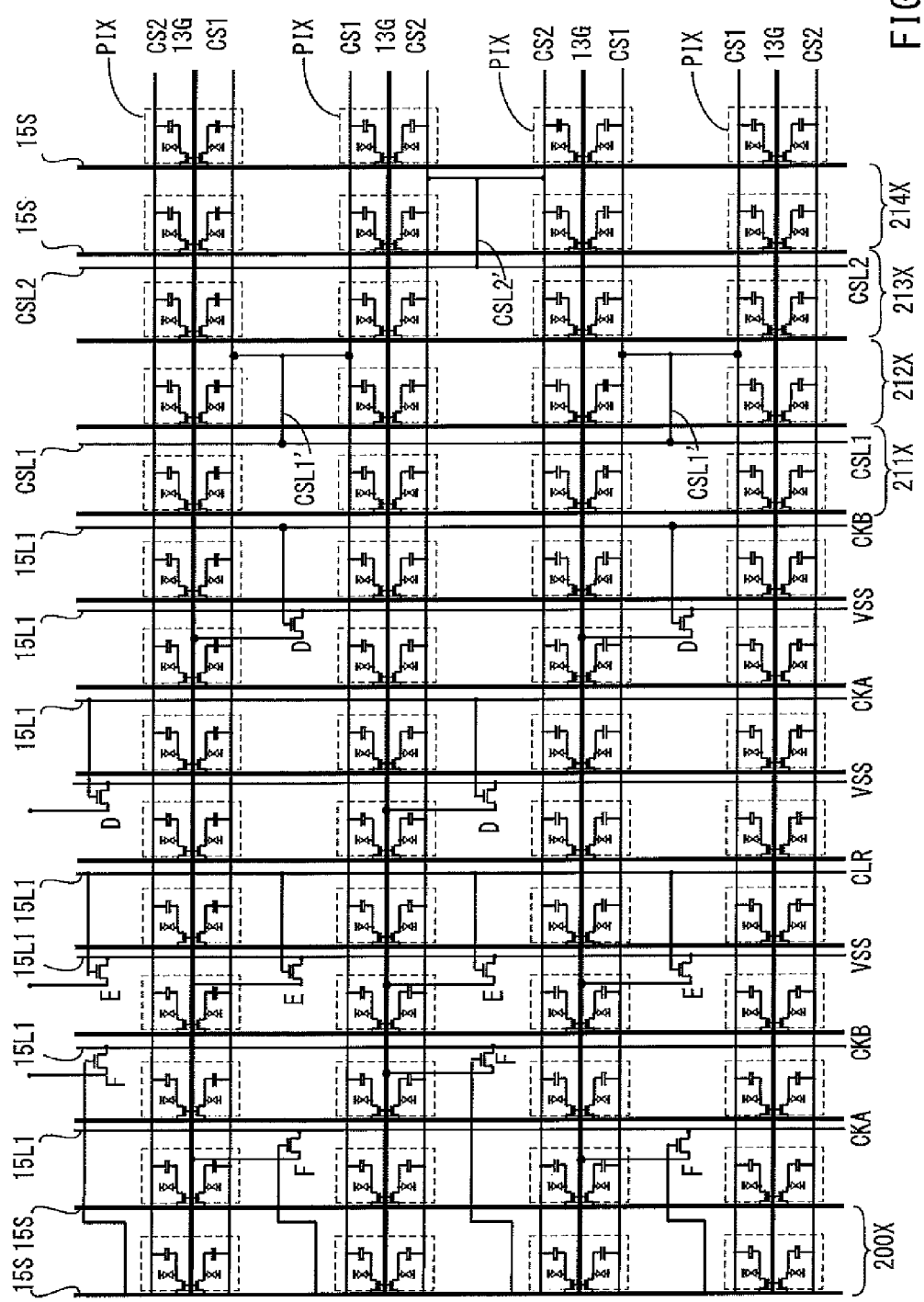
FIG. 27B schematically illustrates gate drivers and pixel regions in which auxiliary capacitance signal lines are provided in the ninth embodiment.

FIGS. 27A and 27B schematically show pixel regions where gate drivers 11 and auxiliary capacitance signal lines CSL1 and CSL2 are provided. The pixel region is continuous where the row 200x connects the representations of FIGS. 27A and 27B.

As shown in FIGS. 27A and 27B, pairs of auxiliary capacitance lines CS1 and CS2 are provided, where the lines of each pair sandwich a gate line 13G: GL(n−2) to GL(n+1). In this implementation, the auxiliary capacitance lines CS1 and CS2 are arranged such that, for each gate line 13G, the auxiliary capacitance lines CS1 and CS2 are switched in position. Further, although FIGS. 27A and 27B do not have the character "TFT-", "A" to "J" in FIGS. 27A and 27B indicate TFT-A to TFT-J constituting parts of gate drivers 11. As is the case in the first embodiment, the elements constituting a gate driver (TFT-A to J and Cbst) are dispersed in pixel regions. Further, lines 13N connecting elements and lines 15L1 for supplying control signals to elements are provided in pixel regions.

No element constituting a part of the gate driver 11 is provided in the pixel regions of the columns 211x to 214x in FIG. 27B. In this implementation, auxiliary capacitance signal lines CSL1 and CSL2 for supplying voltage signals VCS1 and VCS2 to auxiliary capacitance lines CS1 and CS2 are provided in the pixel regions of the columns 211x to 214x. Auxiliary capacitance signal lines CSL1 are provided in the columns 211x and 212x. In the columns 211x, an auxiliary capacitance signal line CSL1 is not connected with an auxiliary capacitance line CS1 and is connected with an auxiliary capacitance line CS1 in the column 212x via an auxiliary capacitance signal line CSL1', which is an extension of a branched auxiliary capacitance signal line CSL1 in the column 212x. Further, auxiliary capacitance lines CSL2 are provided in the columns 213x and 214x. In the column 213x, an auxiliary column signal line CSL2 is not connected with an auxiliary capacitance line CS2 and is connected with an auxiliary capacitance line CS2 via an auxiliary capacitance signal line CSL2', which is an extension of a branched auxiliary capacitance signal line CSL2 in the column 214x.

Figure 28:
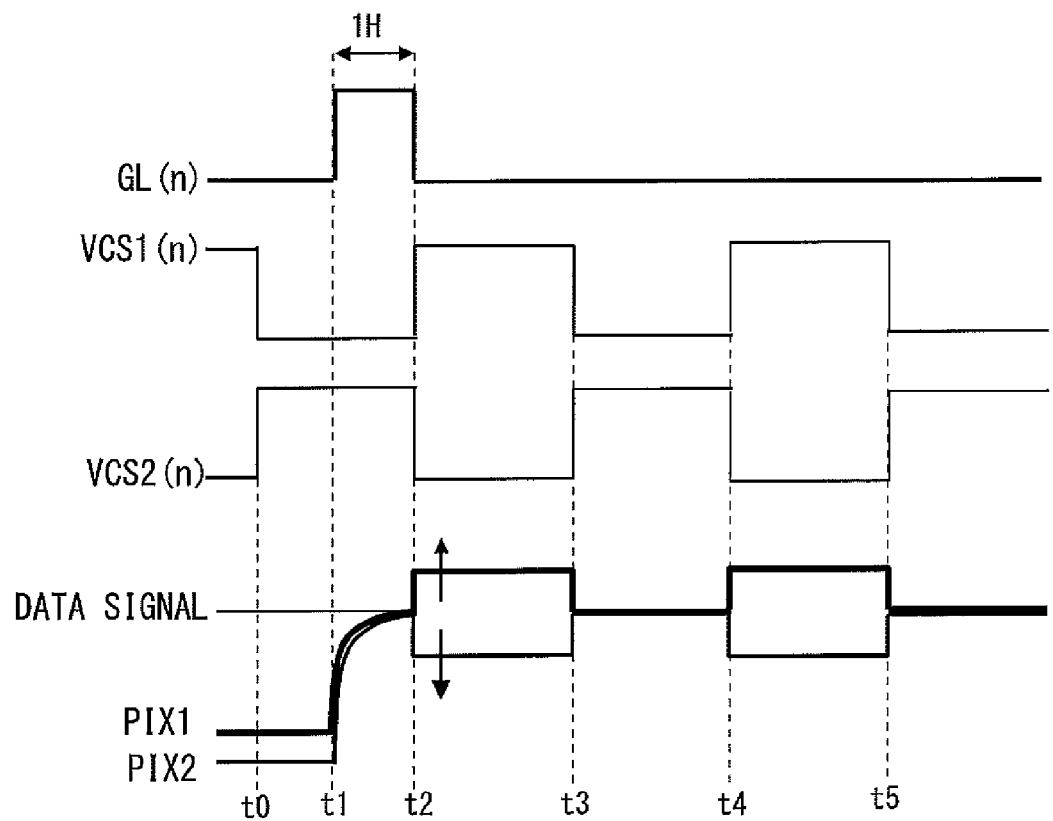
FIG. 28 is a timing chart illustrating how a pixel shown in FIG. 26 is driven.

As discussed above, the voltage signals VCS1 and VCS 2 are supplied to the auxiliary capacitance lines CS1 and CS2 such that the phase of the potential of the auxiliary capacitance line CS1 is opposite the phase of the potential of the auxiliary capacitance line CS2. As the phase of the potential of the auxiliary capacitance line CS1 is opposite the phase of the potential of the auxiliary capacitance line CS2, there is a difference between the effective voltage applied to the sub-pixel PIX1 and that for the sub-pixel PIX2 such that brightness varies among the sub-pixels PIX1 and PIX2. FIG. 28 is a timing chart showing drive waveforms for pixels PIX. FIG. 28 shows an example where a positive data signal is supplied to a source line 15S.

Referring to FIG. 28, from time t0 onward, voltage signals VCS1 and VSC2 are supplied to the auxiliary capacitance lines CS1 and CS2. In the period from time t1 to t2, the gate driver 11 drives the gate line 13G: GL(n), turning on the switching elements T1 and T2 such that a positive data signal is supplied to the source line 15S. This causes the potentials of the sub-pixels PIX1 and PIX2 to rise. Then, at time t2, at which the switching element T1 is turned off, an H level voltage signal VCS1 is supplied to the auxiliary capacitance line CS1 such that the potential of the sub-pixel PIX1 increases due to a voltage upthrust by the capacitor Ccs1. On the other hand, at time t2, at which the switching element T2 is turned off, an L level voltage signal VCS2 is supplied to the auxiliary capacitance line CS2 such that the potential of the sub-pixel PIX2 decreases due to a voltage downthrust by the capacitor Ccs2. From t2 onward, the gate line 13G is in a floating state such that the potentials of the sub-pixels PIX1 and PIX2 increase or decrease depending on the voltage signals VCS1 and VCS2.

Thus, the sub-pixel PIX1 displays images in a luminance that is higher than that determined by data signals, while the sub-pixel PIX2 displays images in a luminance that is lower than that determined by data signals. As images of two different luminance levels are displayed in one pixel, the viewing angle dependency in y-characteristics is reduced. Further, as the gate drivers 11 are provided in the display region and the auxiliary capacitance signal lines CSL1 and CSL2 for supplying voltage signals to the auxiliary capacitance lines CS1 and CS2 are provided in the display region, the picture frame width is reduced.

Tenth Embodiment

The above ninth embodiment describes an implementation where the auxiliary capacitance signal line CSL1 and CSL2 are provided in the region of pixels to serve as auxiliary capacitance control elements and the potentials of the auxiliary capacitance lines CS1 and CS2 are controlled depending on the vehicle signals supplied to the auxiliary capacitance signal lines CSL1 and CSL2. The present embodiment describes an implementation where CS drivers for controlling the potentials of the auxiliary capacitance lines CS1 and CS2 are provided in the region of pixels to serve as auxiliary capacitance control elements.

Figure 29:
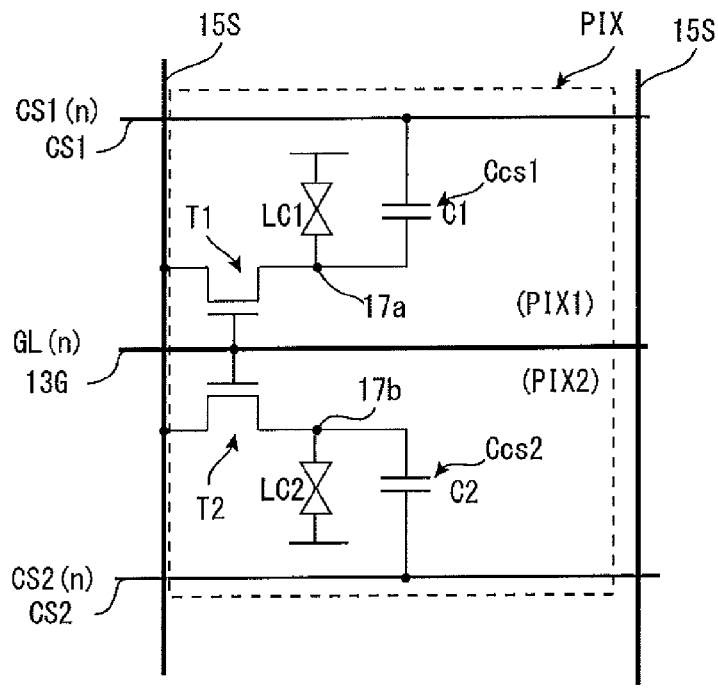
FIG. 29 shows an equivalent circuit of a pixel of a tenth embodiment.

FIG. 29 shows an equivalent circuit of a pixel according to the present embodiment. In FIG. 29, the components that are the same as the corresponding ones of the ninth embodiment are labeled with the same reference numerals as in the ninth embodiment. The differences from the ninth embodiment will be described below. As shown in FIG. 29, no auxiliary capacitance signal lines CSL1 and CSL2 as discussed above are connected with the auxiliary capacitance lines CS1 and CS2.

Figure 30:
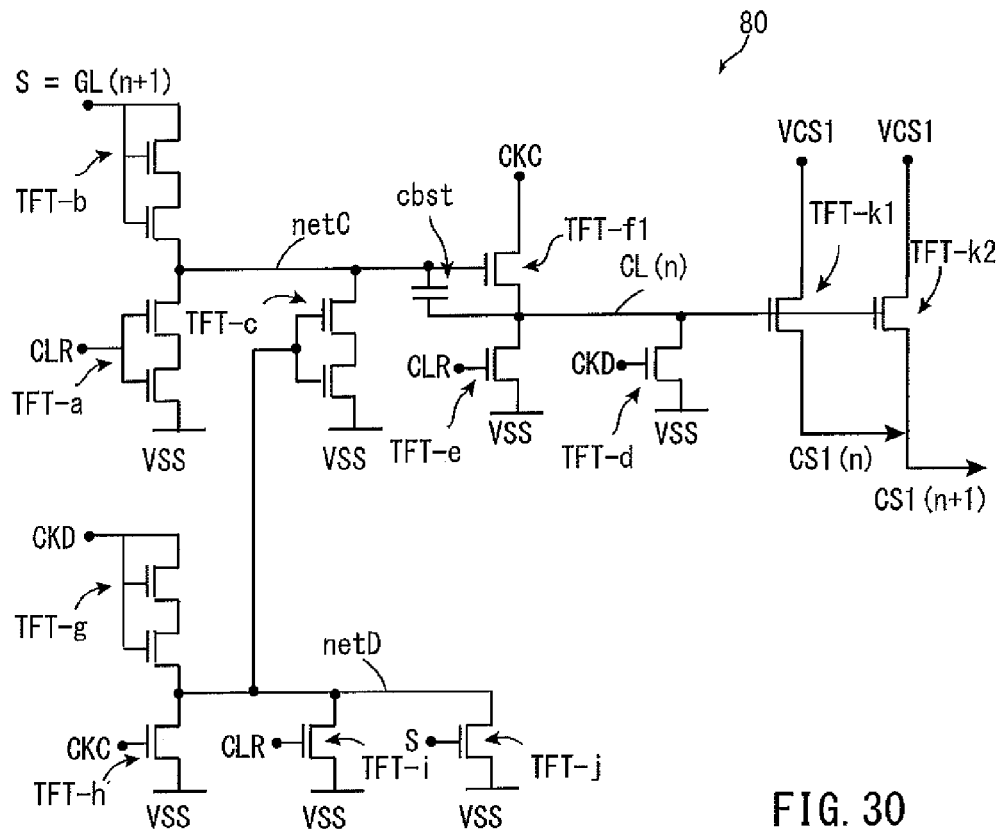
FIG. 30 shows an equivalent circuit of a CS driver of the tenth embodiment.

The construction of the CS drivers will be described below. FIG. 30 shows an equivalent circuit of a CS driver according to the present embodiment. This implementation is a CS driver 80 for controlling the potential of an auxiliary capacitance line CS1($n$). As shown in FIG. 30, the CS driver 80 includes TFT-a to -j, TFT-k1 and TFT-k2, each constituted by a thin-film transistor, and a capacitor cbst. The arrangement with the TFT-a to -j and capacitor cbst is the same as the arrangement of the gate driver 11 with the TFT-A to -J and capacitor Cbst except that different clock signals (CKC and CKD) are supplied.

In this implementation, the potential of the gate line 13G: GL(n+1) is supplied to the gate terminal and drain terminal of the TFT-b and the gate terminal of the TFT-j. A clock signal (CKC) is supplied to the gate terminal of the TFT-h and the drain terminal of the TFT-f. A clock signal (CKD) is supplied to the gate terminals of the TFT-d and -g. The clock signals (CKC) and (CKD) are two-phase clock signals whose phase is reversed at each horizontal scan interval (see FIG. 31). The clock signal (CKC) has the same phase as the clock signal (CKB), while the clock signal (CKD) has the same phase as the clock signal (CKA).

The TFT elements of the CS driver 80 to which the clock signals (CKC, CKD), power supply voltage signal (VSS) and reset signal (CLR) are supplied, shown in FIG. 30, are connected with the control circuit (not shown) provided in the source driver 3 (not shown) via lines 15L1 formed by the source line layer 15.

In FIG. 30, the line connected with the source terminal of the TFT-b, the drain terminal of the TFT-a, the source terminal of the TFT-c, one electrode of the capacitor cbst and the gate terminal of the TFT-f will be referred to as netC. The line connected with the gate terminal of the TFT-c, the source terminal of the TFT-g, the drain terminal of the TFT-h, the source terminal of the TFT-i and the source terminal of the TFT-j will be referred to as netD. The line connected with the other electrode of the capacitor cbst, the source terminal of the TFT-f and the drain terminals of the TFT-e and TFT-d will be referred to as line CL(n).

Further, the CS driver 80 includes a TFT-k1 and TFT-k2 each having a gate terminal connected with the line CL(n). The source terminal of the TFT-k1 is connected with the auxiliary capacitance line CS1. The voltage signal VCS1 or VCS2 is supplied to the drain terminal of the TFT-k1 from the control circuit (not shown) provided along the same side of the display device as the source driver 3 (not shown). The source terminal of the TFT-k2 is connected with the auxiliary capacitance line CS2. The voltage signal VCS1 or VCS2 is supplied to the drain terminal of the TFT-k2 from the control circuit (not shown). As is the case in the above ninth embodiment, the voltage signals VCS1 and VCS2 are signals with potentials of opposite phases, and the polarity of each of them is reversed on a frame-to-frame basis by the control circuit (not shown).

When the line CL(n) goes to H level, the TFT-k1 and TFT-k2 turn on. Then, the potential of the voltage signal VCS1 supplied to the TFT-k1 and TFT-k2 is supplied to the auxiliary capacitance lines CS1($n$) and CS1($n$+1). Further, the potential of the voltage signal VCS2 supplied to the TFT-k1 and TFT-k2 is supplied to the auxiliary capacitance lines CS2($n$) and CS2($n$+1).

Figure 31A:
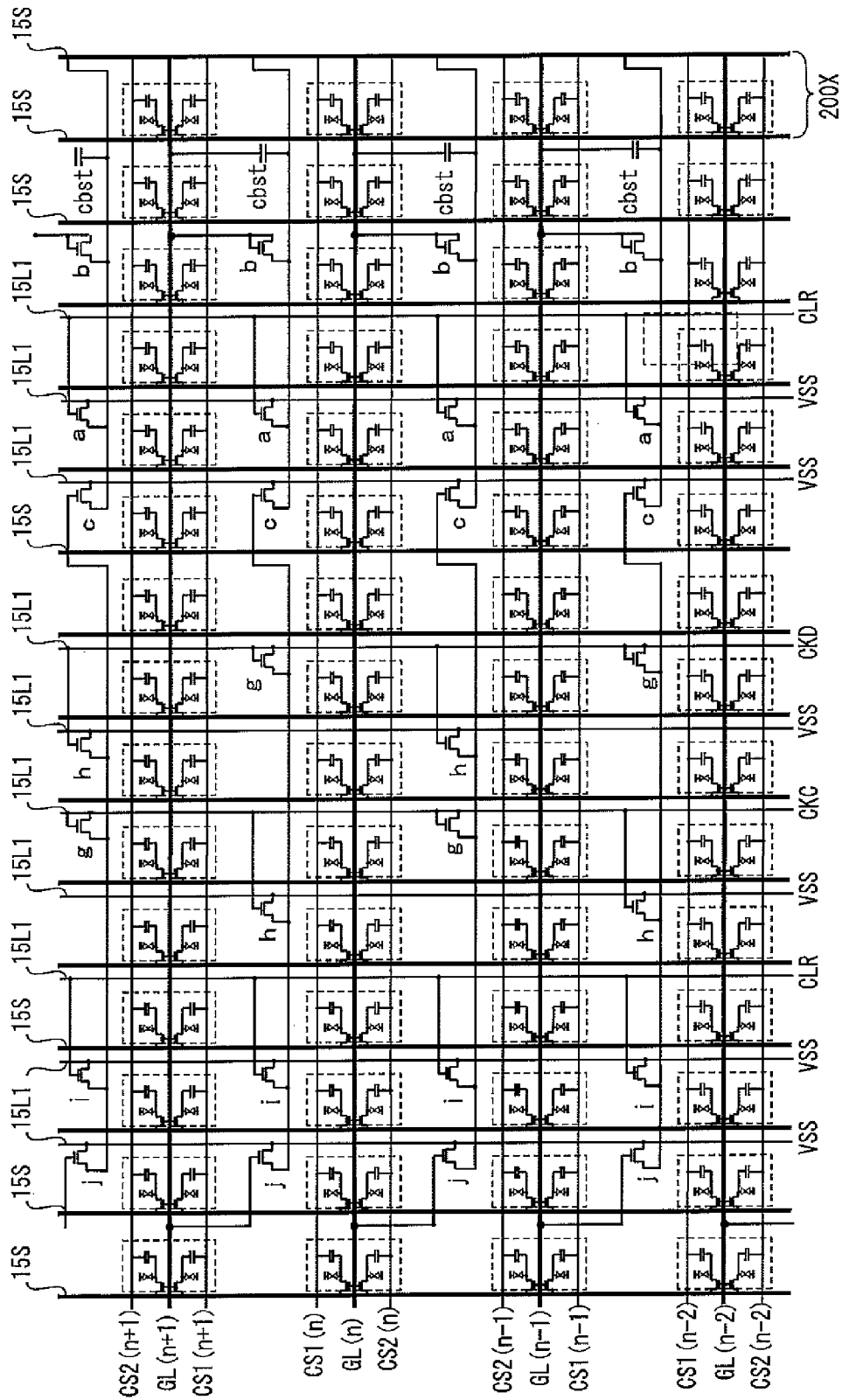
FIG. 31A schematically illustrates pixel regions in which CS drivers and gate drivers are provided in the tenth embodiment.
Figure 31B:
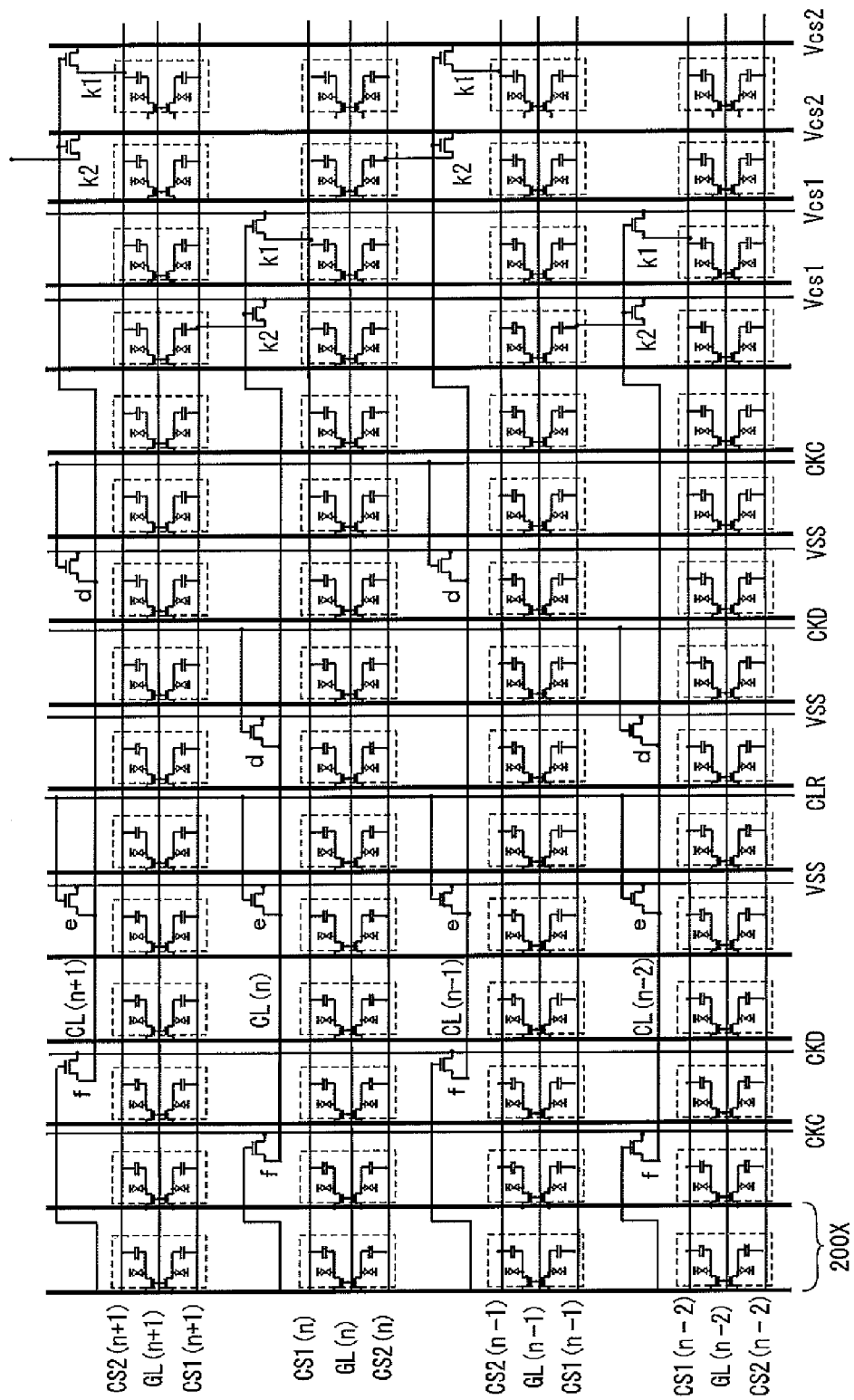
FIG. 31B schematically illustrates pixel regions in which CS drivers and gate drivers are provided in the tenth embodiment.

The elements constituting the above CS driver 80 are located in pixel regions where no gate driver 11 is present. FIGS. 31A and 31B show an example arrangement of the CS driver 80. The representations of FIGS. 31A and 31B are connected at the column 200$x$ and are continuous.

Although FIGS. 31A and 31B do not have the character "TFT-", "a" to "k2" in FIGS. 31A and 31B indicate TFT-a to TFT-k2 constituting parts of CS drivers 80. As shown in this implementation, the elements of a CS driver 80 are dispersed in pixel regions in the same row. Lines 15L1 are provided in the pixel regions of the columns in which TFT elements (TFT-a and c to j) of the CS drivers 80 to which the clock signals (CKC, CKD), power supply voltage signal (VSS) and reset signal (CLR) are supplied are provided. Further, auxiliary capacitance signal lines CSL1 and CSL2 are provided in the pixel regions of the columns in which the TFT elements (TFT-k1 and k2) to which the voltage signals VCS1 and VCS2 are supplied are provided. The CS drivers 80 in a row and those in an adjacent row are arranged such that the clock signals and voltage signals supplied to the former have a phase opposite to that for the latter.

Figure 32:
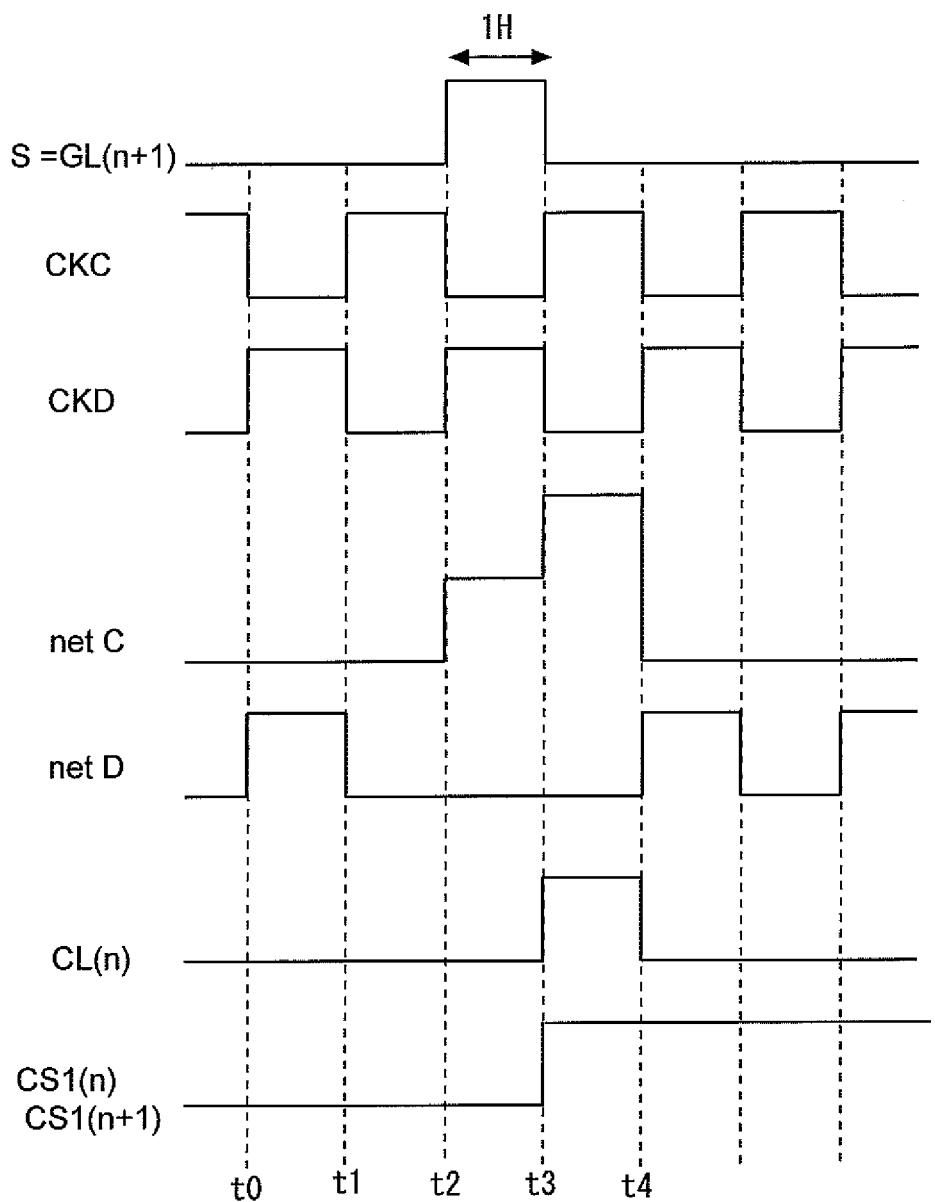
FIG. 32 is a timing chart illustrating how a CS driver shown in FIG. 30 is operated.

The operation of the CS driver 80 will be described below. FIG. 32 is a timing chart showing the operation of the CS driver 80. FIG. 32 shows an example where the auxiliary capacitance line CS1 is driven; the same will apply to the auxiliary capacitance line CS2. In FIG. 32, the period between t2 and t3 is the period during which the gate line 13G: GL(n+1) is selected. The control circuit (not shown) supplies the clock signal (CKC) and clock signal (CKD) to the CS driver 80. The phase of each of the clock signal (CKC) and clock signal (CKD) is reversed at each horizontal scan interval. Although not shown in FIG. 32, a reset signal (CLR) that goes to H (high) level at each vertical scan interval and remains that way for a predetermined period of time is supplied to the CS driver 80 from the control circuit (not shown). When the reset signal (CLR) is supplied, the netC, netD and gate line 13G transitions to L (low) level.

Between time t0 to t1, an L level clock signal (CKC) is supplied and an H level clock signal (CKD) is supplied, which turns on the TFT-g and turns off the TFT-h, charging the netD to H level. Further, the TFT-c and TFT-d turn on and the TFT-f turns off, charging the netC to an L level power supply voltage (VSS) such that an L level potential is provided to the line CL(n).

Next, at time t1, the clock signal (CKC) goes to H level and the clock signal (CKD) goes to L level, which turns off the TFT-g and turns on the TFT-h, charging the netC to L level. Further, the TFT-c and TFT-d turn off such that the potential of the netC is maintained at L level and an L level potential is provided to the line CL(n).

At time t2, the clock signal (CKC) goes to L level and the clock signal (CKD) goes to H level and the set signal (S) is supplied to the CS driver 80 via the gate line 13G: GL(n+1), which turns on the TFT-b and charges the netC to H level. Further, the TFT-j turns on and TFT-g turns on and the TFT-h turns off such that the netD is maintained at L level. The TFT-c and TFT-f turn off such that the potential of the netC does not decrease and is maintained. Meanwhile, the TFT-d is on such that an L level potential is provided to the line CL(n).

At time t3, the clock signal (CKC) goes to H level and the clock signal (CKD) goes to L level, which turns on the TFT-f and turns off the TFT-d. As the potential of the drain terminal of the TFT-f increases, the capacitor Cbst connected with the netC charges the netC to a potential higher than the H level of the clock signal (CKC). Meanwhile, the TFT-g and TFT-j are off and TFT-h is on such that the potential of the netD is maintained at L level. The TFT-c is off such that the potential of the netC does not decrease, and the H level potential of the clock signal (CKC) is provided to the line CL(n) and the TFT-k1 and TFT-k2 turn on. When the TFT-k1 and TFT-k2 are on, the potential of the voltage signal VCS1 being supplied to the TFT-k1 and TFT-k2 is provided to the auxiliary capacitance line CS1.

At time t4, the clock signal (CKC) goes to L level and the clock signal (CKD) goes to H level, which turns on the TFT-g and turns off the TFT-h, charging the netD to H level. This turns on the TFT-c and charges the netC to L level. Meanwhile, the TFT-d is on and the TFT-f is off such that an L level potential is provided to the line CL(n) and the TFT-k1 and TFT-k2 turn off. The capacitor Ccs1 connected with the auxiliary capacitance line CS1 maintains the potential of the auxiliary capacitance line CS1 at H level.

Figure 33A:
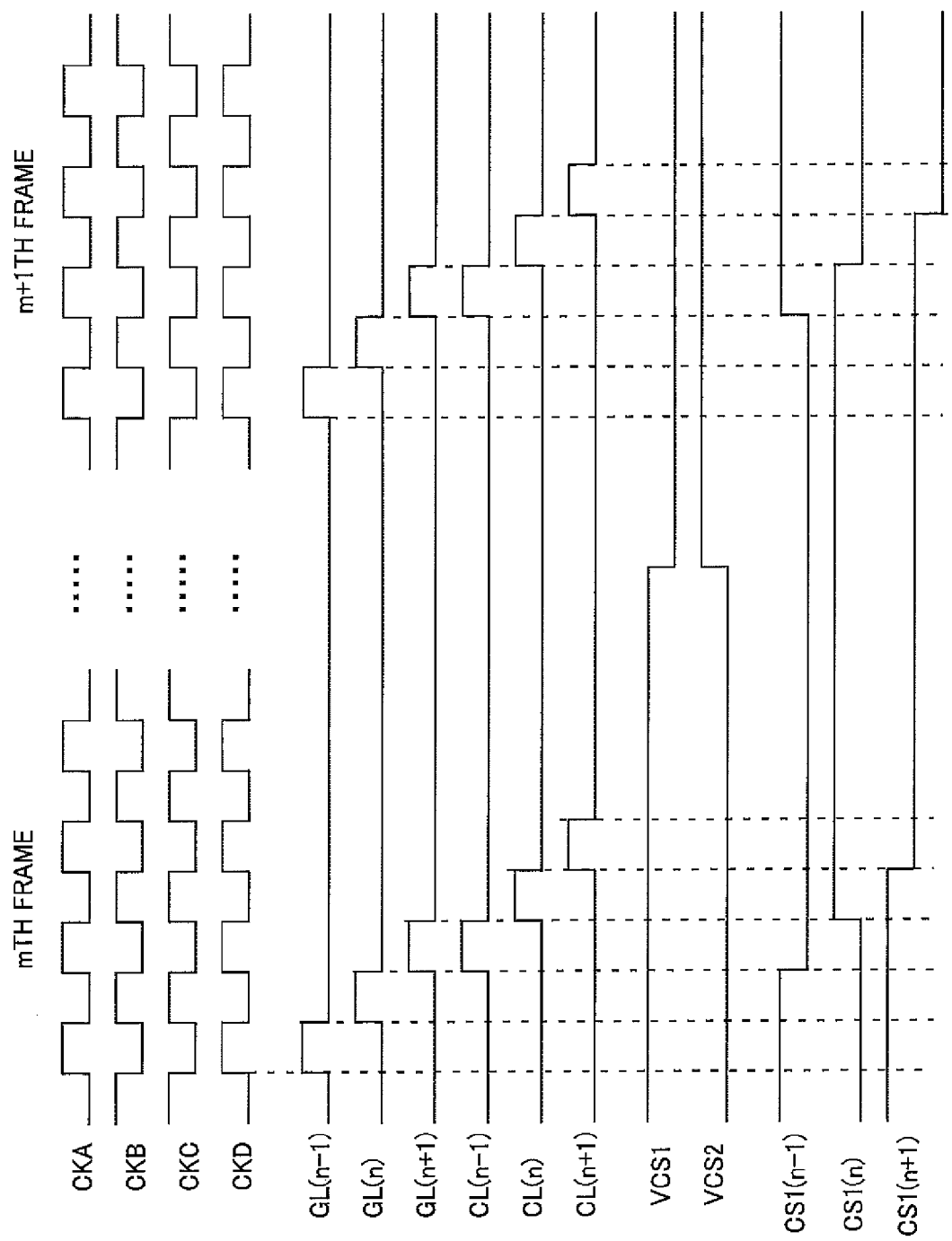
FIG. 33A is a timing chart illustrating how a gate driver and CS driver of the tenth embodiment are operated.

FIG. 33A shows a timing chart showing the operation of the gate driver 11 and the operation of the CS driver 80. In this implementation, during the mth frame, an L level voltage signal VCS2 and an H level voltage signal VCS1 are supplied. As shown in FIG. 33A, during the mth frame, the gate lines 13G: GL(n−1) to GL(n+1) are sequentially driven by the gate drivers 11 in response to the clock signals (CKA and CKB). Each of the potentials of the lines CL(n−1) to CL(n) in the CS drivers 80 transitions to H level, in response to the clock signal (CKC or CKD), after the gate line 13G of the subsequent row is driven. The voltage signal VCS2 is supplied to the TFT-k1 and k2 connected with the line CL(n−1). Thus, when the line CL(n−1) goes to H level during the mth frame, the L level potential of the voltage signal VCS2 is supplied to the auxiliary capacitance line CS1(n−1).

Further, as shown in FIG. 31b, the voltage signal VCS1 is supplied to the TFT-k1 and k2 connected with the line CL(n). Thus, when the line CL(n) goes to H level, the H level potential of the voltage signal VCS1 is supplied to the auxiliary capacitance line CS(n). The same applies to the TFT-k1 and k2 connected with the line CL(n+1): when the L level voltage signal VCS2 is supplied, an L level potential is supplied to the auxiliary capacitance line CS1(n+1).

During the m+1th frame, the polarities of the voltage signals VCS1 and VCS2 are reversed such that an H level voltage signal VCS2 and an L level voltage signal VCS1 are supplied. Thus, the potentials supplied to the auxiliary capacitance lines CS1(n−1) to CS1(n+1) are the reversed ones with respect to those of the mth frame.

Figure 33B:
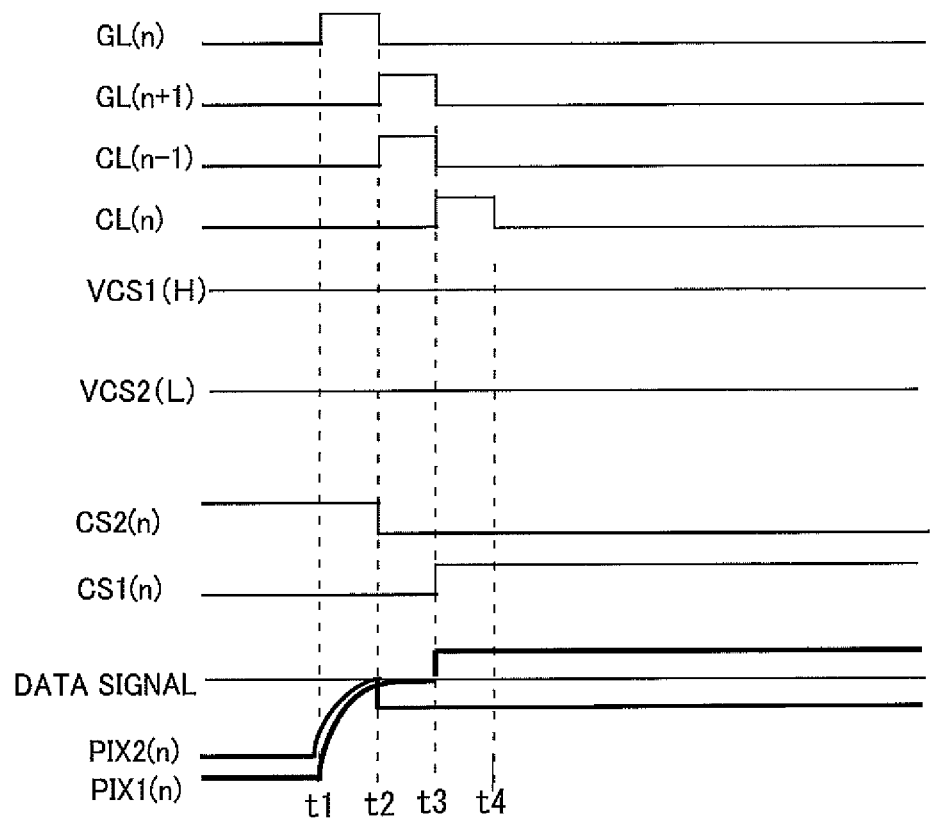
FIG. 33B is a timing chart illustrating how a pixel shown in FIG. 29 is driven.

Thus, as shown in FIG. 33B, at time t1, the gate line 13G: GL(n) is driven, which turns on the switching elements T1 and T2 of the sub-pixels PIX1(n) and PIX2(n) such that a positive data signal is supplied to the source lines 15S. At the same time, the potentials of the sub-pixels PIX1(n) and PIX2(n) increase.

Then, at time t2, the potential of the gate line 13G: GL(n) transitions from H level to L level, which causes the line CL(n−1) of the CS driver 80 to transition from L level to H level. Then, at time t2, an L level voltage signal VCS2 is supplied to the auxiliary capacitance line CS2(n), causing the potential of the sub-pixel PIX2(n) to decrease via the capacitance Ccs2. On the other hand, at time t2, the gate line 13G: GL(n+1) is driven, and, at time t3, the potential of the gate line 13G: GL(n+1) transitions from H level to L level, which causes the line CL(n) of the CS driver 80 transitions to H level. Then, at time t3, an H level voltage signal VCS1 is supplied to the auxiliary capacitance line CS1(n), causing the potential of the sub-pixel PIX1(n) to increase via the capacitor Ccs1. Thus, the sub-pixel PIX1(n) displays an image at a luminance higher than that for data signals, while the sub-pixel PIX2(n) displays an image at a luminance lower than that for data signals.

Eleventh Embodiment

The present embodiment describes an implementation where viewing angle characteristics are improved by a method different from those of the ninth and tenth embodiments when the display mode of the liquid crystal display device 1 is the VA mode.

Figure 34:
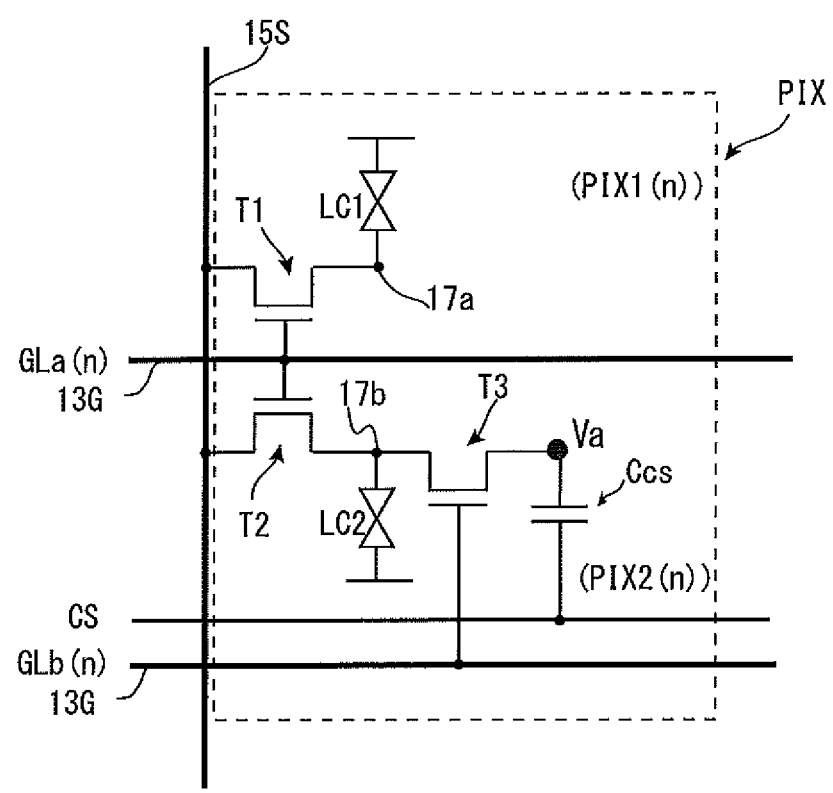
FIG. 34 shows an equivalent circuit of a pixel according to an eleventh embodiment.

FIG. 34 shows an equivalent circuit of a pixel PIX according to the present embodiment. In FIG. 34, the components that are the same as the corresponding ones of the tenth embodiment are labeled with the same reference characters as in the tenth embodiment. The differences from the above embodiments will be described below.

As shown in FIG. 34, the gate terminals of the switching elements T1 and T2 of the sub-pixels PIX1(n) and PIX2(n) of the pixel PIX are connected with the gate line 13G: GLa(n). In the present embodiment, the sub-pixel PIX1(n) has no capacitance C, and includes a liquid crystal capacitance LC1 provided between the pixel electrode 17a and common electrode (not shown).

A capacitor Ccs is provided in the sub-pixel PIX2. One of the electrodes of the capacitor Ccs is connected with an auxiliary capacitance line CS extending substantially parallel to the gate line 13G. The other electrode of the capacitor Ccs is connected with a switching element T3 formed by a thin-film transistor. The gate terminal of the switching element T3 is connected with a gate line 13G: GLb(n) (hereinafter referred to as sub-gate line) extending substantially parallel to the gate line 13G: GLa(n). The switching element T3 has a source terminal connected with the pixel electrode 17b and a drain terminal connected with the other electrode of the capacitor Ccs. The sub-pixel PIX2(n) includes a liquid crystal capacitance LC2 constituted by the pixel electrode 17b and the common electrode (not shown), and an auxiliary capacitance constituted by the capacitor Ccs.

Thus, in the present embodiment, the sub-gate line 13G: GLb(n) is located closer to the sub-pixel PIX2(n) than to the gate line 13G: GLa(n) between the sub-pixels PIX1(n) and PIX2(n). Each of the gate line 13G: GLa(n) and sub-gate line 13G: GLb(n) is driven by the associated gate driver 11 provided in the display region. Further, a potential with a polarity opposite that of gate signals supplied to the source lines 15S is applied to the auxiliary capacitance line CS by the auxiliary capacitance control circuit (not shown).

Figure 35A:
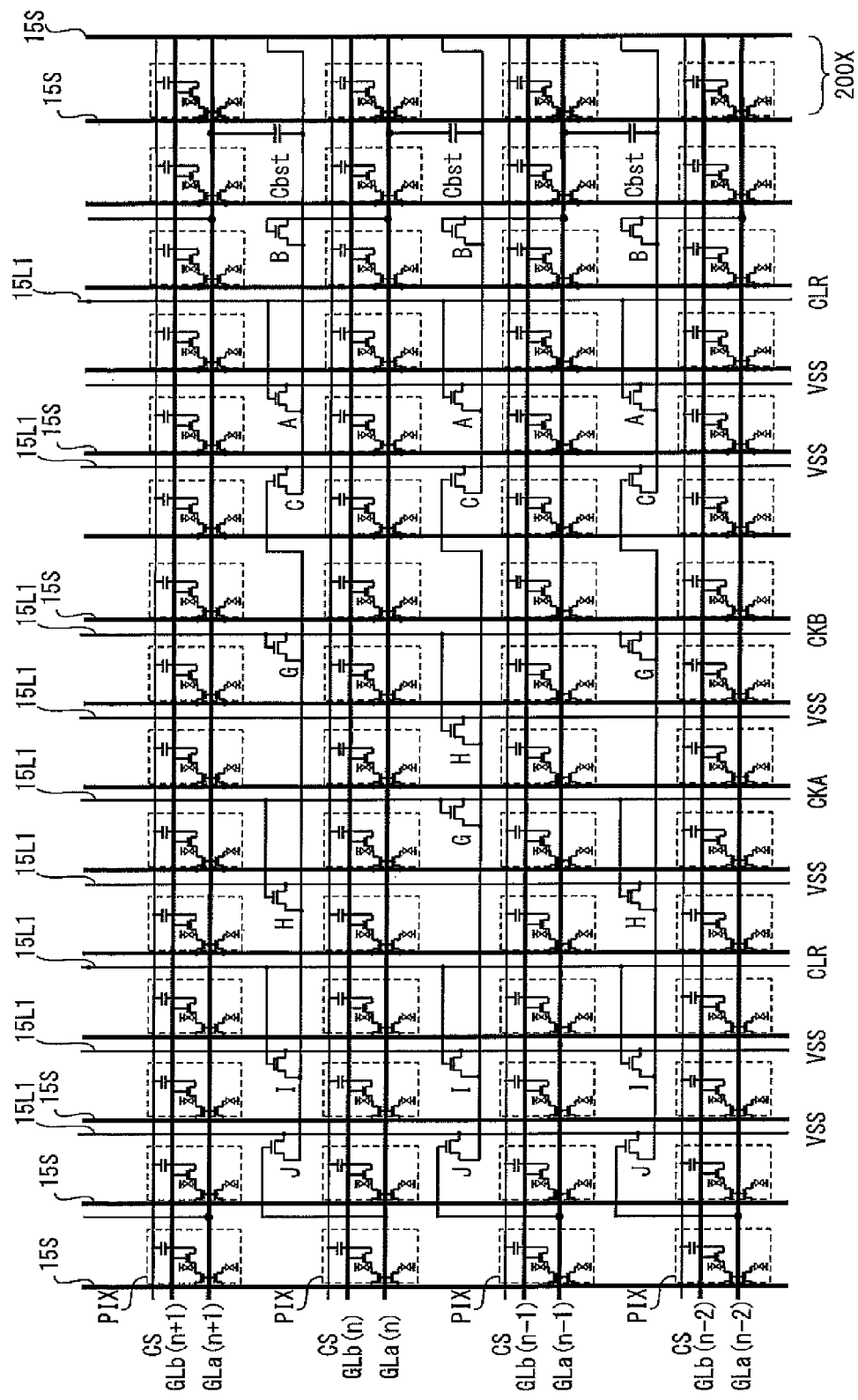
FIG. 35A schematically illustrates pixel regions in which gate drivers 11_A of the eleventh embodiment are provided.
Figure 35B:
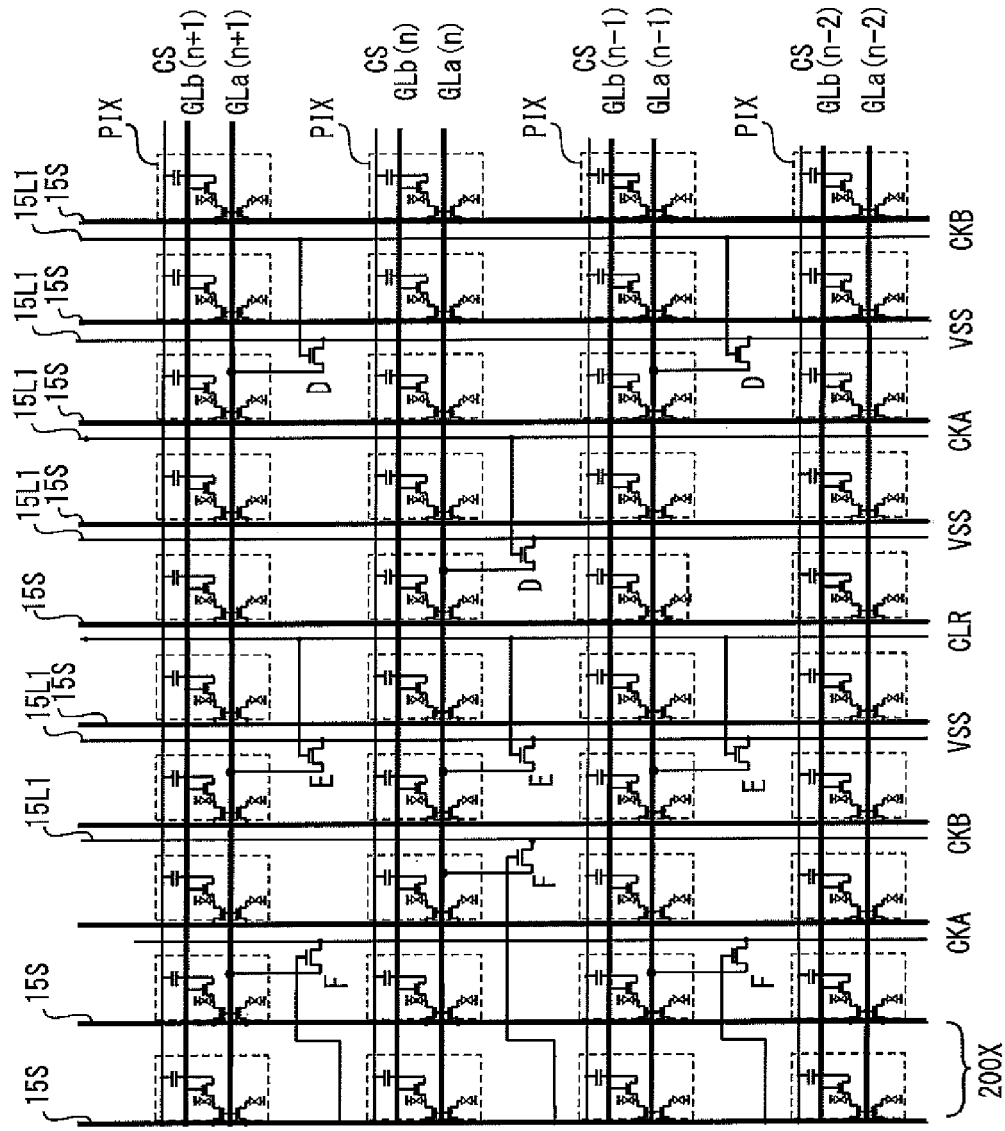
FIG. 35B schematically illustrates pixel regions in which gate drivers 11_A of the eleventh embodiment are provided.
Figure 36A:
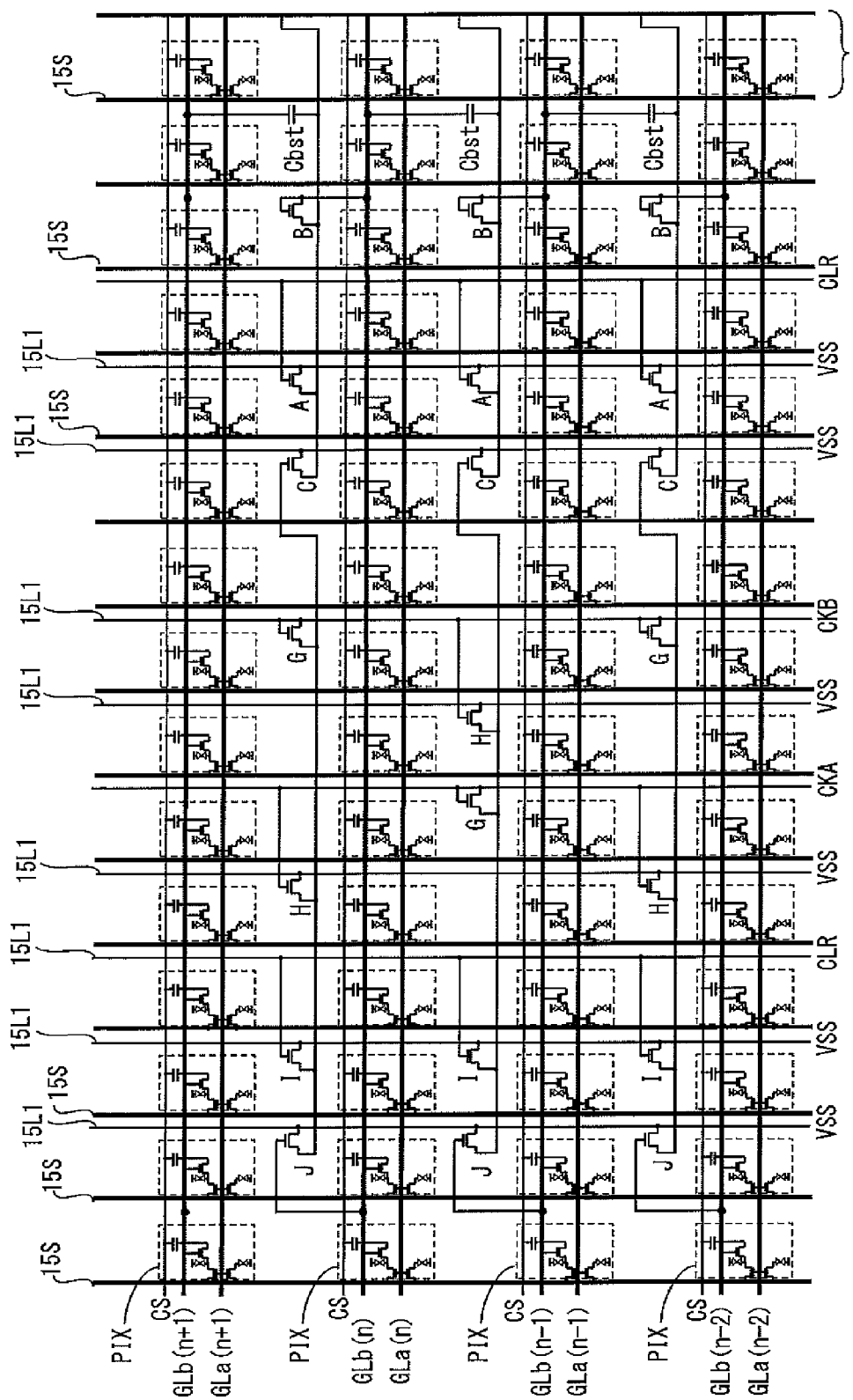
FIG. 36A schematically illustrates pixel regions in which gate drivers 11_B of the eleventh embodiment are provided.
Figure 36B:
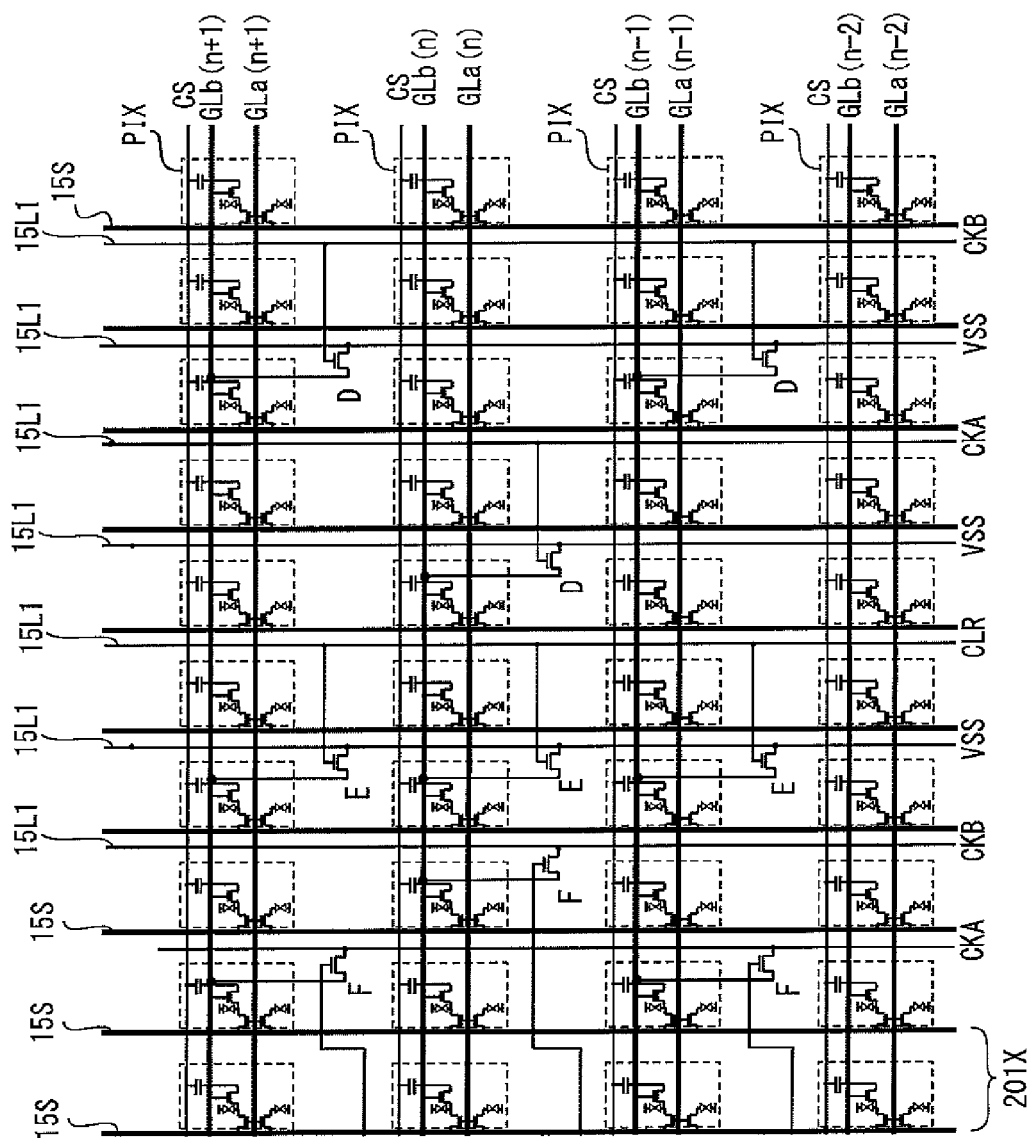
FIG. 36B schematically illustrates pixel regions in which gate drivers 11_B of the eleventh embodiment are provided.

FIGS. 35A and 35B show an example arrangement of a gate driver 11 for driving the gate line 13G: GLa(n) (hereinafter referred to as gate driver 11_A) in the display region. FIGS. 36A and 36B show an example arrangement of gate drivers 11 for driving the sub-gate lines 13G: GLb(n) (hereinafter referred to as gate driver 11_B) (i.e. sub-gate line driver) in the display region.

The representations of FIGS. 35A and 35B are connected at the pixel regions of the column 200x shown in these drawings and are continuous. The representations of FIGS. 36A and 36B are connected at the pixel regions of the column 201x shown in these drawings and are continuous. Although FIGS. 35A and 35B and FIGS. 36A and 36B do not have the character "TFT", "A" to "J" in these drawings indicate "TFT-A" to "TFT-J".

The elements constituting the gate driver 11_A (TFT-A to J and Cbst) are dispersed among gate lines 13G: GLa in FIGS. 35A and 35B. The TFT-B, D to F and J of the gate driver 11_1A are connected with the gate lines 13G: GLa. The gate lines 13G: GLa are sequentially driven by the gate drivers 11_A in response to the control signals (CKA, CKB, CLR, and VSS) supplied via lines 15L1.

In FIGS. 36A and 36B, the elements constituting the gate driver 11_B (TFT-A to J and Cbst) are dispersed among gate lines 13G: GLa in columns in which no gate driver 11_A is present. The TFT-B, D to F and J of the gate driver 11_B are connected with gate lines 13G: GLb. The gate lines 13G: GLb are sequentially driven by the gate drivers 11_B in response to the control signals (CKA, CKB, CLR, and VSS) supplied via lines 15L1.

Figure 37:
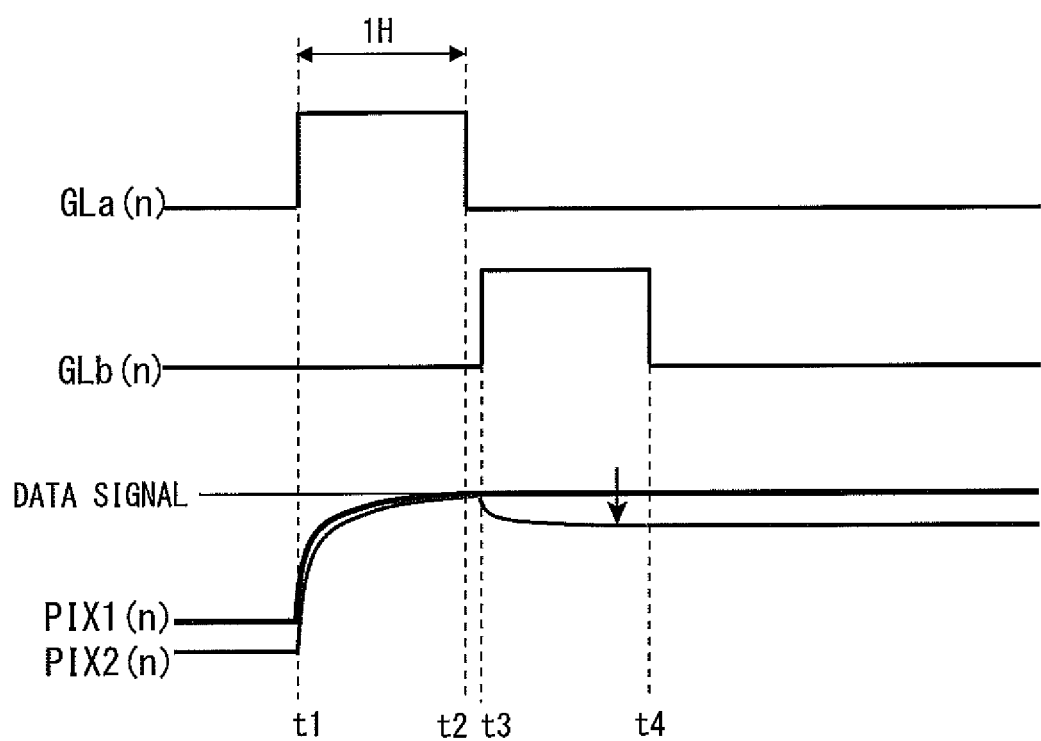
FIG. 37 is a timing chart illustrating how sub-pixels are driven in the eleventh embodiment.

FIG. 37 is a timing chart showing signals encountered when the sub-pixels PIX1(n) and PIX2(n) are driven. As shown in FIG. 37, at time t1, the gate driver 11_A causes the potential of the gate line 13G: GLa(n) to transition to H level, turning on the switching elements T1 and T2. Then, when a positive data signal is supplied to the source line 15S, the potentials of the sub-pixels PIX1(n) and PIX2(n) increase depending on the voltage of data signals such that data is written to the sub-pixels PIX1(n) and sub-pixels PIX2(n).

At time t2, the potential of the gate line 13G: GLa(n) transitions to L level and, then, at time t3, the gate driver 11_B causes the potential of the sub-gate line 13G: GLb(n) to transition to H level. The switching element T1 is off, which maintains the potential of the sub-pixel PIX1(n) and causes the sub-pixel PIX1(n) to display an image at the same luminance as that determined by data signals. On the other hand, the switching element T3 is on, which re-distributes electric charge until one terminal of the capacitor Ccs (Va) and the pixel electrode 17b go to the same potential. Thus, the potential of the sub-pixel PIX2(n) decreases such that an image is displayed at a luminance lower than that determined by data signals.

Twelfth Embodiment

Figure 38:
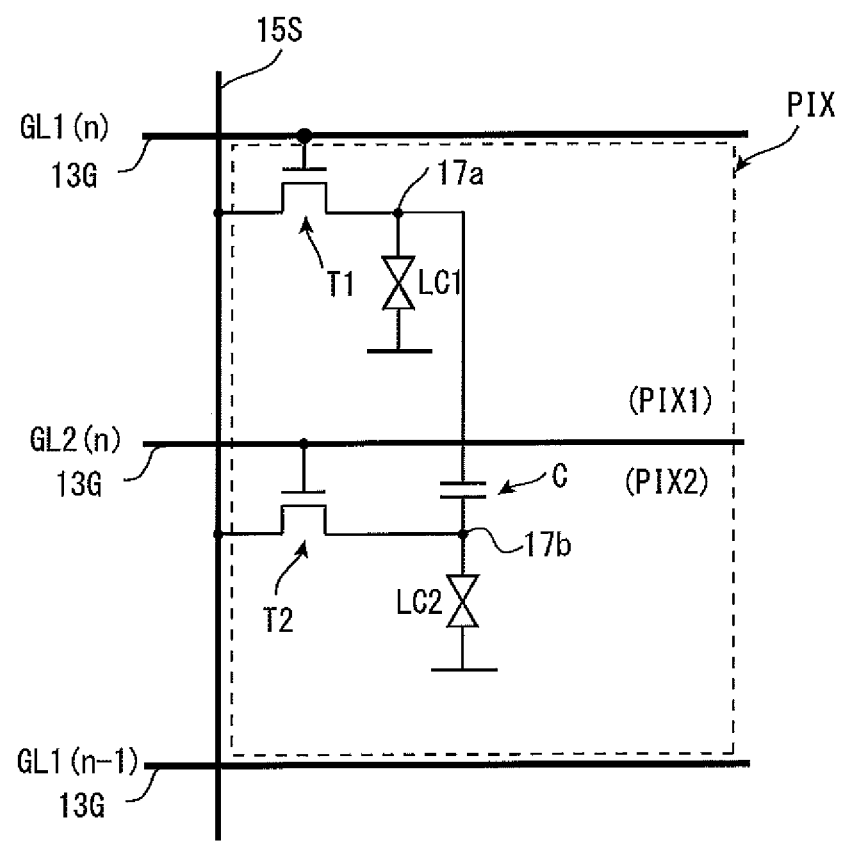
FIG. 38 shows an equivalent circuit of a pixel according to a twelfth embodiment.

The present embodiment describes an implementation where viewing angle characteristics are improved by a method different from those of the tenth and eleventh embodiments when the display mode of the liquid crystal display device 1 is the VA mode. FIG. 38 shows an equivalent circuit of a pixel PIX according to the present embodiment. As shown in FIG. 38, in the present embodiment, a gate line 13G: GL1(n) and a gate line 13G: GL2(n) (sub-gate line) are provided in the pixel PIX. The gate terminal of a switching element T1 connected with the pixel electrode 17a is connected with the gate line 13G: GL1(n). The gate terminal of a switching element T2 connected with the pixel electrode 17b is connected with the gate line 13G: GL2(n). A capacitor C is connected between the pixel electrode 17a and pixel electrode 17b. The gate line 13G: GL1(n) and the gate line 13G: GL2(n) are driven by the associated gate drivers (see FIG. 4) provided in the display region. The gate driver 11 for driving the gate line 13G: GL1(n) will be hereinafter referred to as gate driver 11_1 (i.e. driving circuit). The gate driver 11 for driving the gate line 13G: GL2(n) will be hereinafter referred to as gate driver 11_2 (i.e. sub-gate line driver).

The gate drivers 11_1 and 11_2 have the same construction as the gate driver 11 of the first embodiment except that the set signal (S) supplied to the terminals 111 and 112 and the scan signal (OUT) from the terminal 120 are provided to different destinations. In the gate driver 11_1, a scan signal provided to the gate line 13G of the preceding row GL2(n−1) is supplied as a set signal (S) to the terminals 111 and 112 shown in FIG. 4. Then, the scan signal is provided to the gate line 13G: GL1(n) through the terminal 120 of FIG. 4. In the gate driver 11_2, a scan signal provided to the gate line 13G: GL1(n) is supplied as a set signal (S) to the terminals 111 and 112 shown in FIG. 4. Then, the scan signal is provided to the gate line 13G: GL2(n) through the terminal 120 shown in FIG. 4.

Figure 39A:
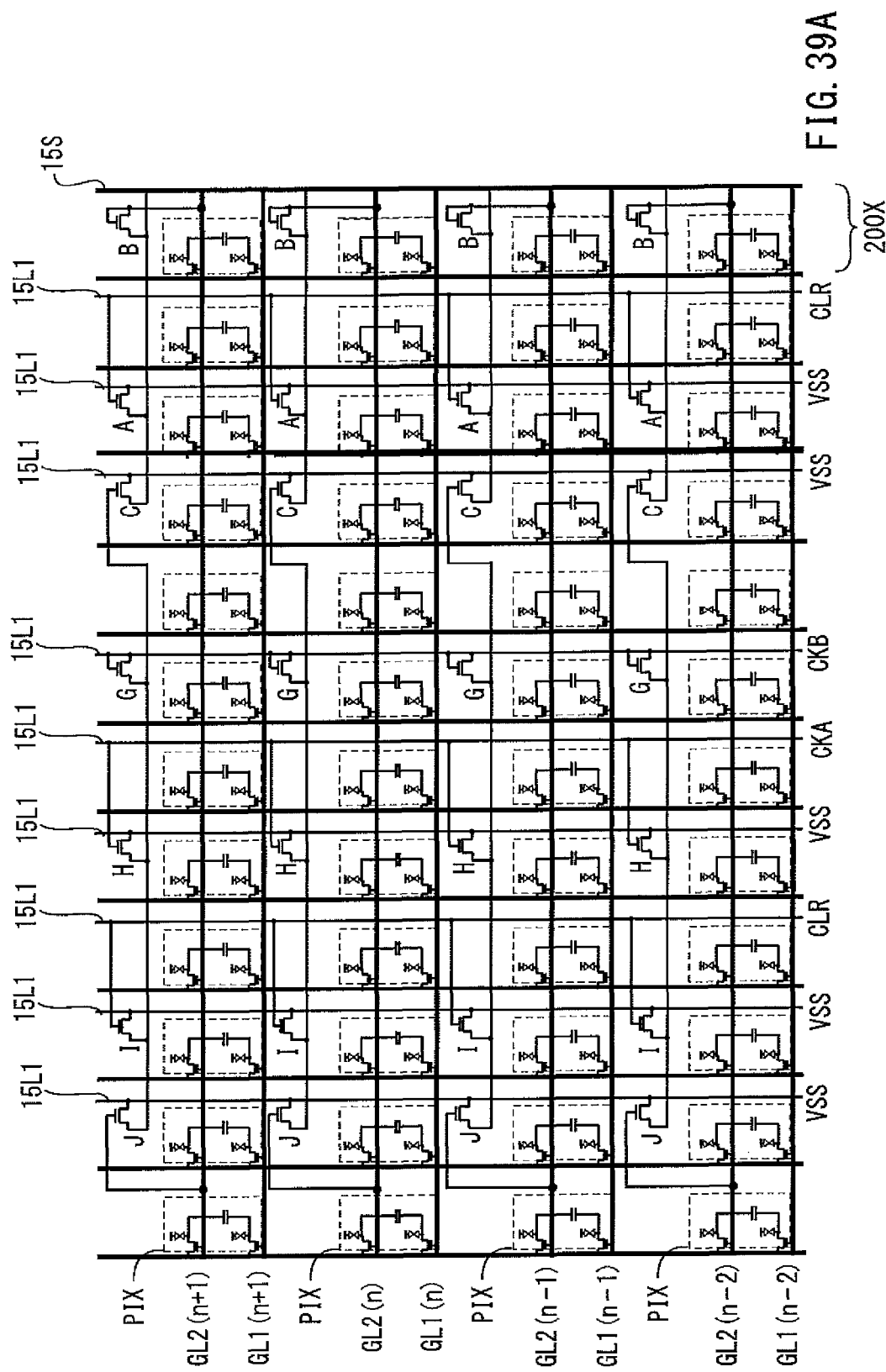
FIG. 39A schematically illustrates pixel regions in which gate drivers 11_1 are provided in the twelfth embodiment.
Figure 39B:
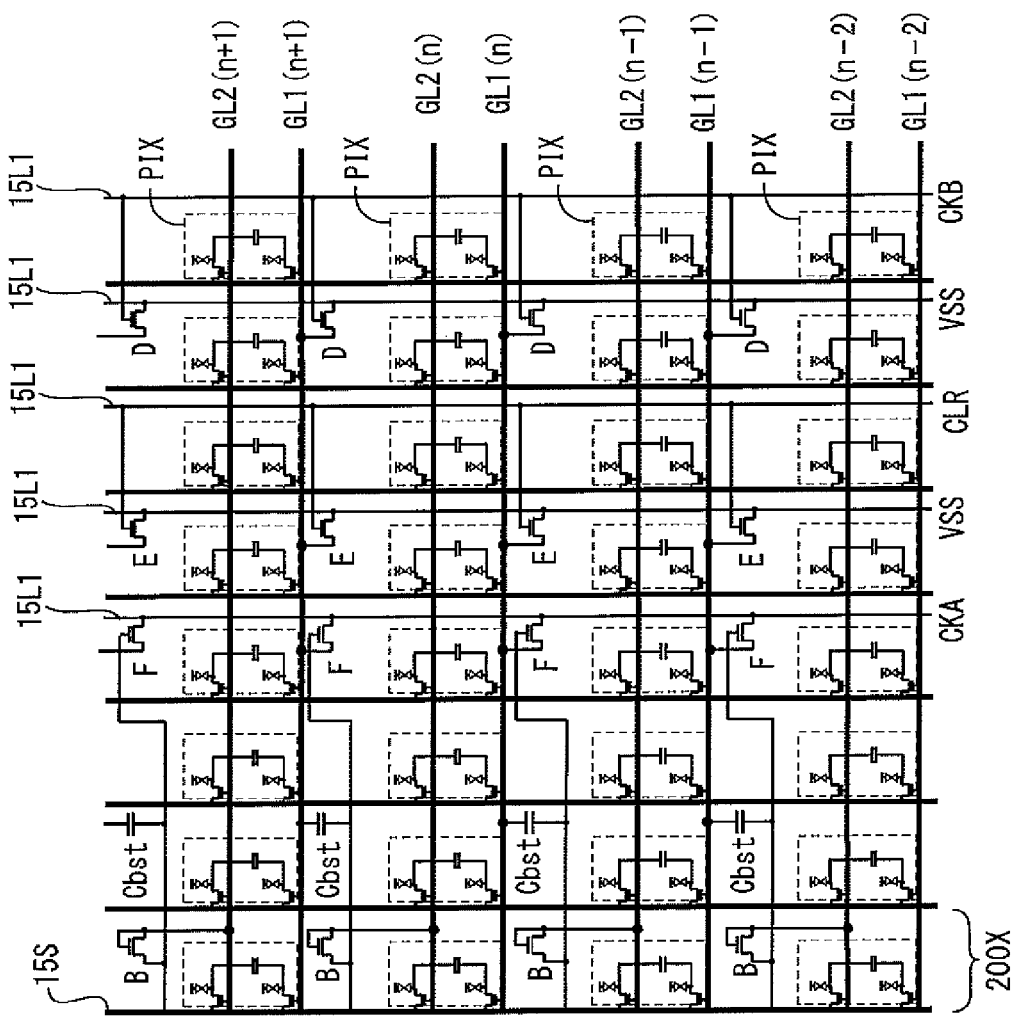
FIG. 39B schematically illustrates pixel regions in which gate drivers 11_1 are provided in the twelfth embodiment.
Figure 39C:
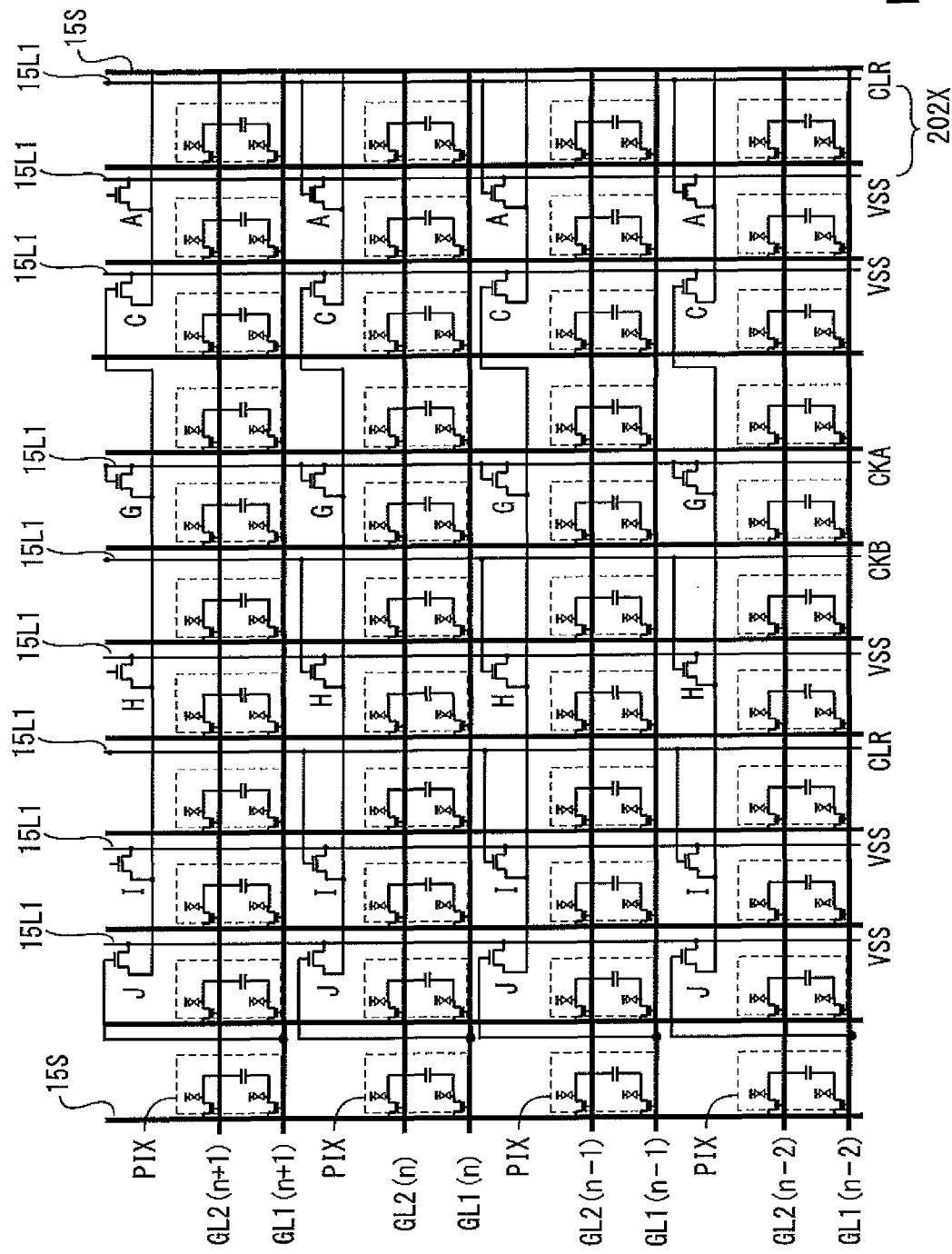
FIG. 39C schematically illustrates pixel regions in which gate drivers 11_2 are provided in the twelfth embodiment.
Figure 39D:
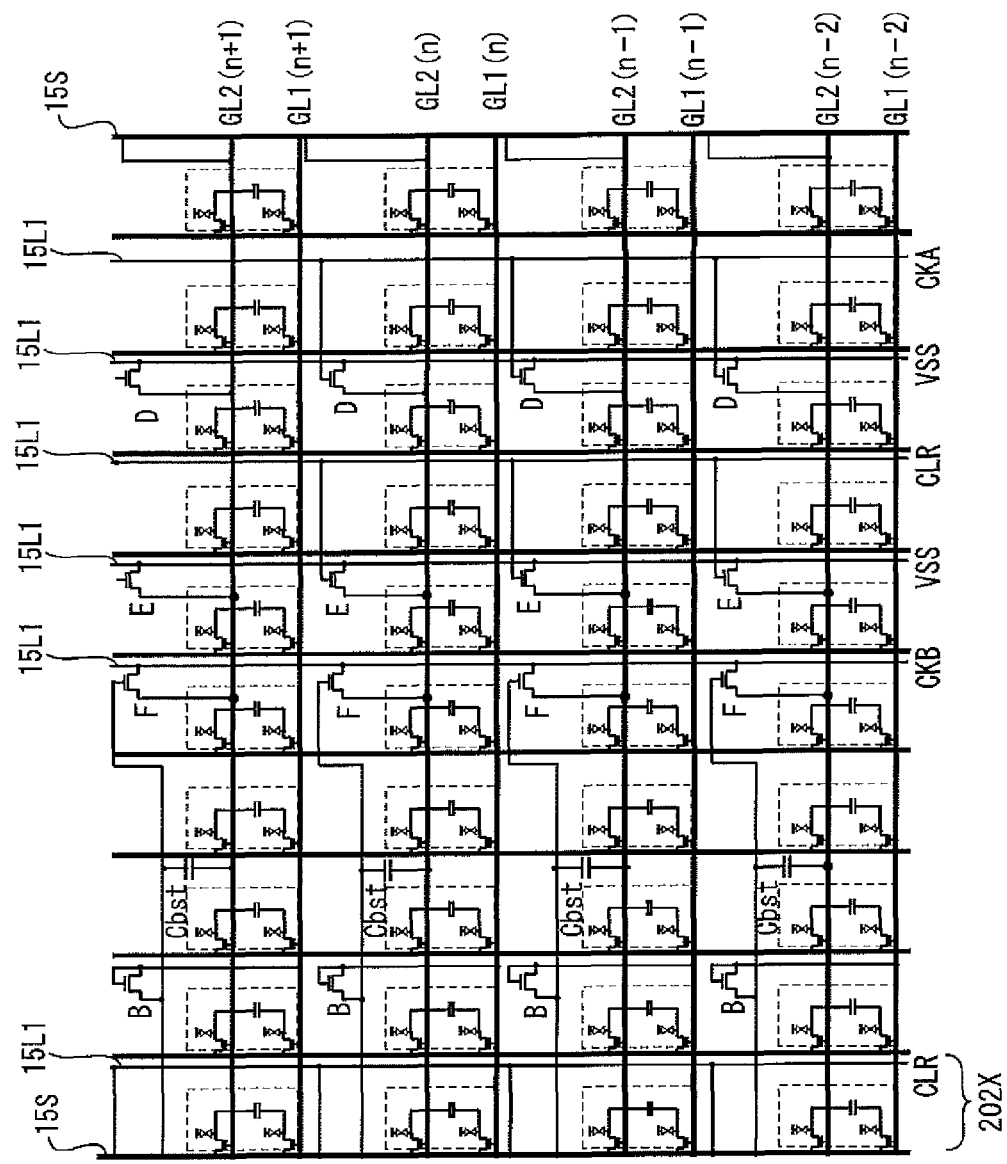
FIG. 39D schematically illustrates pixel regions in which gate drivers 11_2 are provided in the twelfth embodiment.

FIGS. 39A to 39D show an example arrangement of gate drivers 11_1 and 11_2 in the display region. The pixel regions of FIGS. 39A to 39D form a continuity. The representations of FIGS. 39A and 39B are connected at the pixel regions of the column 200x shown in these drawings and are continuous. The representations of FIGS. 39C and 39D are connected at the pixel regions of the column 202x shown in these drawings and are continuous.

Although FIGS. 39A to 39D do not have the character "TFT", "A" to "J" in these drawings indicate "TFT-A" to "TFT-J" constituting the gate drivers 11. As shown in FIGS. 39A and 39B, the elements constituting the gate drivers 11_1 (TFT-A to J and Cbst) are dispersed among gate lines 13G: GL1. The TFT-B and J of a gate driver 11_1 are connected with the gate line 13G: GL2 of the preceding row. The TFT-D to F and capacitor Cbst of the gate drivers 11_1 are connected with gate lines 13G: GL1. The gate lines 13G: GL1 are sequentially driven by the gate drivers 11_1 in response to the control signals (CKA, CKB, CLR and VSS) supplied via the lines 15L1.

As shown in FIGS. 39C and 39D, the elements constituting the gate drivers 11_2 (TFT-A to J and Cbst) are dispersed among gate lines 13G: GL1 in the columns in which no gate driver 11_1 is present. The TFT-B and J of the gate drivers 11_2 are connected with gate lines 13G: GL1. Further, the TFT-D to F and capacitor Cbst of a gate driver 11_2 are connected with the gate line 13G: GL2 of the subsequent row. The gate lines 13G: GL2 are sequentially driven by the gate drivers 11_2 in response to the control signals (CKA, CKB, CLR and VSS) supplied via the lines 15L1. That is, in the present embodiment, the gate line 13G: GL2(n−1) is driven and then the gate line 13G: GL1(n) is driven by gate drivers 11_1. After the gate line 13G: GL1(n) is driven, the gate line 13G: GL2(n) is driven by the gate driver 11_2.

Figure 40:
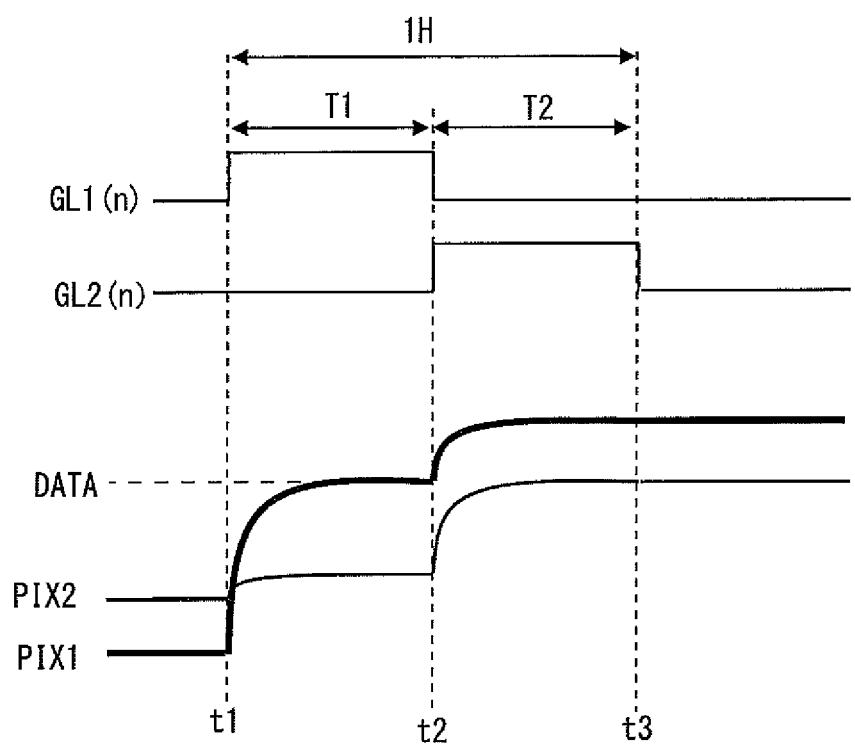
FIG. 40 is a timing chart illustrating how a pixel of the twelfth embodiment is driven.

FIG. 40 is a timing chart showing the driving of the gate lines 13G: GL1(n) and GL2(n) and changes in the potential of the pixel. As shown in FIG. 40, in the present embodiment, one horizontal interval is divided into a T1 period and T2 period, where the gate line 13G: GL1(n) is driven in the period T1 and the gate line 13G: GL(2) is driven in the T2 period.

At time t1, the gate line 13G: GL1(n) is driven by the gate driver 11_1 and a positive data signal is supplied to the source line 15S, which turns on the switching element T1. Thus, the potential of the sub-pixel PIX1 increases depending on the data signal. After time t2, the potential of the gate line 13G: GL1(n) goes to L level and the gate line 13G: GL2(n) is driven by the gate driver 11_2, which turns off the switching element T1 and turns on the switching element T2. Thus, the potential of the sub-pixel PIX2 increases depending on the data signal. At this moment, the potential of the sub-pixel PIX1 is in a floating state, which amplifies the potential of the sub-pixel PIX1 via the capacitor C. As a result, the sub-pixel PIX2 displays an image at a luminance determined by data signals, while the sub-pixel PIX1 displays an image at a luminance higher than that determined by data signals.

Thirteenth Embodiment

The present embodiment describes an implementation where, when the display mode of the liquid crystal display device 1 is the VA mode, the potential of an auxiliary capacitance provided in a pixel is controlled to reduce the voltage amplitude of data signals, thereby reducing power consumption.

Figure 41:
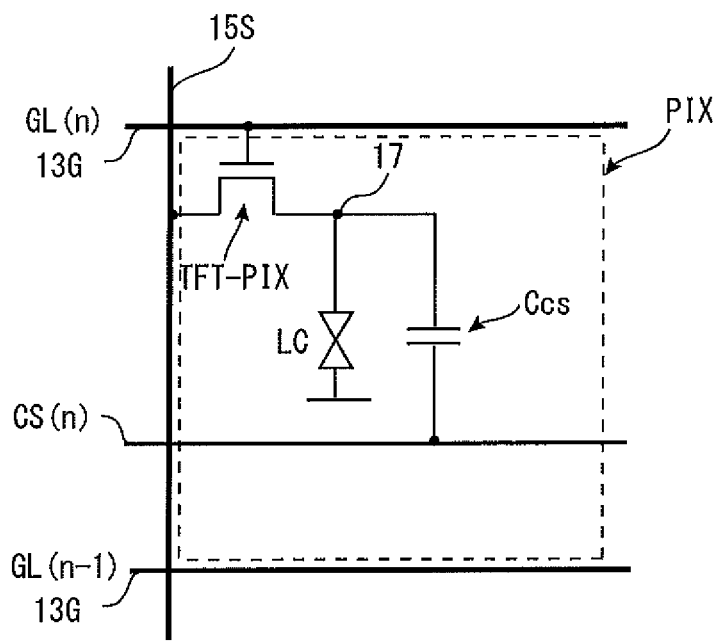
FIG. 41 shows an equivalent circuit of a pixel according to a thirteenth embodiment.

FIG. 41 shows an equivalent circuit of a pixel PIX according to the present embodiment. As shown in FIG. 41, in the present embodiment, in a pixel PIX are provided a switching element TFT-PIX connected with the gate line 13G: GL(n), a pixel electrode 17, a capacitor Ccs, and an auxiliary capacitance line CS(n) extending substantially parallel to the gate line 13G. One of the electrodes of the capacitor Ccs is connected with the pixel electrode 17, while the other electrode is connected with the auxiliary capacitance line CS(n). The pixel PIX includes a liquid crystal capacitance LC formed between the pixel electrode 17 and common electrode 18 (see FIG. 42), and an auxiliary capacitance formed by the capacitor Ccs.

Figure 42:
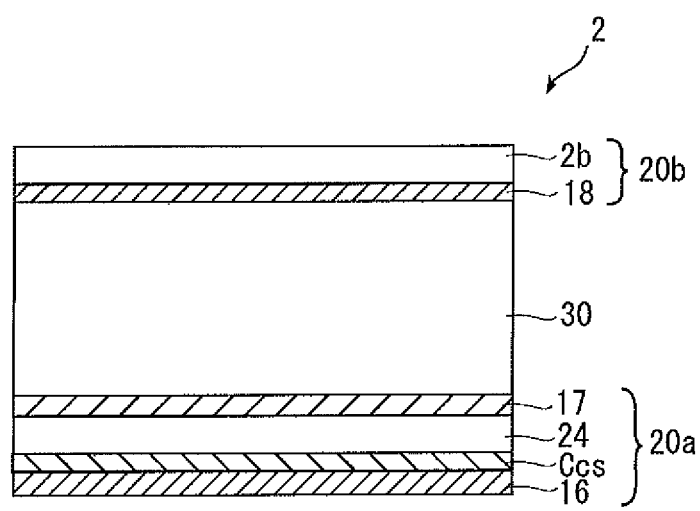
FIG. 42 is a schematic cross-sectional view of a pixel shown in FIG. 41.

FIG. 42 is a schematic cross-sectional view of the display panel 2 according to the present embodiment. As shown in FIG. 42, a liquid crystal layer 30 is provided between the active-matrix substrate 20a and counter-substrate 20b. The counter-substrate 20b includes a glass substrate 2b, on which a common electrode 18 is provided. Further, the active-matrix substrate 20a includes a capacitor Ccs below the pixel electrode 17, with the interlayer insulating film 24 being present in between. When no voltage is applied to the liquid crystal capacitance LC between the common electrode 18 and pixel electrode 17, the liquid crystal molecules are vertically oriented, and the orientation of the liquid crystal molecules changes depending on the voltage applied. In the present embodiment, as is the case in the first embodiment, a gate driver 11 provided in the display region drives a gate line 13G. Further, a CS driver provided in the display region (i.e. auxiliary capacitance line driver) controls the potential of an auxiliary capacitance line CS(n).

Figure 43:
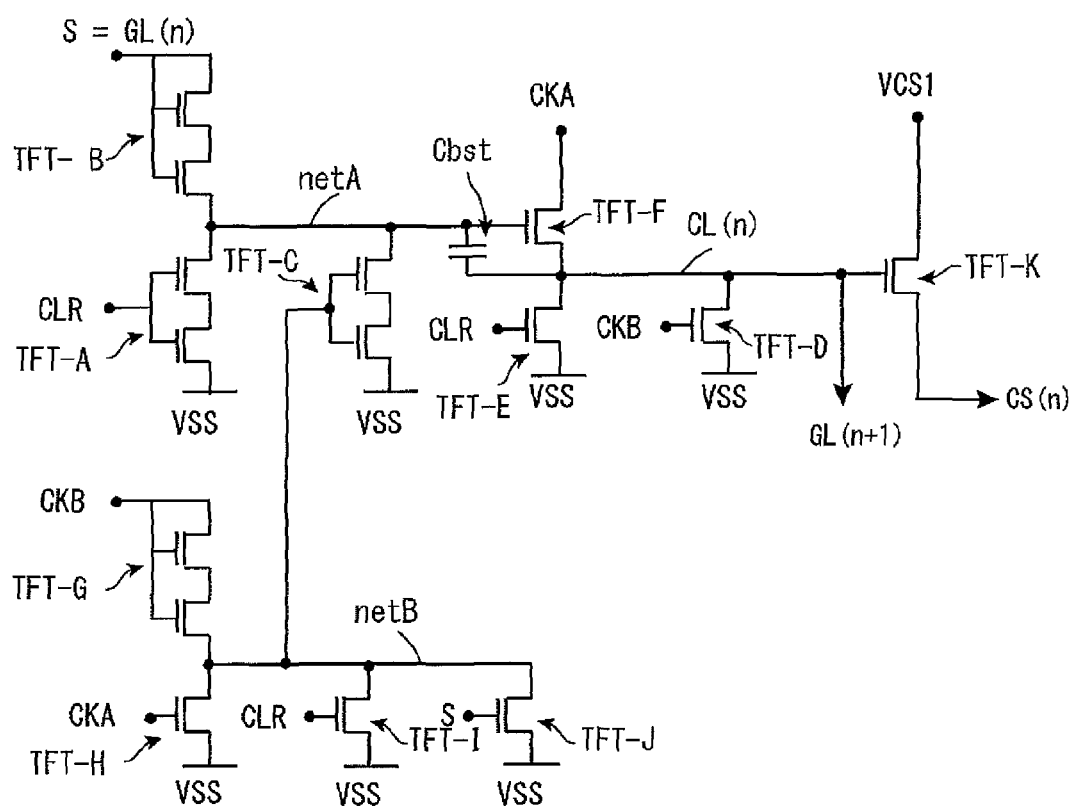
FIG. 43 shows an equivalent circuit of a gate driver and CS driver of the thirteenth embodiment.

In the present embodiment, the elements constituting a gate driver 11 and a CS driver are constructed as a single unit. FIG. 43 shows an equivalent circuit composed of the elements of a CS driver and gate driver 11. The TFT-A to J and capacitor Cbst of FIG. 43 have the same construction as the gate driver 11 of the first embodiment. In FIG. 43, the line to which the electrode of the capacitor Cbst that is not connected with the netA, the source terminal of the TFT-F, and the drain terminals of the TFT-E and TFT-D are connected will be referred to as line CL(n). The line CL(n) is connected with the gate line 13G: GL(n+1).

The line CL(n) of the gate driver 11 is connected with the gate terminal of the TFT-K. The TFT-K is a switching element constituting a part of the CS driver. The voltage signal VCS1 or VCS2 is supplied to the source terminal of the TFT-K, and the drain terminal is connected with the auxiliary capacitance line CS(n).

As is the case with the first embodiment, a set signal (S) is supplied to the TFT-B and J of the gate driver 11 for driving the gate line 13G: GL(n+1) by the gate line 13G of the preceding row (GL(n)). In response to the control signals (CKA, CKB, CLR, VSS), the potential of the line CL(n) is provided to the gate line 13G: GL(n+1). When the potential of the line CL(n) transitions to H level, the TFT-K turns on, and the potential of the voltage signal VCS1 or VCS2 is supplied to the auxiliary capacitance line CS(n). The phases of the potentials of the voltage signals VCS1 and VCS2 are opposite to each other, and these voltage signals are supplied by the control circuit (not shown) while the polarity of each of them is reversed on a frame-to-frame basis.

Figure 44B:
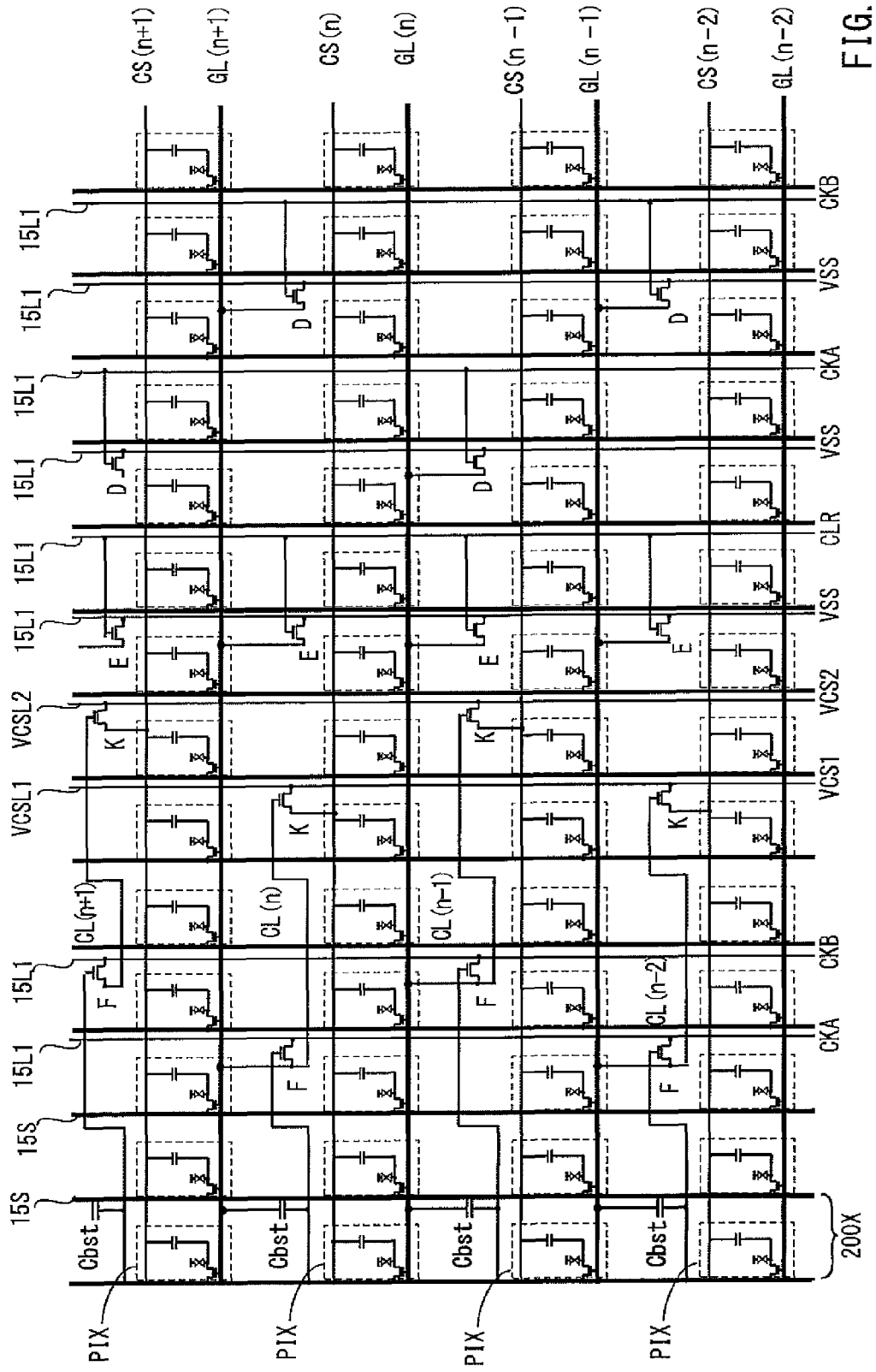
FIG. 44B is a schematic diagram of pixel regions in which gate drivers and CS drivers are provided of the thirteenth embodiment.

FIGS. 44A and 44B show an example arrangement of the elements of FIG. 43 in the display region. The representations of FIGS. 44A and 44B are connected at the column 200x in these drawings and are continuous. As shown in FIGS. 44A and 44B, auxiliary capacitance lines CS are provided to extend substantially parallel to the gate lines 13G. Although FIGS. 44A and 44B do not have the character "TFT-", "A" to "K" in these drawings indicate TFT-A to TFT-K. As shown in these drawings, the TFT-A to J, capacitor Cbst, TFT-K are dispersed among pixel regions between gate lines 13G. Further, the gate terminals of the TFT-B and J of the gate driver 11 for driving the gate line 13G: GL(n), for example, are connected with the gate line 13G: GL(n−1). The source terminals of the TFT-D to F and one of the electrodes of the capacitor Cbst are connected with the gate line 13G: GL(n).

In the pixel regions of the columns in which TFTs-K are provided in FIG. 44B, auxiliary capacitance signal lines VCSL1 and VCSL2 for supplying voltage signals VCS1 or VCS2 are provided to extend substantially parallel to the source lines 15S. The gate terminal of a TFT-K and the source terminal of a TFT-F are connected via a line CL(n). The drain terminal of a TFT-K is connected with an auxiliary capacitance line CS. Each TFT-K is disposed so as to have a potential with the phase that is opposite that of the potential of voltage signals supplied to the TFT-K in an adjacent row.

Figure 45:
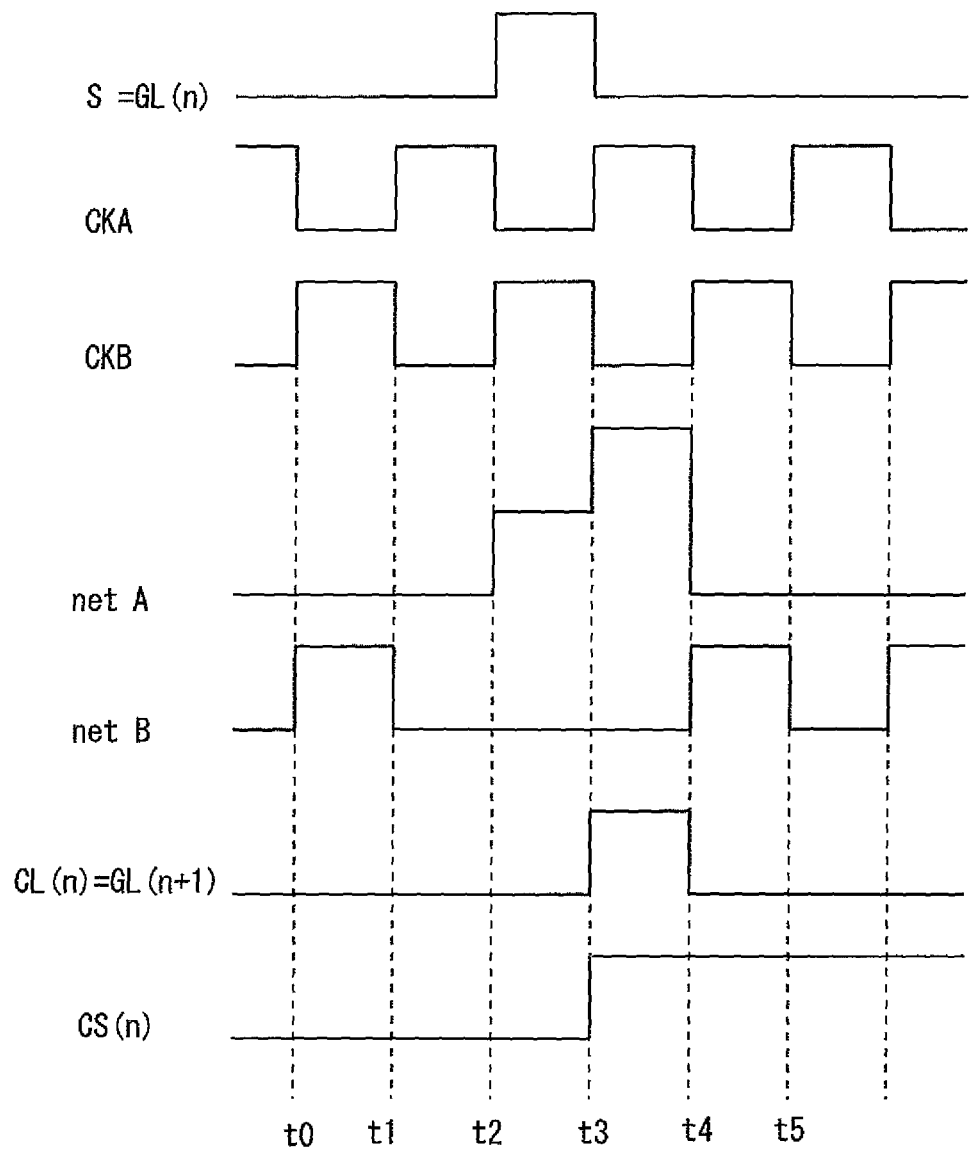
FIG. 45 is a timing chart illustrating how a gate line and an auxiliary capacitance line of the thirteenth embodiment are driven.

The operation of the gate driver 11 and CS driver represented by the equivalent circuit of FIG. 43 will be described below. FIG. 45 is a timing chart showing the operation of the equivalent circuit of FIG. 43. FIG. 45 shows an implementation where the gate line 13G: GL(n+1) is driven by the gate driver 11. The operation of the gate driver 11 driving the gate line 13G is the same as the operation illustrated by FIG. 9 (for an implementation where the gate line 13G: GL(n) is driven), and thus its description will not be given.

At time t3 of FIG. 45, the potential of the netA is further amplified and an H level potential is supplied to the line CL(n), i.e. the gate line 13G: GL(n+1), which turns on the TFT-K. Thus, the potential of the voltage signal VCS1 supplied to the TFT-K is provided to the auxiliary capacitance line CS(n). In this example, an H level voltage signal VCS1 is supplied. In response to the voltage signal VCS1, the potential of the auxiliary capacitance line CS(n) transitions from L level to H level.

Figure 46:
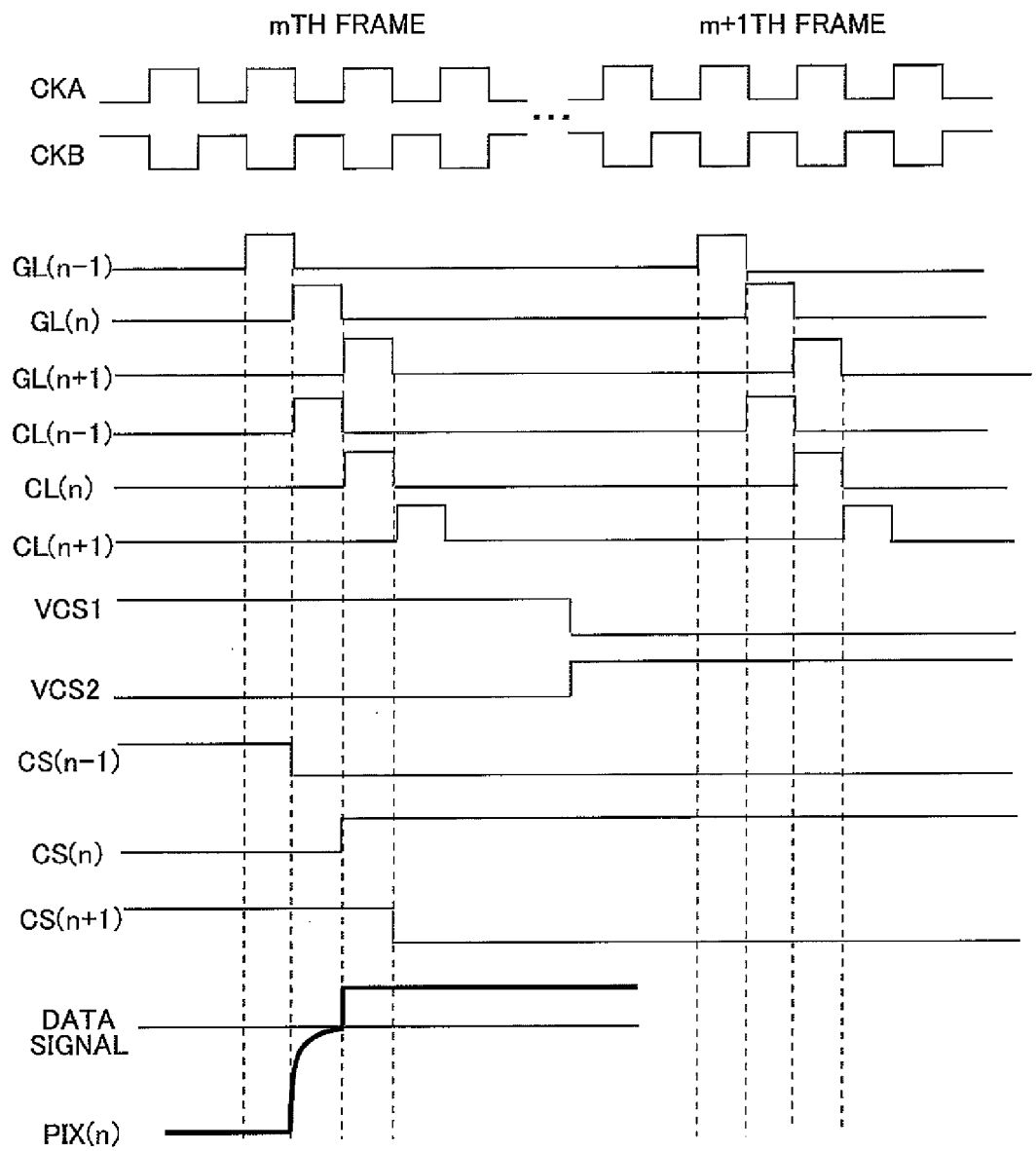
FIG. 46 is a timing chart illustrating how a pixel of the thirteenth embodiment is driven on a frame-to-frame basis.

That is, as shown in FIG. 46, the gate lines 13G: GL(n−1) to GL(n) are sequentially driven, and the potential of the corresponding line CL transitions from L level to H level at the time point at which the gate line 13G of the subsequent row is driven. In FIG. 46, if an H level voltage signal VCS1 and L level voltage signal VCS2 are provided by the control circuit (not shown) in the mth frame, an L level voltage signal VCS1 and an H level voltage signal VCS2 are provided by the control circuit (not shown) in the m+1th frame.

As shown in FIGS. 44A and 44B, the voltage signal VCS2 is supplied to the TFT-K connected with the auxiliary capacitance line CS(n−1) and auxiliary capacitance line CS(n+1). Further, the voltage signal VCS1 is supplied to the TFT-K connected with the auxiliary capacitance line CS(n). Thus, the potential of the auxiliary capacitance line CS(n−1)

is maintained at H level by the voltage signal VCS2 supplied in the m−1th frame until the gate line 13G: GL(n) is driven. Then, it is caused to transition to L level by the voltage signal VCS2 of the mth frame at the time point at which the gate line 13G: GL(n) is driven, that is, when the potential of the line CL(n−1) goes to H level.

Further, until the gate line 13G: GL(n+1) is driven, the potential of the auxiliary capacitance line CS(n) is maintained at L level by the voltage signal VCS1 supplied in the m−1th frame. Then, it is caused to transition to H level by the voltage signal VSC1 of the mth frame at the time point at which the gate line 13G: GL(n+1) is driven, that is, when the potential of the line CL(n) goes to H level. Similarly, when the potential of the line CL(n+1) goes to H level, the voltage signal VCS2 of the mth frame causes the potential of the auxiliary capacitance line CS(n+1) to transition to L level.

In the m+1th frame, each of the potentials of the voltage signals VCS1 and VCS2 of the mth frame is reversed, and a potential with the reversed polarity with respect to the polarity of the potentials of the mth frame is supplied to the auxiliary capacitance lines CS(n−1) to CS(n+1).

Thus, when the gate line 13G: GL(n) is driven in the mth frame, the potential of the pixel PIX(n) having the pixel electrode 17 connected with the gate line 13G: GL(n) increases depending on the data signal. Then, when the gate line 13G: GL(n+1) is driven and the auxiliary capacitance line CS(n) goes to H level, the potential of the pixel PIX(n) is amplified via the capacitor Ccs. In the m+1th frame, a negative data signal is supplied to the source line 15S and an L level voltage signal VCS1 is supplied to the auxiliary capacitance line CS(n) via the auxiliary capacitance signal line VCSL1. As a result, when the gate line 13G: GL(n) is driven, the potential of the pixel PIX(n) is negatively amplified in response to the data signal, and, when the gate line 13G: GL(n+1) is driven and the auxiliary capacitance line CS(n) goes to H level, it is negatively amplified via the capacitor Ccs.

Thus, the pixel PIX(n) displays an image at a luminance that is higher than that determined by a data signal supplied in the mth frame. This reduces the amplitude of data signals, reducing power consumption. Further, in the present embodiment, an element (TFT-K) constituting a part of a CS driver controlling the potential of an auxiliary capacitance line CS, together with the gate line 11, is provided in the display region, and the voltage signals VCS1 and VCS2 are supplied to the CS driver from the source driver 3 via the auxiliary capacitance signal lines VCSL1 and VCSL2. This reduces the width of the portions of the picture frame that are along the side without a source driver 3 compared with implementation where CS drivers are provided outside the display region.

Fourteenth Embodiment

The present embodiment describes an implementation where, when the display mode of the liquid crystal display device 1 is the fringe field switching (FFS) mode, the potential of the common electrode is controlled to reduce the amplitude of the voltage of data signals, thereby reducing power consumption.

Figure 47:
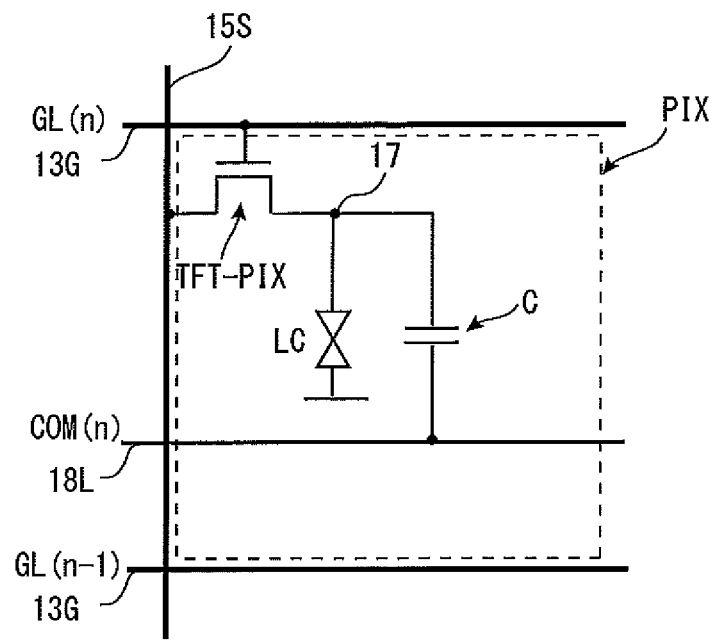
FIG. 47 shows an equivalent circuit of a pixel according to a fourteenth embodiment.

FIG. 47 shows an equivalent circuit of a pixel PIX according to the present embodiment. As shown in FIG. 47, in the pixel PIX are provided a TFT-PIX connected with the gate line 13G: GL(n), a pixel electrode 17, a capacitor C, and a common electrode line 18L (COM(n)) extending substantially parallel to the gate line 13G. The capacitor C has one electrode connected with the pixel electrode 17 and the other electrode connected with the common electrode line 18L: COM(n). The pixel PIX includes a liquid crystal capacitance LC formed by the pixel electrode 17 and common electrode line 18L, and an auxiliary capacitance formed by a capacitor C.

Figure 48:
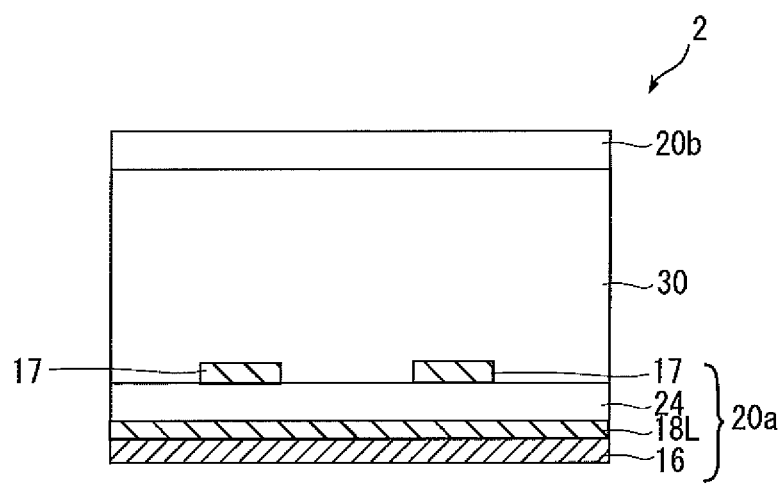
FIG. 48 is a schematic cross-sectional view of the pixel of FIG. 47.

FIG. 48 is a schematic cross-sectional view of the display panel 2 of the present embodiment. As shown in FIG. 48, a liquid crystal layer 30 is provided between an active-matrix substrate 20a and a counter-substrate 20b. A comb teeth-shaped pixel electrode 17 is provided on the active-matrix substrate 20a. A common electrode line 18L is provided below the pixel electrode 17, with the interlayer insulating film 24 being present in between. When no voltage is applied between the common electrode line 18L and pixel electrode 17, the liquid crystal molecules are horizontally oriented, and the orientation of liquid crystal molecules changes depending on the voltage applied.

As is the case in the first embodiment, in the present embodiment, a gate driver 11 provided in the display region drives a gate line 13G, and, a COM driver (i.e. common electrode driver) provided in the display region controls the potential of the common electrode line 18L. The polarity of the potential of the common electrode line 18L is reversed on a frame-to-frame basis. A data signal with a polarity reversed with respect to the potential of the common electrode line 18L is supplied to the source line 15S on a frame-to-frame basis.

Figure 49:
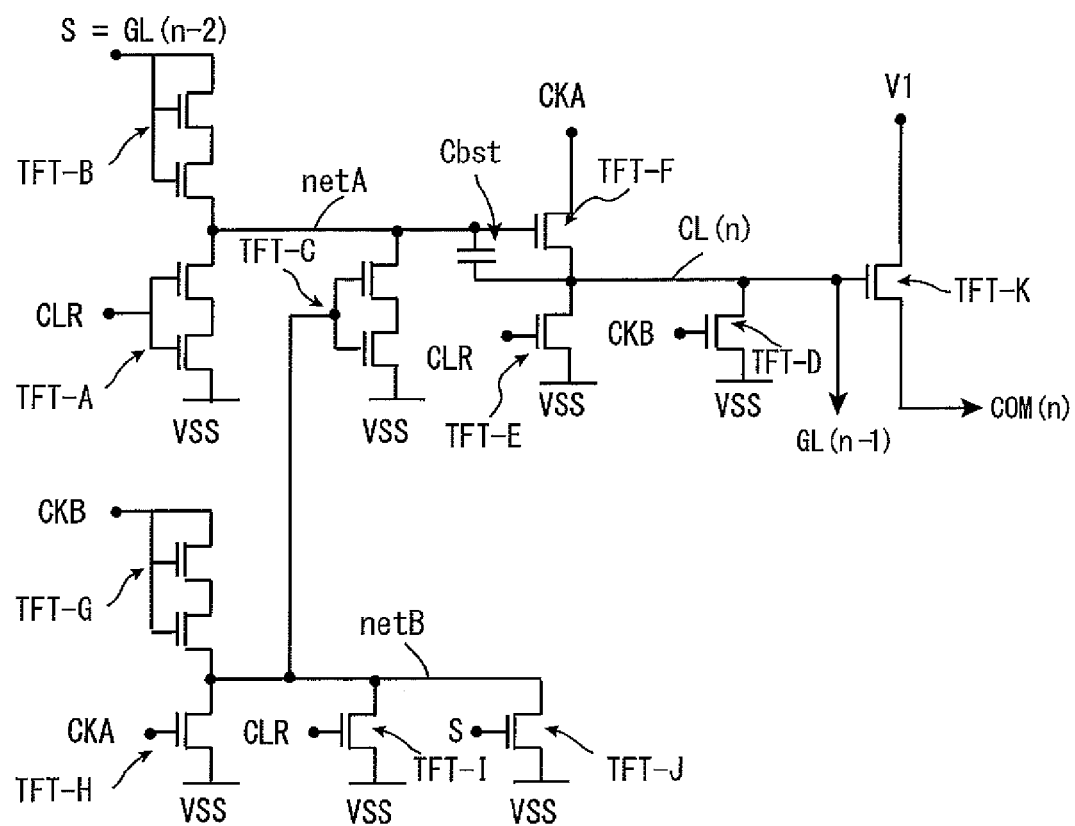
FIG. 49 shows an equivalent circuit of a gate driver and COM driver of the fourteenth embodiment.

In the present embodiment, the elements constituting a gate driver 11 and COM driver are constructed as a single unit. FIG. 49 shows an equivalent circuit composed of the elements of a COM driver and gate driver 11. The equivalent circuit of FIG. 49 has the same construction as the equivalent circuit of FIG. 43 for the thirteenth embodiment except that the gate line 13G: GL(n−1) is driven and the source terminal of the TFT-K is connected with the common electrode line 18L: COM(n). In the present embodiment, the TFT-K is a switching element constituting a part of the COM driver. The potentials of the voltage signals V1 and V2 supplied to the drain terminal of the TFT-K are of opposite phases. The polarity of each of the voltage signals V1 and V2 is reversed by the control circuit (not shown) on a frame-to-frame basis.

Figure 50A:
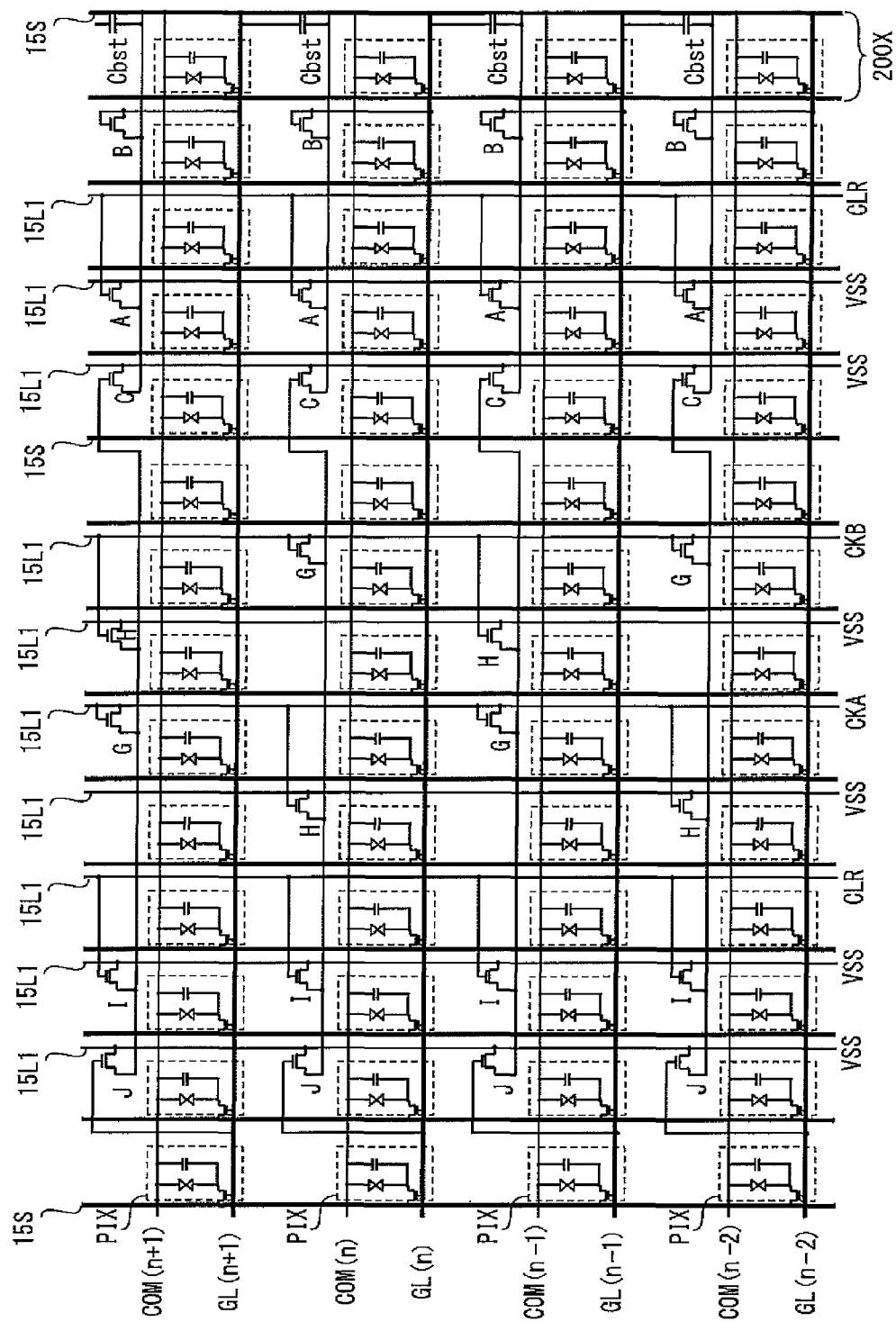
FIG. 50A is a schematic diagram of pixel regions in which gate drivers and COM devices are provided in the fourteenth embodiment.
Figure 50B:
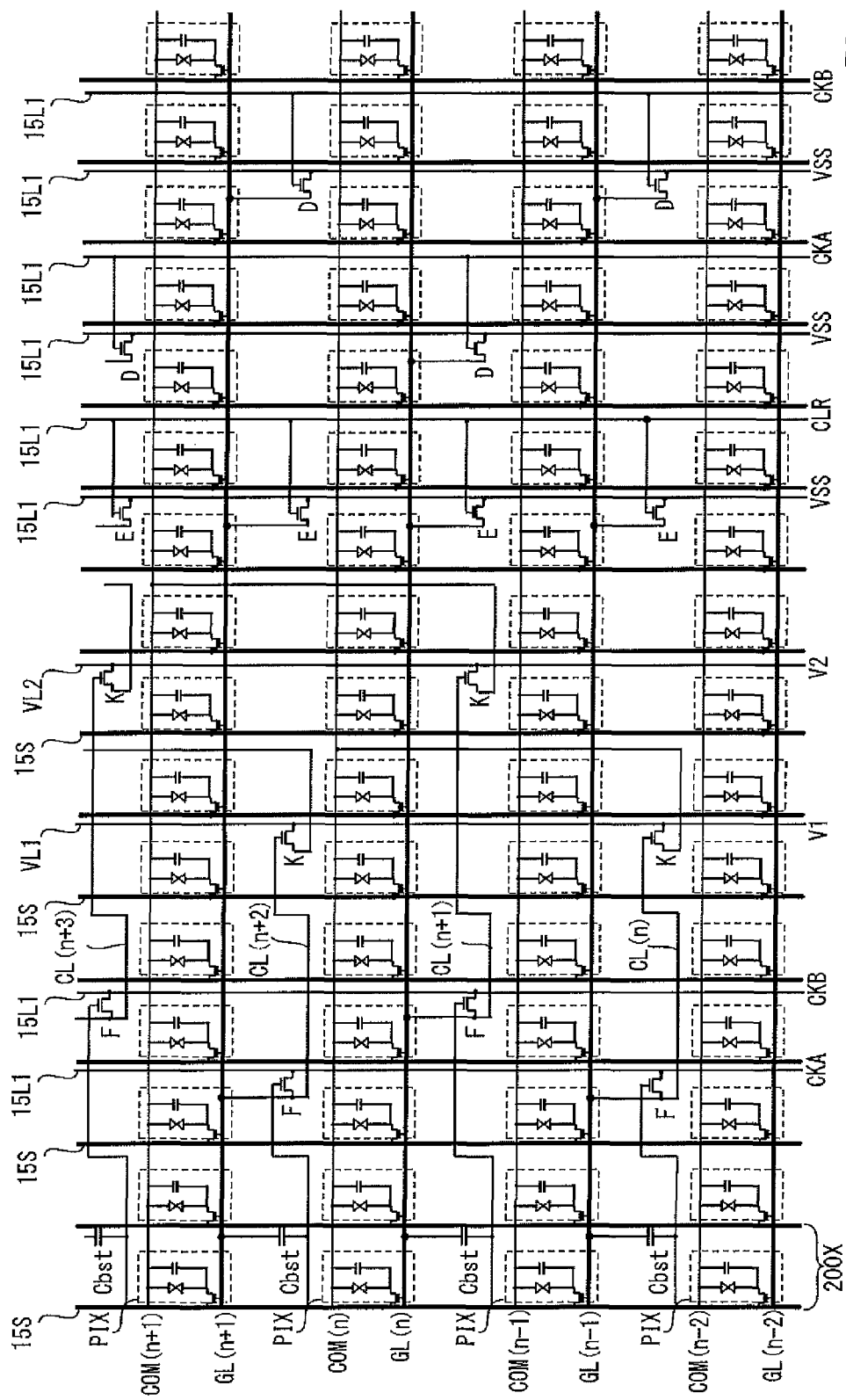
FIG. 50B is a schematic diagram of pixel regions in which gate drivers and COM devices are provided in the fourteenth embodiment.

FIGS. 50A and 50B show an example arrangement of the elements constituting the equivalent circuit of FIG. 49 in the display region. The representations of FIGS. 50A and 50b are connected at the column 200x in these drawings and are continuous. As shown in FIGS. 50A and 50B, common electrode lines 18L extend substantially parallel to the gate lines 13G. Although FIGS. 50A and 50B do not have the character "TFT-", "A" to "K" in these drawings indicate TFT-A to TFT-K described above. The TFT-A to J, capacitor Cbst, TFT-K are dispersed among pixel regions between gate lines 13G. The gate terminals of the TFT-B and J of the gate driver 11 for driving the gate line 13G: GL(n−1) is connected with the gate line 13G of the preceding row GL(n−2), and the source terminal of the TFT-D to F and one of the electrodes of the capacitor Cbst are connected with the gate line 13G: GL(n−1).

In the pixel regions of the columns in which the TFTs-K are provided in FIG. 50B, common electrode signal lines VL1 and VL2 each supplying the voltage signal V1 or V2 are provided to extend substantially parallel to the source lines 15S. The source terminal of the TFT-F of the gate driver 11 for driving the gate line 13G: GL(n−1) is connected with the gate terminal of the TFT-K via the line CL(n). The source terminal of the TFT-K is connected with the common electrode line 18L: COM(n). The TFTs-K in a row and those in an adjacent row are arranged such that the voltage signals and potentials supplied to the former have a phase opposite to that for the latter.

Figure 51:
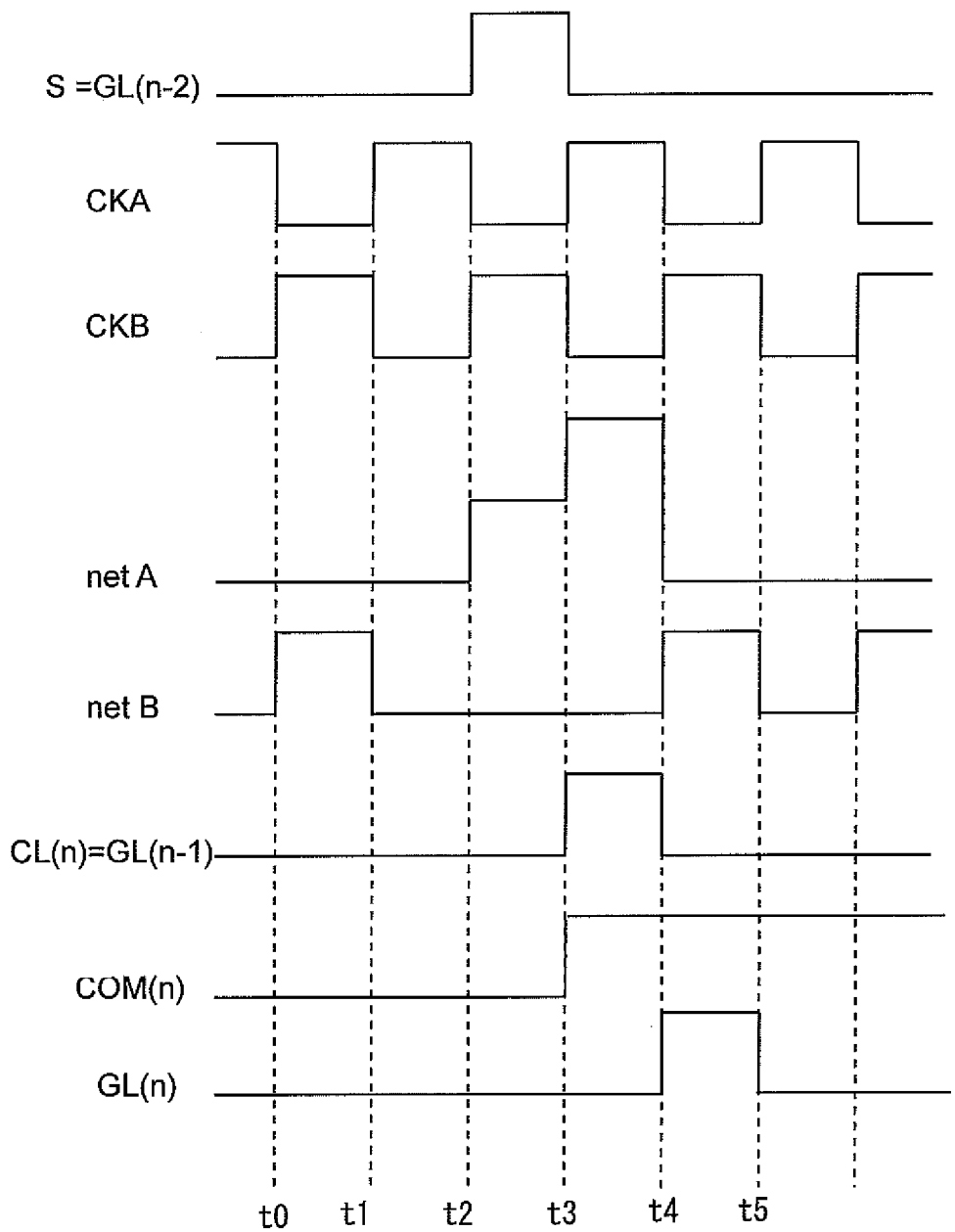
FIG. 51 is a timing chart illustrating how a gate line and a common electrode line of the fourteenth embodiment are driven.

The operation of the gate driver 11 and COM driver will be described below. FIG. 51 is a timing chart showing the operation of the equivalent circuit of FIG. 49. FIG. 51 shows an example where the gate line 13G: GL(n+1) is driven by the gate driver 11. The operation of the gate driver 11 driving the gate line 13G is the same as the operation illustrated by FIG. 9 (for an example where the gate line 13G: GL(n) is driven), and thus their description will not be given.

At time t3 of FIG. 51, the potential of the netA is further amplified as the clock signal (CKA) transitions to H level, and an H level potential is provided to the line CL(n), i.e. the gate line 13G: GL(n−1), which turns on the TFT-K. Thus, the potential of the voltage signal V1 supplied to the TFT-K is provided to the common electrode line 18L: COM(n). In this example, an H level voltage signal V1 is supplied. The potential of the common electrode line 18L: COM(n) transitions from L level to H level. After the common electrode line 18L: COM(n) transitions to H level, the gate line 13G: GL(n) is driven in a manner similar to that in which the gate line 13G: GL(n−1) is driven.

Figure 52:
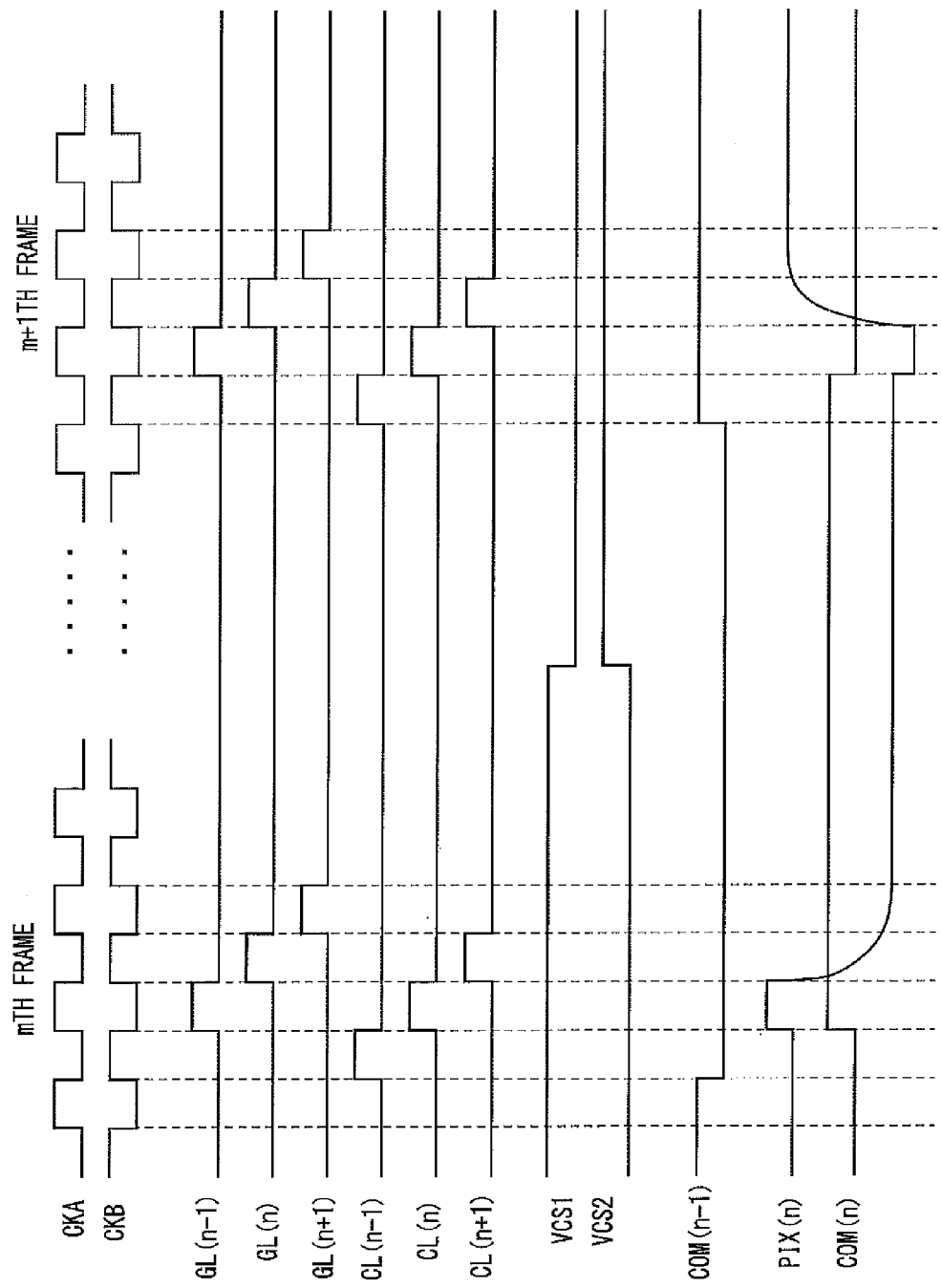
FIG. 52 is a timing chart illustrating how a pixel is driven on a frame-to-frame basis in the fourteenth embodiment.

That is, as shown in FIG. 52, the gate lines 13G: GL(n−1) to GL(n+1) are sequentially driven, and the potential of each of the lines CL(n−1) to CL(n+1) sequentially transitions from L level to H level at the time point at which the gate line 13G of the preceding row is driven. In FIG. 52, an H level voltage signal V1 and an L level voltage signal V2 are provided by the control circuit (not shown) in the mth frame. In the m+1th frame, an L level voltage signal V1 and an H level voltage signal V2 are provided by the control circuit (not shown).

The voltage signal V1 is supplied to the TFT-K connected with the common electrode line 18L: COM(n), and the voltage signal V2 is supplied to the TFT-K connected with the common electrode line 18L: COM(n+1) (see FIGS. 50A and 50B). Thus, the potential of the common electrode line 18L: COM(n) is maintained at L level by the voltage signal V1 supplied in the m−1th frame until the gate line 13G: GL(n−1) is driven. Then, it is caused to transition to H level by the voltage signal V1 of the mth frame at the time point at which the gate line 13G: GL(n−1) is driven, that is, when the potential of the line CL(n) goes to H level. Similarly, the potential of the common electrode line 18L: COM(n−1) is caused to transition to L level by the voltage signal V2 of the mth frame at the time point at which the gate line 13G: GL(n−2) is driven, that is, when the potential of the line CL(n−1) goes to H level.

In the m+1th frame, the polarity of each of the voltage signals V1 and V2 is reversed with respect to those of the mth frame such that potentials with polarities reversed with respect to those for the mst frame are supplied to the common electrode lines 18L: COM(n−1) to COM(n+1). The polarity of the potential of the common electrode line 18L of each pixel PIX is reversed before the data for this pixel PIX is written such that a data signal with a polarity opposite to that for the common electrode lines 18L is provided by the source driver 3 to the source lines 15S. Thus, when a negative data signal is written to the pixel PIX (n) in the mth frame, as shown in FIG. 52, the potential of the line CL(n) goes to H level, and, when the potential of the common electrode line 18L: COM(n) transitions to H level, the potential of the pixel PIX(n) is positively amplified. Then, the gate line 13G: GL(n) is driven and a negative data signal is supplied to the source line 15S. Thus, the potential of the pixel PIX(n) is negatively amplified depending on the data signal and the potential of the common electrode line 18L: COM(n), and is maintained until the m+1th frame.

In the m+1th frame, when the potential of the common electrode line 18L: COM(n) transitions from H level to L level, the potential of the pixel PIX(n) is negatively amplified. Then, the gate line 13G: GL(n) is driven and a positive data signal is supplied to the source line 15S. Thus, the potential of the pixel PIX(n) is positively amplified depending on the data signal and the potential of the common electrode line 18L: COM(n), and is maintained until the m+2th frame.

As the polarity of a data signal is reversed in response to the common electrode line 18L whose polarity is reversed on a frame-to-frame basis, the amplitude of a data signal is reduced compared with that in implementations where the potential of the common electrode line 18L is constant, thereby reducing power consumption. Further, providing in the display region the elements constituting a COM driver for controlling the potential of a common electrode line 18L, together with a gate driver 11, reduces the width of the portions of the picture frame that are along the three sides of the display device, i.e. the sides other than that one having the source driver 3.

Fifteenth Embodiment

The fourteenth embodiment describes an implementation where the orientation of liquid crystal molecules is controlled by a horizontal electric field produced by the pixel electrodes and common electrode. The present embodiment describes an implementation where the orientation of liquid crystal molecules is controlled using a vertical electric field and horizontal electric field to improve the response speed of liquid crystal molecules.

Figure 53:
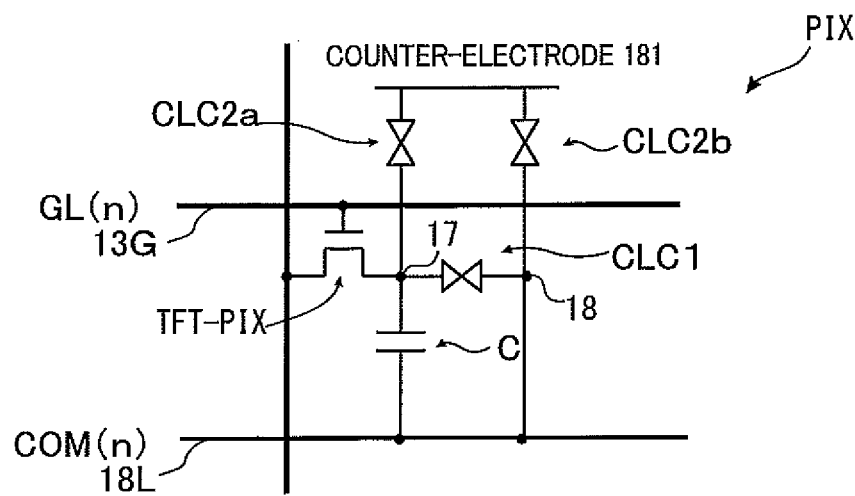
FIG. 53 shows an equivalent circuit of a pixel according to a fifteenth embodiment.
Figure 54:
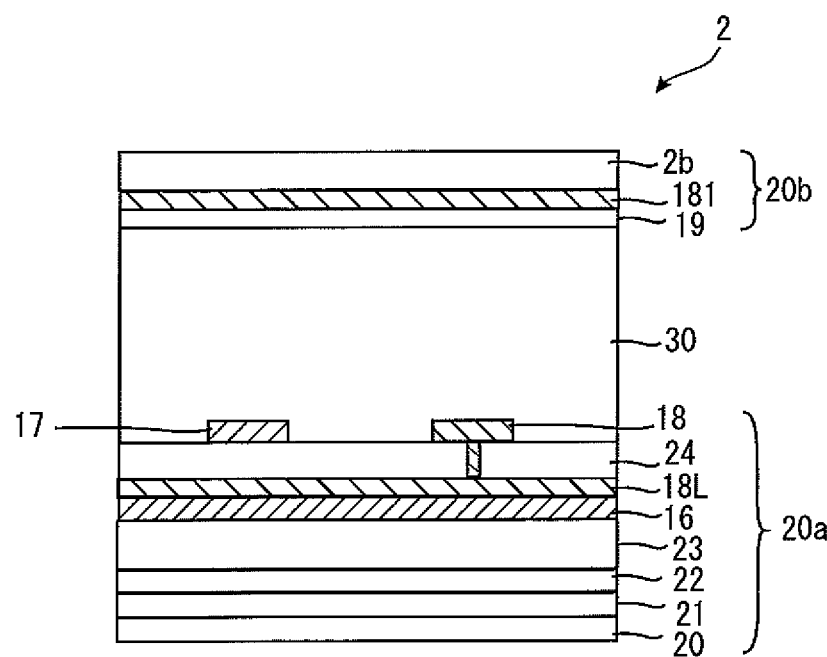
FIG. 54 is a schematic cross-sectional view of the pixel of FIG. 53.

FIG. 53 shows an equivalent circuit of a pixel according to the present embodiment. FIG. 54 is a schematic cross-sectional view of the pixel of FIG. 53. The construction of the display panel 2 and the pixel according to the present embodiment will be described below with reference to FIGS. 53 and 54.

As shown in FIG. 53, the pixel PIX of the present embodiment includes a TFT-PIX connected with a gate line 13G and a source line 15S, a pixel electrode 17, a common electrode 18 and a capacitor C. Further, a common electrode line 18L is provided for the pixel PIX, extending substantially parallel to the gate line 13G. The drain terminal of the TFT-PIX is connected with the pixel electrode 17 and one of the electrodes of the capacitor C. The other electrode of the capacitor C is connected with the common electrode line 18L.

As shown in FIG. 54, the counter-substrate 20b includes a glass substrate 2b, a counter-electrode 181 provided on the glass substrate, and a black matrix and color filters (both not shown). An overcoat layer 19 is provided on top of the counter-electrode 181. The active-matrix substrate 20a includes a pixel electrode 17 and a common electrode 18 disposed in parallel, and an interlayer insulating film 24 is provided below the pixel electrode 17 and common electrode 18. A common electrode line 18L is provided below the interlayer insulating film 24, and the common electrode line 18L and common electrode 18 are connected with each other via a contact hole formed in the interlayer insulating film 24.

The pixel PIX includes liquid crystal capacitances CLC1, CLC2a and CLS2b. The liquid crystal capacitance CLC1 is provided between the pixel electrode 17 and common electrode 18. The liquid crystal capacitance CLC2a is provided between the counter-electrode 181 and pixel electrode 17. The liquid crystal capacitance CLC2b is provided between the common electrode 18 and common electrode line 18L and the counter-electrode 181. The liquid crystal capacitance CLC1 produces a horizontal electric field and the liquid crystal capacitance CLC2a and liquid crystal capacitance CLC2b produce a vertical electric field.

The potentials of the common electrode 18 and common electrode line 18L are controlled by a COM driver (i.e. common electrode driver), described below, such that their polarity is reversed on a frame-to-frame basis. Further, a data signal with a reversed polarity with respect to the potential of the common electrode 18 and common electrode line 18L is supplied by the source driver 3 to the source line 15S.

Figure 55A:
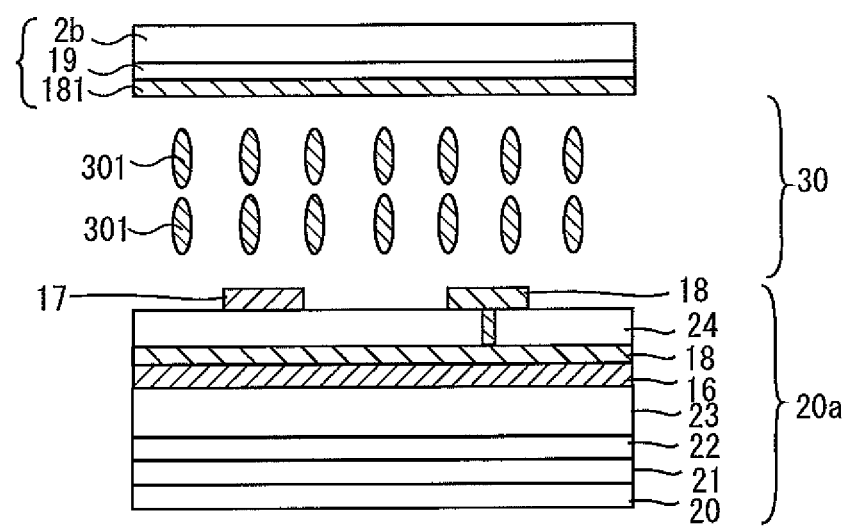
FIG. 55A schematically illustrates the pixel of FIG. 53 with no horizontal electric field being produced.
Figure 55B:
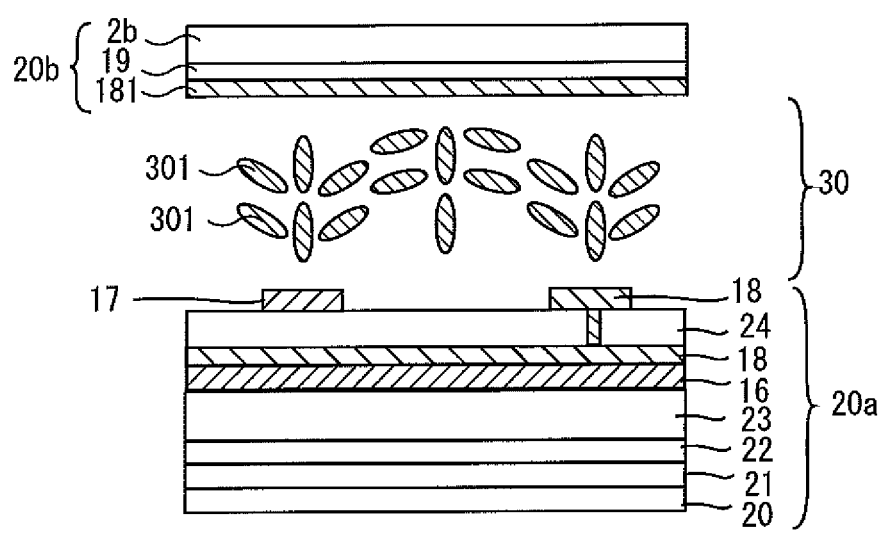
FIG. 55B schematically illustrates the pixel of FIG. 53 with a horizontal electric field being produced.

When a positive data signal is written to the pixel, for example, a DC voltage of 7.5 volts may be applied to the counter-electrode 181 and a voltage of 15 volts may be applied to the pixel electrode 17 and the common electrode 18 and common electrode line 18L, in which case no horizontal electric field is produced between the pixel electrode 17 and common electrode 18. As a result, as shown in FIG. 55A, liquid crystal molecules 301 are vertically oriented. Pixels oriented in this manner display black. On the other hand, under the above condition, a voltage of 0 volts on the pixel electrode 17 produces a horizontal electric field between the pixel electrode 17 and common electrode 18. In this case, as shown in FIG. 55B, the orientation of liquid crystal molecules 301 changes depending on the strength of the horizontal electric field. Pixels oriented in this manner displays white. When there is no horizontal electric field, the vertical electric field causes the liquid crystal molecules 301 to return to the vertical orientation. Thus, the response speed of the liquid crystal molecules 301 is improved.

When a negative data signal is written, for example, a voltage of 15 volts may be applied to the pixel electrode 17 and a voltage of 0 volts may be applied to the common electrode 18 and common electrode line 18L, in which case liquid crystal molecules 301 are oriented as shown in FIG. 55B, displaying white. Under this condition, a voltage of 0 volts on the pixel electrode 17 causes the liquid crystal molecules 301 to be oriented as shown in FIG. 55A (i.e. vertically oriented), displaying black.

In the present embodiment, as is the case in the present embodiment, the gate line 13G is driven by a gate driver 11 provided in the display region. Further, a COM driver for controlling the potentials of the common electrode 18 and common electrode line 18L is provided in the display region.

As is the case in the above fourteenth embodiment, the gate driver 11 and COM driver of the present embodiment are constructed such that the elements constituting the COM driver is integrated with the gate driver 11. An equivalent circuit of the gate driver 11 and COM driver of the present embodiment is the same as that of FIG. 49. Further, the elements constituting the gate driver 11 and COM driver of the present embodiment are provided in the display region, as is the case with the above elements of FIGS. 50A and 50B, and a timing chart for illustrating the driving of the pixel is the same as the above chart of FIG. 52.

Thus, when, as shown in FIG. 52, in the mth frame the potential of the line CL(n) goes to H level and the potentials of the common electrode line 18L: COM(n) and common electrode 18 transition to H level, the potential of the pixel PIX(n) is positively amplified. Then, the gate line 13G: GL(n) is driven, and a negative data signal is supplied to the source line 15S. Thus, the potential of the pixel PIX(n) is negatively amplified depending on the data signal and the potentials of the common electrode line 18L: COM(n) and common electrode 18, and is maintained until the m+1th frame.

In the m+1th frame, the potentials of the common electrode line 18L: COM(n) and common electrode 18 transition from H level to L level, and the potential of the pixel PIX(n) is negatively amplified. Then, the gate line 13G: GL(n) is driven and a positive data signal is supplied to the source line 15S. Thus, the potential of the pixel PIX(n) is positively amplified depending on the data signal and the potentials of the common electrode line 18L: COM(n) and common electrode 18, and is maintained until the m+2th frame.

Thus, using both a vertical electrode field and a horizontal electrode field increases the response speed of the liquid crystal layer 30 in each pixel. Further, providing in the display region the COM driver for controlling the potentials of the common electrode line 18L and common electrode 18 and the gate driver 11 for driving the gate line 13G reduces the width of the portions of the picture frame that are along the sides of the display device other than that one having the source driver 3.

Although embodiments of the present invention have been described, the above embodiments are merely examples that may be used to carry out the present invention. Thus, the present invention is not limited to the above embodiments, and can be carried out with appropriate modifications to or combinations of the above embodiments without departing from the spirit of the present invention. Variations of the present invention will be described below.

<Variations>

Figure 56:
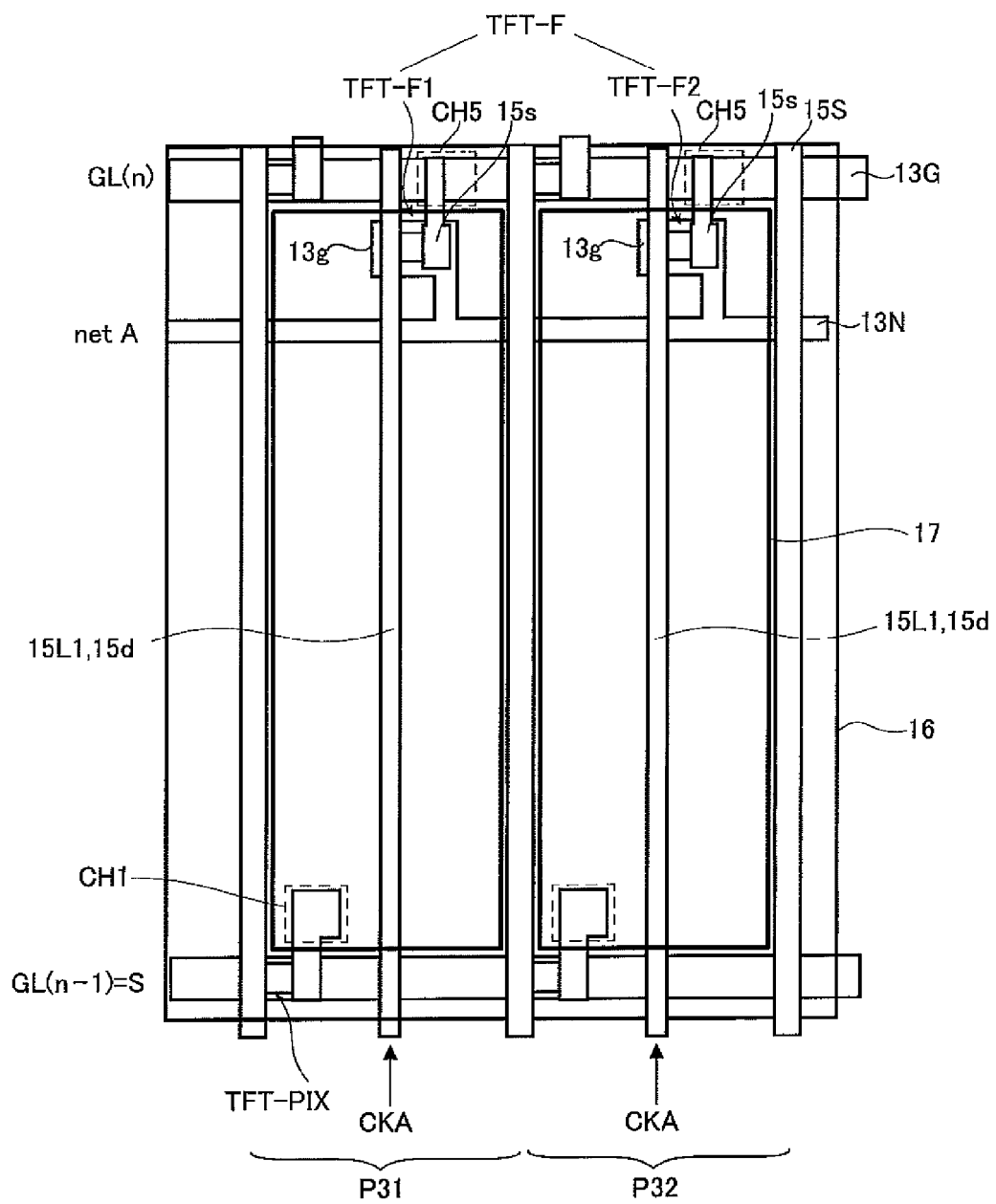
FIG. 56 is a plan view of an implementation in which a gate driver is connected according to Variation 1.

(1) The above first to fifteenth embodiments describe implementations where the TFT-F (see FIGS. 8C and 10B) is located in one pixel region; alternatively, the TFT-F may be located in a plurality of pixel regions. FIG. 56 is a plan view of an example of how the TFT-F may be connected according to the present variation. As shown in FIG. 56, The TFT-F is constructed such that a TFT-F1 and a TFT-F2, provided in two pixel regions P31 and P32, are connected in parallel. In each of the pixel regions P31 and P 32 are provided a line 15L1 and a drain terminal 15d for the TFT-F1 or TFT-F2 formed by the source line layer 15. Further, a line 13N formed by the gate line layer 13 is located in the pixel regions P31 and P32, while a gate terminal 13g is provided for each of the TFT-F1 and TFT-F2 connected with the lines 13N. The source terminals 15s of the TFT-F1 and TFT-F2 are connected with the gate line 13G: GL(n) via the contact CH5.

A clock signal (CKA) is supplied to the TFT-F1 and TFT-F2 via the lines 15L1, and the potential of the netA is provided to the gate line 13G from the TFT-F1 and TFT-F2 via the contact CH5. Thus, as the TFT-F and TFT-D, which have a larger output than the other TFTs, are each located in a plurality of pixel regions, the decrease in the aperture ratio of the pixel region is reduced and each TFT itself is constructed with a larger size.

Figure 57:
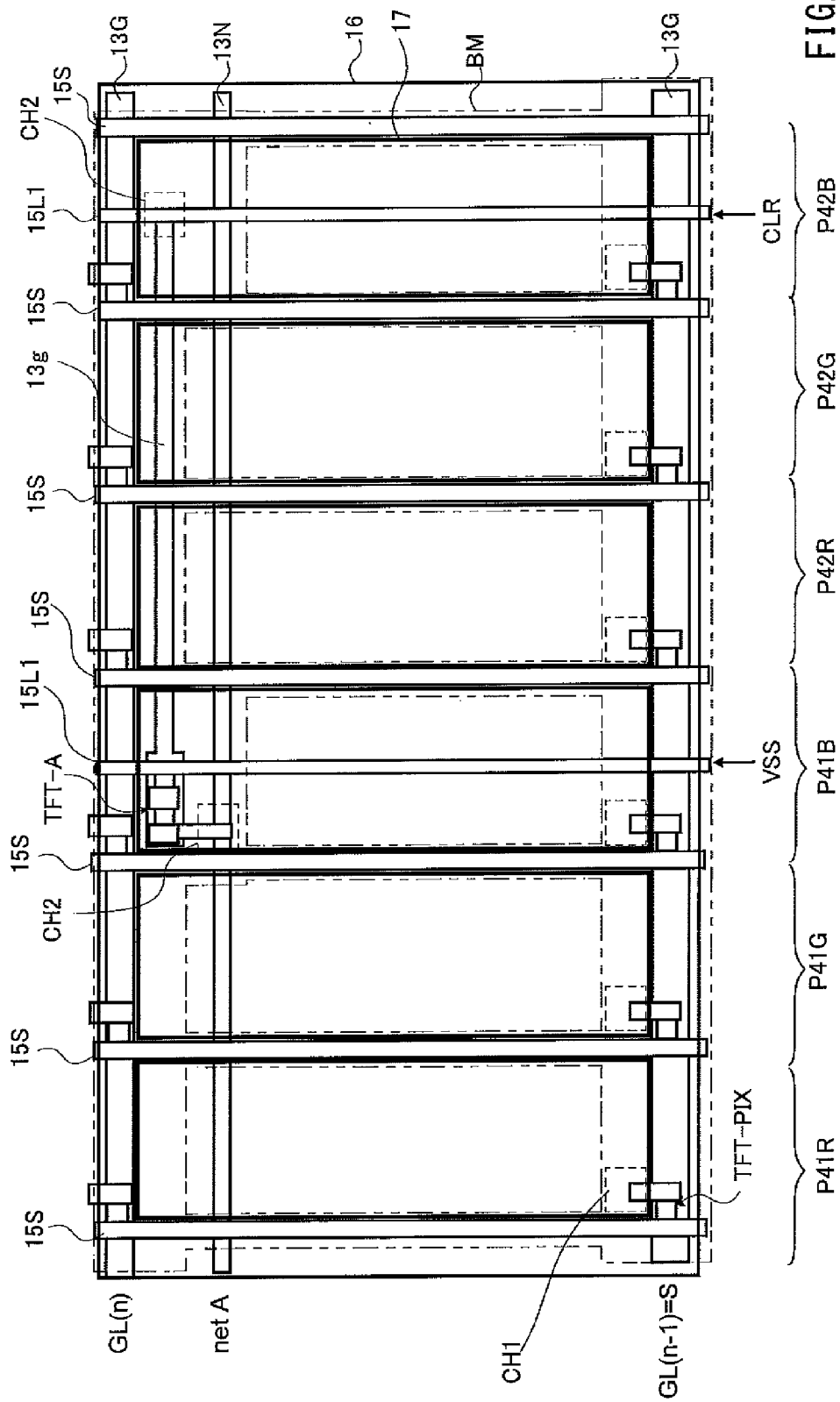
FIG. 57 is a plan view of an implementation in which a gate driver is connected according to Variation 2.

(2) The above first embodiment describes an implementation where the switching elements of a gate driver 11 and line 15L1 are provided in the pixel regions of all colors; alternatively, starting from one of the first to fifteenth embodiments, the elements constituting parts of the driving circuits such as gate drivers 11 and CS drivers 80 may be provided in the pixel regions of a specified color. FIG. 57 is a plan view of an example of how the switching elements (for example, TFT-A) constituting a part of a gate driver 11 may be connected according to the present variation. As shown in FIG. 57, lines 15L1 for supplying a power supply voltage signal (VSS) and reset signal (CLR) to the TFT-A are provided in blue (B) pixel regions P41B and P42B. Further, the TFT-A is provided in the pixel region P41B. The gate terminal 13g of the TFT-A is located in the pixel regions P41B to P42B so as to be connected with the line 15L1 via the contact CH2 of the pixel region P42B. Thus, as TFTs and lines 15L1 are provided in the pixels of a specified color, the elements constituting parts of the gate driver 11 are further dispersed, thereby minimizing the decrease in the aperture ratio. Further, as switching elements and lines are provided in blue (B) pixels, which affect luminance to a less degree than red (R) and green (G) pixels, the decrease in luminance due to the presence of a gate driver 11 in a pixel region is reduced.

Figure 58:
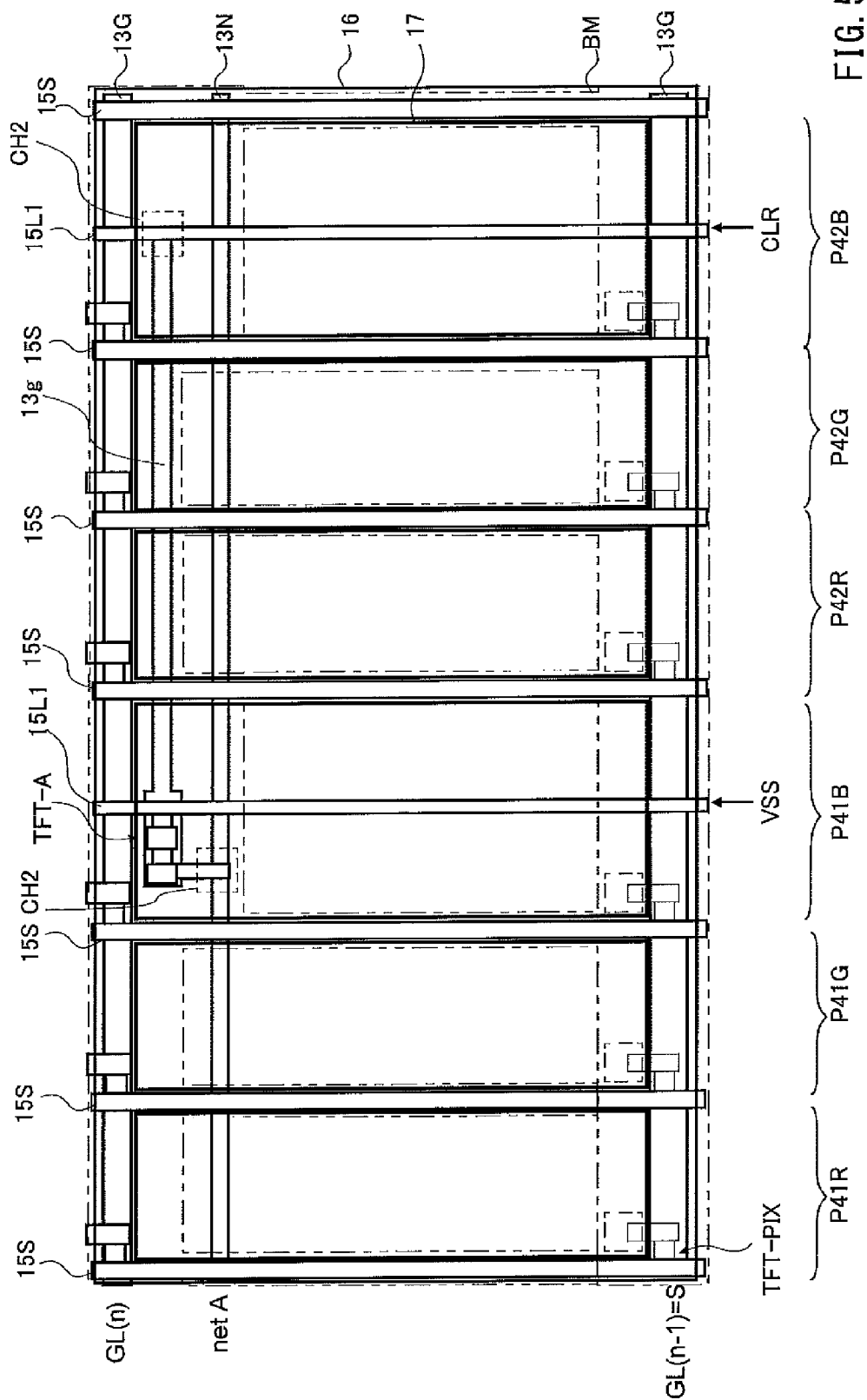
FIG. 58 is a plan view of pixel regions according to Variation 3.

(3) Starting from the above Variation (2), pixel regions having elements constituting parts of a driving circuit may be larger than pixel regions for other colors. FIG. 58 is a plan view showing pixel regions in which elements (for example, TFT-A and line 15L1) constituting parts of a gate driver 11 are provided. As shown in FIG. 58, the pixel regions P41B and P42B, in which the TFT-A and line 15L1 are provided, have a horizontal dimension (i.e. that in the direction in which the source lines 15S are arranged) that is larger than that of pixel regions of other colors. Thus, the red (R), green (G) and blue (B) pixel regions have a generally uniform aperture ratio compared with that of Variation (2), thereby reducing the variation in color balance caused by differences in aperture ratio.

Figure 59:
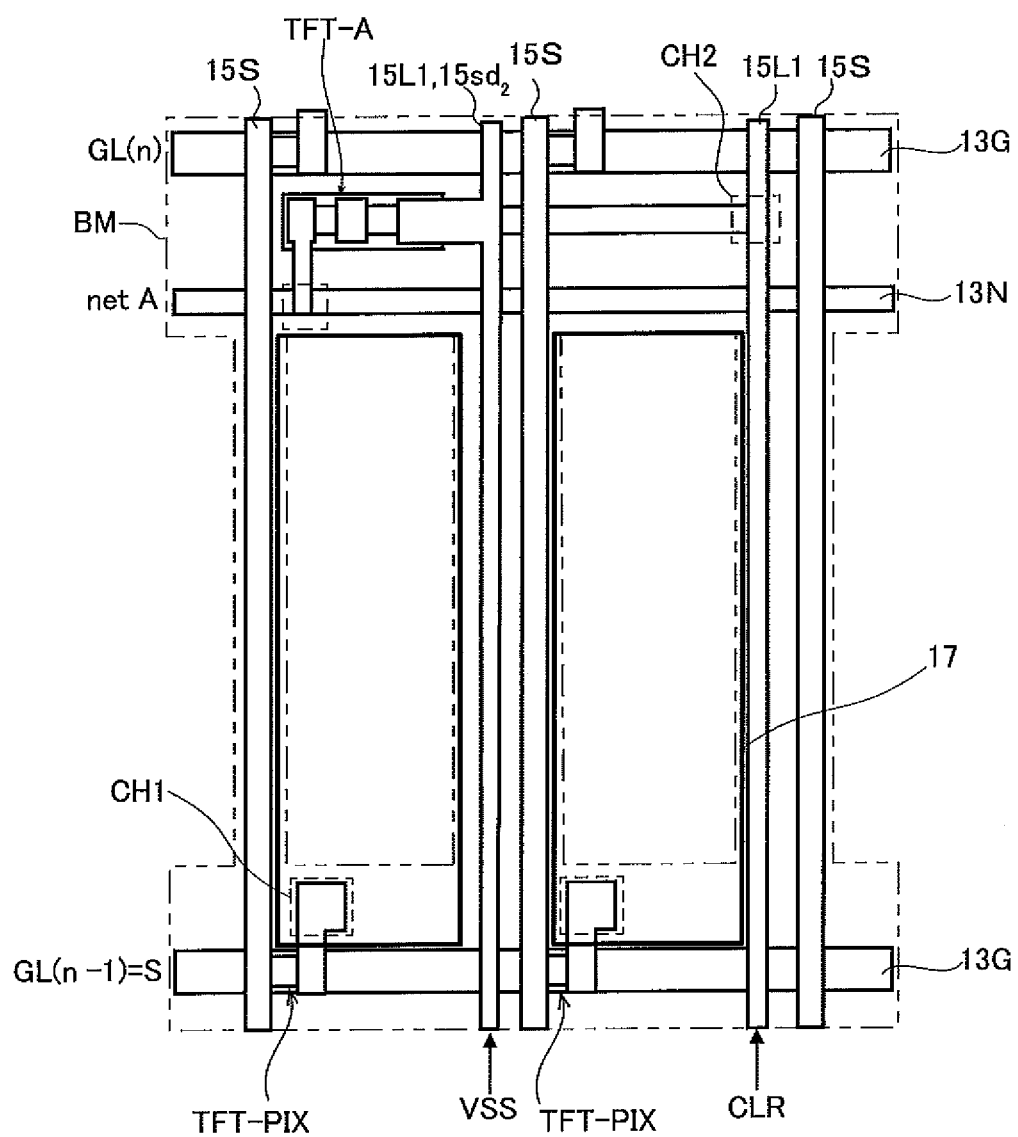
FIG. 59 is a plan view of an implementation in which a gate driver is connected according to Variation 4.

(4) The above first embodiment describes implementations where a shield layer 16 is provided between the pixel electrode 17 and gate driver 11 to prevent interference between the gate driver 11 and pixel electrode 17 provided in a pixel region. Starting from one of the second to fifteenth embodiments, such a shield layer 16 may be provided between the elements constituting the driving circuit and the pixel electrode. Further, starting from one of the first to fifteenth embodiments, no shield layer 16 may be provided and the elements of the driving circuit may be arranged in pixel regions so as not to overlie the pixel electrodes. FIG. 59 is a plan view of pixel regions where the TFT-A is provided as an element constituting a part of the gate driver 11. As shown in FIG. 59, the TFT-A and line 13N and lines 15L1 are located so as not to overlie the pixel region 17. This reduces the parasitic capacitance produced between a switching element and line constituting parts of the gate driver 11, and the pixel electrode 17, thereby achieving appropriate image display.

(5) Starting from one of the above first to fifteenth embodiments, the line 13N and line 15L1 (i.e. lines) constituting parts of the gate driver 11 may be provided in locations in the pixel regions that depend on the display mode of the liquid crystal. Examples of lines arrangements for various display modes, i.e. VA mode, FFS mode and in-plane switching (IPS) mode will be described below.

Figure 60A:
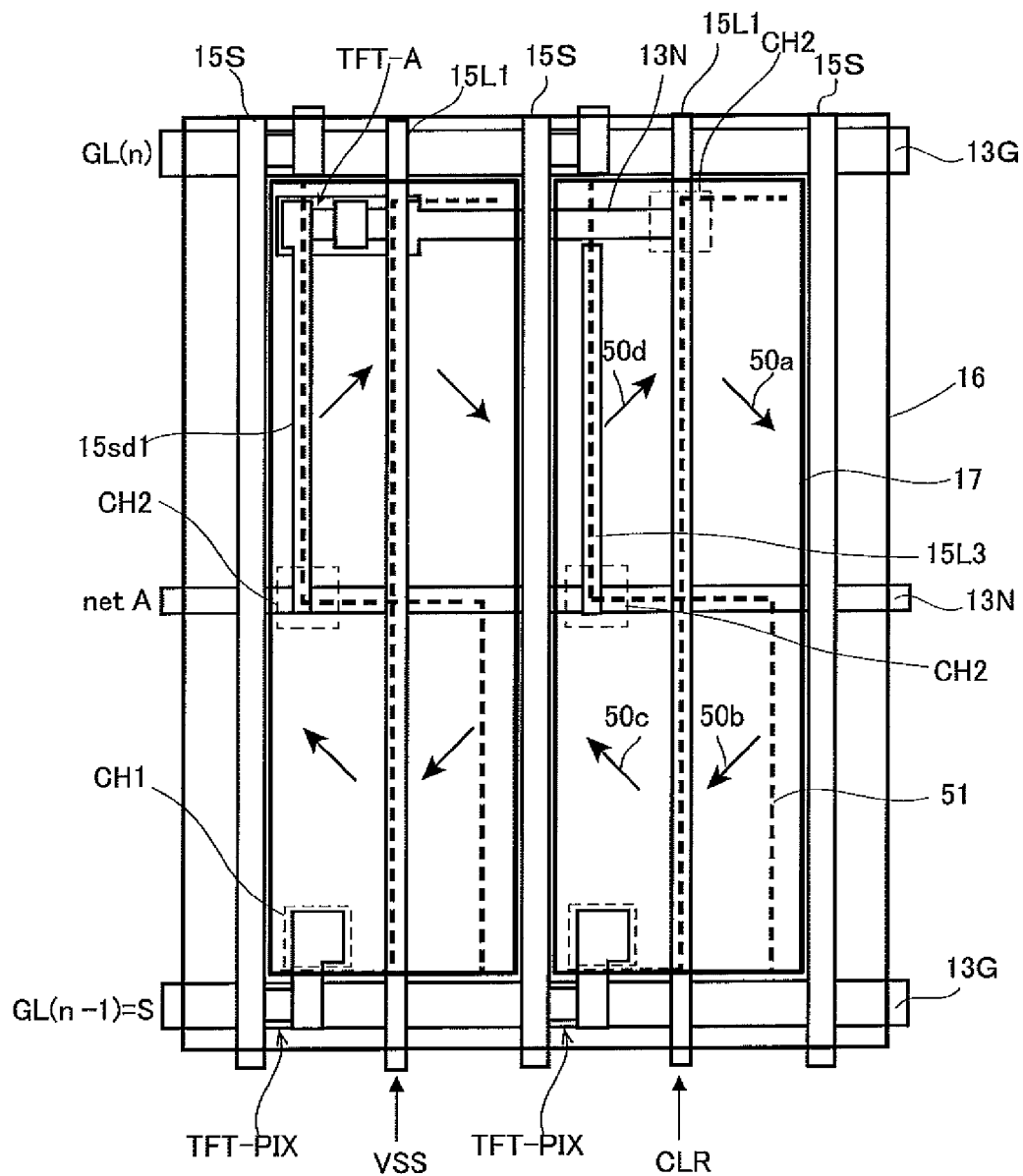
FIG. 60A is a plan view showing how lines may be arranged for the VA mode.

FIG. 60A is a plan view of an example of how lines may be arranged for the VA mode. This drawing illustrates a region in which the elements constituting the TFT-A are provided. As shown in FIG. 60A, the orientation film provided on each of the active-matrix substrate 20a and counter-substrate 20b is divided into four areas of different orientations such that, when the orientation film is illuminated from a plurality of directions, liquid crystal molecules in one pixel region are oriented in four directions, indicated by arrows 50a, 50b, 50c and 50d. At the boundaries between the areas of different orientations, liquid crystal molecules hit each other, which results in areas where liquid crystal molecules are oriented in a direction extending along the polarizing axis of the linear polarizer. Light transmission is low in these areas, producing dark lines.

In FIG. 60A, the broken lines 51 indicate areas where dark lines appear (hereinafter referred to as dark-line region). When there are dark-line regions 51, as in FIG. 60A, the lines 15L1 and line 13N may be provided so as to overlie the dark-line regions 51. This reduces the decrease in light transmission in the pixel regions where the gate driver 11 is present.

Further, if a TFT, such as a TFT-A or TFT-D, is located in a plurality of pixel regions, for example, a line 15L3 that has substantially the same size as the drain terminal 15sd1 of the element A1 of the TFT-A located in the pixel region to the left in FIG. 60A may be connected with the line 13N of the pixel region to the right via a contact CH2. Thus, the pixel regions have a generally uniform aperture ratio.

Figure 60B:
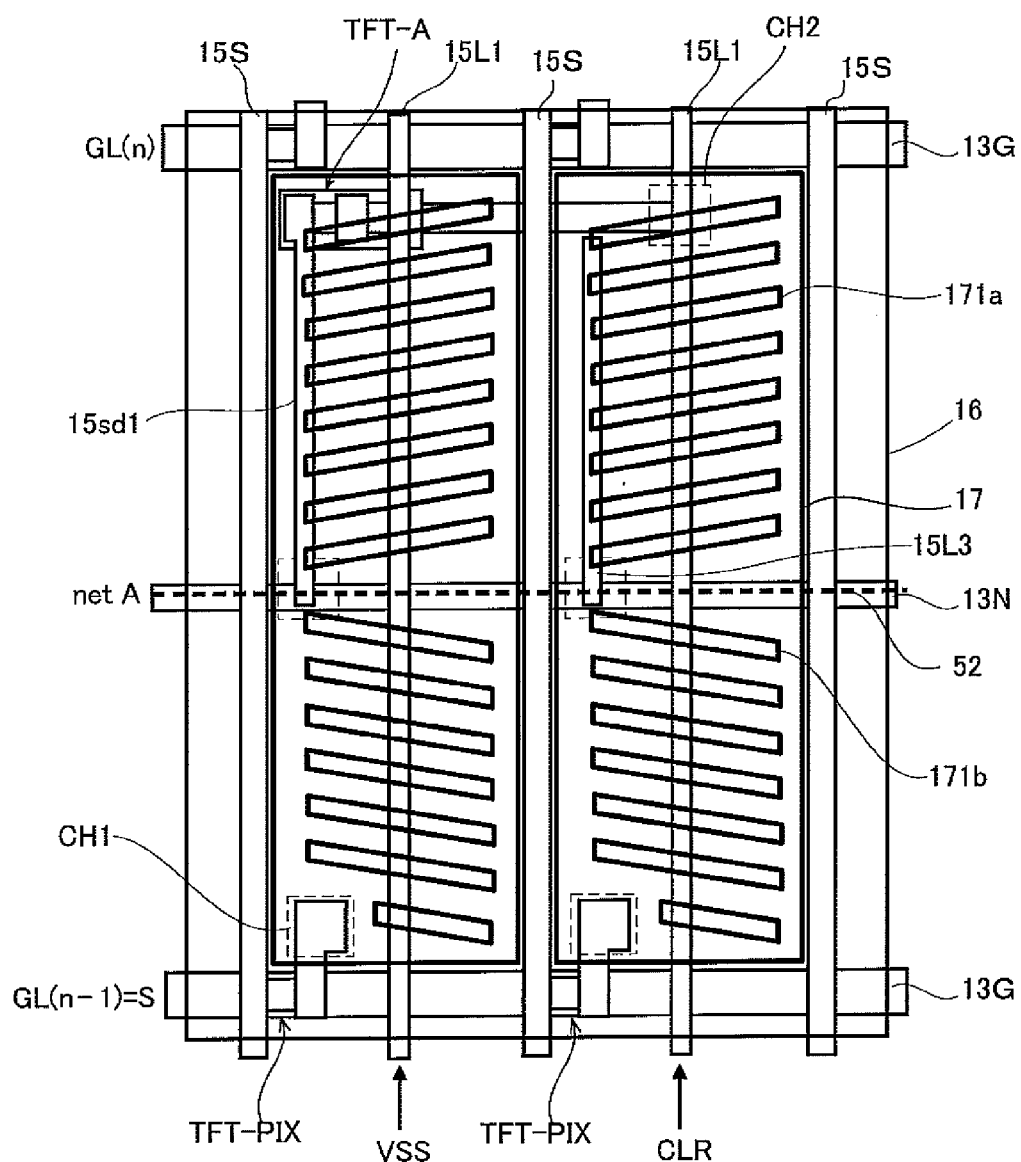
FIG. 60B is a plan view showing how lines may be arranged for the FFS mode.

An arrangement for the FFS mode will be described below. FIG. 60B is a plan view of an example of how lines may be arranged for the FFS mode. In FIG. 60B, the pixel electrode 17 of each pixel region has a plurality of slits 171 (171a and 171b). In FIG. 60B, slits 171a are provided in the upper portion of the pixel electrode 17, while slits 171b are provided in the lower portion. For each pixel region, the slits 171a and the slits 171b form an angle that results in these groups of slits being generally mirror images of each other with respect to the boundary between the group of slits 171a and the group of slits 171b. Thus, the orientation film is divided into areas with two different orientation directions of liquid crystal molecules. In the implementation of FIG. 60B, the portions indicated by broken line 52 that forms the boundary between two areas with different orientation directions form dark-line regions. In this case, the line 13N may be provided to overlie the dark-line region 52. Further, as is the case in the arrangement of FIG. 60A, a line 15L3 that has substantially the same size as the drain terminal 15sd1 of the element A1 of the TFT-A may be connected with the line 13N in the pixel region to the right.

Figure 60C:
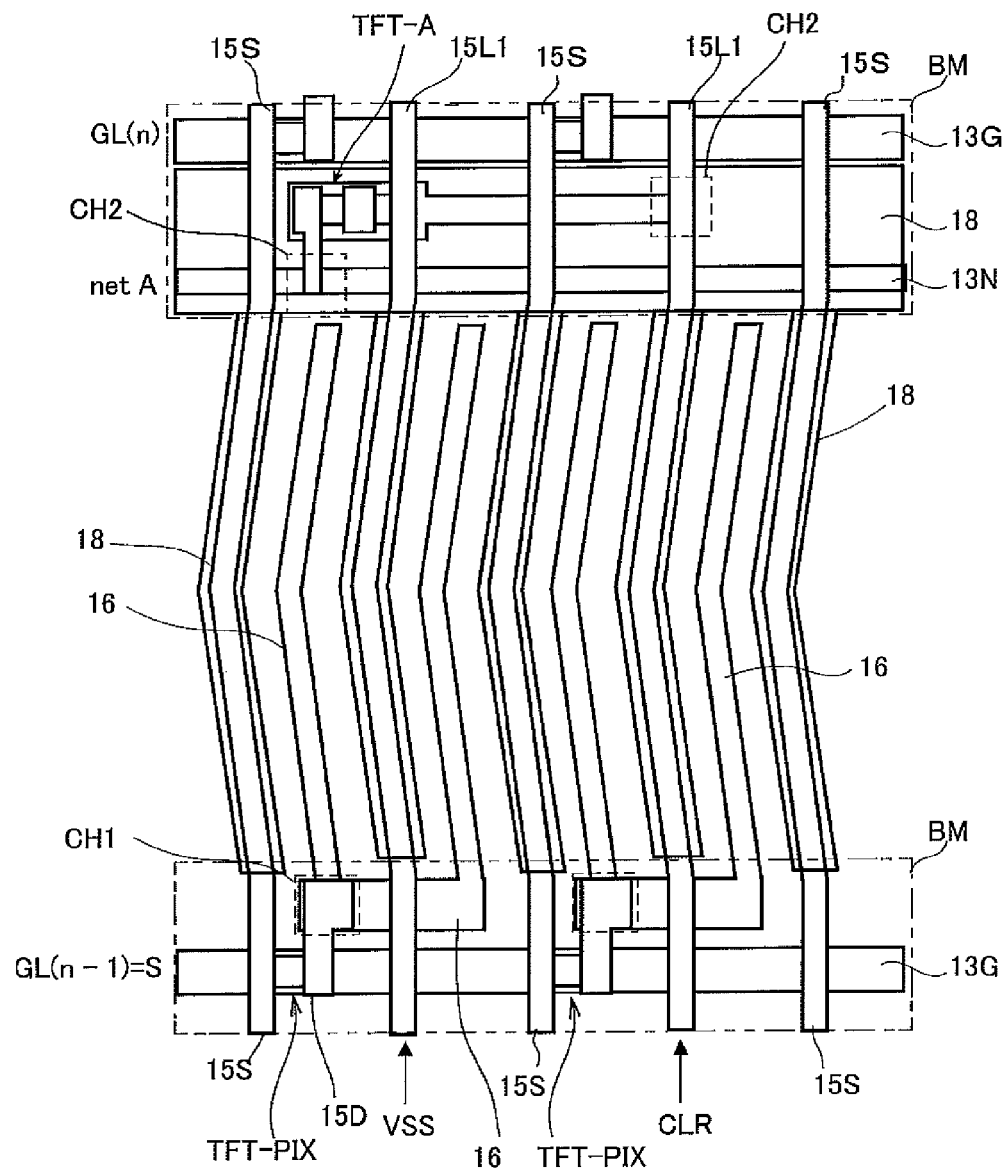
FIG. 60C is a plan view showing how lines may be arranged for the IPS mode.

An arrangement for the IPS mode will be described below. FIG. 60C is a plan view of an example of how lines may be arranged for the IPS mode. As shown in FIG. 60C, a comb teeth-shaped pixel electrode 17 is provided in each pixel electrode. On the active-matrix substrate 20a is further provided a common electrode 18 located to overlie a part of the light-shielding region BM, source lines 15S and lines 15L1. In the region other than the light-shielding region BM, the source lines 15S, lines 15L1, pixel electrodes 17 and common electrode 18 are bent to have portions in two different directions connected generally at the center of their extension. The comb-teeth-shaped pixel electrode 17 and common electrode 18 produce a horizontal electric field such that liquid crystal molecules in each pixel region are controlled to be oriented in two directions. As shown in FIG. 60C, in this case, switching elements constituting parts of the gate driver 11 and line 13N and lines 15L1 may be provided in the lower portion of the common electrode 18. This construction reduces the parasitic capacitance produced between the pixel electrode 17 and gate driver 11.

Figure 61A:
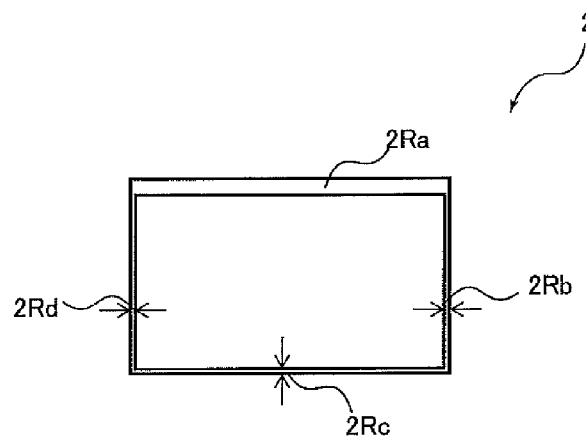
FIG. 61A is a schematic view of a display panel according to Variation 6.
Figure 61B:
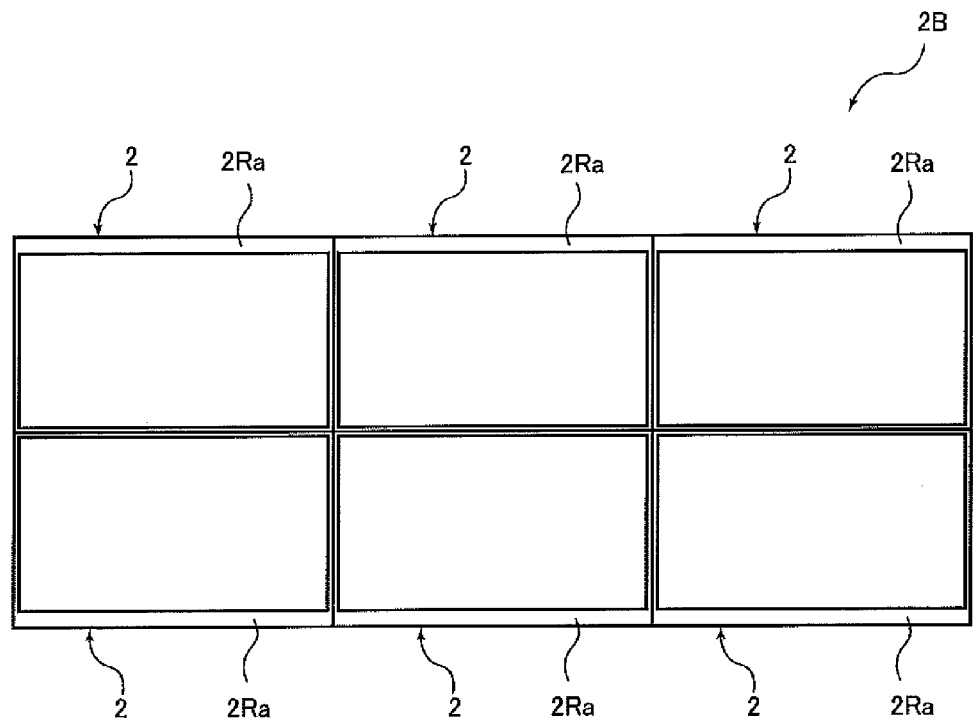
FIG. 61B is a schematic view of a tiled panel according to Variation 6.

(6) A plurality of display panels 2 according to one of the above first to fifteenth embodiments may be arranged to form a large display. As shown in FIG. 61A, as is the case in the first embodiment, the picture frame region 2Ra includes terminals 12g (not shown). The other picture frame regions 2Rb, 2Rc and 2Rd have a smaller width than the picture frame region 2Ra. As shown in FIG. 61B, a plurality of display panels 2 may be arranged such that the picture frame region 2Ra of each panel is on the periphery to form a tiled large panel 2B. In this case, the three sides of a display panel 2, i.e. the picture frame regions 2Rb, 2Rc and 2Rd have a smaller width such that the boundaries inside the display panel 2 cannot easily be seen.

Figure 62:
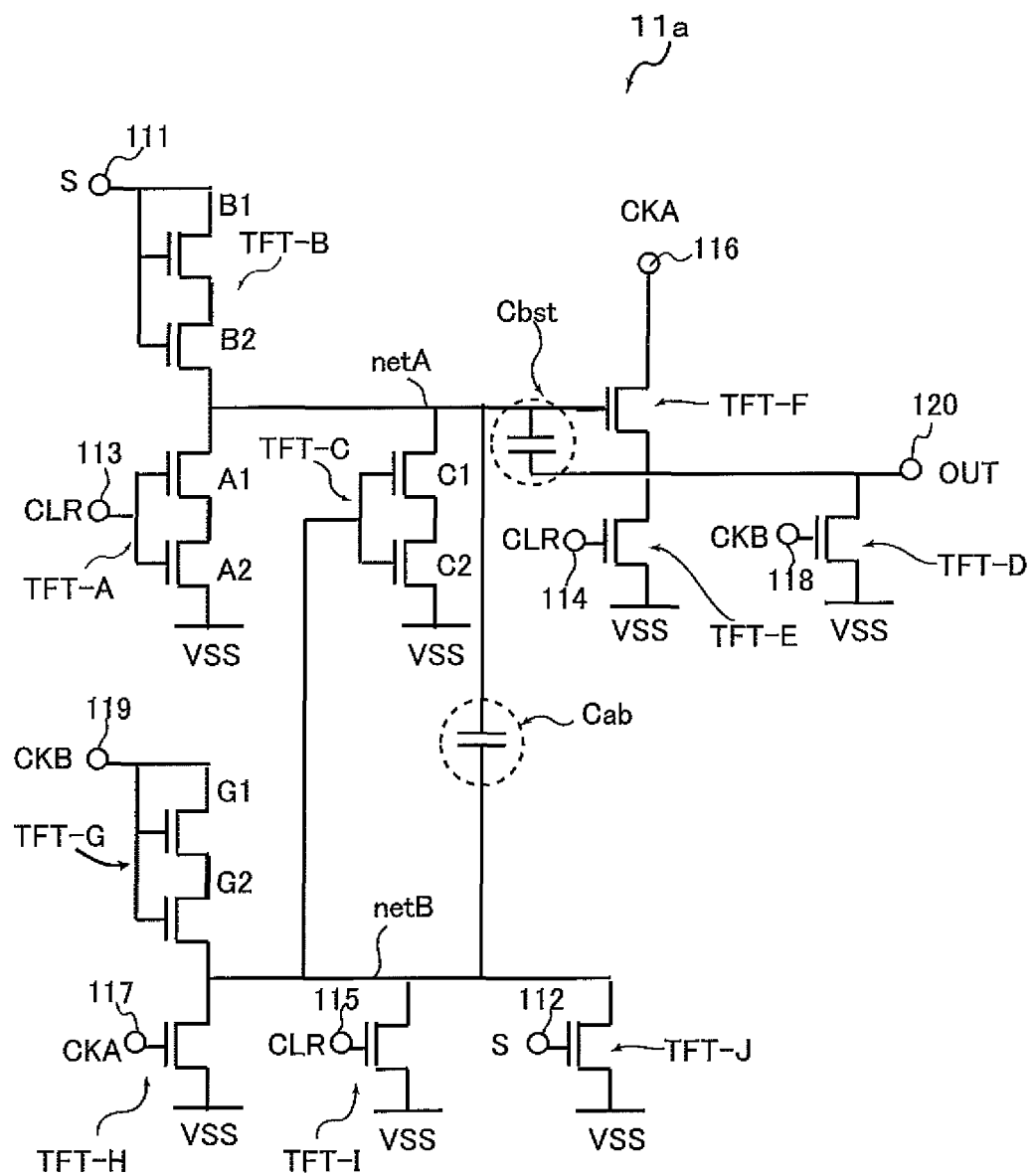
FIG. 62 shows an example equivalent circuit of a gate driver according to Variation 7.

(7) Starting from one of the above first to fifteenth arrangements, the gate driver 11 may be constructed in the following manner. FIG. 62 shows an example equivalent circuit of a gate driver according to the present variation. As shown in FIG. 62, in addition to the components shown in FIG. 4, the gate driver 11a includes a capacitor Cab connected between the netA and netB.

Figure 63A:
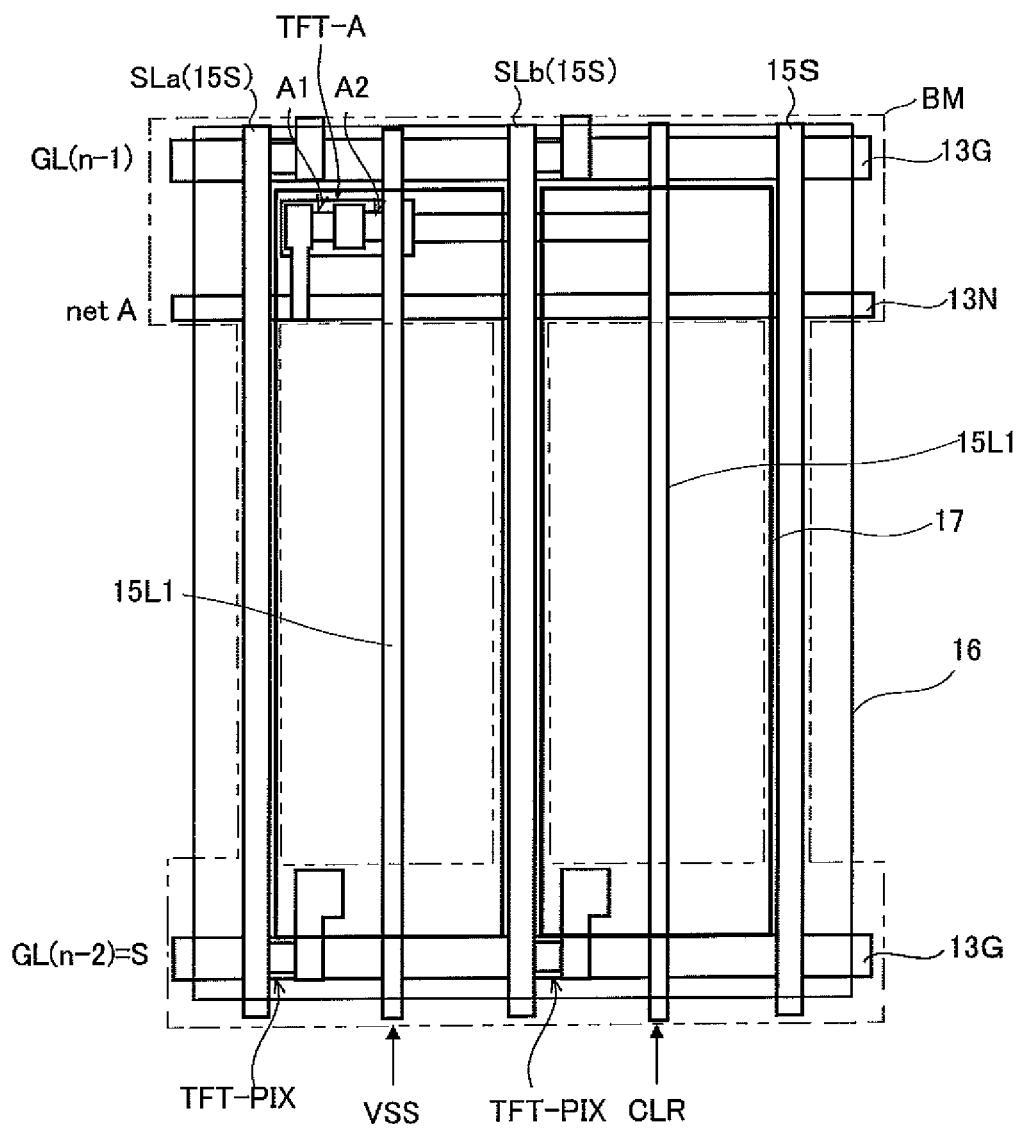
FIG. 63A is a plan view of pixel regions in which a TFT-A is provided.
Figure 63B:
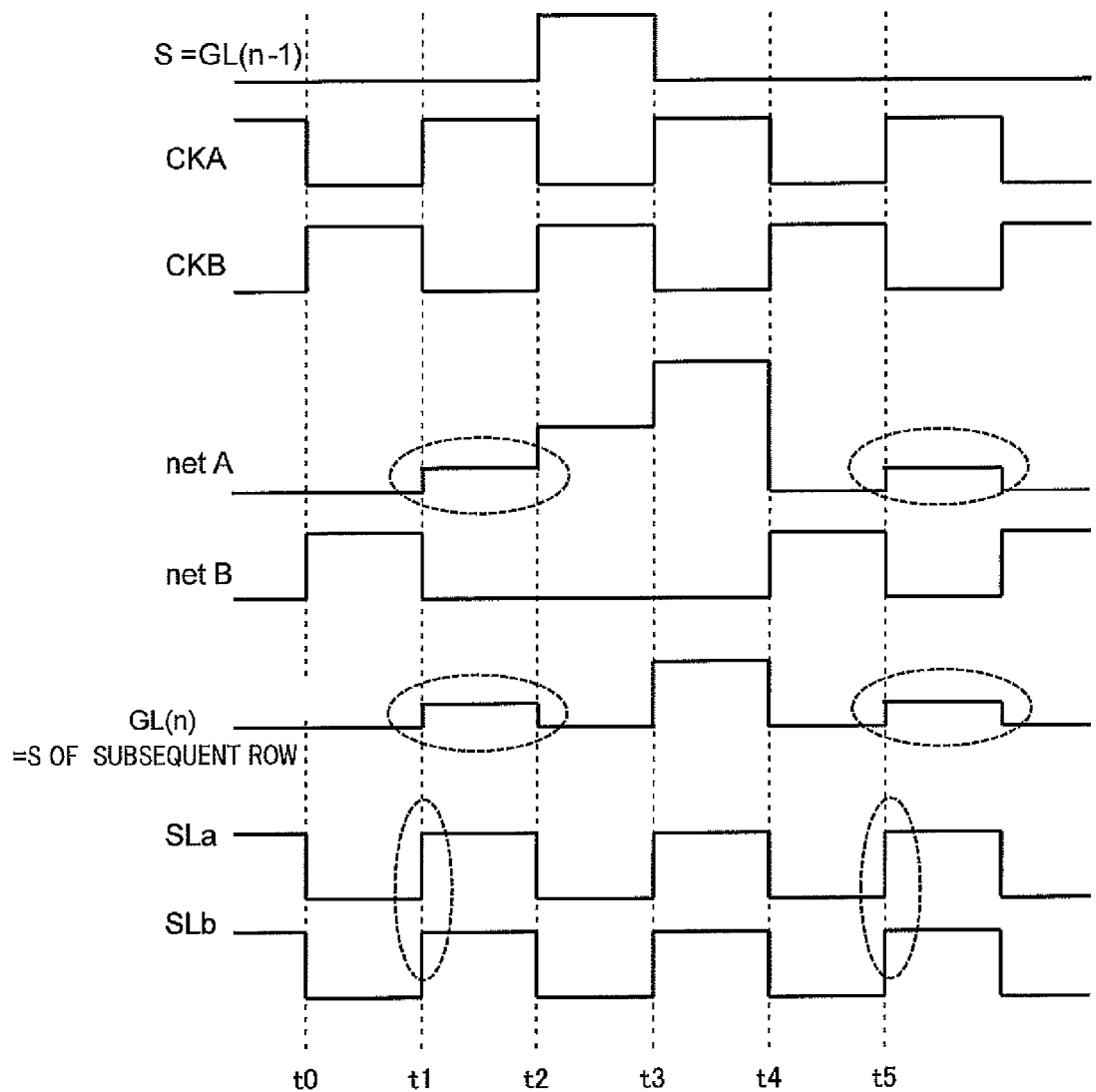
FIG. 63B illustrates noise produced in a gate line due to a parasitic capacitance between a netA and a source line.

As discussed above, the elements constituting the gate driver 11 are provided in pixel regions. As such, a parasitic capacitance may be produced between the line 13N for the netA and netB formed by the gate line layer 13 and the source line 15S, potentially causing noise at gate lines 13G. For example, in the pixel region where the TFT-A is provided shown in FIG. 63A, a parasitic capacitance may be produced between the source line Sla(15S) and SLb(15S) and the line 13N for the netA. FIG. 63B is a waveform diagram showing signals encountered when such a parasitic capacitance is produced.

As shown in FIG. 63B, during time t1 to t2 in which the clock signal (CKB) is at L level and the clock signal (CKA) is at H level, when the source line Sla and LSb display an image that requires the potentials of these lines to be relatively high, a parasitic capacitance occurs between the line 13N for the netA and the source lines SLa and SLb such that the TFT-F cannot remain off, producing noise at the gate line 13G: GL(n). During time t1 to t2, the TFT-C for maintaining the netA at L level is off such that the gate line 13G: GL(n) is susceptible to the influence from the source lines SLa and SLb during this period. On the other hand, during time t4 to t5 in which the clock signal (CKB) is at H level, the TFT-C and TFT-D are on. Thus, the potential of the line 13N for the netA and the gate line 13G: GL(n) is maintained at L level and is thus not affected by variations in the potentials of the source lines SLa and SLb.

Figures 64A, 64B, 64C:
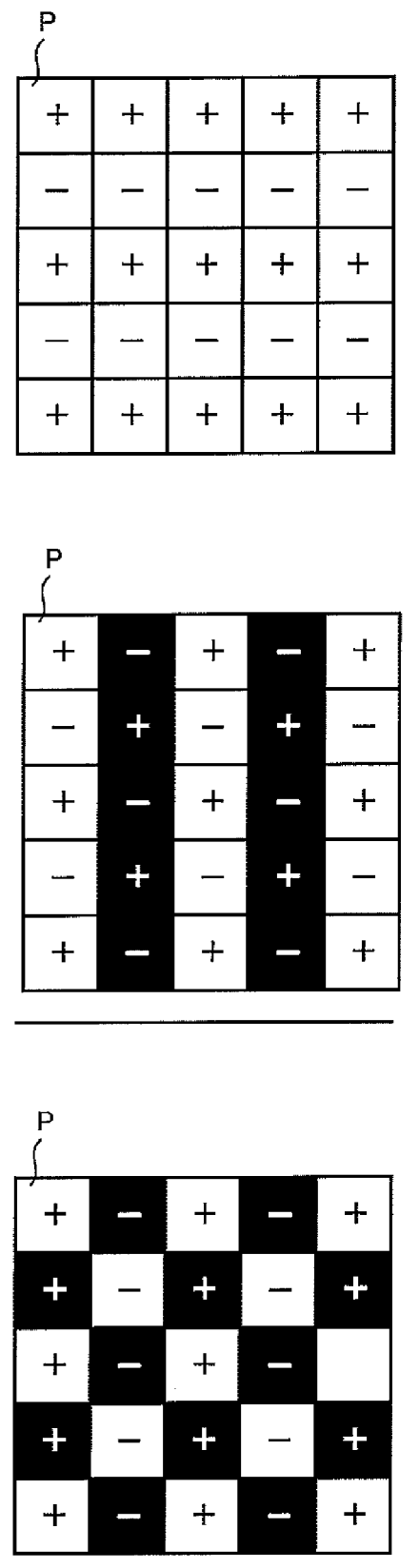

If noise occurs during a period where the potential of the gate line 13G is L level, the off margin of the TFT-PIX may decrease, potentially causing a malfunction. Particularly, noise often occurs when the polarity pattern is as described below. FIGS. 64A to 64C each show a pattern of polarities of pixel regions that often cause noise. The region P indicated by a rectangle in FIGS. 64A to 64C is a pixel region. The character "+" or "−" in the region P indicates the polarity of the pixel region. FIG. 64A shows a polarity pattern encountered when white is displayed by line inversion driving in normally black mode. FIG. 64B shows a polarity pattern encountered when white and black lines are displayed by dot inversion driving in normally black mode. FIG. 64C shows a polarity pattern encountered when a white and black zigzag pattern is displayed by source inversion driving in normally black mode.

Figure 65:
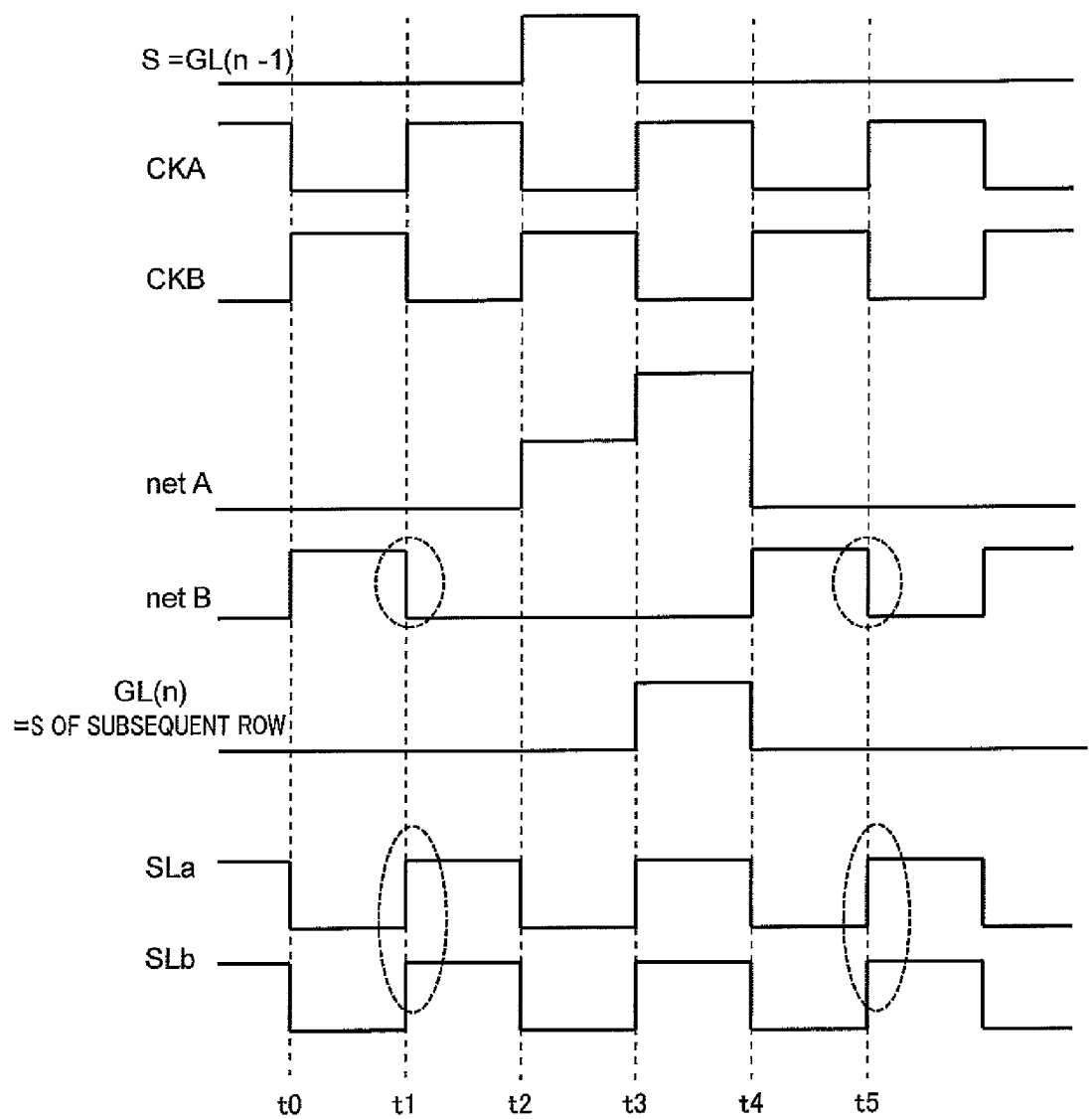
FIG. 65 is a waveform diagram for an implementation using the gate drivers of Variation 7.

In the present variation, as shown in FIG. 62, a capacitor Cab is provided between the netA and netB to reduce noise in the waveform of netA shown in FIG. 63B such that the TFT-F remains off. FIG. 65 shows waveforms encountered when a capacitor Cab is provided if the polarity pattern is as shown in FIG. 64A or 64C. If no capacitor Cab is provided, as shown in FIG. 63B, during time t1 to t2, a parasitic capacitance occurs between the netA and source lines SLa and SLb such that the potential of the netA cannot remain at L level. If the capacitor Cab is provided, at time t1, potential of the netA is upthrusted and, at the same time, a variation in the potential of the netB draws the potential of netA down to L level. As a result, as shown in FIG. 65, the potential of the netA remains at L level in time t1 to t2 such that the TFT-F remains off, thereby reducing noise at the gate line 13G: GL(n).

Figure 66:
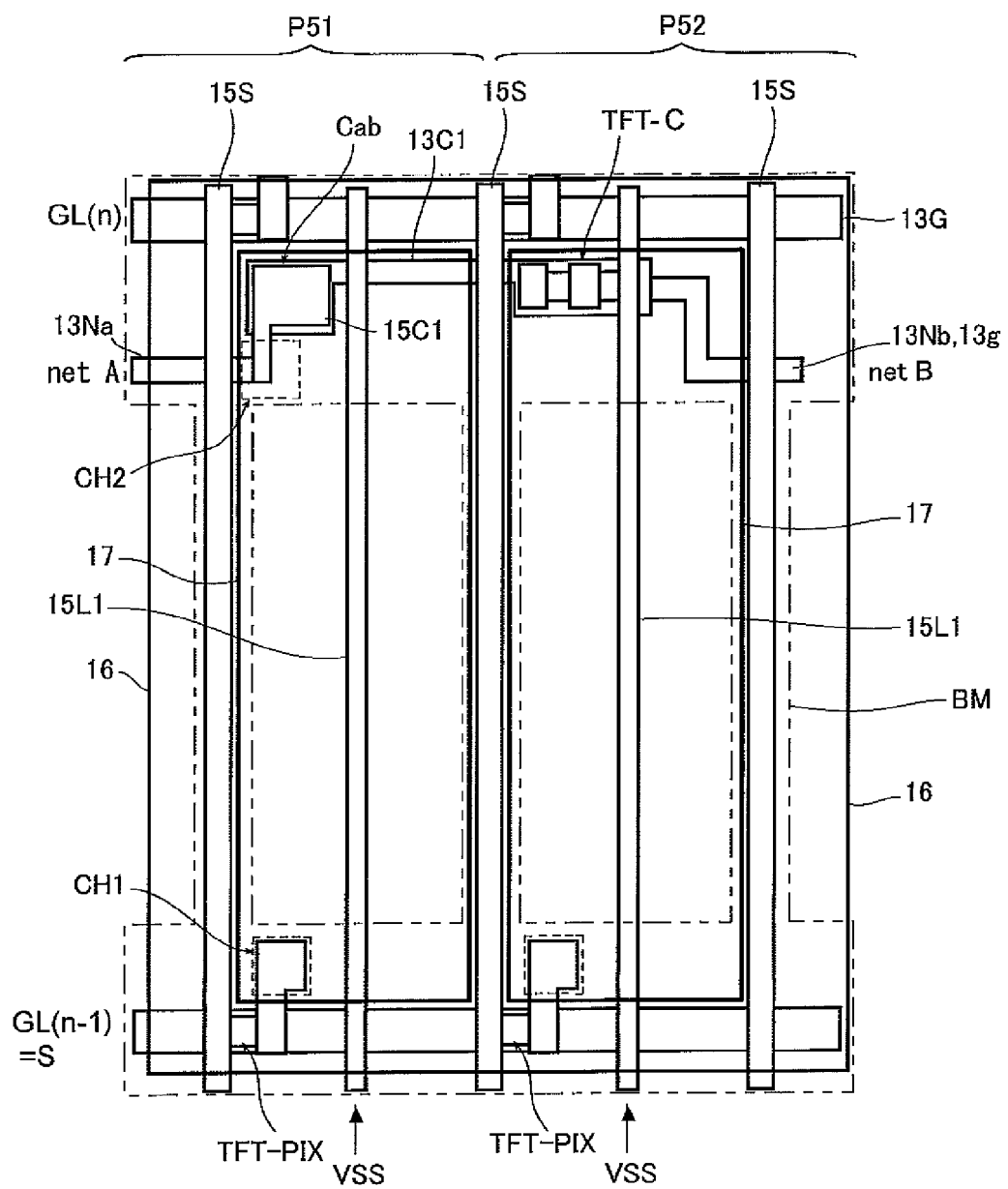
FIG. 66 is a plan view of an implementation in which the capacitor Cab of Variation 7 is connected.

The capacitor Cab may also be connected in the following manner. FIG. 66 is a schematic view of pixel regions where a capacitor Cab and TFT-C are provided. As shown in FIG. 66, in the pixel region P51, the TFT-PIX is connected with the pixel electrode 17 via a contact CH1. Further, the gate line layer 13 forms one electrode 13c1 of the capacitor Cab and the gate line 13G and line 13Na. The source line layer 15 forms the other electrode 15c1 of the capacitor Cab and the source line 15S and line 15L1. The electrode 15c1 is connected with the line 13Na for the netA via the contact CH2. The electrode 13c1 of the capacitor Cab is located in the pixel regions P51 and P52, and is connected with the line 13Nb for the netB.

(8) The above first to fifteenth embodiments describe implementations where the semiconductor layer portions 14 in the switching elements constituting parts of the gate driver 11 are made of an oxide semiconductor; alternatively, the semiconductor layer portions 14 may be made of polysilicon or amorphous silicon.

(9) The above first to fifteenth embodiments describe implementations where on the substrate 20 of the active-matrix substrate 20a are provided gate lines 13G, source lines 15S, gate drivers 11, terminals 12g for receiving control signals and the like for the gate drivers 11, and terminals 12s for receiving data signals and the like for the source lines 15S; in addition, a source driver 3 and display control circuit 4 may be provided.

(10) The above first to fifteenth embodiments describe implementations where the display panel 2 is a liquid crystal panel; alternatively, it may be a panel using organic electroluminescence (EL). An implementation with an organic EL panel will be described below.

Figure 67:
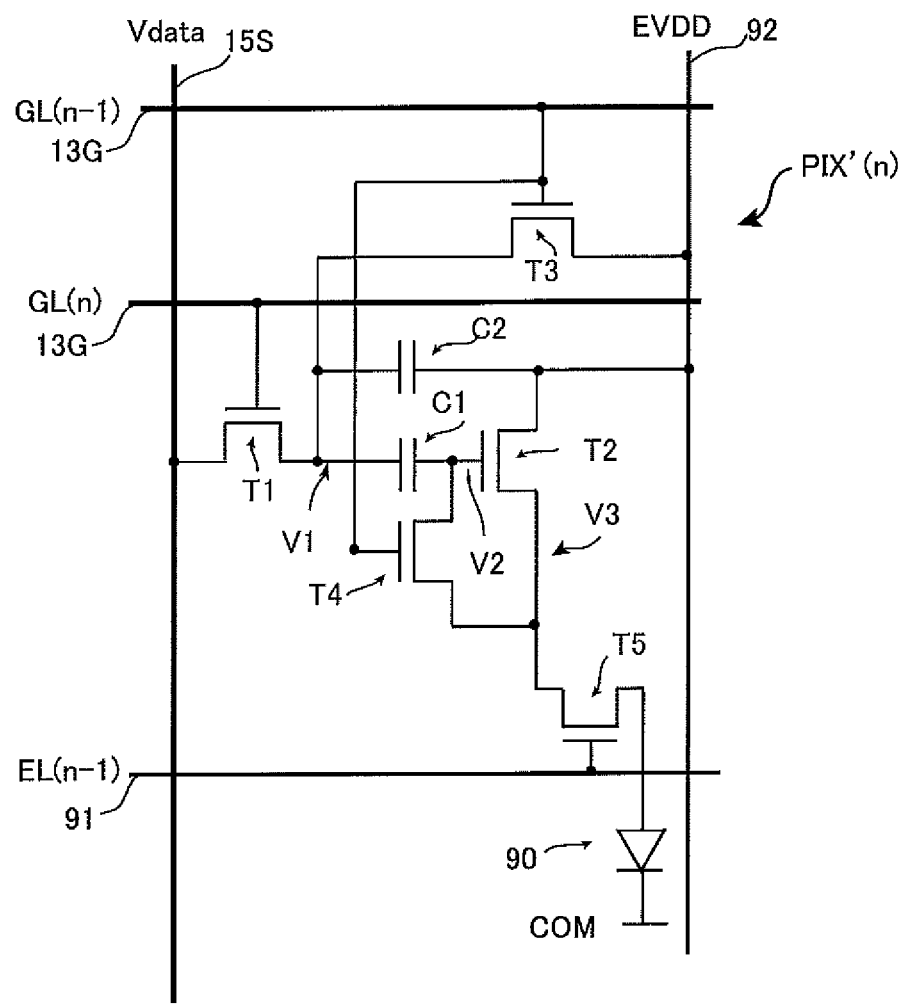
FIG. 67 shows an equivalent circuit of a pixel according to Variation 10.

FIG. 67 shows an equivalent circuit of a pixel of a display panel 2' according to the present variation. As shown in FIG. 67, in the pixel PIX'(n) are provided switching elements T1 to T1 made of thin-film transistors, capacitors C1 and C2 and an organic light-emitting device (OLED) 90. In the pixel PIX'(n) are further provided a light-emission control line 91 extending generally parallel to the gate line 13G, and a power supply line 92 (EL(n−1)) extending generally parallel to the data line 15S.

The gate terminals of the elements T3 and T4 are connected with the gate line 13G of the preceding row (GL(n−1)). The element T3 has a source terminal connected with the power supply line 92, and a drain terminal connected with one electrode (hereinafter referred to as first electrode) of each of the capacitors C1 and C2 and the drain terminal of the element T1.

As the gate line 13G: GL(N−1) is driven, the element T3 turns on such that the voltage signal EVDD supplied to the power supply line 92 is supplied to the capacitors C1 and C2.

The element T4 has a drain terminal connected with the other electrode (hereinafter referred to as second electrode) of the capacitor C1 and the gate terminal of the TFT-T2, and a source terminal connected with the drain terminal of the element T2. As the gate line 13G: GL(n−1) is driven, the element T4 turns on, which, together with the element T2, constitutes a diode connection.

The element T1 is connected with the gate line 13G: GL(n) and the data line 15S. When the gate line 13G: GL(n) is selected, the element T1 turns on, and the data signal Vdata supplied to the data line 15S is supplied to the first electrode of the capacitor C1.

The element T2 has a source terminal connected with the second electrode of the capacitor C2 and the power supply line 92, and a drain terminal connected with the OLED 90 via the element T5.

The element T5 (i.e. switching element for controlling light emission) is connected between the drain terminal of the element T2 and the anode of the OLED 90. The gate terminal of the element T5 is connected with the light-emission control line 91 of the preceding row (EL(n−1)). Depending on the potential of the light-emission control line 91: EL(n−1), the element T5 disconnect the OLED 90 from the element T2. The OLED 90 emits light depending on the current from the element T2 via the element T5.

Figure 68A:
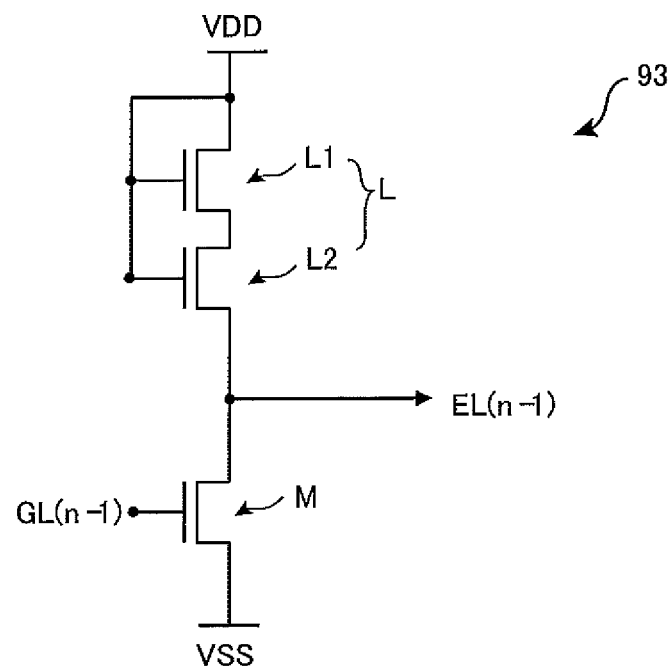
FIG. 68A shows an equivalent circuit of an EL driver for controlling the potential of a light-emission control line of Variation 10.

In the present variation, the potential of the light-emission control line 91 is controlled by an EL driver (i.e. light control line driver) provided in the display region. FIG. 68A shows an equivalent circuit of an EL driver for controlling the potential of the light-emission control line 91: EL(n−1). As shown in FIG. 68A, the EL driver 93 includes switching elements L and M each made of a thin-film transistor.

The switching element L includes switching sub-elements L1 and L2 connected in series. The gate terminals of the switching sub-elements L1 and L2 are connected with the drain terminal of the switching sub-element L1. The power supply voltage signal VDD is supplied to the drain terminal of the sub-element L1. Thus, the power supply voltage signal VDD is constantly supplied to the light-emission control line 91: EL(n−1) via the switching element L. The switching element L may be, for example, a dual-gate switching element or a switching element with a larger channel length than the switching element M so as to have a smaller driving capability than the switching element M.

The switching element M has a gate terminal connected with the gate line 13G: GL(n−1) and a drain terminal connected with the light emission control line 91: EL(n−1). The power supply voltage signal VSS is supplied to the source terminal of the switching element M. When the gate line 13G: GL(n−1) is driven, the switching element M turns on, and the power supply voltage signal VSS is supplied thereto.

Figure 68B:
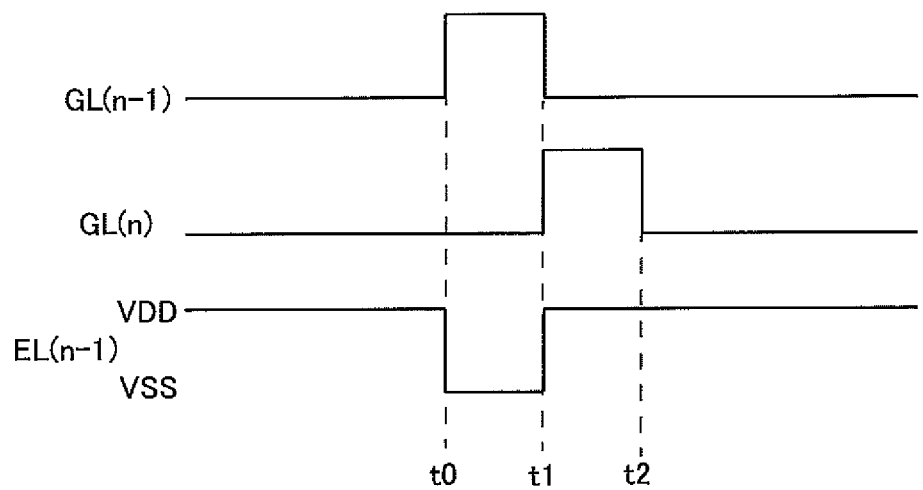
FIG. 68B is a timing chart illustrating how a gate line and a light-emission control line of Variation 10 are driven.

As discussed above, the power supply voltage signal VDD is constantly supplied to the light-emission control line 91: EL(n−1) via the switching element L, and the switching element L is constructed such that the switching element M has a higher driving capability. Thus, as shown in FIG. 68B, during time t0 to t1 where the potential of the gate line 13G: GL(n−1) goes to H level, the light-emission control line 91: EL(n−1) is charged to the power supply voltage signal VSS. On the other hand, after time t1 at which the potential of the gate line 13G: GL(n−1) goes to L level and the potential of the gate line 13G: GL(n) goes to H level, the light-emission control line 91: EL(n−1) is charged to the power supply voltage signal VDD.

An example arrangement of the elements constituting the gate driver 11 and EL driver 93 of the present variation in display regions will be described below. FIGS. 69A to 69E are schematic plan views of pixel regions in which the elements of gate drivers 11 and EL drivers 93 are provided. The pixel regions of FIGS. 69A to 69E form a single continuous area.

As shown in FIGS. 69A to 69E, in the present variation, in each pixel are provided a gate line 13G for the row having this pixel and a gate line 13G for acquiring the output of the gate line 13G for the pixels of the preceding row (hereinafter referred to as preceding gate line) so as to extend generally parallel to each other.

Figure 69A:
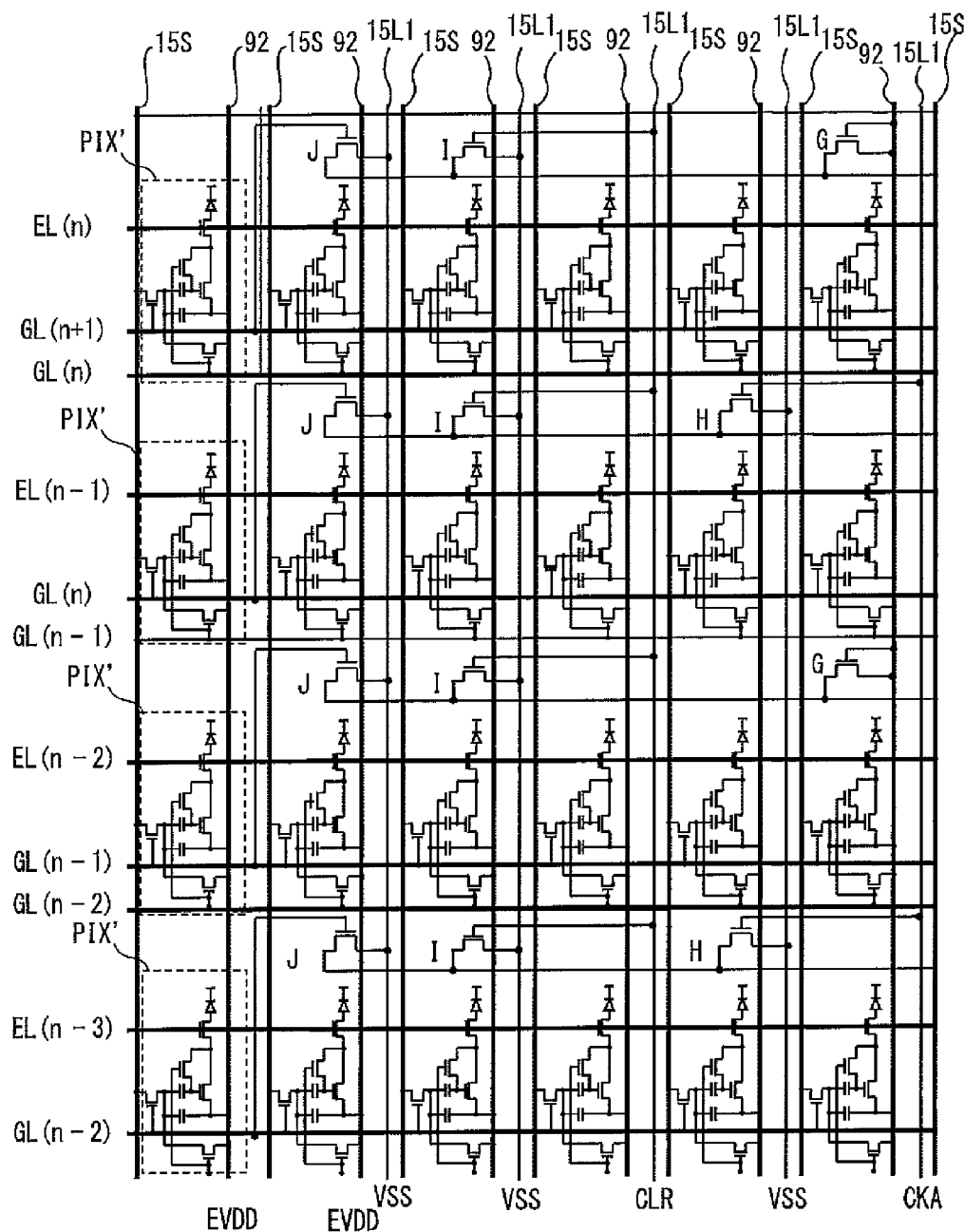
FIG. 69A is a schematic diagram of pixels in which gate drivers and EL drivers are provided according to Variation 10.

For example, in the pixel PIX'(n) shown in FIG. 69A, the preceding gate line 13G: GL(n−1) and the gate line 13G: GL(n) are provided. Depending on the output of the preceding gate line 13G: GL(n−1), the gate line 13G: GL(n) is driven and data is written to the pixel PIX'(n). Further, in the pixel PIX'(n−1) in the row preceding the row having the pixel PIX'(n) are provided the gate line 13G: GL(n−1) and the preceding gate line 13G: GL(n−2). Depending on the output of the preceding gate line 13G: GL(n−2), the gate line 13G:GL(n−1) is driven and data is written to the pixel PIX'(n−1). The preceding gate line 13G is connected with the associated gate line 13G via the line 95 shown in FIG. 69E. For example, when the gate line 13G: GL(n) is driven by a gate driver 11, the output is supplied to the pixels of the row GL(n+1) via the preceding gate line 13G: GL(n) which are in the pixels of the row GL(n+1).

Figure 69B:
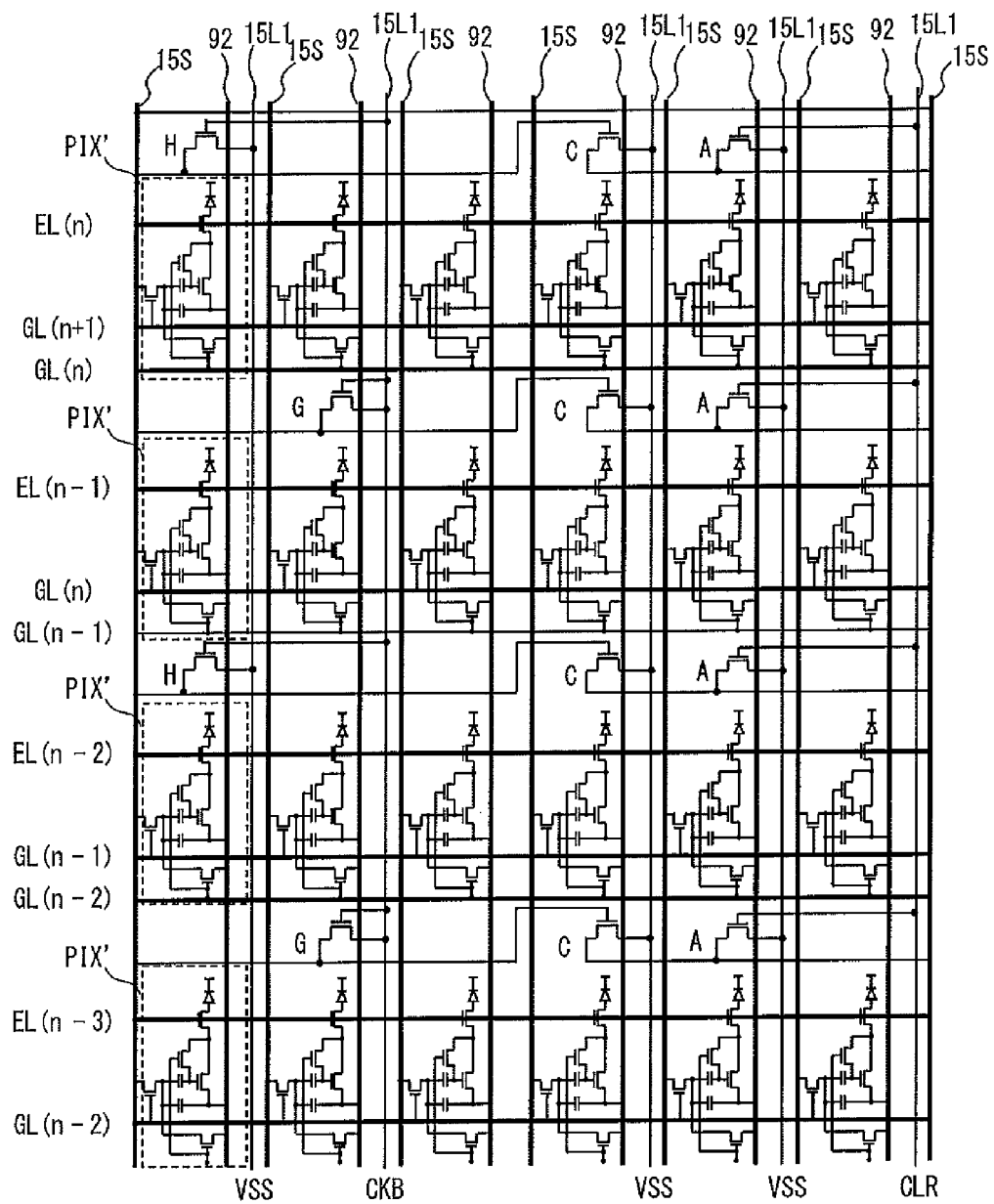
FIG. 69B is a schematic diagram of pixels in which gate drivers and EL drivers are provided according to Variation 10.
Figure 69C:
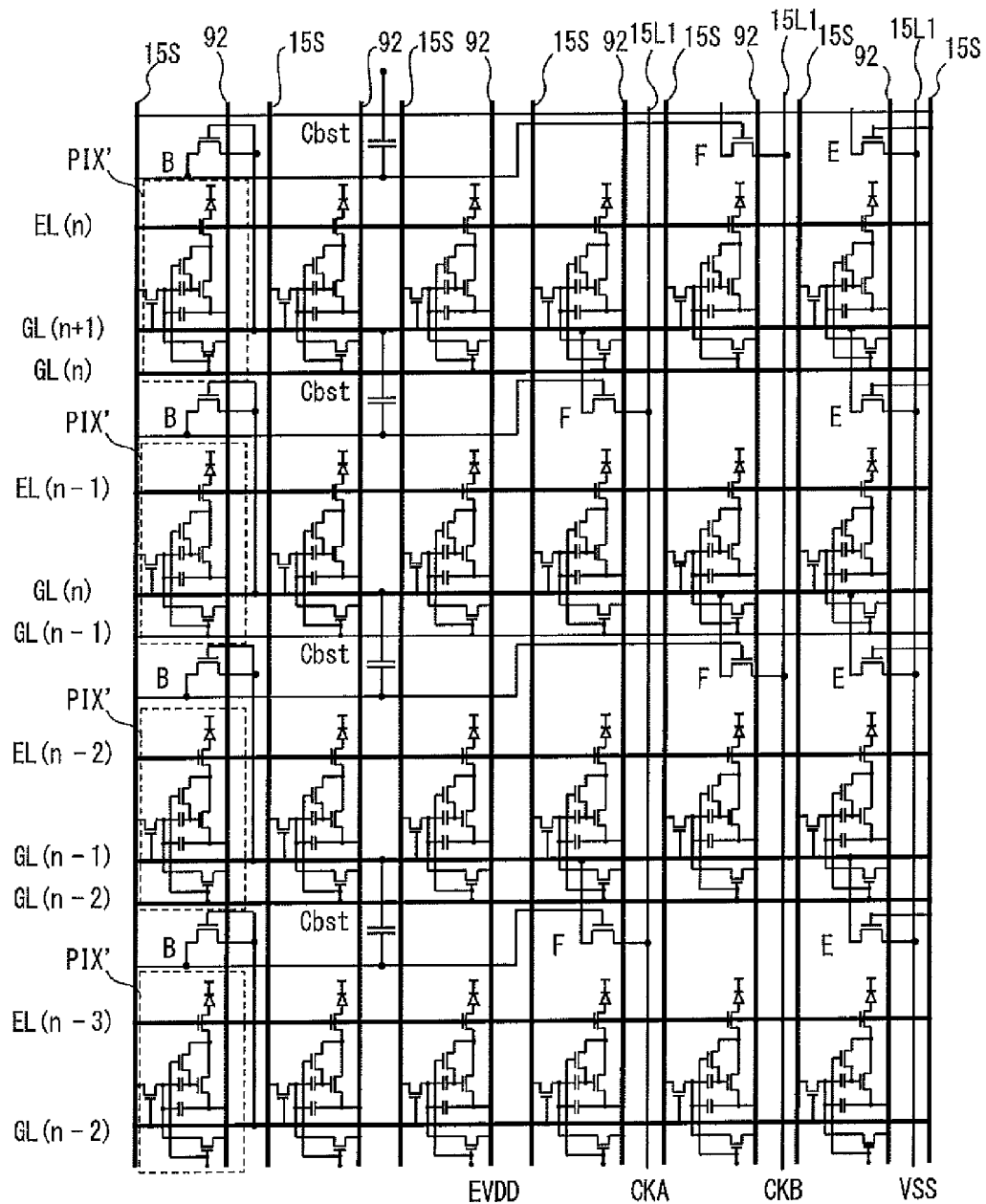
FIG. 69C is a schematic diagram of pixels in which gate drivers and EL drivers are provided according to Variation 10.
Figure 69D:
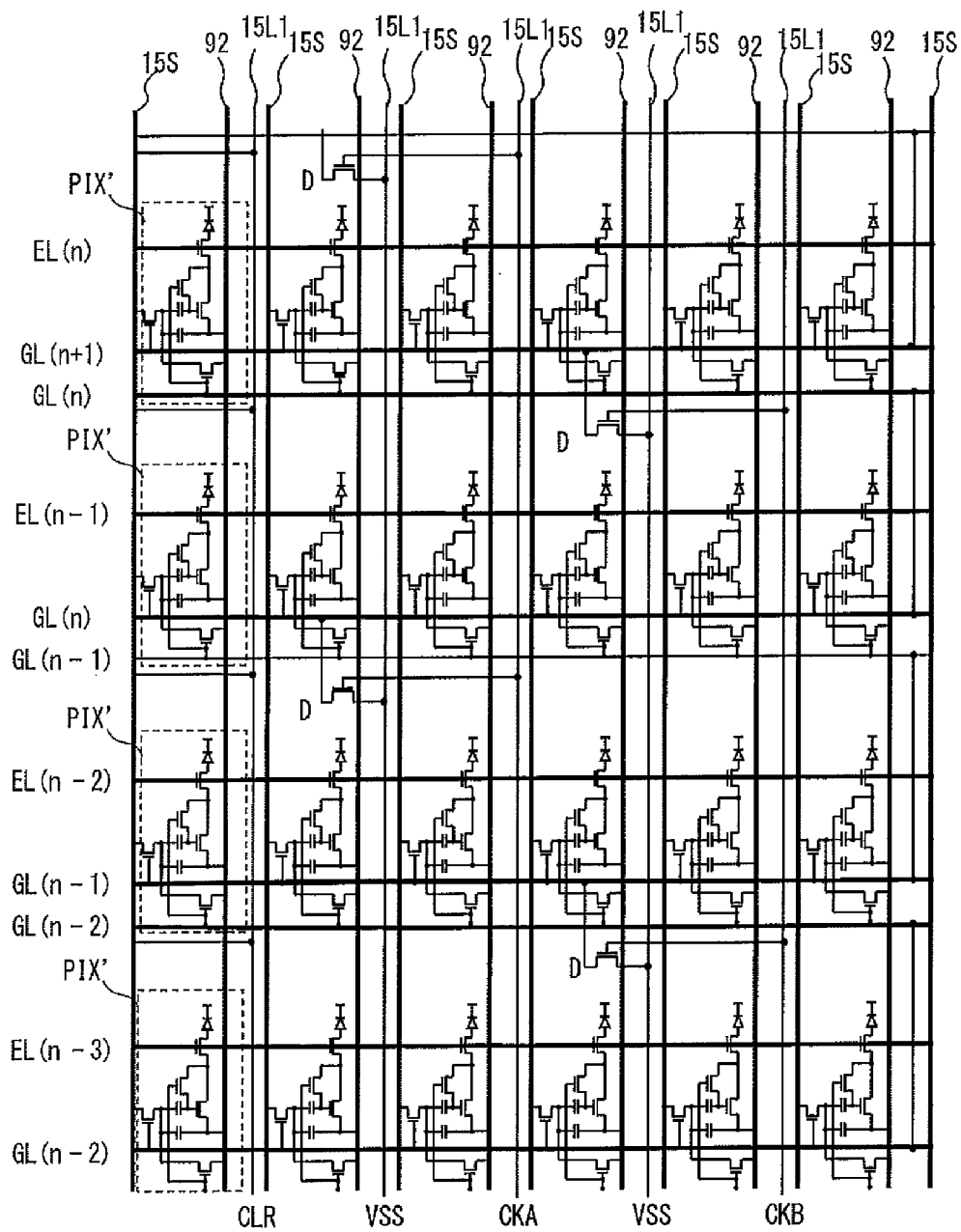
FIG. 69D is a schematic diagram of pixels in which gate drivers and EL drivers are provided according to Variation 10.
Figure 69E:
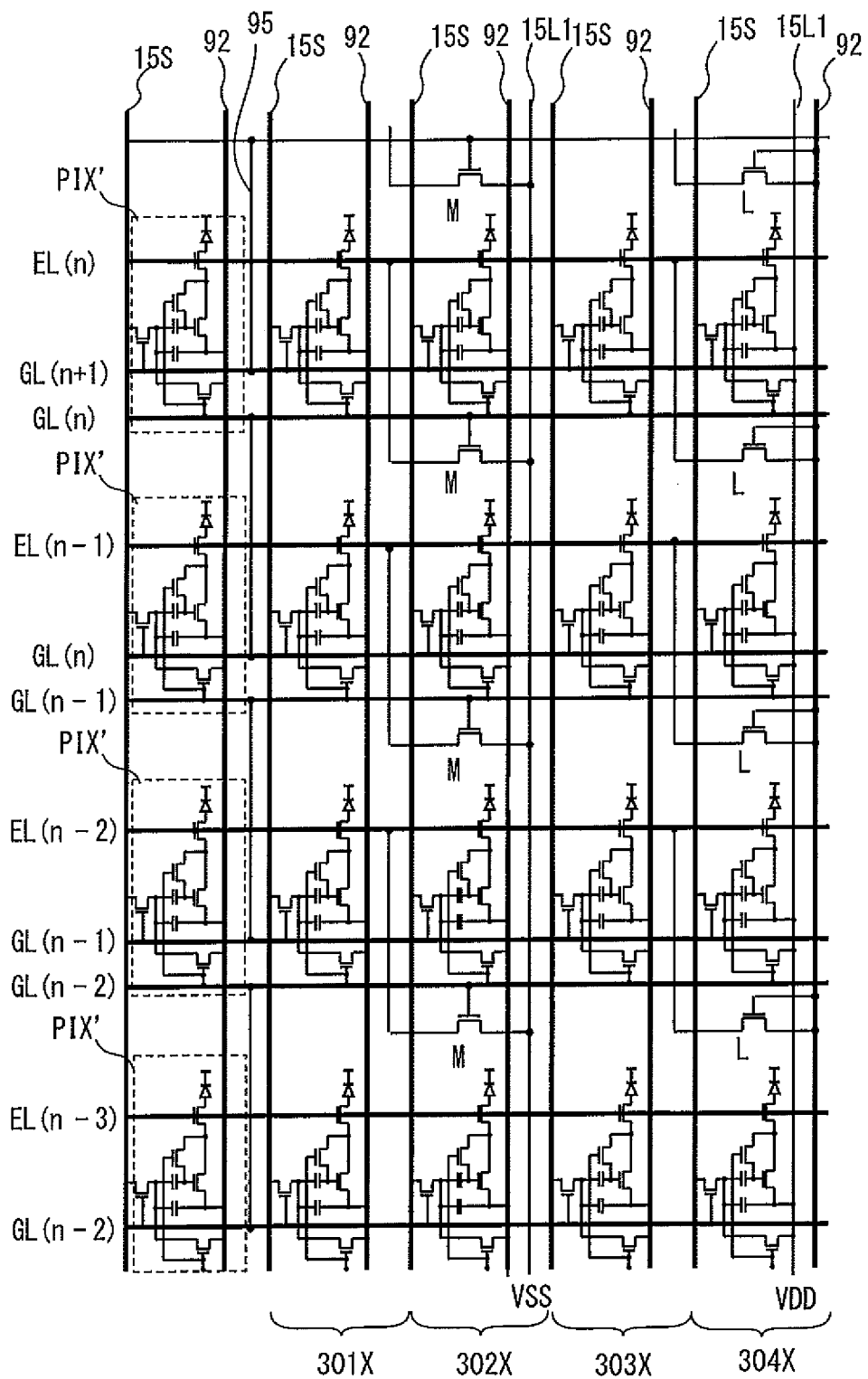
FIG. 69E is a schematic diagram of pixels in which gate drivers and EL drivers are provided according to Variation 10.

Although FIGS. 69A and 69B do not have the character "TFT", "A" to "J", "L", and "M" indicate TFT-A to TFT-J, TFT-L and TFT-M. As is the case in the above first embodiment, the elements constituting the gate driver 11 for driving a gate line 13G (TFT-A to J, Cbst) are dispersed in pixel regions. Further, in the pixel regions of the columns in which those elements of gate drivers 11 that receive control signals (CKA, CKB, VSS and CLR) are provided, lines 15L1 are provided for supplying the control signals.

The switching elements L and M of an EL driver 93 are provided for each light-emission control line EL(91). The switching element M is located in pixel regions of the columns 301x to 302x. The switching element L is located in pixel regions of the columns 303x to 304x. Lines 15L1 for supplying the power supply voltage signals VSS and VDD are provided in the columns 302x and 304x, in which the switching elements M and L are provided. Thus, the elements constituting an EL driver 93 are provided in pixel regions in which the elements of a gate driver 11 are not present.

Figure 70:
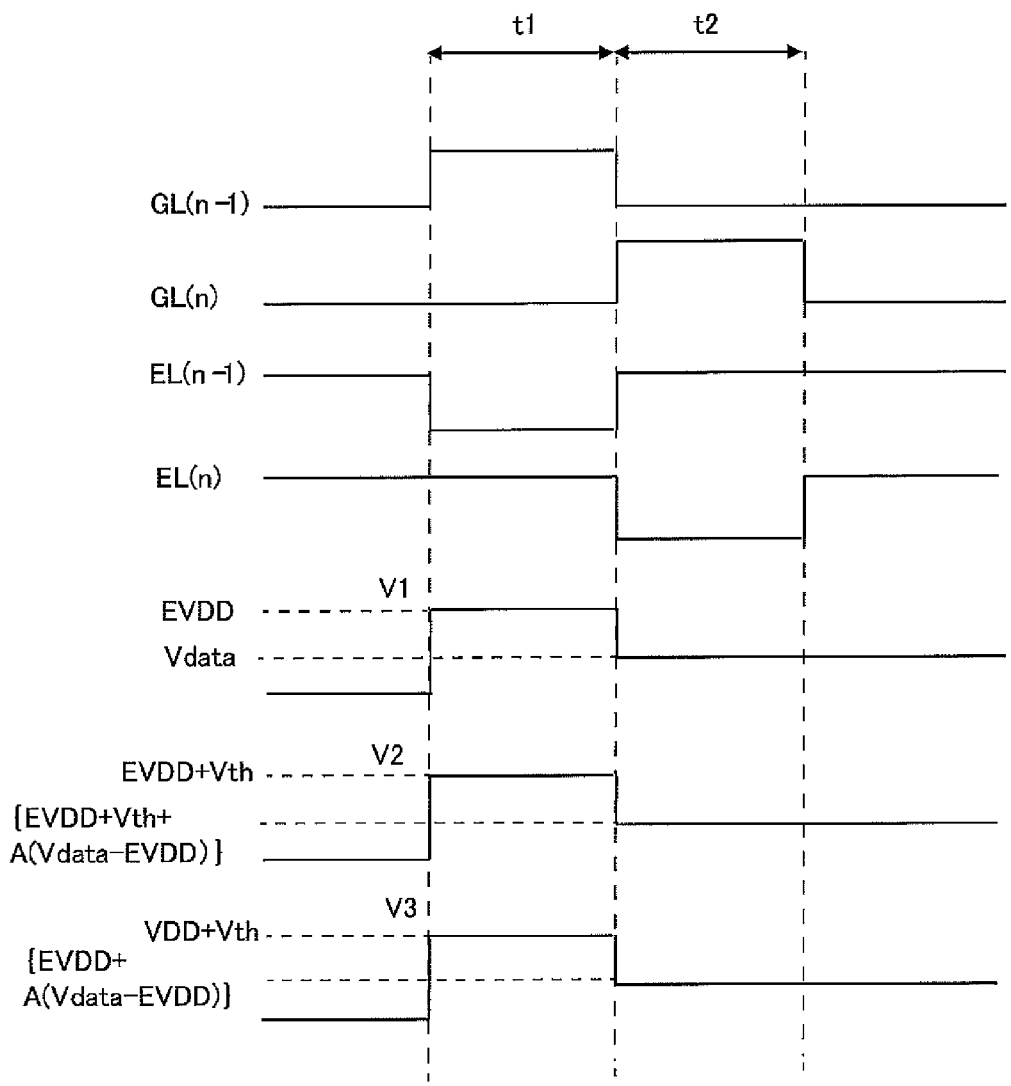
FIG. 70 is a timing chart illustrating how the pixel of FIG. 67 is driven.

FIG. 70 shows a timing chart showing the timing for driving the pixel PIX' shown in FIG. 67. In FIG. 70, during time period t1, the potential of the light-emission control line 91: EL(n−1) is at L level, and the potential of the gate line 13G: GL(n−1) is at H level. In this state, the element T5 is off and the OLED 90 is disconnected from the element T2. Further, since the element T3 is on, the portion V1 of FIG. 67 is charged to the voltage signal EVDD which is supplied from the power supply line 92. Further, since the element T4 is on, the portions V2 and V3 of FIG. 67 are short-circuited, and are charged to the threshold voltage Vth of the voltage signal EVDD+T2.

After time period t1, in time period t2, the potential of the light-emission control line 91: EL(n−1) goes to H level, the potential of the gate line 13G: GL(n−1) goes to L level, and the potential of the gate line 13G: GL(n) goes to H level. The data signal Vdata is supplied to the source line 15S at the time point at which the gate line 13G: GL(n) goes to H level. In this state, the element T5 is on such that the OLED 90 is connected with the element T2. Further, the element T3 is off and the element T1 is on such that the portion V1 of FIG. 67 is charged to the data signal Vdata.

Further, since the element T4 is off, the portion V2 of FIG. 67 is affected by the variation in the potential of the portion V1 via the capacitor C1. Thus, the voltage of the portion V2 changes to: voltage signal EVDD+threshold voltage Vth+A×(data signal Vdata−voltage signal EVDD). Here, A=C1/(C1+Cp) (C1: capacitance of the capacitor C1; Cp: parasitic capacitance or the like of the switching element). At this moment, the potential of the portion V3 in FIG. 67 becomes the value that is lower by the threshold voltage Vth of the element T2. That is, V3=voltage signal EVDD+A×(data signal Vdata−voltage signal EVDD). Thus, a current that is independent from the threshold voltage Vth flows into the portion V3, thereby eliminating variations in the threshold voltage Vth.

Figure 71:
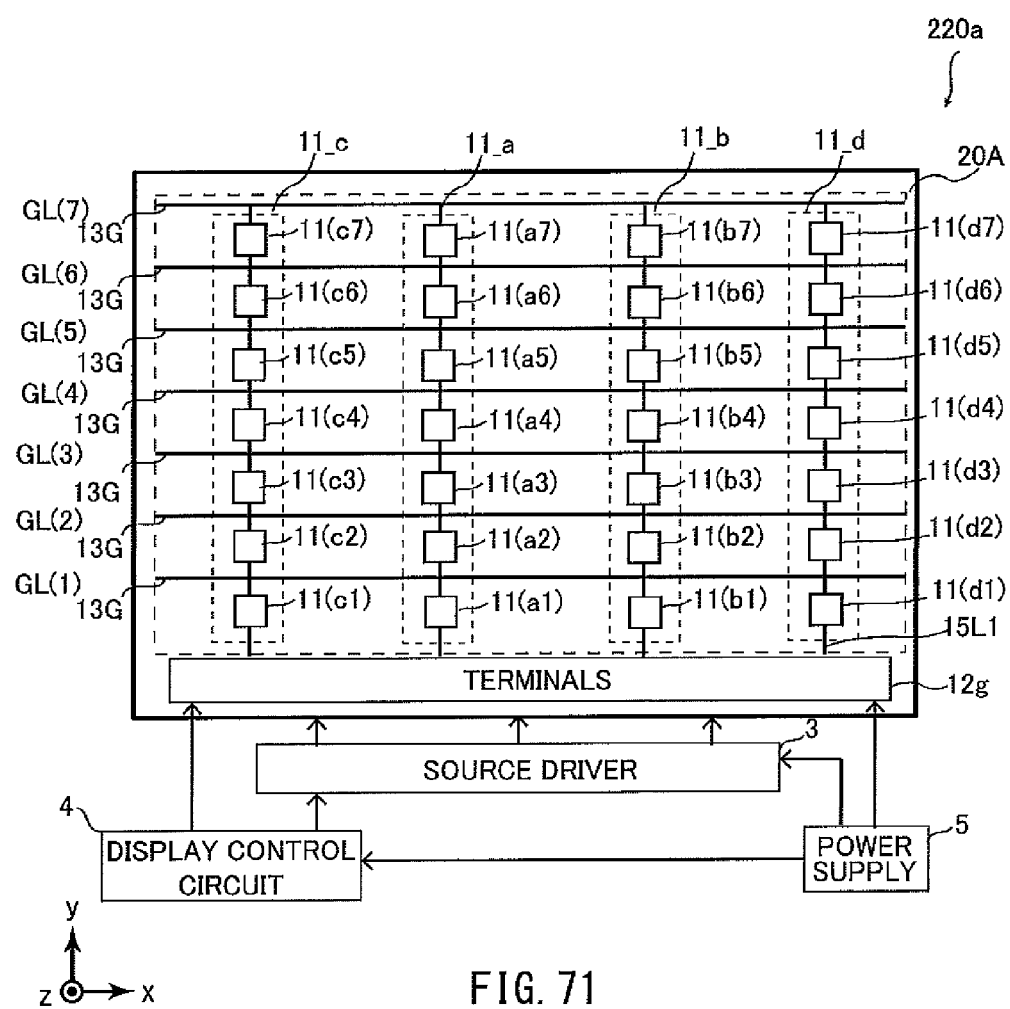
FIG. 71 illustrates an example construction of an active-matrix substrate according to Variation 11.

(11) The above fifth embodiment describes an implementation where two gate lines 13G are driven simultaneously by one pair of gate drivers (11_a and 11_b); alternatively, they may be driven by two or more pairs of gate drivers. For example, as shown in FIG. 71, in addition to one pair of gate driver groups (11_a and 11_b) described above, a gate driver group 11_c (gate drivers 11(c1) to 11(c7)) and a gate driver group 11_d (gate drivers 11(d1) to 11(d7)) that are similar to the gate driver groups (11_a and 11_b) may be provided. The gate driver groups 11_c and 11_d are provided in columns other than those for the gate drive groups 11_a and 11_b. In this case, the start pulse signal Sa is supplied to the gate driver group 11_c at the same time point as that for the gate driver group 11_a, and the start pulse signal Sb is supplied to the gate driver group 11_d at the same time point as that for the gate driver group 11_b. Thus, the gate driver 11 (an) in the gate driver group 11_a and the gate driver 11 (cn) of the gate driver group 11_c drive the gate line 13G of the nth row (n is an integer, 1≤n≤7) in a synchronized manner. Then, after the driving by the gate driver groups 11_a and 11_c, the gate driver 11(bn) of the gate driver group 11_b and the gate driver 11(dn) of the gate driver group 11_d drive the gate line 13G of the nth row in a synchronized manner.

(12) Starting from one the above first, third, sixth to eighth embodiments and the above variations (1) to (9), gate drivers 11 may be arranged in the following manner.

(12-1: Example Arrangement 1)

In the present variation, the gate drivers 11 provided for the gate lines 13G of the even-numbered rows (hereinafter referred to as gate drivers 11x) are connected via a line 15L1, and the gate drivers 11 provided for the gate lines 13G of the odd-numbered rows (hereinafter referred to as gate drivers 11y) are connected via a line 15L1. Then, the gate drivers 11x and the gate drivers 11y are driven separately to sequentially drive all the gate lines 13G.

Figure 72:
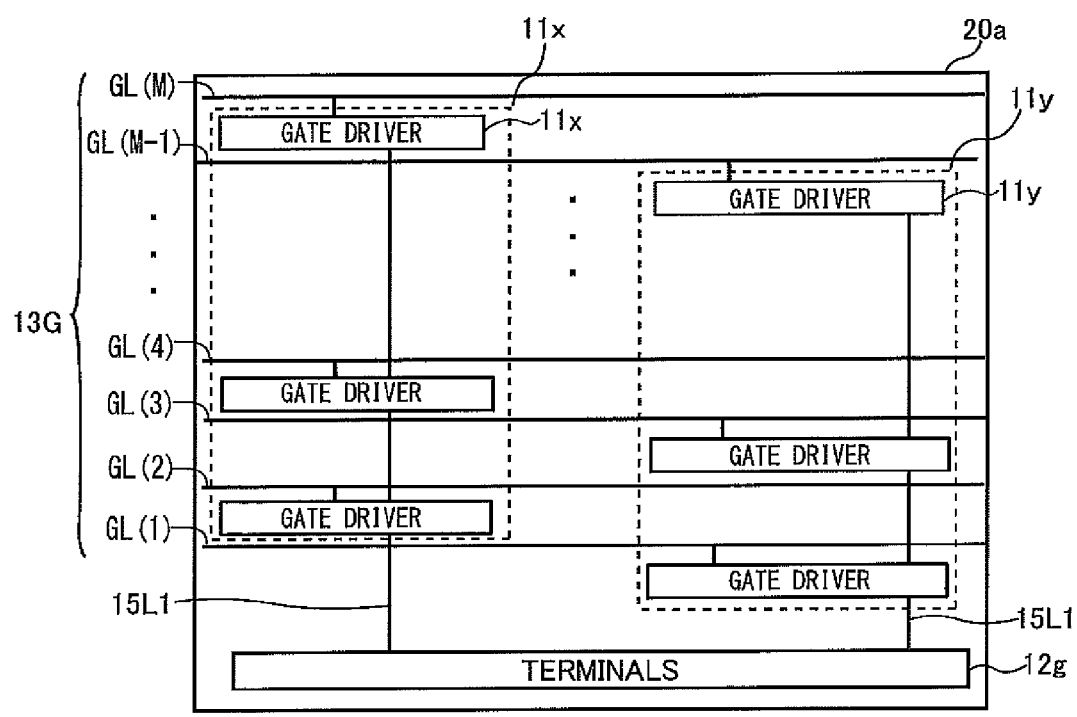
FIG. 72 is a schematic diagram of an active-matrix substrate according to Variation 12.

FIG. 72 is a schematic diagram of an active-matrix substrate 20a according to the present variation. In this drawing, for convenience, the source line 15S and first terminals 12s are not shown. As illustrated in FIG. 72, M gate lines 13G: GL(1) to GL(M) are provided on the active-matrix substrate 20a. On the active-matrix substrate 20a, the gate drivers 11x provided for the gate lines 13G of the even-numbered rows (GL(2), GL(4), . . . GL(M)) are located in the same columns and connected with each other via a line 15L1. Further, the gate drivers 11y provided for the gate lines 13G of the odd-numbered rows (GL(1) to GL(M−1)) are located in the same columns and connected with each other via a line 15L1. The gate drivers 11x are located in pixel regions of columns that are different from those for the gate drivers 11y.

Figure 73A:
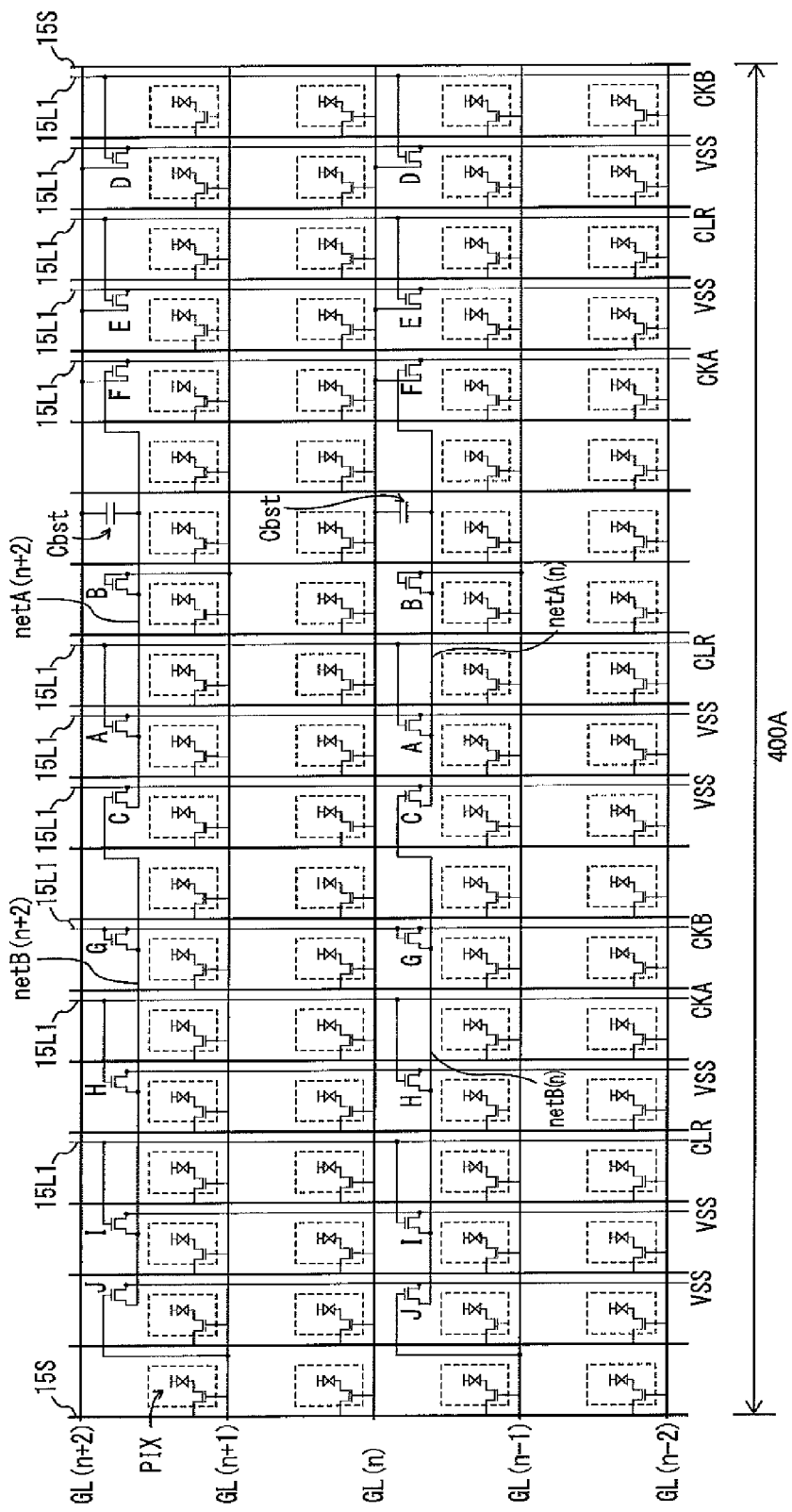
FIG. 73A shows an equivalent circuit of gate drivers 11x shown in FIG. 72.

Each of the gate drivers 11x and 11y has the same circuit construction as the gate driver 11 of the first embodiment (see FIG. 4). FIG. 73A shows an equivalent circuit of gate drivers 11x provided in the display region, while FIG. 73B shows an equivalent circuit of gate drivers 11y provided in the display region. Although FIGS. 73A and 73B do not have the character "TFT" for convenience, "A" to "J" in the drawings indicate "TFT-A" to "TFT-J" of FIG. 4.

As illustrated in FIG. 73A, a gate driver 11x for driving the gate line 13G: GL(n) (hereinafter referred to as gate driver 11x(n)) is provided between the lines GL(n) and GL(n−1). A gate driver 11x for driving the gate line 13G: GL(n+2) (hereinafter referred to as gate driver 11x(n+2)) is provided between the rows GL(n+2) and GL(n). The TFT-A to TFT-J, capacitor Cbst, internal nodes (netA(n), netA(n+2), netB(n) and netB(n+2)) constituting the gate driver 11x are provided in pixel regions in columns 400A and in the row in which the gate driver is provided. In FIG. 73A, lines 15L1 extending generally parallel to the source lines 15S are provided in the pixel regions of the columns in which the elements receiving the control signals (VSS, CLR, CKA and CKB) are provided and the nearby columns. The adjacent gate drivers 11x(n) and 11x(n+2) are connected via a line 15L1.

Further, as illustrated in FIG. 73B, a gate driver 11y for driving the gate line 13G: GL(n−1) (hereinafter referred to as gate driver 11y(n−1)) is provided between the rows GL(n−2) and GL(n−1). A gate driver 11y for driving the gate line 13G: GL(n+1) (hereinafter referred to as gate driver 11y(n+1)) is provided between the rows GL(n+1) and GL(n). The TFT-A to TFT-J, capacitor Cbst, internal nodes (netA(n−1), netA(n+1), netB(n−1) and netB(n+1)) constituting the gate driver 11y are provided in pixel regions in columns 400B and in the row in which the gate driver is provided. In FIG. 73B, lines 15L1 extending generally parallel to the source lines 15S are provided in the columns in which the elements receiving the control signals (VSS, CLR, CKA and CKB) are provided and the nearby columns. The adjacent gate drivers 11y(n−1) and 11y(n+1) are connected via a line 15L1.

Figure 74:
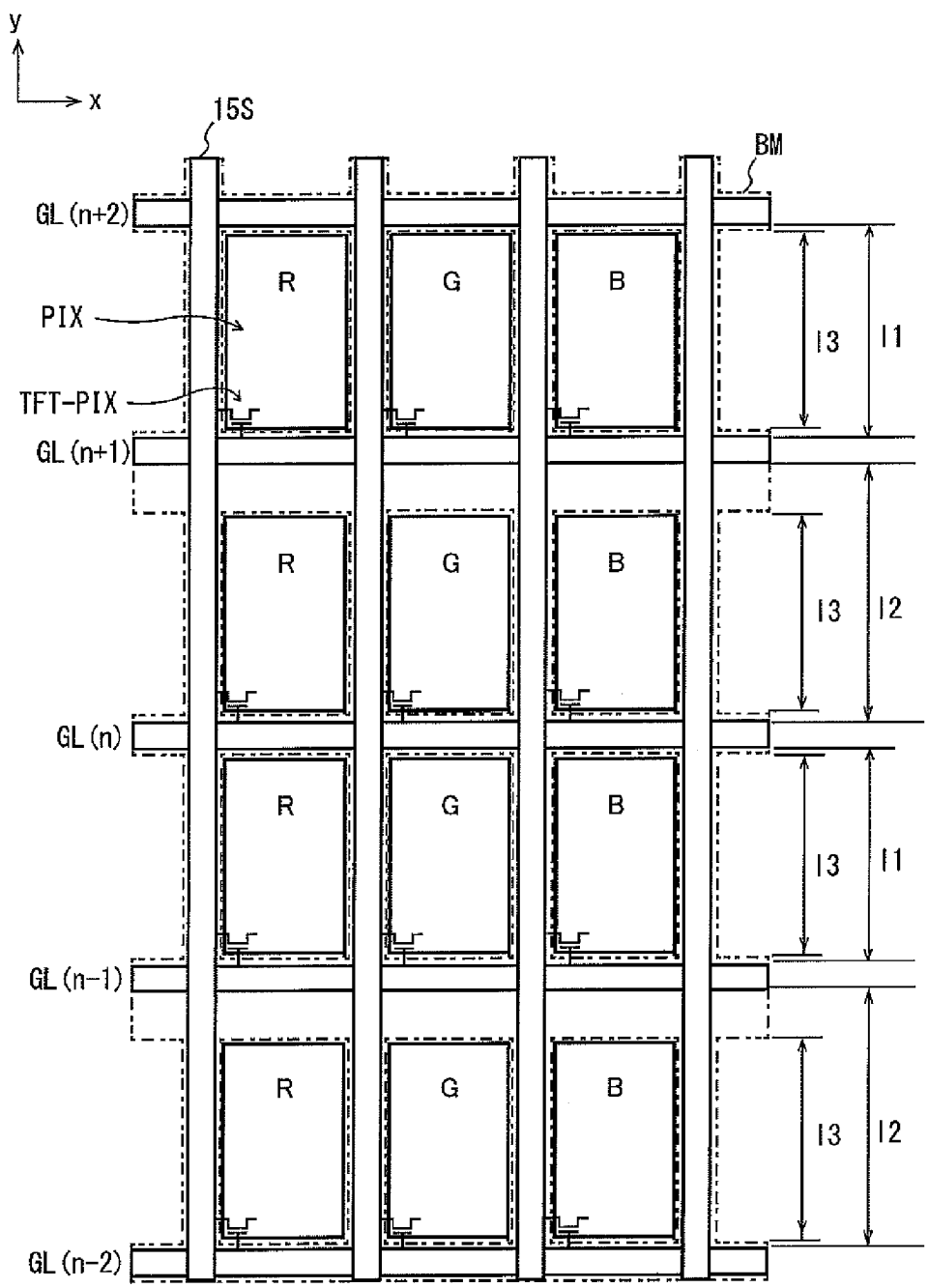
FIG. 74 is a simplified schematic view of some pixel regions in which a gate driver 11y shown in FIG. 73B is provided.

The size of a pixel region in a row in which a gate driver 11x or 11y are provided will be described below. FIG. 74 is a simplified schematic view of some pixel regions of columns 400B in which a gate driver 11y is provided. In this drawing, the character "R", "G" or "B" for a pixel PIX indicates the color of the color filter corresponding to the pixel PIX. Further, as is the case in the first embodiment, the region BM indicated by one-dot-chain lines indicates a light-shielding region where light is blocked by the black matrix. Although not shown in this drawing, some of the elements constituting the gate drivers 11y are located between the rows GL(n+1) and GL(n) near the gate line 13G: GL(n+1) and between the rows GL(n−1) and GL(n−2) near the gate line 13G: GL(n−1).

As shown in FIG. 74, the length 12 between the gate lines 13G where a gate driver 11y is present is greater than the length 11 between the gate lines 13G where a gate driver 11y is not present. However, regardless of whether a gate driver 11y is present, the length 13 of the aperture as measured in the direction of extension of the source lines 15S for each pixel PIX is substantially the same for light shielding. Thus, the aperture ratio for each pixel is generally uniform.

That is, in the columns 400A and 400B in which gate drivers 11x and 11y are provided, the distance between the gate lines 13G where a the gate driver 11x or 11Y is present is larger than the distance between the gate lines 13G where a gate driver 11x or 11y is not present. Further, the light-shielding region of the pixel regions of a row in which a gate driver 11x or 11y is present is larger than that of the pixel regions of a row in which a gate driver 11x or 11y is not present such that the aperture ratio of every pixel region is substantially the same.

Thus, in a region where a gate driver is provided, a gate driver is not present in all the spaces between the gate lines, thereby improving the aperture ratio compared with implementations where a gate driver is present in all the spaces between the gate lines.

If gate drivers 11x and 11y are provided such that there is a space between a region in which a gate driver 11x is present and a region in which a gate driver 11y is present, the distance between the gate lines 13G in this space (hereinafter referred to as no-gate driver region) may be substantially the same. More specifically, for example, the distance between gate lines 13G in a no-gate driver region may have the intermediate value between the distance 11 between gate lines 13G of rows in which a gate driver 11x or 11y is not present shown in FIG. 74 and the distance 12 of gate lines 13G of rows in which a gate driver 11x or 11y is present. Further, light may be shielded for the no-gate driver regions such that the width in the vertical direction (i.e. the y-direction in FIG. 74) of an aperture of a pixel region in a no-gate driver region is equal to the width of an aperture in a region in which a gate driver 11x or 11y is present (i.e. the width 13 in FIG. 74). More specifically, for example, the width in the vertical direction (i.e. the y-direction in FIG. 74) of the portions of the light-shielding region BM that cover gate lines 13G of no-gate driver regions may have the intermediate value of the width of the portions of the light-shielding region MB that cover the gate line 13G: GL(n+1) shown in FIG. 74 and the width of the light-shielding region MB covering the gate line 13G: GL(n) shown in FIG. 74.

(12-2: Example Arrangement 2)

Figure 75A:
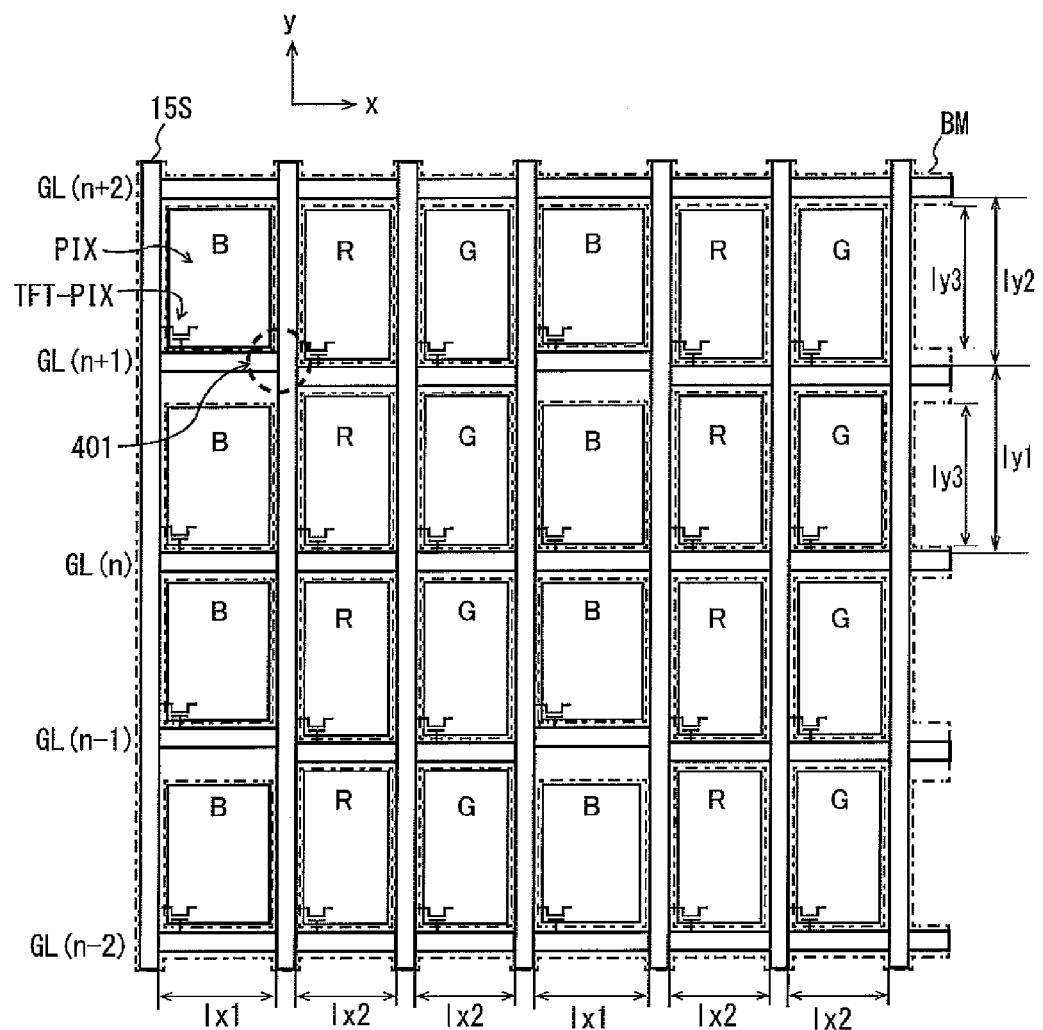
FIG. 75A is a schematic view of pixel regions in which gate drivers 11y are provided.

An example arrangement where gate drivers 11x and 11y are disposed only in the pixels for one of the colors R, G and B will be described below. FIG. 75A is a simplified schematic view of a portion of the display region in an implementation where the TFT-A to TFT-J and capacitor Cbst constituting a gate driver 11y are disposed in B pixels. Although the following describes an example arrangement of gate drivers 11y, gate drivers 11x may be disposed in a manner similar to that of FIG. 75A.

As shown in FIG. 75A, the width lx1 of B pixels in the x-direction is larger than the width lx2 of pixels R and G in the x-direction. Further, the width of R and G pixels in the y-direction has substantially the same length ly2 regardless of whether a gate driver 11y is present. On the other hand, the width of B pixels in the y-direction varies depending on whether the gate driver 11 is present or not. That is, the B pixels in rows in which a gate driver 11y is present has a width ly1 that is larger than the width ly2 of R and G pixels in the y-direction. Further, the B pixels in rows in which a gate driver 11y is not present has a width ly3 that is smaller than the width ly2 of R and G pixels in the y-direction. That is, as shown in FIG. 75A, one of the pair of gate lines 13G forming a row in which a gate driver 11y is present has portions that correspond to B pixels in this row and that are displaced outwardly with respect to the portions corresponding to the R and G pixels. The other one of the pair of gate lines 13G forming the row in which a gate driver 11y is present are substantially in a straight line with respect to all the portions corresponding to the R, G and B pixels in this row.

Figure 75B:
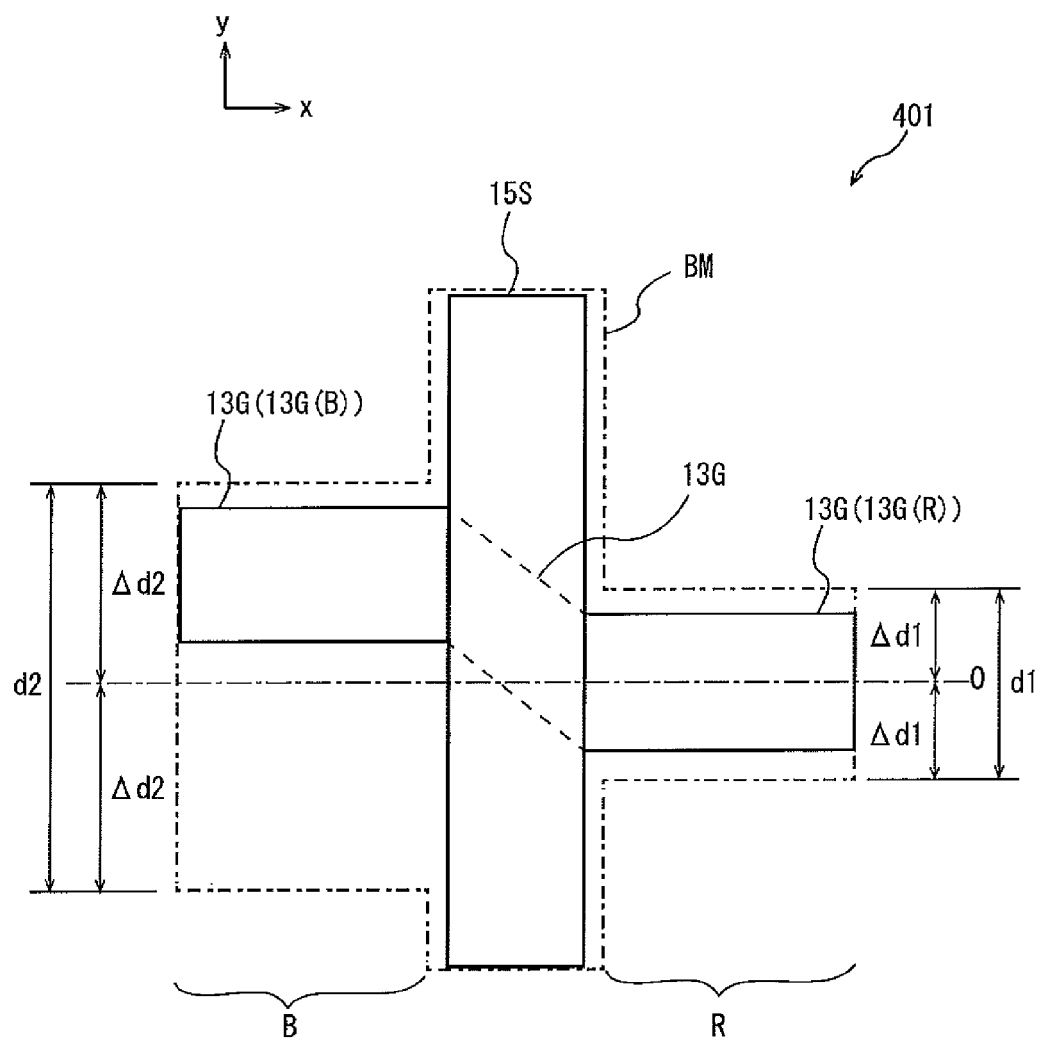
FIG. 75B is an enlarged schematic view of the portion defined by the broken circle of FIG. 75A.

Further, as shown in FIG. 75A, light is blocked for the portion in which an element of a gate driver 11y is provided such that the B pixels in the row in which the gate driver 11y is present have substantially the same aperture ratio. FIG. 75B shows an enlarged schematic view of the portion defined by the broken circle 401 shown in FIG. 75A.

As shown in FIG. 75B, the portions of the gate 13G corresponding to B and R pixels are generally perpendicular to the source line 15S (see 13G(B) and 13G(R)), and the portion thereof that crosses the source line 15S is diagonal to the source line 15S (i.e. non-perpendicular). The portions of the light-shielding region that correspond to a B pixel has a range of ±Δd2 in the y-direction with respect to the one-dot-chain line O which passes near the central axis of the portions of the gate line 13G(R) that correspond to the R pixel, and has a width in the y-direction of d2(=2·Δd2). The portions of the light-shielding region that correspond to the R pixel has a range of ±Δd1 in the y-direction with respect to the one-dot-chain line O, and has a width in the y-direction of d1(=2·Δd1).

(12-3: Example Arrangement 3)

The higher the resolution of the display panel, the more difficult it is to dispose the elements constituting gate drivers in pixels. In view of this, the distance between the source lines 15S forming a pixel in which an element of a gate driver is provided may be larger in its portion with the element than in the other portions.

Figure 76A:
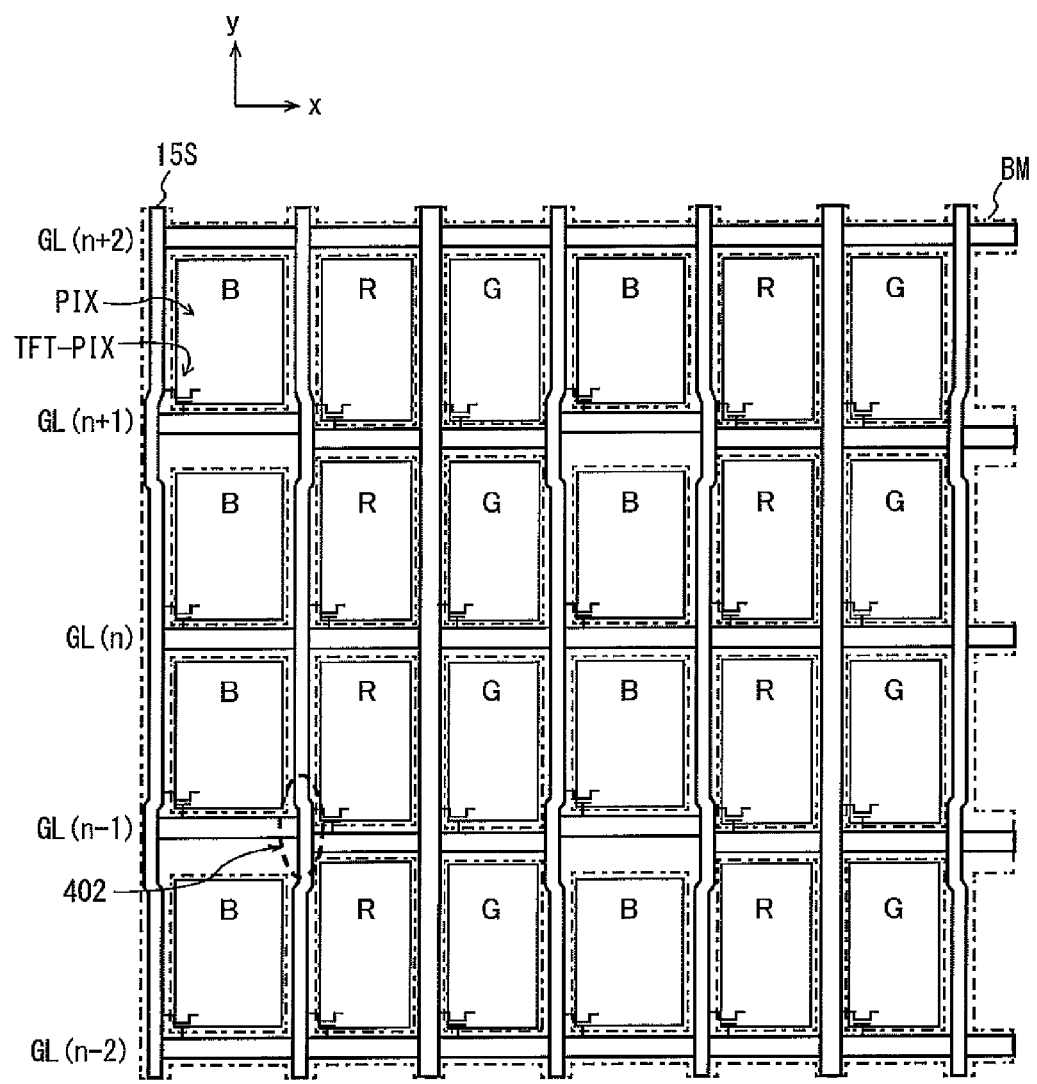
FIG. 76A is a schematic view of pixel regions in which gate drivers 11y shown in FIG. 75A are provided.
Figure 76B:
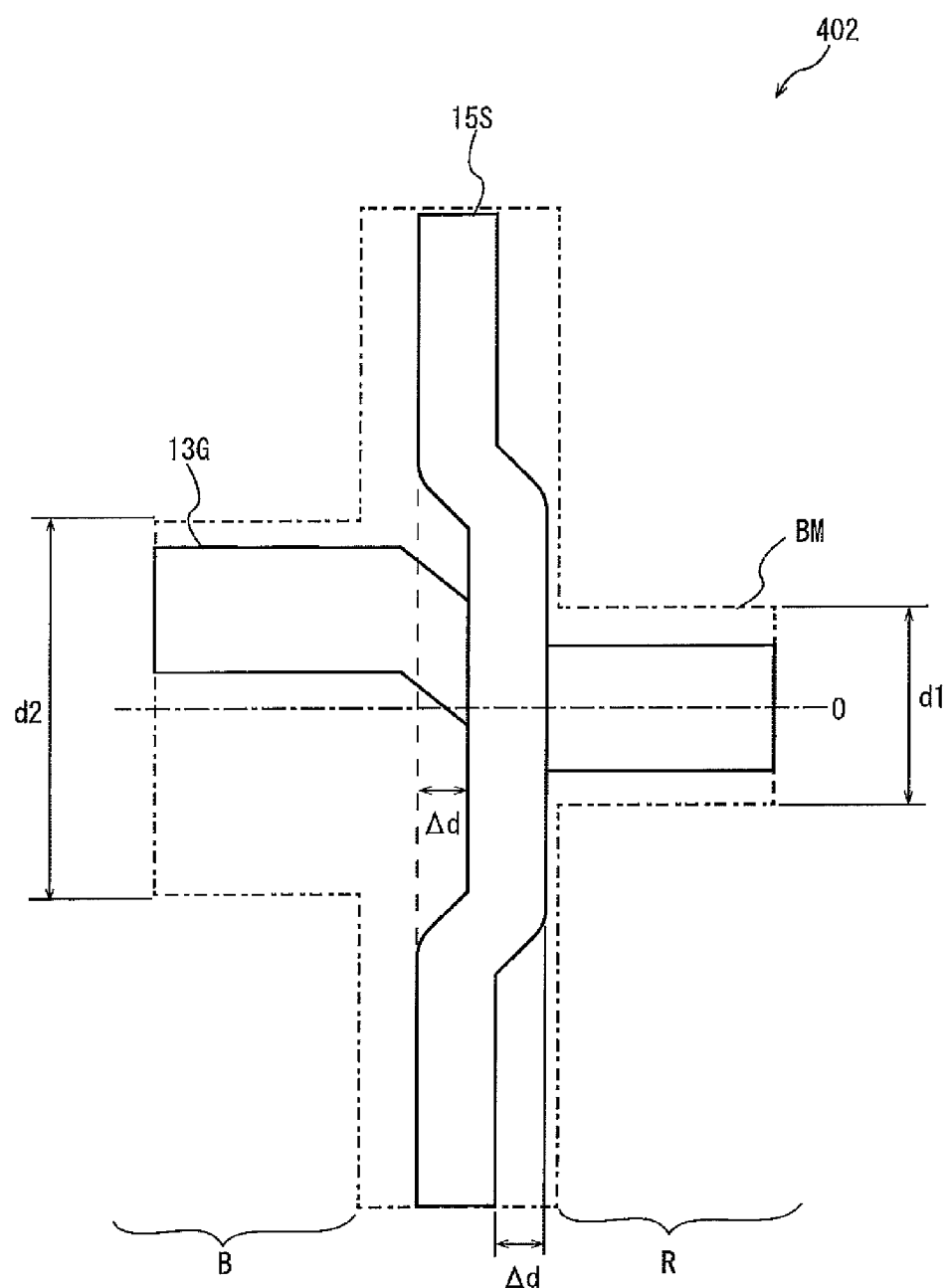
FIG. 76B is an enlarged schematic view of the portion defined by the broken ellipse of FIG. 76A.

FIG. 76A shows an implementation where the distance between the source lines 15S forming a B pixel in which an element of a gate driver 11y as shown in FIG. 75A is provided, in its portion with the element of the source driver 11y, i.e. in the portion with the light-shielding region, is larger than the aperture of the B pixel. FIG. 76B is an enlarged schematic view of the portion defined by the broken ellipse 402 shown in FIG. 76A. As shown in FIG. 76B, one of the source lines 15S forming a B pixel, in the portion with the width d2 of the light-shielding region BM of the B pixel in the y-direction, is located outward, or displaced toward the adjacent R pixel, by Δd. The arrangement shown in FIGS. 76A and 76B provides a larger region in which an element of a gate driver 11y is provided than an implementation of FIG. 75A, thereby making it easier to dispose elements of gate drivers 11y in B pixels.

(12-4: Example Arrangement 4)

FIGS. 73A and 73B illustrate implementations where the elements and internal node lines constituting gate drivers 11x and 11y are disposed in one row between gate lines 13G; alternatively, the elements and internal node lines constituting gate drivers 11x and 11y may be disposed in pixel regions of a plurality of rows. A specific implementation of such an arrangement is shown in FIG. 77.

Figure 77:
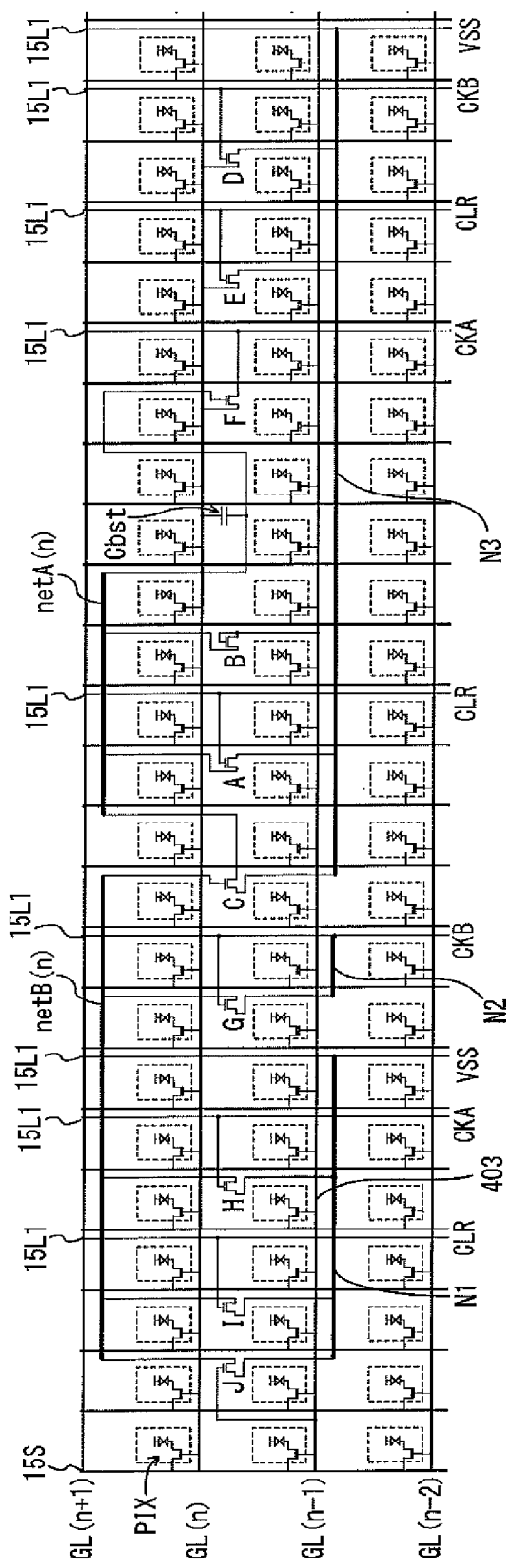
FIG. 77 is a schematic diagram of an implementation in which gate drivers 11x(n) are arranged.

FIG. 77 shows an example arrangement of elements and internal node lines constituting the gate driver 11x(n) for driving the gate line 13G: GL(n). Although FIG. 77 does not have the character "TFT-", "A" to "J" in FIG. 77 indicate TFT-A to TFT-J. As shown in FIG. 77, the TFT-A to TFT-J and capacitor Cbst constituting a gate driver 11x(n) is disposed between the gate lines 13G: GL(n) and GL(n−1). The netA(n) and netB(n), which are internal nodes for the gate driver 11x(n), are disposed between the gate lines 13G: G(n+1) and GL(n). Internal node lines N1 to N3 are disposed between the gate lines 13G: GL(N−1) and GL(n−2).

The internal node line N1 connects the source terminals of the TFT-H, I and J, and is connected with a line 15L1 to which the power supply voltage VSS is supplied. The internal node line N2 is connected with the drain terminal of the TFT-G and a line 15L1 to which the clock signal CKB is supplied. The internal node line N3 connects the source terminals of the TFT-A, C and D and is connected with a line 15L1 to which the power supply voltage VSS is supplied.

In this arrangement, the pixel region 403 in which the TFT-H is provided shown in FIG. 77, for example, only needs to have a line for connecting to the line 15L1 supplying the clock signal CKA, a line for connecting the drain terminal of the TFT-H with the netB(n) and a line for connecting the source terminal of the TFT-H with the internal node line N1. In the implementation of FIG. 73A, the netB(n) is provided in the pixel region having the TFT-H, while in the implementation of FIG. 77, the netB(n) is provided in pixel regions of the preceding row, reducing the number of lines in the TFT-H, thereby improving the aperture ratio.

(12-5: Example Arrangement 5)

In one of the above implementations, in the display region of the active-matrix substrate 20a, the regions made of two different columns 400A and 400B include gate drivers 11x for driving the gate lines 13G of even-numbered rows and gate drivers 11y for driving the gate lines 13G of odd-numbered rows; alternatively, for example, the display region may include, in three regions extending in the extension direction of the gate lines 13, gate drivers for driving the gate line 13G of the 3n−2th row, gate drivers for driving the gate line 13G of the 3n−1th row, and gate drivers for driving the gate line 13G of the 3nth row. The present variation only requires that, in the display region, a gate driver 11 be provided in each of K regions (K is an integer, K≥2) arranged in a direction in which the gate lines 13G extend, each gate driver being provided for every K gate lines, gate drivers being provided on different gate lines 13G in different regions.

(13) In the above fourteenth embodiment, an electric short circuit between a pixel electrode 17 and the common electrode 18 may cause a problem called bright spot at a pixel. If the pixel with a bright spot is a pixel in which dummy lines 15L4 and 13N' (see FIG. 25A) are provided, a laser beam or the like may be directed to the dummy lines 15L4 and 13N' to cause a short circuit to electrically connect the pixel electrode 17 with the common electrode 18. As no voltage is applied to the pixel electrode 17 of the pixel with a bright spot, the common electrode 18 and pixel electrode 17 are at the same voltage, and this pixel region displays black (i.e. black spot). As the pixel with a bright spot now has a black spot, the decrease in display quality is reduced compared with cases with a bright spot.

The present variation describes an implementation where, when a bright spot is produced at a pixel with dummy lines, the dummy lines may be short-circuited to electrically connect the pixel electrode 17 with the common electrode 18; alternatively, if pixels have auxiliary capacitance electrodes, dummy lines may be short-circuited to connect a pixel electrode 17 with an auxiliary capacitance electrode.

(14) The above first to fifteenth embodiments and the above variations describe implementations where a line 15L1 for supplying control signals such as clock signals to the gate driver 11 is located near the center of the pixel region (see FIGS. 8B to 8D); if the pixel pitch is small, as in a high-resolution display panel, a line 15L1 needs to be provided to avoid the TFT-PIX. For example, if a line 15L1 is located near one source line 15S(b) of the pixel PIX(a) as shown in FIG. 78A, a capacitance between the line 15L1 and source line 15S(b) may cause noise in a data signal supplied to the source line 15S(b), producing luminance unevenness. In view of this, the present variation constructs the pixel PIX(a) such that a portion of the line 15L1 is spaced apart from the source lines 15S(a) and 15S(b) by substantially the same distance.

FIG. 78B is a schematic diagram of an example arrangement of a line 15L1 according to the present variation. In the implementation of FIG. 78B, in the pixel PIX(a), the distance between the source line 15S(a) for supplying a data signal to the pixel PIX(a) and the source line 15S(b) for supplying a data signal to the pixel PIX(b) is X. The line 15L1 has bent portions 151 that are bent generally at a right angle within the pixel PIX(a) such that a portion of the line 15L1 is disposed to be spaced apart from the source line 15S(a) and 15S(b) by a distance of about X/2. This arrangement reduces the capacitance between the line 15L1 and the source lines 15S(a) and 15S(b). The effects of this arrangement will be described below, also with reference to FIG. 78A for comparison.

The distance between the line 15L1 and source line 15S(a) will be represented by d1, the distance between the line 15L1 and source line 15S(b) will be represented by d2, and the line 15L1, source line 15S(a) and 15S(b) will be considered to approximate a parallel plate capacitor. Then, the capacitance $C_{CON\text{-}SL}$ between the line 15L1 and the source lines 15S(a) and 15S(b) for a unit length will be expressed by the following equation:

$$C_{CON\text{-}SL} = k\left(\frac{1}{d_1} + \frac{1}{d_2}\right) = \frac{kx}{d_1 d_2} \quad \text{[Equation 1]}$$

k: constant of proportionality)

Thus, the $C_{CON\text{-}SL}$ in the implementation of FIG. 78A is represented by $C_{CON\text{-}SL\_A}=(36k/5)/X$. The $C_{CON\text{-}SL}$ in the implementation of FIG. 78B is represented by $C_{CON\text{-}SL\_B}=4k/X$. That is, $C_{CON\text{-}SL\_B}<C_{CON\text{-}SL\_A}$, which means that the arrangement of the line 15L1 shown in FIG. 78B has a smaller capacitance $C_{CON\text{-}SL}$ than the arrangement of the line 15L1 shown in FIG. 78A. This reduces noise in a data signal for an adjacent pixel PIX(b), thereby reducing luminance unevenness.

In the implementation of FIG. 78B, each of the bent portions 151 of the line 15L1 is bent generally at a right angle; alternatively, as shown in FIG. 78C, it may be bent diagonally (i.e. non-perpendicularly). This arrangement reduces the entire length of the line 15L1 in the pixel PIX(a) compared with the implementation of FIG. 78B, thereby reducing the load on the line 15L1 when receiving a control signal.

FIGS. 78B and 78C show implementations where the TFT-PIX in each of adjacent upper and lower pixels is connected with the same source line 15S(a) or 15S(b); alternatively, as shown in FIGS. 79A and 79B, the TFTs-PIX of adjacent upper and lower pixels may be connected with opposite source lines 15S(a) and 15S(b). This implementation only requires that the bent portions 151 of the line 15L1 be bent in the directions opposite those of FIGS. 78B and 78C.

(15) Starting from the above first to eighth embodiments and Variation (1) to (9) and (11) to (14), an auxiliary capacitance electrode connected with a pixel electrode may be provided. In such an arrangement, for example, as shown in FIG. 80, auxiliary capacitance electrodes CS connected with the pixel electrodes may be provided in the display region 200, an auxiliary capacitance electrode Cs may be connected with an auxiliary capacitance line CsL disposed along the periphery of the auxiliary capacitance electrode Cs outside the display region 200, and a predetermined voltage may be applied to the auxiliary capacitance electrodes Cs via the auxiliary capacitance line CsL. In this case, an auxiliary capacitance electrode Cs of a pixel in which a line 15L1 is provided may receive noise from the line 15L1. Since a pixel in which no line 15L1 is provided does not receive noise from a line 15L1, the potential of a pixel electrode 17 varies depending on whether a line 15L1 is provided in the pixel, potentially causing luminance unevenness. In the present variation, the connection portions between the auxiliary capacitance electrodes Cs and auxiliary capacitance line CsL are not only disposed along the periphery but also within the display region such that the auxiliary capacitance electrodes Cs are kept at a predetermined voltage. A specific description will be given below.

(15-1: Example Arrangement 1)

FIG. 81A is a schematic diagram of a pixel in which a dummy line (adjustment line) is provided. In the implementation of this drawing, in the pixel PIX are provided a dummy line 13N' extending generally parallel to the gate line 13G, a dummy line 15L4 extending generally parallel to the source line 15S, and a low-impedance line 40 overlying the dummy line 15L4. In this drawing, the auxiliary capacitance electrode Cs is not shown. The low-impedance line 40 extends generally parallel to the source line 15S, and the ends of the low-impedance line 40 are electrically connected with auxiliary capacitance line CsL disposed along the periphery of the area of the auxiliary capacitance electrodes Cs shown in FIG. 80. The low-impedance line 40 is at the same potential as the common electrode provided on the counter-substrate 20b, and this potential may not be fixed.

FIG. 81B is a cross-sectional view of the pixel PIX of FIG. 81A taken along line A-A. As shown in FIG. 81B, the dummy line 15L4 is located in the source line layer 15, i.e. in the same layer as the source line 15S. A protection film 23 is provided on top of the source line layer 15. On top of the protection film 23 is provided a low-impedance line 40 overlying the dummy line 15L4, and an auxiliary capacitance electrode Cs is provided to be in contact with the low-impedance line 40. A pixel electrode 17 is provided above the auxiliary capacitance electrode Cs, with an interlayer insulating film 24 being present in between.

Since the low-impedance line 40 is located above the dummy line 15L4 to overlie it, the decrease in the aperture ratio of the pixel PIX due to the presence of the low-impedance line 40 is reduced. Further, in this implementation, no low-impedance line 40 is provided in a pixel in which a switching element of a gate driver 11 is provided, thereby reducing such a line's influence on the operation of the gate driver 11.

Further, as the low-impedance line 40 is provided, contacts between the auxiliary capacitance line CsL and auxiliary capacitance electrodes Cs are provided not only along the periphery of the area of auxiliary capacitance electrodes Cs, but also in pixels in which dummy lines 15L4 are provided. Thus, even when an auxiliary capacitance electrode Cs near a low-impedance line 40 is affected by noise from a line 15L1 and its potential is displaced from a predetermined level, a charge is supplied thereto from the auxiliary capacitance line CsL via the low-impedance line 40 such that the potential of the electrode returns to the predetermined level.

(15-2: Example Arrangement 2)

In the above implementations of FIGS. 81A and 81B, the low-impedance line 40 is provided above the dummy line 15L4; alternatively, a low-impedance line 40 that also serves as a dummy line may be provided in the source line layer 15. FIG. 82A is a schematic diagram of a pixel in such an arrangement. In the implementation of this drawing, in the pixel PIX are provided a dummy line 13N' and a low-impedance line 40 that also serves as a dummy line 15L4. The low-impedance line 40 extends generally parallel to the source line 15S, and the ends of the low-impedance line 40 are electrically connected with the auxiliary capacitance line CsL along the periphery of the area of the auxiliary capacitance electrode Cs shown in FIG. 80.

FIG. 82B is a cross-sectional view of the pixel PIX of FIG. 82A taken along line B-B. As shown in FIG. 82B, in the source line layer 15 is provided a low-impedance line 40 located between the source lines 15S. On top of the source line layer 15 is provided a protection film 23 in which a contact hole CH extending therethrough to the surface of the low-impedance line 40 is formed, and an auxiliary capacitance electrode Cs is provided on top of the protection film 23. The low-impedance line 40 is connected with the auxiliary capacitance electrode Cs via the contact hole CH.

Since the low-impedance line 40 is connected with the auxiliary capacitance electrode Cs and auxiliary capacitance line CsL, the auxiliary capacitance electrode Cs can easily maintain a predetermined voltage. Further, since the low-impedance line 40 is located in the aperture of the pixel, it can serve as a dummy line 15L4 for adjusting the aperture ratio of the pixel. Further, in this implementation, the low-impedance line 40 is located in the source line layer 15 such that no mask pattern for forming the low-impedance line 40 is necessary. This reduces manufacturing costs compared with implementations where a low-impedance line 40 is provided in a different layer.

(15-3: Example Arrangement 3)

The above Example Arrangements 1 and 2 describe implementations where a low-impedance line 40 is provided in a pixel in which a dummy line 15L4 is provided; an implementation where a low-impedance line 40 is provided regardless of whether a dummy line 15L4 is provided in the pixel or not will be described.

FIG. 83A is a schematic diagram of a pixel of such an arrangement. In the implementation of this drawing, a low-impedance line 40 is located in the light-shielding region BM and extends generally parallel to the gate line 13G, and the ends of the low-impedance line 40 are electrically connected with the auxiliary capacitance line CsL along the periphery of the auxiliary capacitance electrode Cs shown in FIG. 80. In this drawing, the auxiliary capacitance electrode Cs and the elements constituting parts of the gate driver 11 including the dummy line 15L4 or line 15L1 are not shown.

FIG. 83B is a cross-sectional view of the pixel PIX of FIG. 83A taken along line C-C. As shown in FIG. 83B, a low-impedance line 40 and auxiliary capacitance electrode Cs are provided on top of the protection film 23, and the auxiliary capacitance electrode Cs is in contact with the low-impedance line 40. Thus, as the low-impedance line 40 is provided in the light-shielding region BM, it can also be provided in a pixel in which an element constituting a part of a gate driver 11 is provided without decreasing the aperture ratio of the pixel. Thus, even when the potential of an auxiliary capacitance electrode Cs near a line 15L1, which is particularly susceptible to noise of the line 15L1, is displaced from a predetermined level, the potential of this auxiliary capacitance electrode Cs can return to the predetermined level.

(15-4: Example Arrangement 4)

In the above implementation of FIG. 83B, the auxiliary capacitance electrode Cs is located on top of the low-impedance line 40 such that the low-impedance line 40 and auxiliary capacitance electrode Cs are in contact with each other; alternatively, other arrangements are possible as long as the auxiliary capacitance electrode Cs and low-impedance line 40 are in contact with each other, as in the following implementation.

FIG. 83C is a cross-sectional view of the pixel PIX of FIG. 83A taken along line C-C. As shown in FIG. 83C, the low-impedance line 40 is located in the gate layer 13, i.e. in the same layer as the gate line 13G. On top of the gate layer 13 are stacked a gate insulating film 21 and protection films 22 and 23, and a contact hole CH is formed in the gate insulating film 21 and protection films 22 and 23 to extend therethrough to the surface of the low-impedance line 40. An auxiliary capacitance electrode Cs is provided on top of the protection film 23, and the low-impedance line 40 is connected with the auxiliary capacitance electrode Cs via the contact hole CH. Similar to the implementation of FIG. 83B, this arrangement makes it easier to maintain, at a predetermined level, the potential of the auxiliary capacitance electrode Cs in a pixel in which an element constituting a part of a gate driver 11 is provided, without reducing the aperture ratio of the pixel.

(16) The above first to fifteenth embodiments describe implementations where the elements constituting gate drivers 11 are provided in the display region; however, only the elements constituting the driving circuits for controlling the potentials of those signal lines crossing the data lines that share at least one function are required to be provided in the display region. Only at least one of the elements constituting each of the gate drivers 11, 11_A, 11_B, 11_1 and 11_2, at least one of the elements constituting each of the CS drivers 80, or at least one of the elements constituting each of the EL drivers 93 are required to be provided in the display region.

INDUSTRIAL APPLICABILITY

The present invention is industrially useful as a display device including an active-matrix substrate.

The invention claimed is:

1. An active-matrix substrate comprising:
a plurality of data lines;
a plurality of lines crossing the plurality of data lines and including at least gate lines;
a plurality of control signal lines provided in a display region that includes pixel regions defined by the data lines and the gate lines, the plurality of control signal lines being provided with a control signal from outside the display region; and
a driving circuit including a plurality of switching elements connected to the plurality of the control signal lines, the driving circuit being connected with at least one of the gate lines and applying one of a selection voltage and a non-selection voltage to the at least one of the gate lines by driving the plurality of the switching elements in response to the control signal supplied via the plurality of the control signal lines, wherein
at least one of the plurality of switching elements is located in the pixel regions,
the active-matrix substrate further comprises:
a pixel electrode in the pixel regions, and
a shield layer made of a conductive film provided between portions of the plurality of the control signal lines overlapping the pixel electrode and the pixel electrode.

2. The active-matrix substrate according to claim 1, wherein the shield layer also is provided between the switching elements located in the pixel region and the pixel electrode.

3. The active-matrix substrate according to claim 1, further comprising:
a pixel electrode located in one of the pixel regions and connected with one of the gate lines and one of the data lines,
wherein one of the switching elements of the driving circuit that is located in the pixel region is disposed so as not to overlie the pixel electrode.

4. The active-matrix substrate according to claim 1, wherein an adjustment line is further provided in a pixel region in which the switching element of the driving circuit is not provided such that this pixel region has an aperture ratio substantially equal to that of a pixel region in which a switching element of the driving circuit is provided.

5. The active-matrix substrate according to claim 1, further comprising:
a first insulating layer located between a gate line layer forming the gate lines and a data line layer forming the data lines;
a second insulating layer having a greater thickness than the first insulating layer and provided on the data line layer and including a contact hole extending therethrough to the data line layer; and
a conductive layer portion provided in the contact hole, wherein the control signal lines are disposed in the data line layer so as to be generally parallel to the data lines in the pixel regions,
wherein the control signal lines are interrupted at locations overlying the gate lines, and
wherein interrupted portions of each of the control signal lines are connected via the conductive layer portion in the contact hole of the second insulating layer.

6. The active-matrix substrate according to claim 1, wherein at least a portion of the control signal line is disposed to be generally parallel to the data lines and located at generally the same distance from two data lines in the pixel region.

7. The active-matrix substrate according to claim 1, further comprising:
a pixel switching element located in one of the pixel regions and connected with one of the data lines and one of the gate lines,
wherein the gate line has portions with a width smaller than the maximum width of the gate line, one of the portions being located between the point on the gate line to which a gate terminal of the pixel switching element is connected and the intersection of the data line and the gate line, and the other one of the portions being located near the intersection of a portion of the gate line to which the gate terminal is not connected and the data line.

8. The active-matrix substrate according to claim 1, wherein a pixel region in which a switching element of the driving circuit is provided has a lager dimension in a direction in which at least one of the gate line and the data line extends than other pixel regions.

9. The active-matrix substrate according to claim 1, further comprising an auxiliary capacitance electrode,
an outer auxiliary capacitance line located outside the display region and connected with the auxiliary capacitance electrode to supply a predetermined potential to the auxiliary capacitance electrode; and
a low-impedance line located in the pixel region and connected with the auxiliary capacitance electrode in the pixel regions and connected with the outer auxiliary capacitance line.

10. The active-matrix substrate according to claim 1, wherein a plurality of driving circuits are provided, each for one of the gate lines.

11. The active-matrix substrate according to claim 1, wherein the display region is divided into a plurality of sub-regions arranged in a direction in which the gate lines are arranged, and a driving circuit provided for a gate line disposed in each of the plurality of sub-regions applies one of a selection voltage and a non-selection voltage to the gate line at a frequency that is specified for the sub-region.

12. The active-matrix substrate according to claim 1, wherein the pixel region corresponds to one of a plurality of colors, and the control signal lines are provided in a pixel region corresponding to one of the plurality of colors.

13. The active-matrix substrate according to claim 1, further comprising:
   a first terminal located outside the display region to supply a data signal to the plurality of data lines; and
   a second terminal located outside the display region to supply the control signal to the plurality of the control signal lines,
   wherein the first and second terminals are located outside of a side of the display region that is parallel to the gate lines.

14. The active-matrix substrate according to claim 1, wherein
   N gate lines (N is a natural number) are provided as the plurality of the gate lines,
   M driving circuits (M is a natural number, M≥2) consisting of a first to Mth driving circuits, are provided for each of the gate lines,
   the M driving circuits provided for the nth gate line (1≤n≤N) apply a selection voltage to the nth gate line in order beginning with the first driving circuit and ending with the Mth driving circuit, the second one of the M driving circuits to the Mth drive circuit apply the selection voltage to the nth gate line at a time point at which the preceding driving circuit applies the selection voltage to the n+1th gate line, and
   a data signal is supplied to one of the data lines at a time point at which the Mth driving circuit applies the selection voltage to the nth gate line, the data signal being for an image to be written to the pixel region defined by the nth gate line and said one of the data line.

15. The active-matrix substrate according to claim 1, wherein the pixel region includes a plurality of sub-pixel regions,
   the lines include the gate lines and sub-gate lines,
   one of the sub-pixel regions includes a sub-pixel electrode driven by one of the gate lines and one of the data lines,
   the other one of the sub-pixel regions includes a sub-pixel electrode driven by one of the sub-gate lines and said one of the data lines and a capacitor connected between the sub-pixel electrode in the other one of the sub-pixel regions and the pixel electrode in the one of the sub-pixel regions,
   the driving circuit includes a sub-gate line driver located in a pixel region in which the switching element is not provided, and provided for one of the sub-gate lines to apply one of the selection voltage and the non-selection voltage to the sub-gate line in response to the control signal, and
   the sub-gate line driver applies the selection voltage to the sub-gate line in one horizontal interval after the selection voltage is applied to the gate line.

16. The active-matrix substrate according to claim 1, wherein the pixel region includes a plurality of sub-pixel regions,
   the lines include the gate lines, sub-gate lines and auxiliary capacitance lines,
   the plurality of sub-pixel regions each include a sub-pixel electrode driven by one of the gate lines and one of the data lines,
   one of the sub-pixel regions includes an auxiliary capacitance connected with one of the auxiliary capacitance lines, and a sub-pixel switching element including a gate terminal connected with one of the sub-gate lines, a source terminal connected with the sub-pixel electrode in the one of the sub-pixel regions, and a drain terminal connected with the auxiliary capacitance,
   the driving circuit includes a sub-gate line driver located in a pixel region in which the switching element is not provided, and provided for one of the sub-gate lines to apply one of the selection voltage and the non-selection voltages to the sub-gate line, and
   the sub-gate line driver applies the selection voltage to the sub-gate line in response to the control signal after the selection voltage is applied to the gate line.

17. The active-matrix substrate according to claim 1, wherein the pixel region includes a plurality of sub-pixel regions,
   the lines include the gate lines, first auxiliary capacitance lines and second auxiliary capacitance lines,
   the plurality of sub-pixel regions each include a sub-pixel electrode driven by one of the gate lines and one of the data lines,
   one of the sub-pixel regions includes a first auxiliary capacitance connected with the sub-pixel electrode in the one of the sub-pixel region and one of the first auxiliary capacitance lines,
   the other one of the sub-pixel regions includes a second auxiliary capacitance connected with the sub-pixel electrode in the other one of the sub-pixel regions and one of the second auxiliary capacitance line,
   the driving circuit includes an auxiliary capacitance line control element provided inside the display region to control a potential of the first auxiliary capacitance line and a potential of the second auxiliary capacitance line, and
   the auxiliary capacitance line control element applies voltages to the first auxiliary capacitance line and the second auxiliary capacitance line such that the potential of the first auxiliary capacitance line and the potential of the second auxiliary capacitance line have opposite phases after the selection voltage is applied to the gate line.

18. The active-matrix substrate according to claim 1, wherein the lines include the gate lines and auxiliary capacitance lines,
   the pixel region includes an auxiliary capacitance connected with the pixel electrode and one of the auxiliary capacitance lines,
   the driving circuit includes auxiliary capacitance line drivers each provided for one of the auxiliary capacitance lines, and
   the auxiliary capacitance line driver applies a voltage with the same polarity as the voltage on the data line to the auxiliary capacitance line in response to the control signal.

19. The active-matrix substrate according to claim 1, wherein the driving circuit is provided in each of K regions (K is a natural number, K≥2) arranged in a direction in which the gate lines of the display region extend, each driving circuit being provided for every K gate lines, driving circuits being provided on different gate lines in different regions.

20. The active-matrix substrate according to claim 1, wherein the lines include the gate lines and common electrode lines,
   the pixel region includes an auxiliary capacitance connected with the pixel electrode and one of the common electrode lines,
   the driving circuit includes common electrode drivers each located in a pixel region in which the switching element is not provided, and provided for one of the common electrode lines, and the common electrode driver applies to the common electrode line a voltage with a polarity opposite that of the potential of the data line in response to the control signal.

21. The active-matrix substrate according to claim 20, wherein the driving circuit is provided in each of K regions (K is a natural number, K≥2) arranged in a direction in which the gate lines of the display region extend, each driving circuit being provided for every K gate lines, driving circuits being provided on different gate lines in different regions.

22. A display panel comprising:
the active-matrix substrate according to claim 1;
a counter-substrate including a color filter and a counter-substrate; and
a liquid crystal layer sandwiched between the active-matrix substrate and the counter-substrate.

23. The display panel according to claim 22, wherein at least one element of the driving circuit is provided on the active-matrix substrate in a dark-line region that is produced depending on orientation in the liquid crystal layer within the pixel region.

24. A display device comprising:
the display panel according to claim 22; and
a housing containing the display panel,
the housing including a first cover portion located to overlie a portion of a picture frame region of the display panel and a portion of the display region and having a lens with a viewer's side that is curved in shape, and a second cover portion covering at least a side of the display panel.

25. A display panel comprising:
the active-matrix substrate according to claim 1;
a counter-substrate including a color filter; and
a liquid crystal layer sandwiched between the active-matrix substrate and the counter-substrate.

* * * * *